(12) United States Patent
Che et al.

(10) Patent No.: US 11,958,870 B2
(45) Date of Patent: Apr. 16, 2024

(54) SPIRO-CONTAINING PLATINUM(II) EMITTERS WITH TUNABLE EMISSION ENERGIES AND SYNTHESES THEREOF

(71) Applicant: THE UNIVERSITY OF HONG KONG, Hong Kong (CN)

(72) Inventors: Chi Ming Che, Hong Kong (CN); Wai Hung Ang, Hong Kong (CN); Mao Mao, Hong Kong (CN); Gang Cheng, Hong Kong (CN)

(73) Assignee: The University of Hong Kong, Hong Kong (CN)

( * ) Notice: Subject to any disclaimer, the term of this patent is extended or adjusted under 35 U.S.C. 154(b) by 933 days.

(21) Appl. No.: 16/969,872

(22) PCT Filed: Jan. 18, 2019

(86) PCT No.: PCT/CN2019/072312
§ 371 (c)(1),
(2) Date: Aug. 13, 2020

(87) PCT Pub. No.: WO2019/144845
PCT Pub. Date: Aug. 1, 2019

(65) Prior Publication Data
US 2021/0261588 A1    Aug. 26, 2021

Related U.S. Application Data

(60) Provisional application No. 62/621,978, filed on Jan. 25, 2018.

(51) Int. Cl.
*H01L 51/50* (2006.01)
*C07F 15/00* (2006.01)
*H10K 85/30* (2023.01)

(52) U.S. Cl.
CPC ....... *C07F 15/0086* (2013.01); *H10K 85/346* (2023.02)

(58) Field of Classification Search
None
See application file for complete search history.

(56) References Cited

U.S. PATENT DOCUMENTS

| 3,172,862 A | 3/1965 | Gurnee et al. |
| 4,356,429 A | 10/1982 | Tang |
| 2016/0133862 A1* | 5/2016 | Li ....................... H10K 85/346 546/4 |

FOREIGN PATENT DOCUMENTS

| CN | 106795428 A | 5/2017 |
| CN | 107056844 A | 8/2017 |

OTHER PUBLICATIONS

Chow et al., Highly luminescent palladium(II) complexes with sub-millisecond blue to green phosphorescent excited states. Photocatalysis and highly efficient PSF-OLEDs; Chem. Sci.,2016, 7,6083-6098 (Year: 2016).*

(Continued)

*Primary Examiner* — Gregory D Clark
(74) *Attorney, Agent, or Firm* — SALIWANCHIK, LLOYD & EISENSCHENK

(57) ABSTRACT

An asymmetric tetradentate metal complex of a N^C^C^N comprising tetradentate ligand has a metal connected to binding sites which are connected to each other via three or four covalent bonds that can be either single or double bonds with bridging linkers reside between C^C and C^N moieties. These linkers result in three-dimension metal complexes with distorted square planar geometries. The four donor atoms coordinate to a metal center. Upon metal binding a 5-6-6 membered metallocycle is formed upon chelation including a first nitrogen donor bond, a first metal-carbon bond, a second metal-carbon bond, and a second nitrogen (Continued)

donor bond. The light emission from these metal complexes can be tuned by the ligand structure over the entire visible spectrum.

17 Claims, 33 Drawing Sheets

(56) References Cited

OTHER PUBLICATIONS

Office Action dated Apr. 26, 2023 in Korean Application No. 10-2020-7023903.
Chow, P. et al., "Highly luminescent palladium(II) complexes with sub-millisecond blue to green phosphorescent excited states. Photocatalysis and highly efficient PSF-OLEDs†," Chemical Science, 2016, 7: 6083-6098.
International Search Report dated Apr. 17, 2019 in International Application No. PCT/CN2019/072312.

* cited by examiner

| | |
|---|---|
| Empirical formula | $C_{44}H_{30}Cl_3N_2OPt$ |
| Formula weight | 913.21 |
| Temperature / K | 100 |
| Wavelength / Å | 1.54178 |
| Crystal system | Orthorhombic |
| Space group | Pbca |
| a / Å | 11.7204(3) |
| b / Å | 15.9817(4) |
| c / Å | 40.8305(9) |
| $\alpha$ / deg | 90.00 |
| $\beta$ / deg | 90.00 |
| $\gamma$ / deg | 90.00 |
| Volumn / Å$^3$ | 7648.0(3) |
| Z | 8 |
| Crystal size/mm$^3$ | 0.3 × 0.03 × 0.01 |
| Density (calcd) / g/cm$^3$ | 1.586 |
| $\mu$ / mm$^{-1}$ | 9.074 |
| F (000) | 3632.0 |
| $2\theta_{max}$ / deg | 133.28 |
| Index ranges | $-13 \leq h \leq 12$<br>$-18 \leq k \leq 18$<br>$-44 \leq l \leq 46$ |
| Final R indexes [I>2σ(I)] | $R_1 = 0.0622$,<br>$wR_2 = 0.1485$ |
| Goodness of fit S | 1.063 |
| Largest diff. peak/hole / e·Å$^{-3}$ | 3.32 / -5.28 |

Note: $R_1 = \Sigma ||F_o| - |F_c|| / \Sigma |F_o|$, $wR_2 = \{\Sigma [w(F_o^2 - F_c^2)^2] / \Sigma [w(F_o^2)^2]\}^{1/2}$

FIG. 8C

| Complex | UV-Vis absorption[a] $\lambda_{abs}$ (nm) / ε (mol$^{-1}$dm$^3$cm$^{-1}$) | Emission[b] $\lambda_{em}$ (nm) | $\Phi_{em}$[c] | HOMO[d] | LUMO[d] | $T_d$ / °C |
|---|---|---|---|---|---|---|
| [structure] | 263 (2.95), 281 (2.56, sh), 317 (1.54), 345 (0.78, sh), 378 (0.69), 426 (0.12) | 519 | 0.78 | −5.34 | −2.42 | 420 |
| [structure] | 267 (3.94), 2.81 (3.47, sh), 299 (2.12, sh), 317 (1.45), 335 (1.13, br), 356 (1.09, br), 374 (1.17), 417 (0.76), 470 (0.11, sh) | 615 | 0.48 | −5.36 | −2.81 | 387 |
| [structure] | 267 (4.40), 288 (3.31, sh), 298 (2.71, sh), 317 (1.52, sh), 338 (0.99), 379 (0.38, sh) | 451 | 0.30 | −5.34 | −2.27 | 410 |

[a] Determined in degassed dichloromethane (complex concentration = 2 x 10$^{-5}$ mol dm$^{-3}$).
[b] Determined in PMMA thin film (dopant concentration = 5 wt%).
[c] Determined with Hamamatsu QY absolute PL quantum yield measurement system.
[d] HOMO and LUMO levels were estimated from onset potentials using FeCp$_2^{+/0}$ values of 4.8 eV below the vacuum level.

FIG. 10

SPIRO-CONTAINING PLATINUM(II) EMITTERS WITH TUNABLE EMISSION ENERGIES AND SYNTHESES THEREOF

This application is the U.S. national stage application of PCT/CN2019/072312, filed Jan. 18, 2019, which claims priority from U.S. Provisional Patent Application Ser. No. 62/621,978 filed Jan. 25, 2018, the disclosure of each of which is incorporated herein by reference in its entirety.

BACKGROUND OF INVENTION

Organic electroluminescence was firstly disclosed by Gurnee and Reet Teoste, U.S. Pat. No. 3,172,862. Subsequently, Tang, U.S. Pat. No. 4,356,429 and Appl. Phys. Lett. 1987, 51, 12, 913 disclosed the first organic light-emitting diode (OLED). Afterwards, emissive organic materials for OLEDs and OLED device architecture with multilayer designs became extensively researched. OLEDs, in general, are advantageous over conventional lighting and display technologies because of thinner layers, lower operating voltage, self-emitting properties, higher brightness, higher color purities, and other features.

Devices based on organometallic based materials are superior to their organic counterparts for device efficiencies and stabilities. Iridium dominants the organometallic OLED industry because iridium(III)-based OLEDs display higher emission efficiency, shorter emission lifetime and good device performance. Of iridium alternatives, platinum is a preferred option because it is of higher natural abundance and is lower in cost than iridium. However, many issues are remained before platinum(II) emitters in OLED production are used; these issues include efficiency roll-off, color purity, and color tunability.

Square planar coordination geometry of platinum(II) emitters intrinsically display intermolecular interactions that cause self-quenching, which is detrimental to OLED device performance as high performance obliges high dopant concentration retain serious efficiency roll-off that results from intermolecular interactions such as triplet-triplet annihilation. Recently, platinum(II) emitters have exhibited improved emission efficiency, better than other platinum(II) analogues, and have been comparable to iridium(III) counterparts (Chem. Sci. 2014, 5, 4819). These emitters are primarily green to yellow in emission, $\lambda_{em}$=510-550 nm. Red and blue platinum(II) emitters seldom display high emission efficiency with high device performance, the red having an inherently mismatched energy gap; while blue emitters are a challenge to produce and yield less stable devices. Therefore, a need exists for a new class of materials which display emission energy over the entire visible spectrum (R/G/Y/B-colors) with improved optical emittance and absorbance.

BRIEF SUMMARY

Embodiments of the invention are directed to an asymmetric tetradentate metal complex emitter possessing a ligand core that result in complexes that possess high emission efficiencies, minimal self-quenching, tunable emission energies, and variable emission lifetimes. The metal complex can be used as host materials in, for example, displays and can act as an emitter in, for example, OLEDs. The metal complex emitter has the structure:

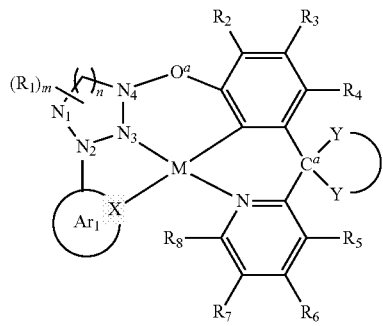

where M is Pt, Ir, W, Fe, Ru, Ni, Pd, Cu, Au or Zn; $Ar_1$ is independently a substituted or unsubstituted aromatic or heteroaromatic ring where X is C or N; where

has the structure

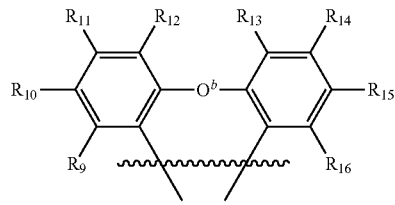

to form a spiro unit with $C^a$ where $O^b$ is a bond, O, S, $NR_{17}$, B $R_{17}$, $PR_{17}$, $CR_{17}R_{18}$, or $SiR_{17}R_{18}$ where $O^a$ is O, S, $NR_{19}$, B $R_{19}$, $PR_{19}$, $CR_{19}R20$, or $SiR_{19}R_{20}$; where $N_1$, $N_2$ and $N_4$ are independently unsubstituted or substituted boron, carbon, nitrogen, oxygen, silicon, germanium, phosphorous, sulphur or selenium and n is 1 to 3; where $N_3$ is carbon, boron, nitrogen, oxygen, silicon, germanium, phosphorous, sulphur or selenium; and the ring containing $N_1$, $N_2$, $N_3$ and $N_4$ is a saturated, unsaturated or aromatic ring; where $R_1$ is one or more substituents on the ring and is independently hydrogen, substituted or unsubstituted alkyl, alkenyl, alkynyl, aryl, heteroaryl, cycloalkyl, heterocyclyl, amino, nitro hydroxyl, halogen, thio, alkoxy, haloalkyl, arylalkane or arylalkene; where $C^a$ is carbon, silicon, or germanium; where $R_2$, $R_3$, $R_4$, $R_5$, $R_6$, $R_7$, and $R_8$ are independently hydrogen, substituted or unsubstituted alkyl, alkenyl, alkynyl, aryl, heteroaryl, cycloalkyl, heterocyclyl, amino, nitro hydroxyl, halogen, thio, alkoxy, haloalkyl, arylalkane or arylalkene, where $R_9$, $R_{10}$, $R_{11}$, $R_{12}$, $R_{13}$, $R_{14}$, $R_{15}$, and $R_{16}$ are independently hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group and where a pair of adjacent R groups can independently form a 5-8 membered aryl, or arylalkyl ring which may be interrupted one or more times with O, S, N, or $NR_{21}$; and where $R_{17}$, $R_{18}$, $R_{19}$, $R_{20}$, and $R_{21}$ are independently alkyl, alkenyl, alkynyl, aryl, heteroaryl, cycloalkyl, heterocyclyl, haloalkyl, arylalkane or arylalkene.

BRIEF DESCRIPTION OF DRAWINGS

FIG. 8C is a table of crystal data, structure solution and refinement for complex 1, according to an embodiment of the invention.

FIG. 10 is a table of emission and orbital data for green, red, and blue emitters, complex 1, complex 4, and complex 5, respectively, according to an embodiment of the invention.

DETAILED DISCLOSURE

Figure 1:
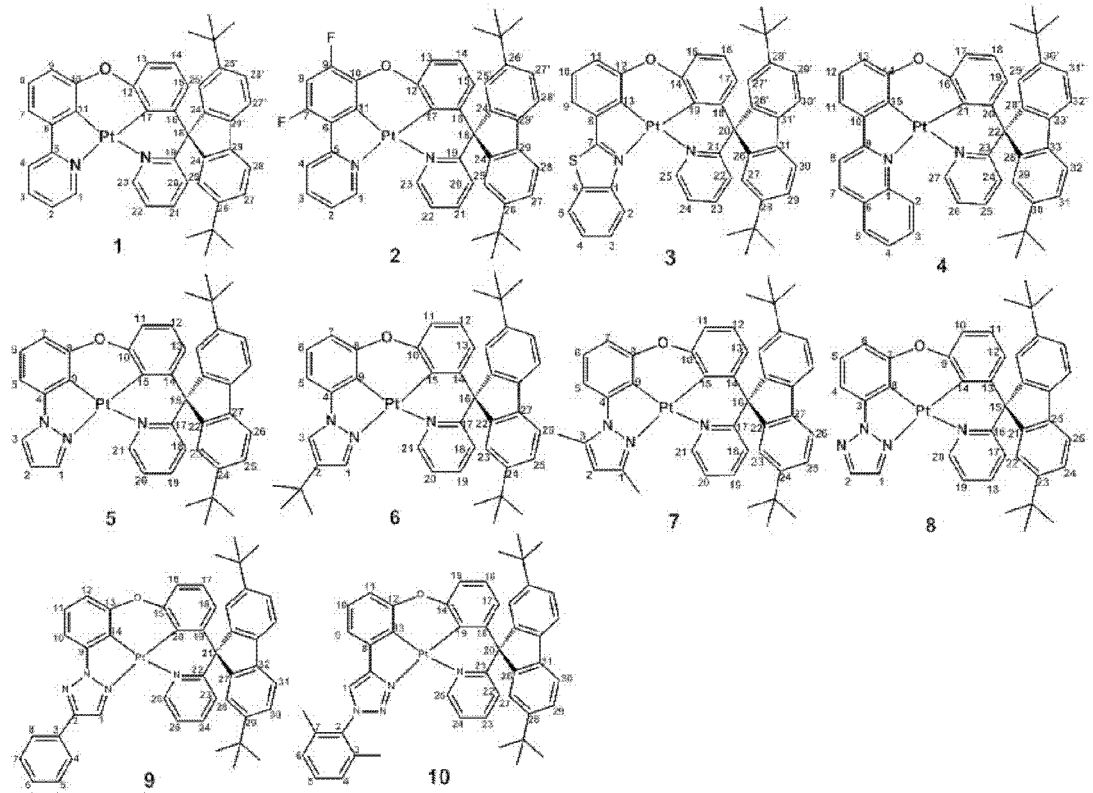
FIG. 1 shows N^C^C^N platinum(II) complexes 1-10 with the labeling scheme of the ligands.
Figure 2:
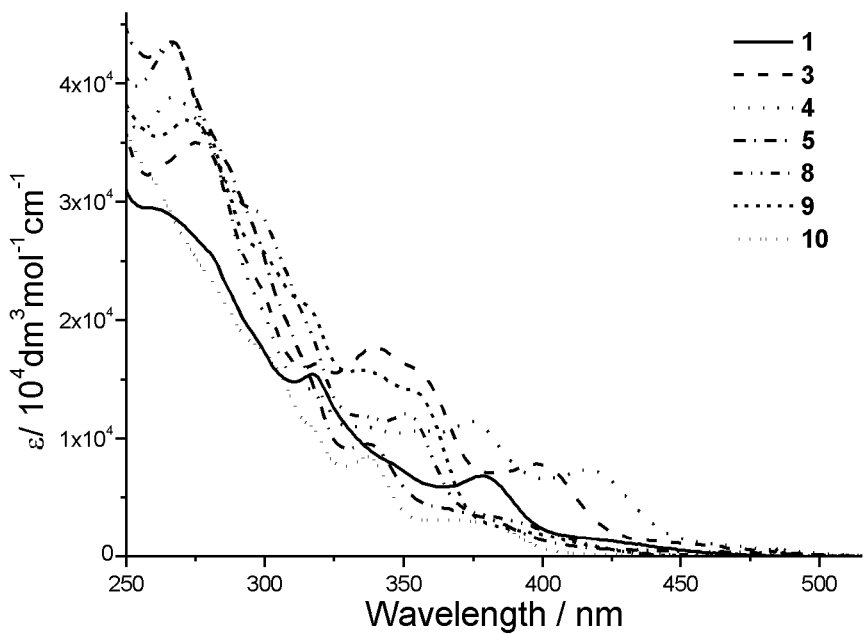
FIG. 2 shows UV-vis absorption spectra of complexes 1, 3, 4, 5, 8, 9 and 10 in dichloromethane ($2 \times 10^{-5}$ dm$^3$ mol$^{-1}$) at room temperature.
Figure 3:
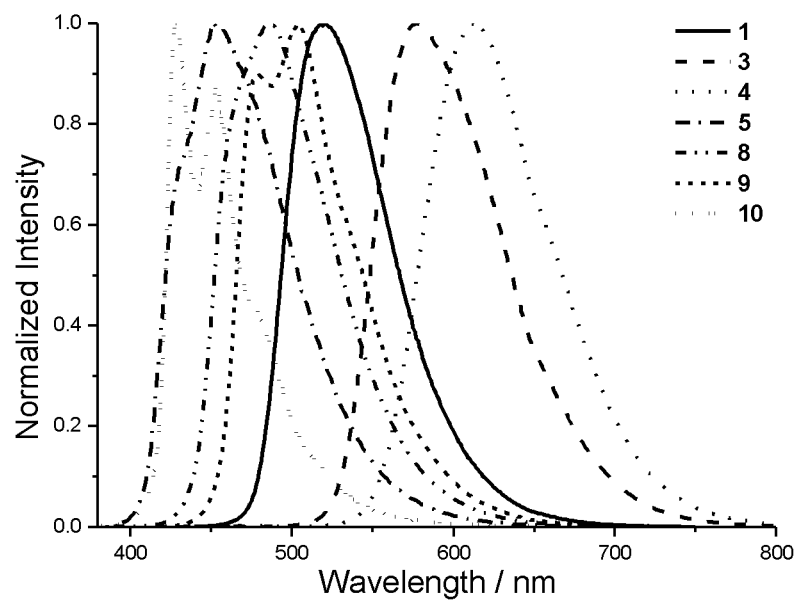
FIG. 3 shows emission spectra of complexes 1, 3, 4, 5, 8, 9 and 10 in dichloromethane ($2 \times 10^{-5}$ dm$^3$ mol$^{-1}$) at room temperature.
Figure 4:
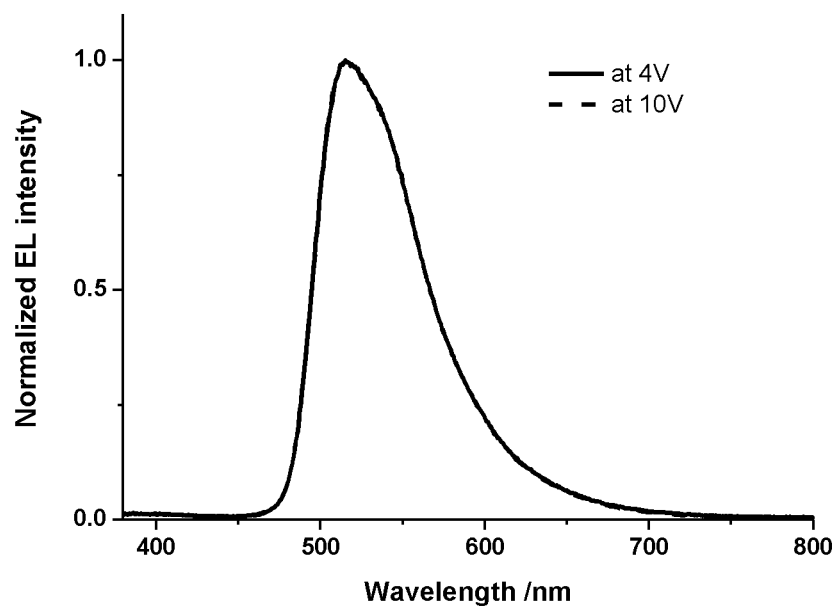
FIG. 4 shows normalized EL spectra of complex 1-based OLED at different driving voltages.
Figure 5:
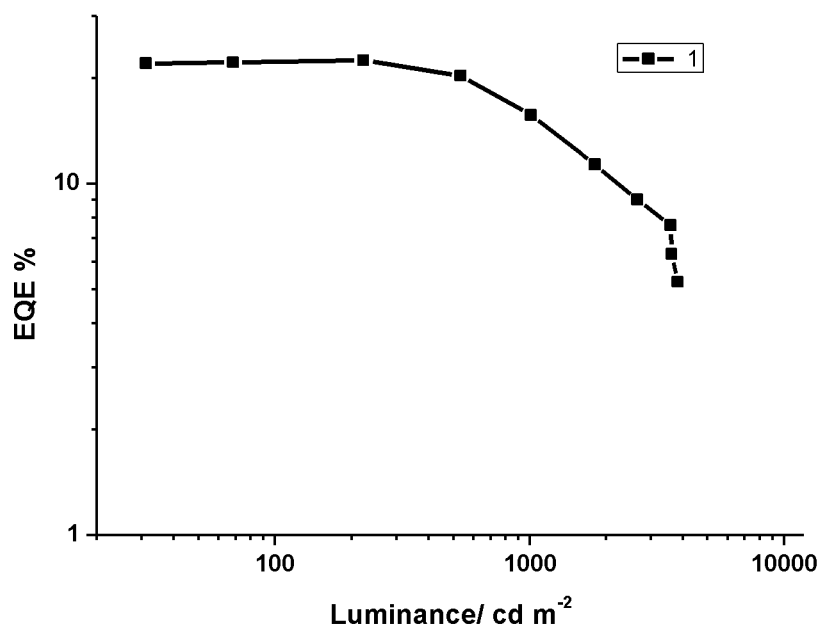
FIG. 5 shows EQE-luminance characteristics of complex 1-based OLED.
Figure 6:
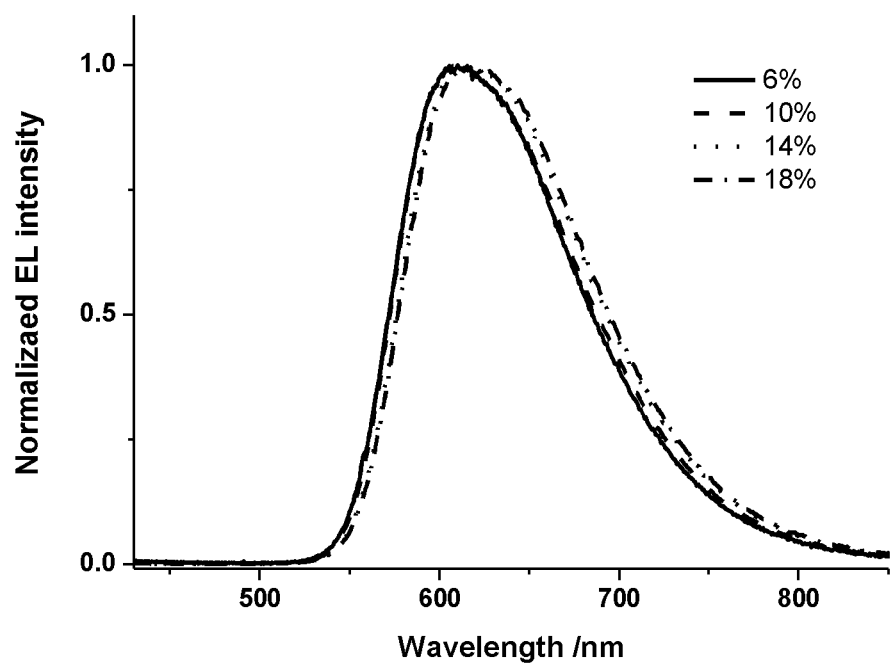
FIG. 6 shows normalized EL spectra of complex 4-based OLEDs at different doping concentrations.
Figure 7:
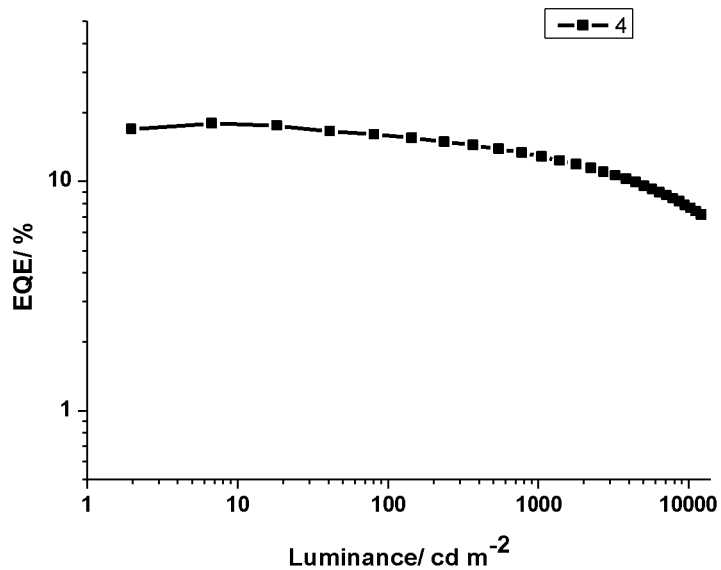
FIG. 7 shows EQE-luminance characteristics of complex 4-based OLED.

An embodiment of the invention is an asymmetric N^C^C^N comprising tetradentate ligand. Although, in many embodiments of the invention, the two C binding sites comprise carbon atoms, both C sites can be other atoms, as indicated below. The tetradentate ligand has the structure:

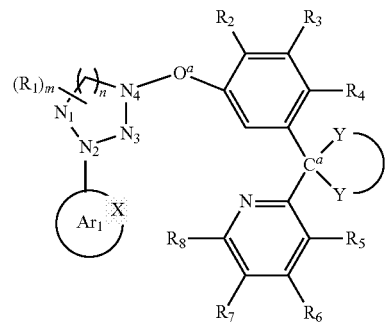

where Ar$_1$ is a substituted or unsubstituted aromatic or heteroaromatic ring where X is N or other electron pair donor;

has the structure

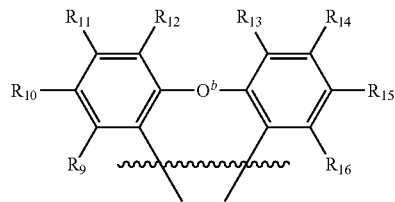

to form a spiro unit with C$^a$, where C$^a$ is carbon or silicon and O$^b$ is a bond, O, S, NR$_{17}$, B R$_{17}$, PR$_{17}$, CR$_{17}$R$_{18}$, or SiR$_{17}$R$_{18}$; where O$^a$ is O, S, NR$_{19}$, B R$_{19}$, PR$_{19}$, CR$_{19}$R20, or SiR$_{19}$R$_{20}$; where N$_1$, N$_2$ and N$_4$ are independently unsubstituted or substituted boron, carbon, nitrogen, oxygen, silicon, germanium, phosphorous, sulphur or selenium and n is 1 to 3; where N$_3$ is carbon, boron, nitrogen, oxygen, silicon, germanium, phosphorous, sulphur or selenium; and the ring containing N$_1$, N$_2$, N$_3$ and N$_4$ is a saturated, unsaturated or aromatic ring; where R$_1$ is independently hydrogen, substituted or unsubstituted alkyl, alkenyl, alkynyl, aryl, heteroaryl, cycloalkyl, heterocyclyl, amino, nitro, hydroxyl, halogen, thio, alkoxy, haloalkyl, arylalkane or arylalkene; where R$_2$, R$_3$, R$_4$, R$_5$, R$_6$, R$_7$, and R$_8$ are independently hydrogen, substituted or unsubstituted alkyl, alkenyl, alkynyl, aryl, heteroaryl, cycloalkyl, heterocyclyl, amino, nitro hydroxyl, halogen, thio, alkoxy, haloalkyl, arylalkane or arylalkene; where R$_9$, R$_{10}$, R$_1$, R$_{12}$, R$_{13}$, R$_{14}$, R$_{15}$, and R$_{16}$ are independently hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group and where a pair of adjacent R groups can independently form a 5-8 membered aryl, or arylalkyl ring which may be interrupted one or more times with O, S, N, or NR$_{21}$; and where R$_{17}$, R$_{18}$, R$_{19}$, R$_{20}$, and R$_{21}$ are independently alkyl, alkenyl, alkynyl, aryl, heteroaryl, cycloalkyl, heterocyclyl, haloalkyl, arylalkane or arylalkene.

Another embodiment of the invention is an asymmetric tetradentate metal complex of the N^C^C^N comprising tetradentate ligand. The metal complex has the structure:

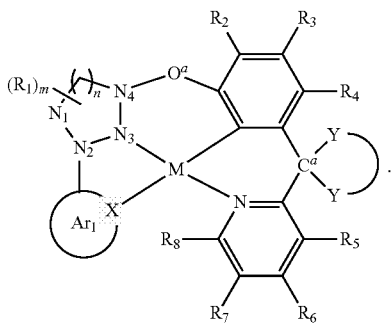

In this structure, the binding sites are connected via three or four covalent bonds that can be either single or double bonds. Bridging linkers, $O^a$ and $C^a$ reside between the C^C and C^N moieties. These $O^a$ and $C^a$ linkers result in three-dimension metal complexes with distorted square planar geometries. The four donor atoms coordinating to platinum (II) center constitute the Pt-N^C^C^N core. The metal center has +2 oxidation state for Pt(II), Pd(II), Ru(II), Cu(II) or Zn(II) or +3 oxidation state for Ru(III), Au(III), or Ir(III)). Formation of 5-6-6 membered metallocycles upon chelation result from the first nitrogen donor bond, a first metal-carbon bond, a second metal-carbon bond, and a second nitrogen donor bond.

The $C^a$

linkage inhibits stacking between metal complexes even with a square planar geometry of the coordinated metal. The three-dimensional requirements of the spiro portion, defined by $C^a$ and

inhibit self-quenching of the metal complex.

The metal complexes according to embodiments of the invention possess good thermal stabilities with decomposition temperature as high as 430° C. under nitrogen. The complexes sublime at temperatures in excess of 300° C. at a pressure of $1\times10^{-5}$ Torr. According to an embodiment of the invention, a device comprising a complex is fabricated by a thermal deposition process with little residues remaining upon device fabrication. The metal complexes are stable in air and soluble in common organic solvents, such as, but not limited to, dichloromethane, chloroform, ethyl acetate, diethyl ether, acetone, hexane, dimethyl sulfoxide, dimethylformamide, methanol, and ethanol. The good solubility in organic solvents of these emitters is advantageous for fabrication of light-emitting devices using solution processing.

The metal emitters display blue, green, yellow and red emission with emission efficiencies of almost 90%. The metal emitters are useful for lighting or display technologies where a single emitter or a combination of emitters is used. Tunable emission energies over the visible spectrum ($\lambda$=430-700 nm) is achieved by including different aromatic heterocycles

on the ligand framework. For example, when

is substituted by a pyridyl ring and M is Pt(II), an intense green emission ($\lambda_{em}$=516 3 nm) occurs with emission quantum yield of 81% in solution; device based on the emitter displays stable green emission over wide range of dopant concentration for example, but not limited to, 1 to 30 wt % and CIE coordinates of (0.29±0.01, 0.60±0.01) which matched standard green in the phase alternating line (PAL) color encoding system.

In addition to the ability to tune emission energy, emission lifetime can be varied from micro-seconds to milli-seconds. The metal complexes can be used as emitters or hosts in light-emitting device that is a host-guest system. Short emission lifetime inhibits this metal emitter from undergoing undesirable electrochemical reactions when excitation is by electrical means. Metal complex with long emission lifetimes transfer energy from host to dopant more efficiently as self-emission of the host being a less competitive process. These metal complexes exhibit minimal self-quenching upon increased concentration, displaying self-quenching rate constants that are in the order of $10^7$ dm$^3$ mol$^{-1}$ s$^{-1}$. The N^C^C^N core coordinating to a metal center with the formation of 5-6-6 membered metallocycles provides a robust bulk configuration resulting in a highly stable emitter with minimal intermolecular interactions. Devices based on the metal emitters show a wide doping window, for example, but not limited to 2 to 30 wt % with stable CIE coordinates at high luminance of up to 10000 cd m$^{-2}$.

The distorted square planar geometry of these metal complexes, according to embodiments of the invention, is a unique structural feature as revealed in the X-ray crystal structure of the exemplary complex:

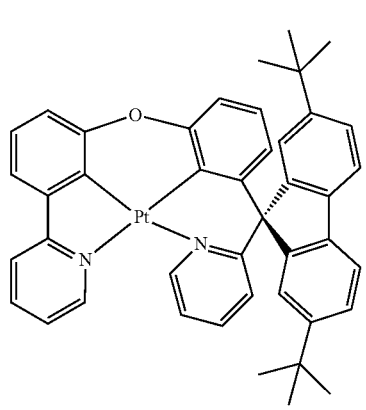

Figure 8A:
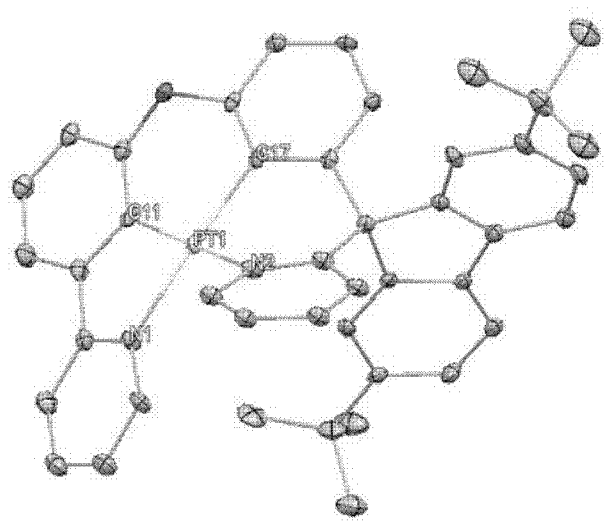
FIG. 8A is the molecular structure of an the asymmetric tetradentate platinum (II) complex 1, according to an embodiment of the invention, as determined by X-ray crystallography shown with ellipsoid presented at the 50% probability level and hydrogens removed for clarity.
Figure 8B:
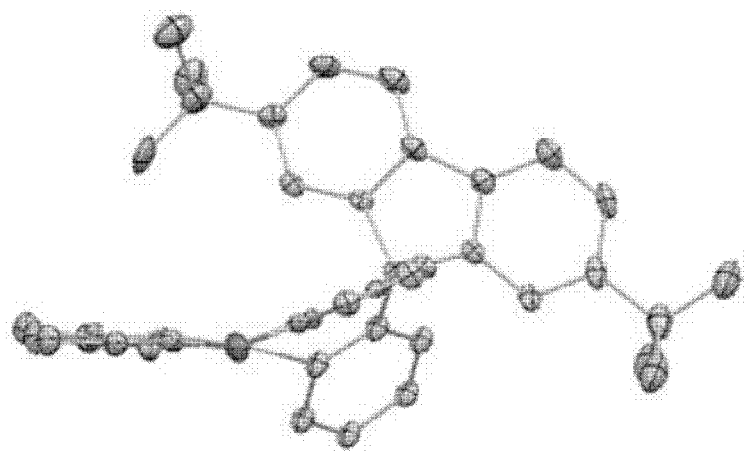
FIG. 8B is the molecular structure of complex 1, according to an embodiment of the invention, rotated to a different frame of view, as determined by X-ray crystallography shown with ellipsoid presented at the 50% probability level and hydrogens removed for clarity.
Figure 9:
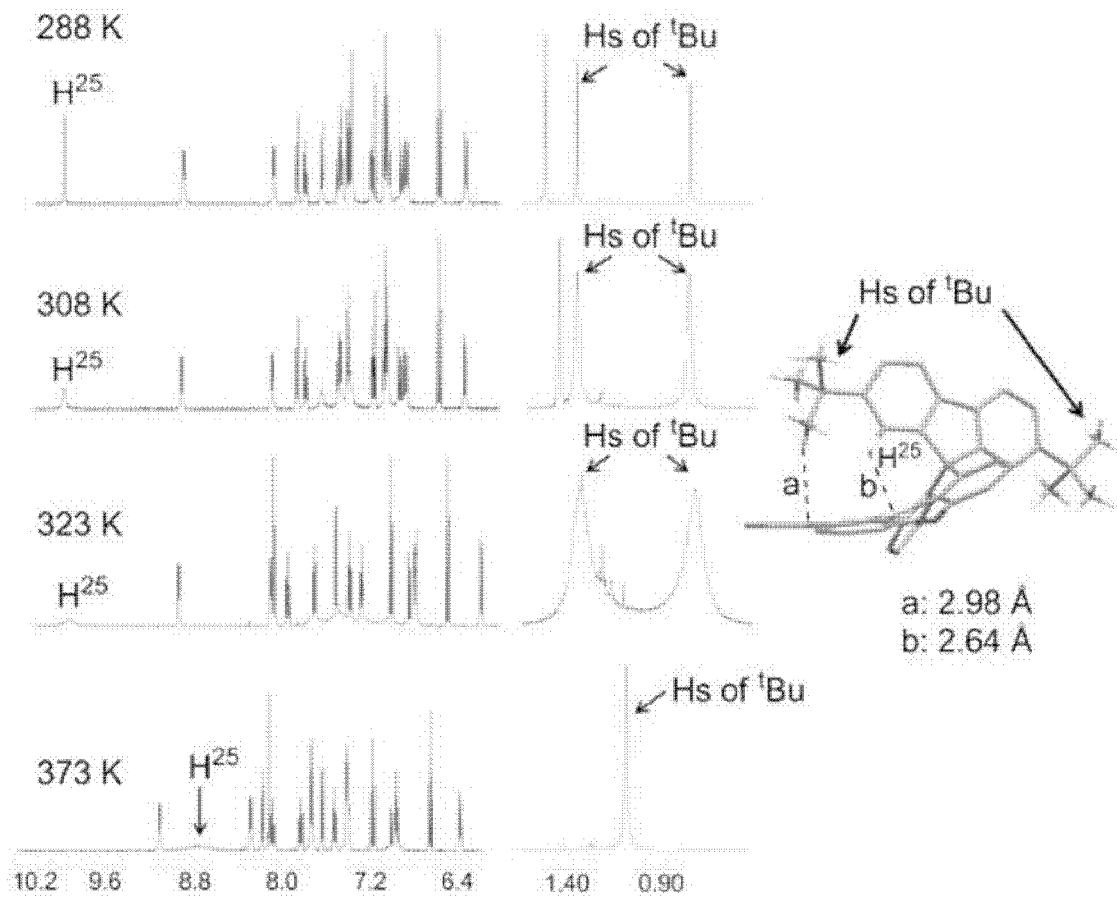
FIG. 9 shows $^1$H NMR spectra for 1 of [2,6-$^i$PrNCN]Cr(THF)$_2$ in CDCl$_3$ as a function of temperature, according to an embodiment of the invention.

(Complex 1)

shown in FIGS. 8A and 8B with crystal data given in FIG. 8C. The exemplary complex of FIG. 8 has a Pt(II) center with a distorted structure such that a spiro-fluorene moiety perpendicular to the C^N 6-membered ring is projected over a face of the chelated metal. This distorted structure has a boat-like conformation to the two six-membered rings, C^C with an oxygen bridge and C^N with the orthogonal spiro-linkage. The projection over the chelated metal displays a short, 2.46 Å, distance between a hydrogen atom of a t-butyl group on the spiro-fluorene unit and the Pt(II) center, or a C—H . . . Pt interaction. This interaction causes the $^1$H NMR signal of the fluorenyl moiety to be shifted unusually compared to that of the equivalent signal for the corresponding free ligand. The chemical environments experienced by the protons of the tert-butyl group of the fluorene coalesce upon increasing the temperature to 373 K, as illustrated in FIG. 9; while other protons on the complex undergo a minimal change upon heating due to the rigid ligand scaffold of the complex. Due to the unique geometry of the asymmetric square planar metal complexes, according to embodiments of the invention, the color pallet is tunable as indicated for the exemplary asymmetric Pt(II) metal complexes tabulated in FIG. 10, where blue, red, and green emissions are displayed. For this reason, the metal complexes is an emitter that can be employed in a visible light emitting device, such as an OLED and, with the use of a plurality of emitters, the device can display a contrast, and with a multiplicity of emitters a full color display is possible. Visible light emitters can emit as designed in the range where $\lambda_{max}$ extends over the range of 450 nm to 635 nm, having a self-quenching rate constant of $10^{-7}$ dm$^3$ mol$^{-1}$ s$^{-1}$ or less. The light emitting devices can be fabricated by state of the art methods, such as vacuum deposition or solution processing. The device can be one with a delayed fluorescence or phosphorescence.

Figure 11:
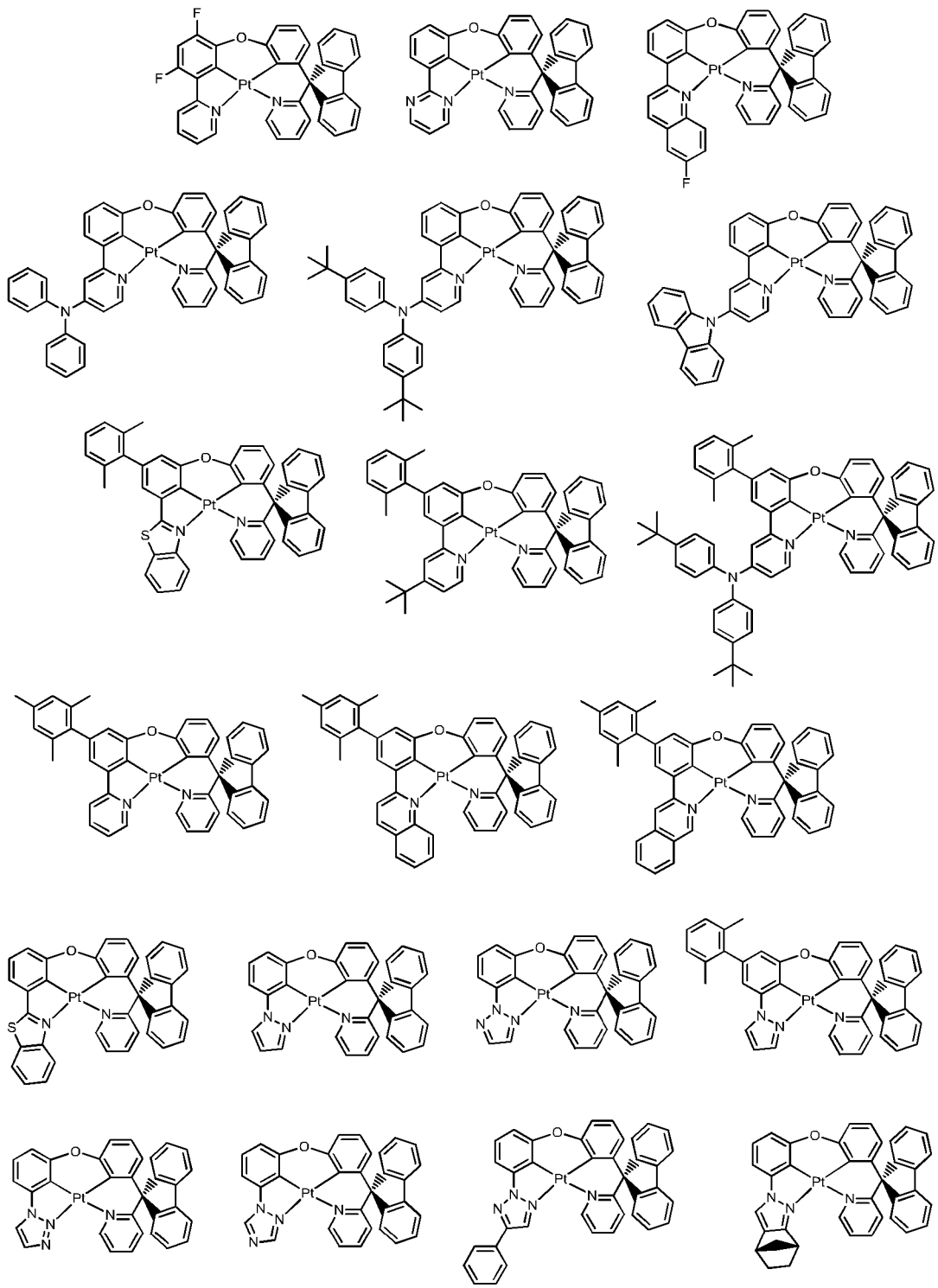
FIG. 11 shows different Pt(II) asymmetric complexes, according to embodiments of the invention.
Figure 11:
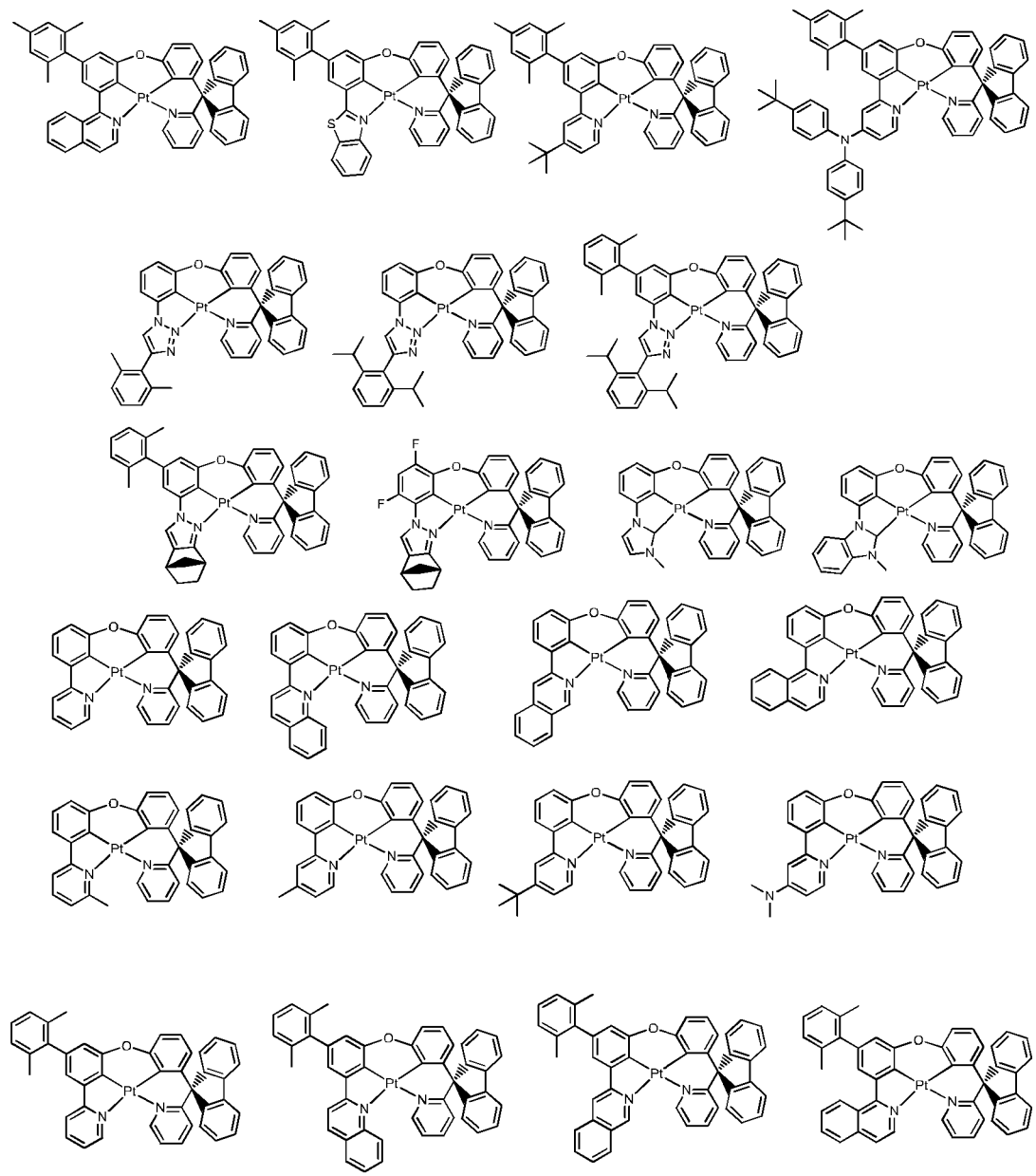
Figure 11:
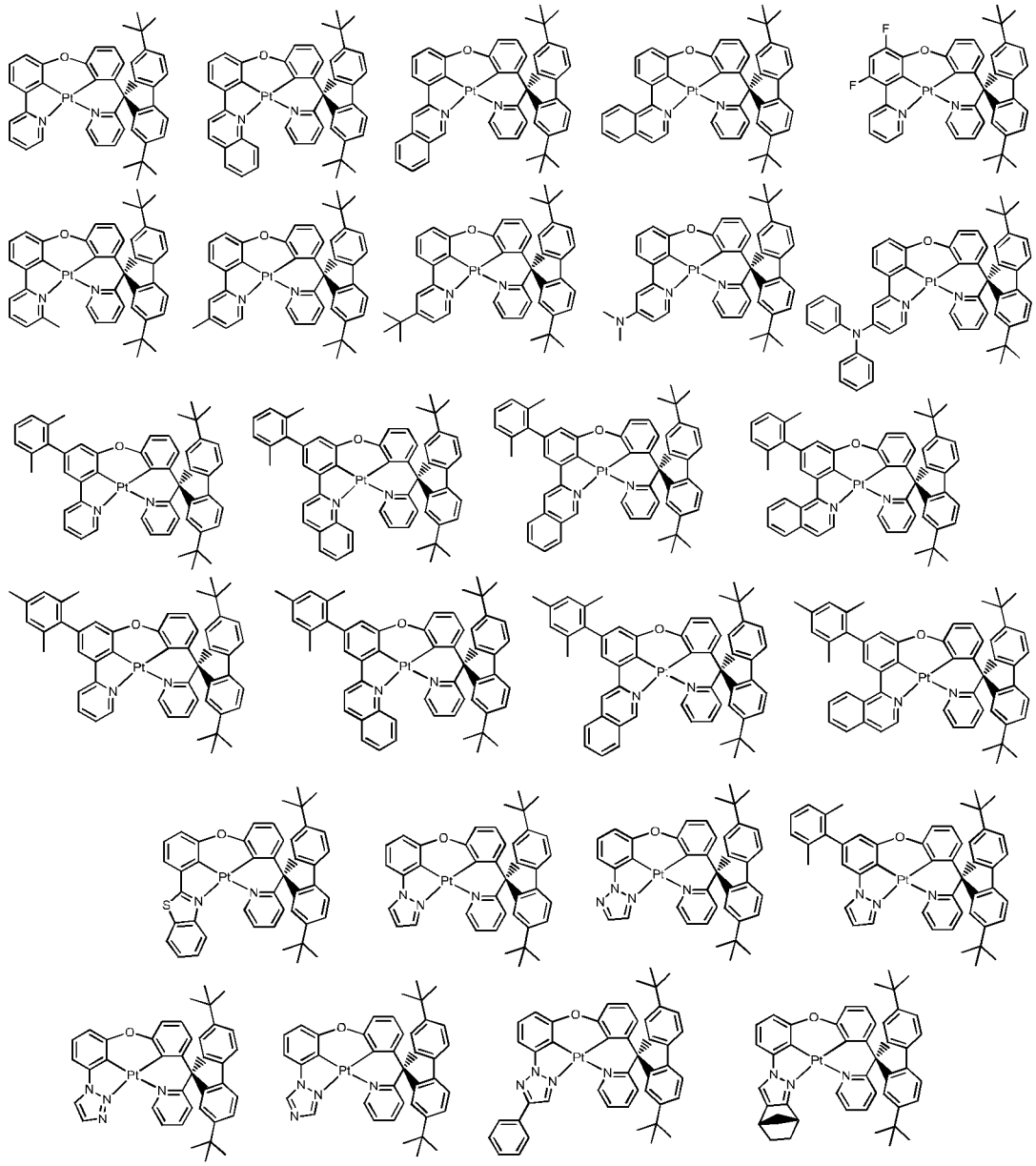
Figure 11:
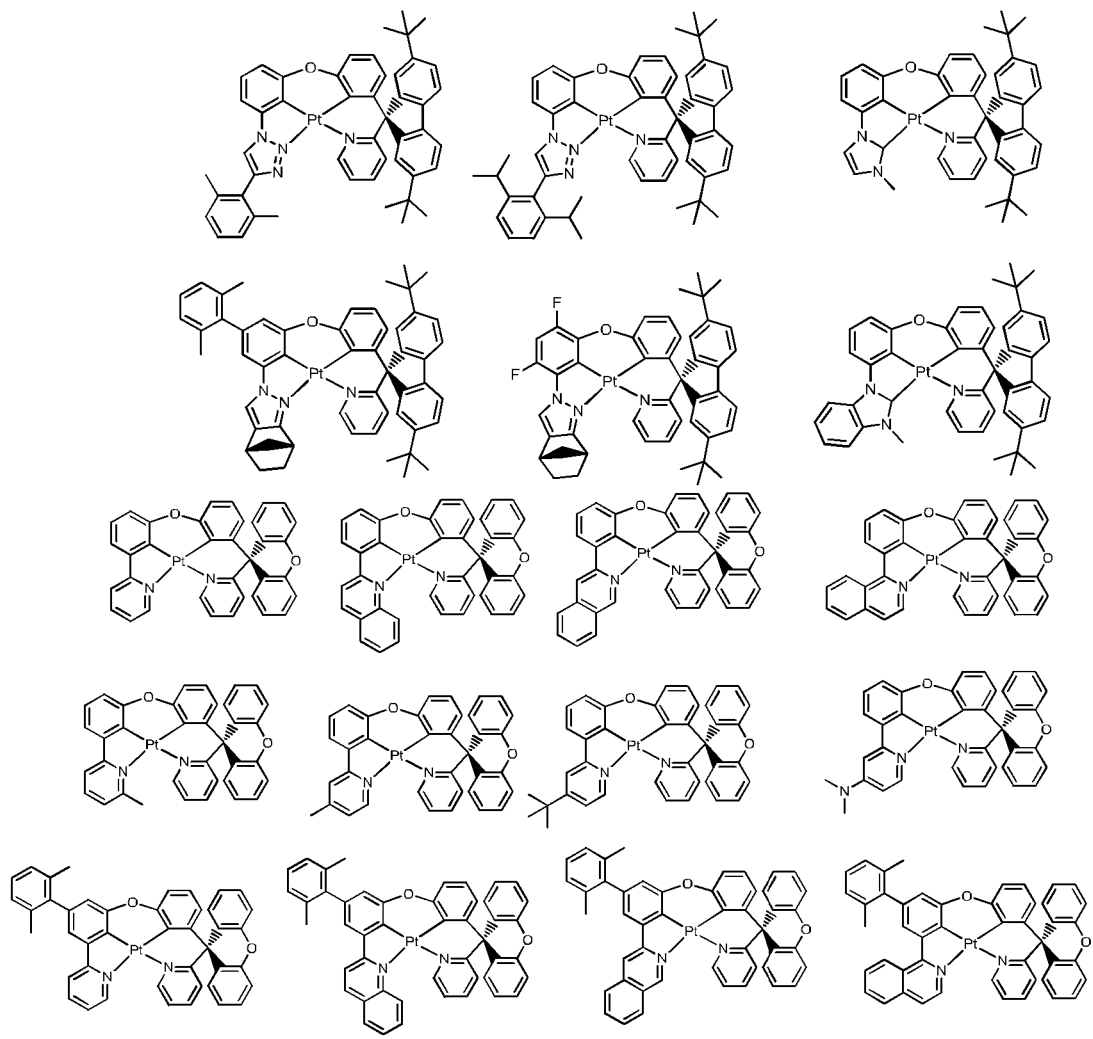
Figure 11:
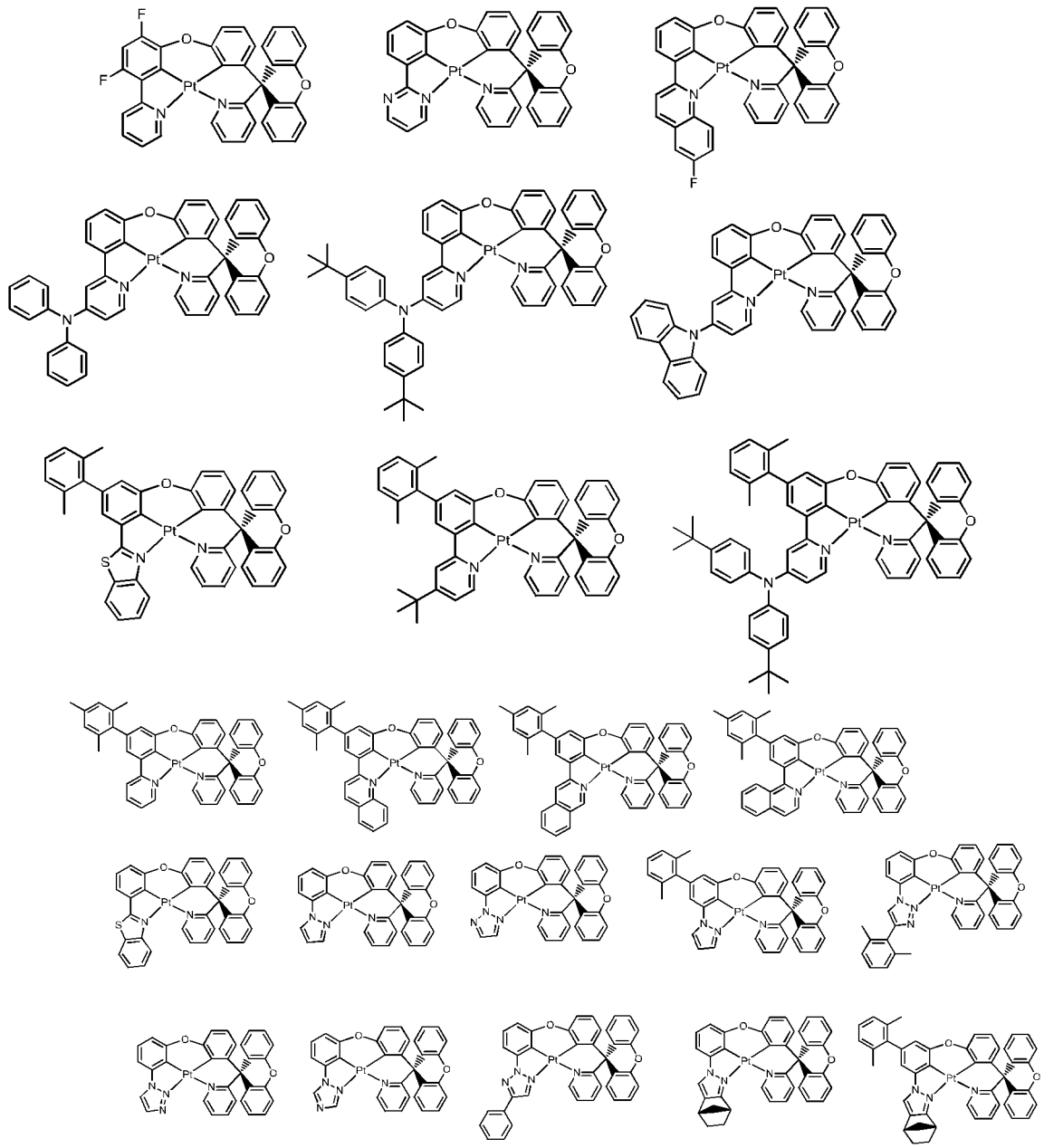
Figure 11:
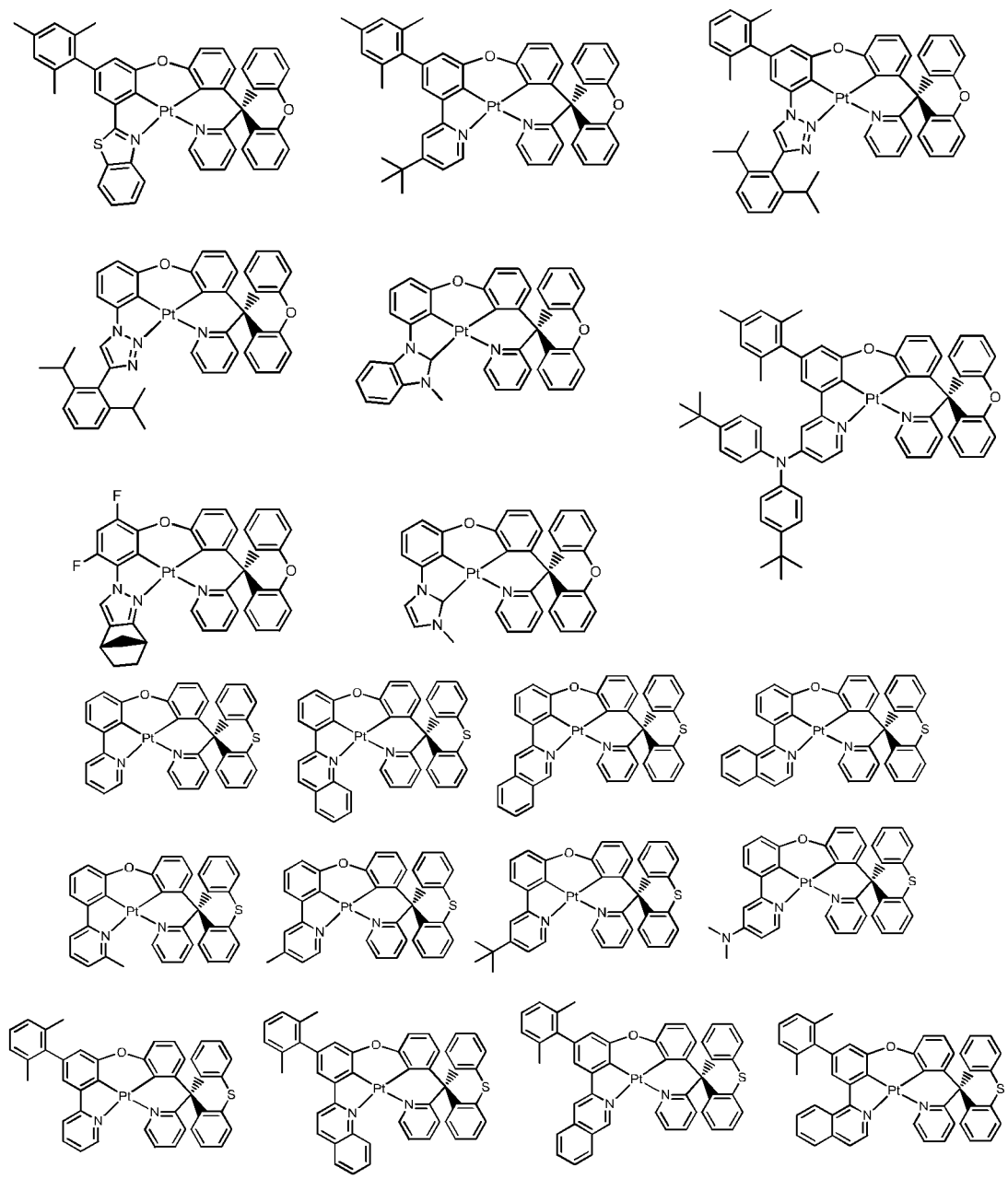
Figure 11:
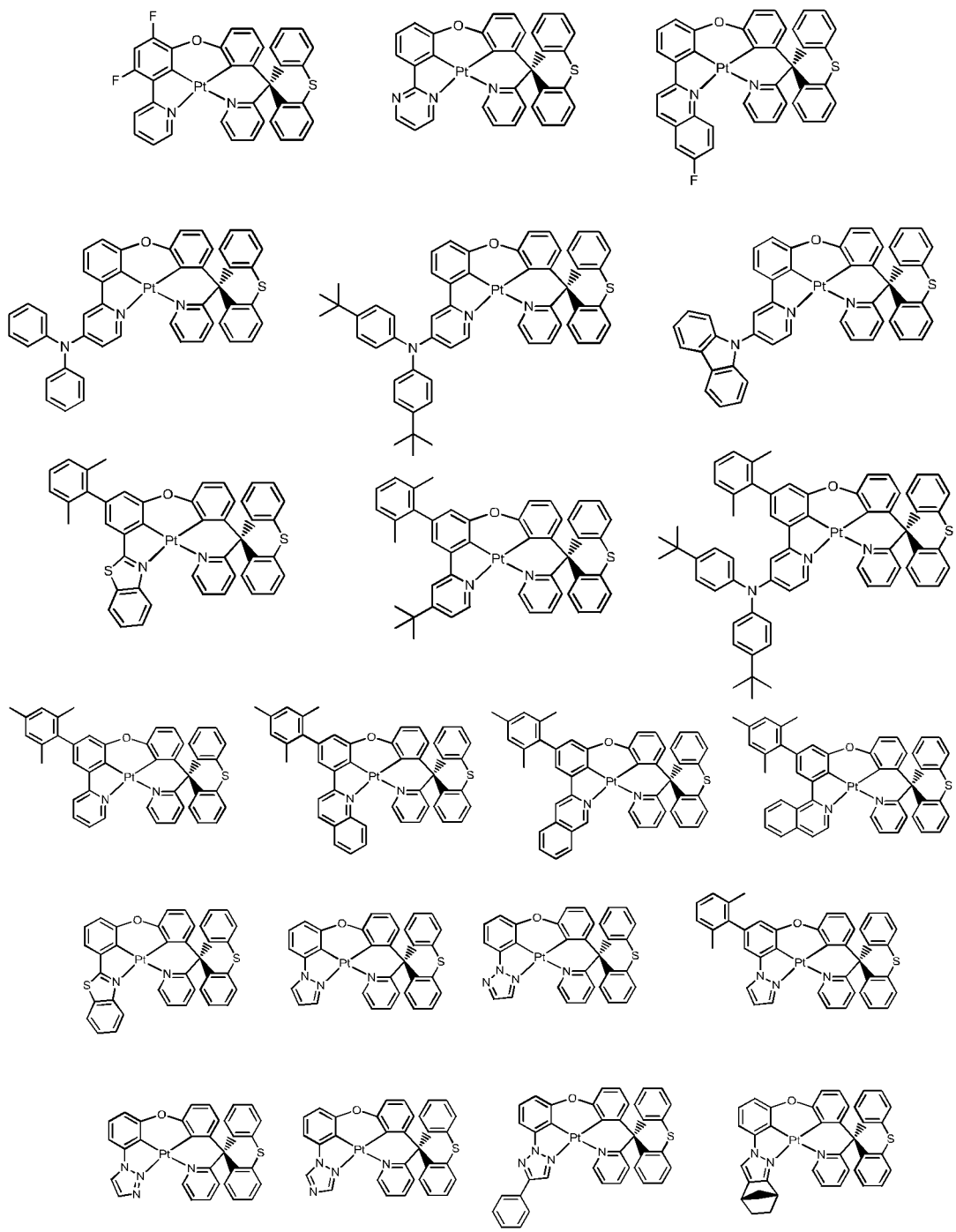
Figure 11:
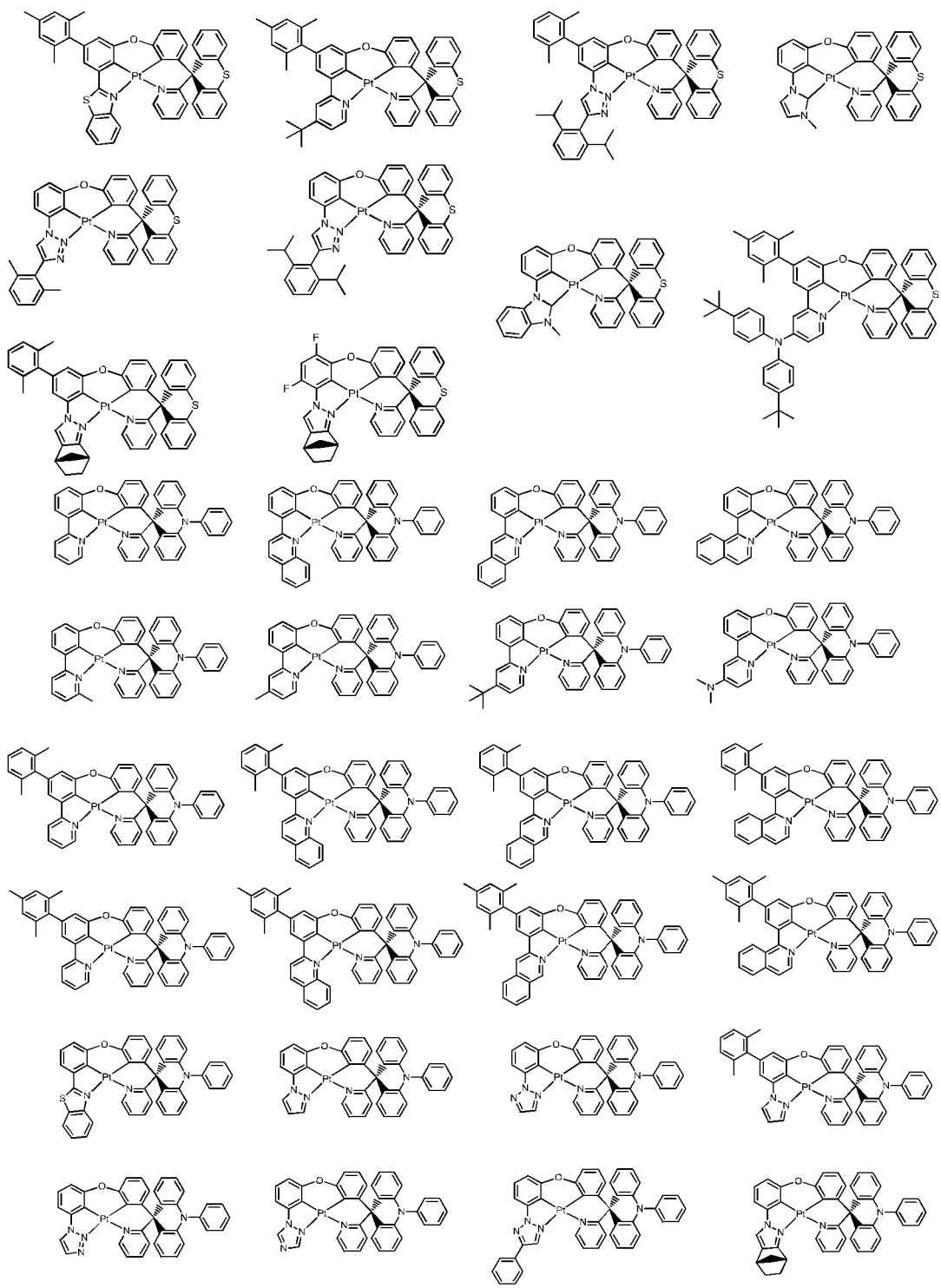
Figure 11:
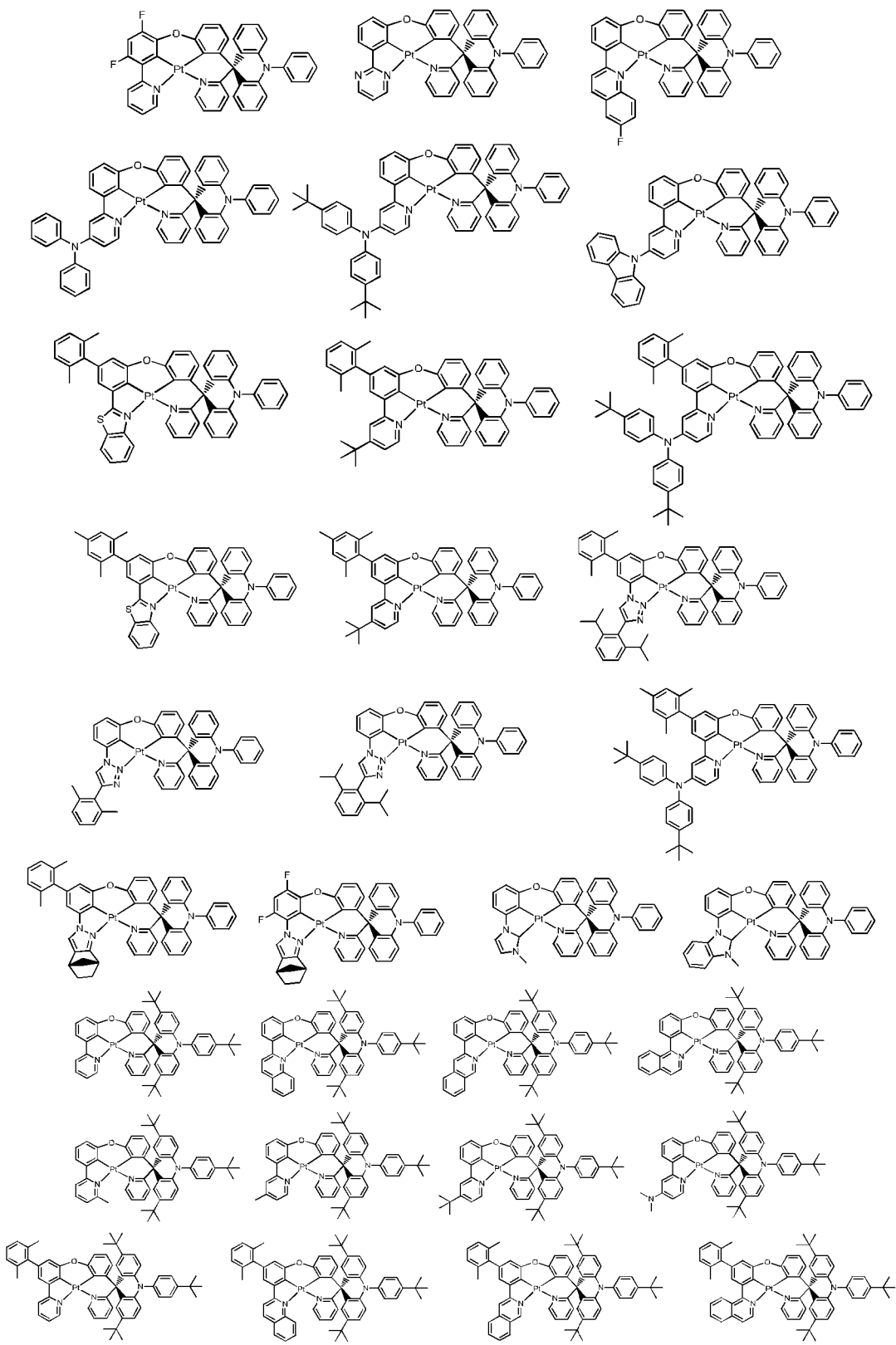
Figure 11:
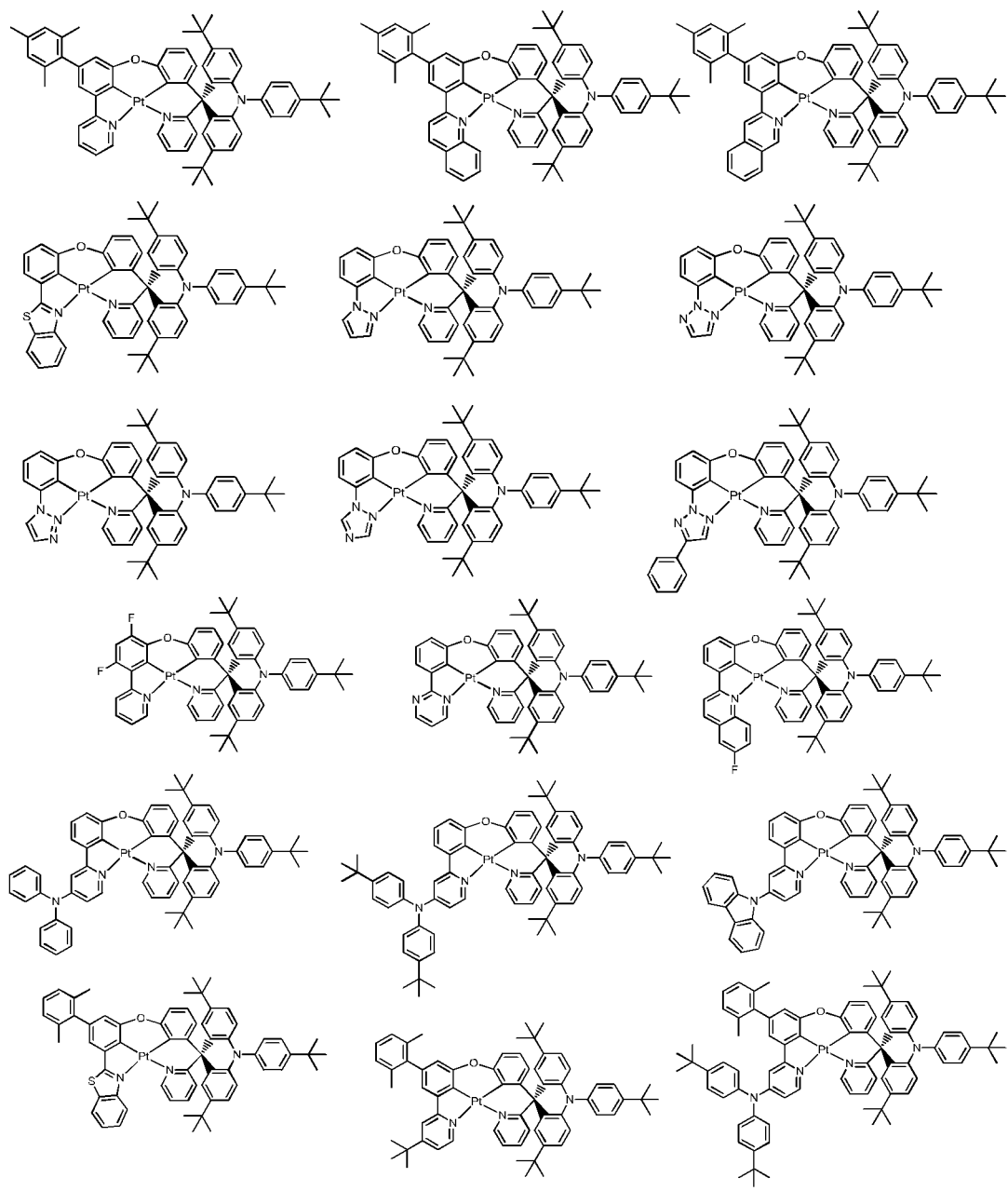
Figure 11:
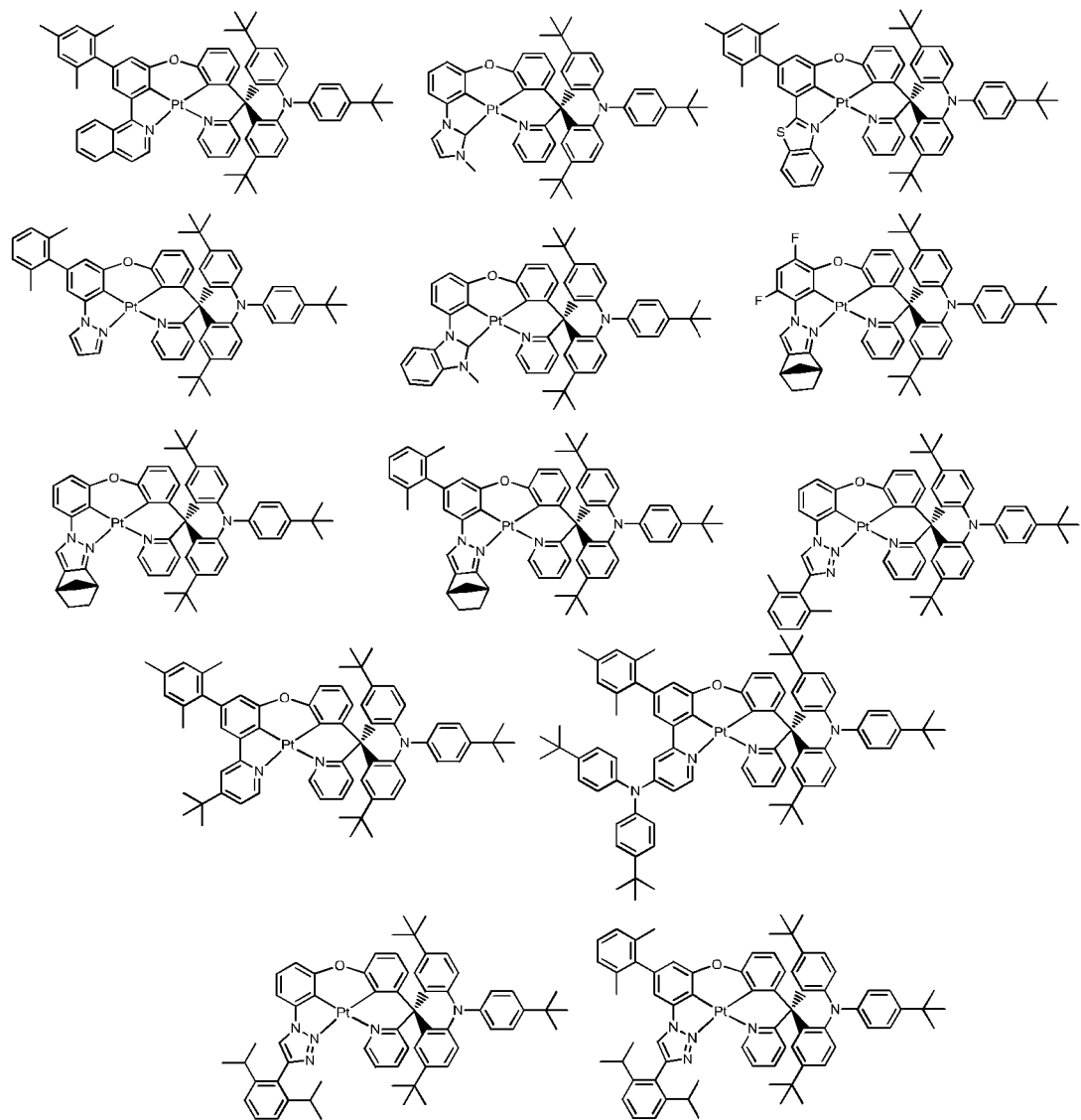
Figure 11:
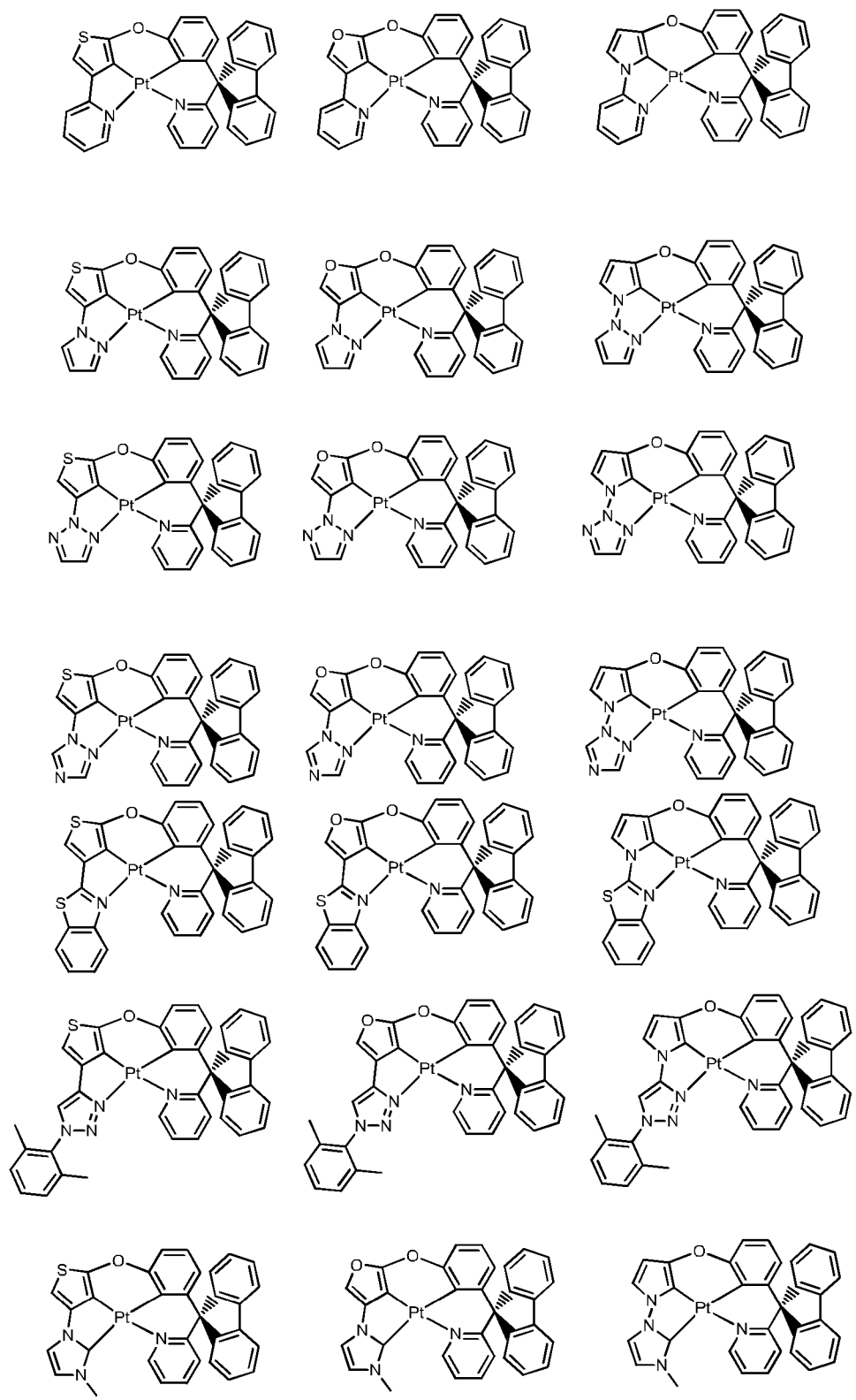
Figure 11:
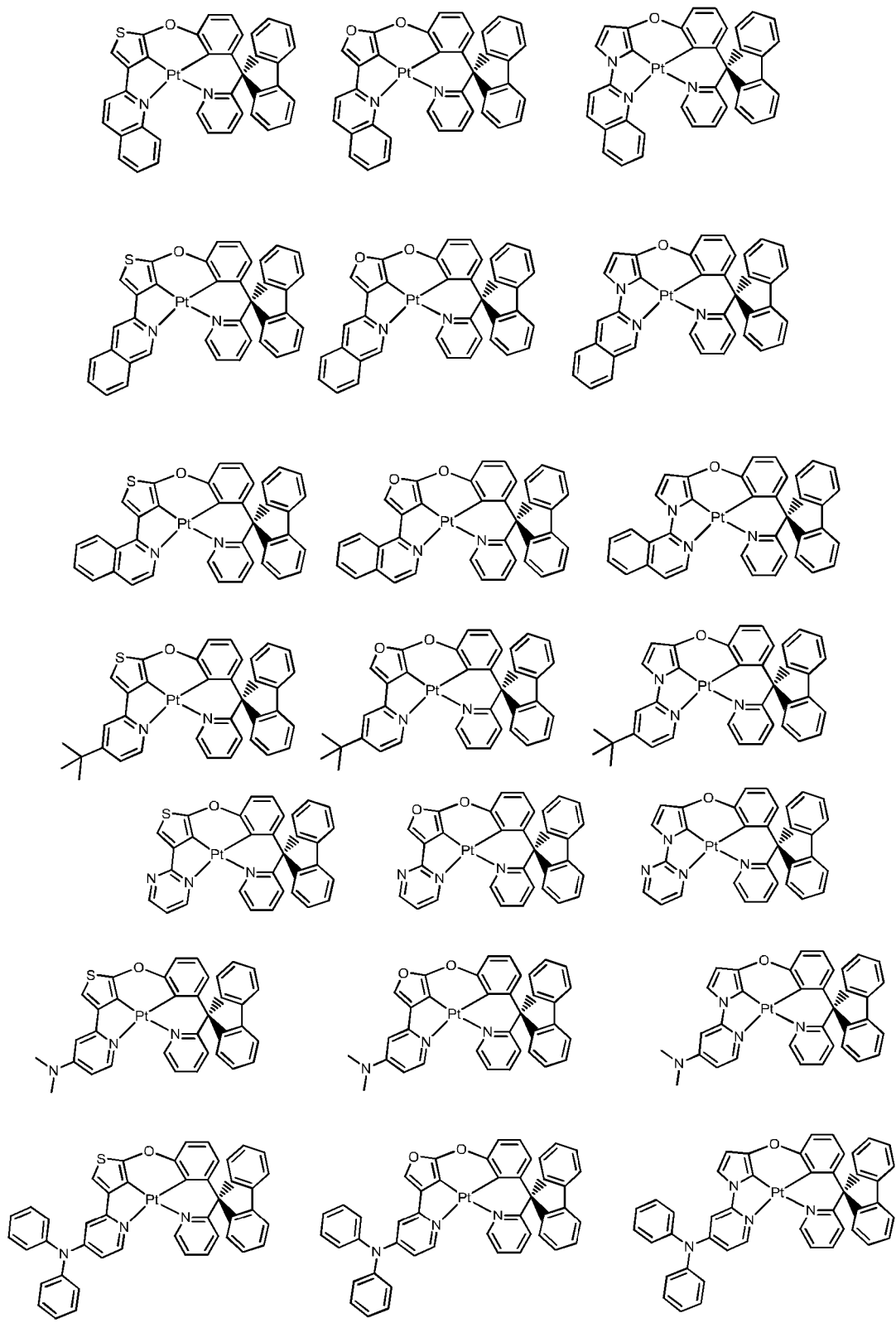
Figure 12:
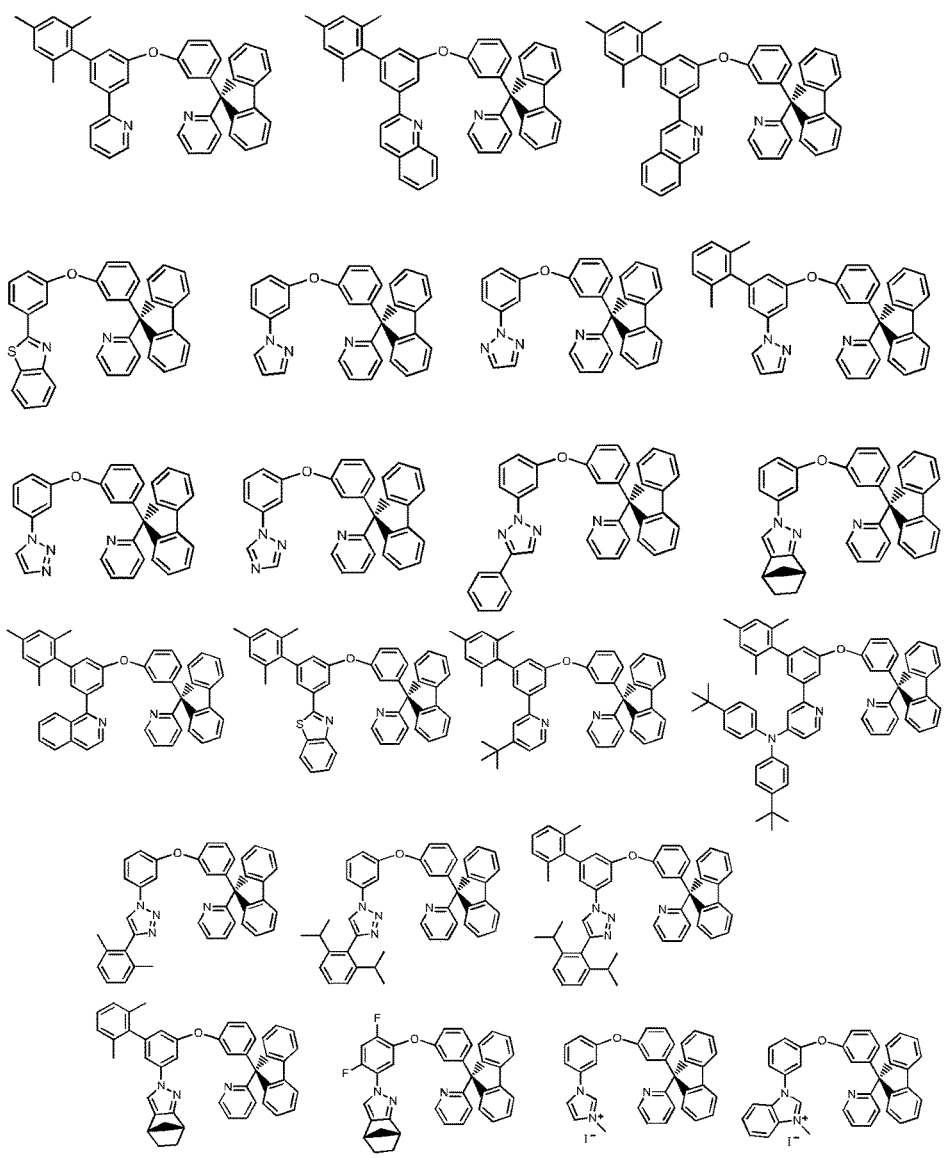
FIG. 12 shows different asymmetric N^C^C^N comprising tetradentate ligands, according to embodiments of the invention.
Figure 12:
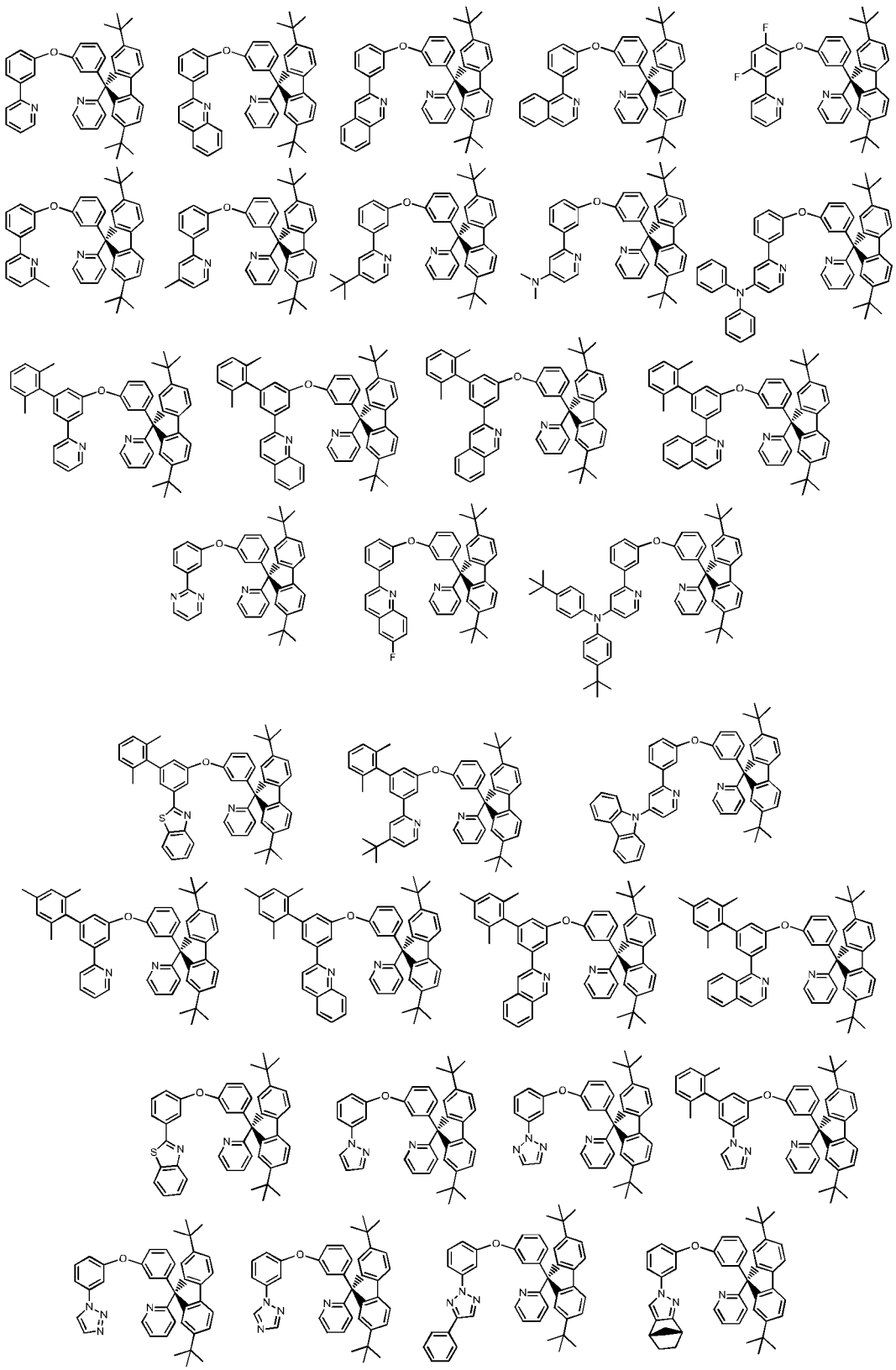
Figure 12:
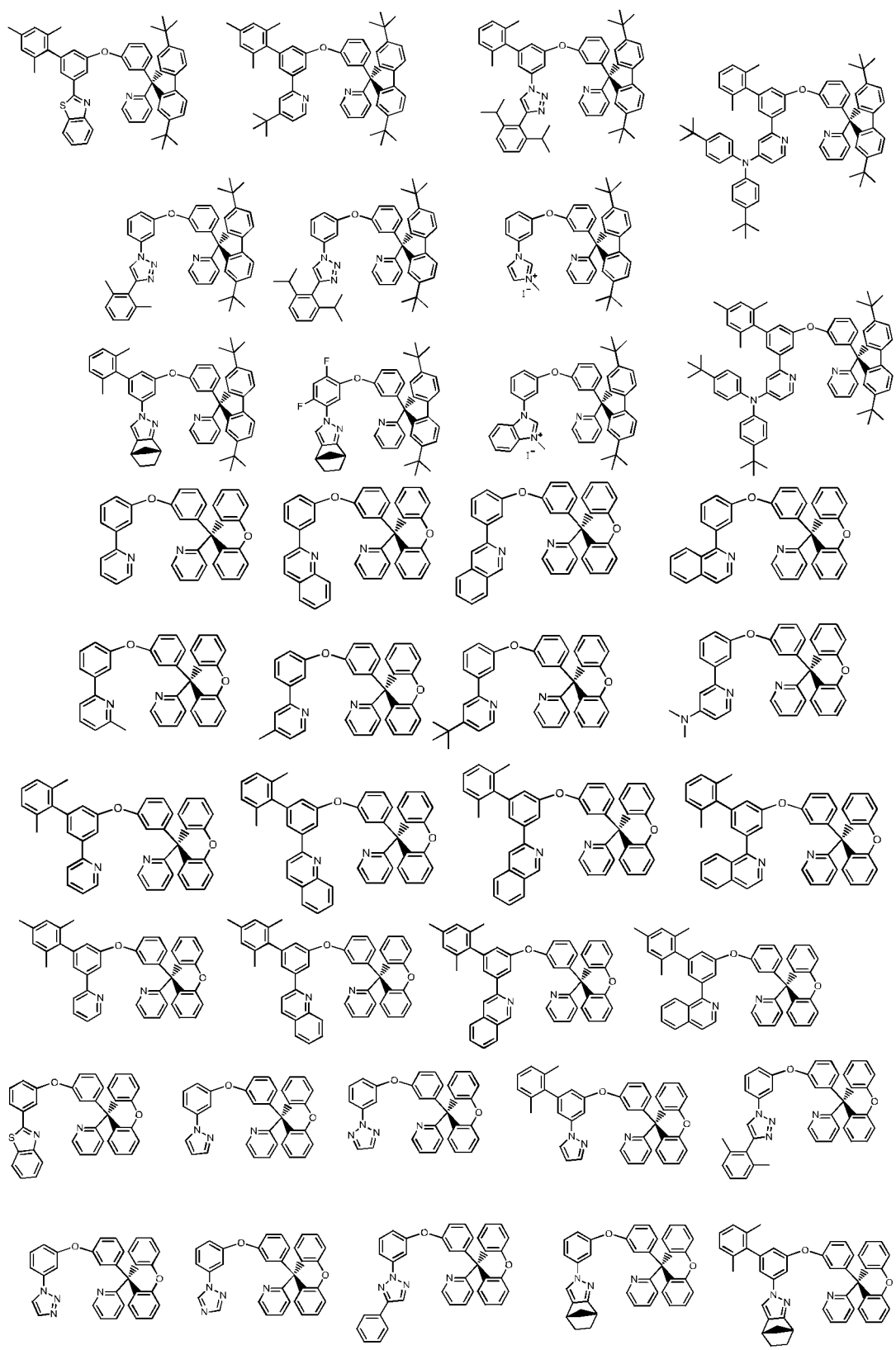
Figure 12:
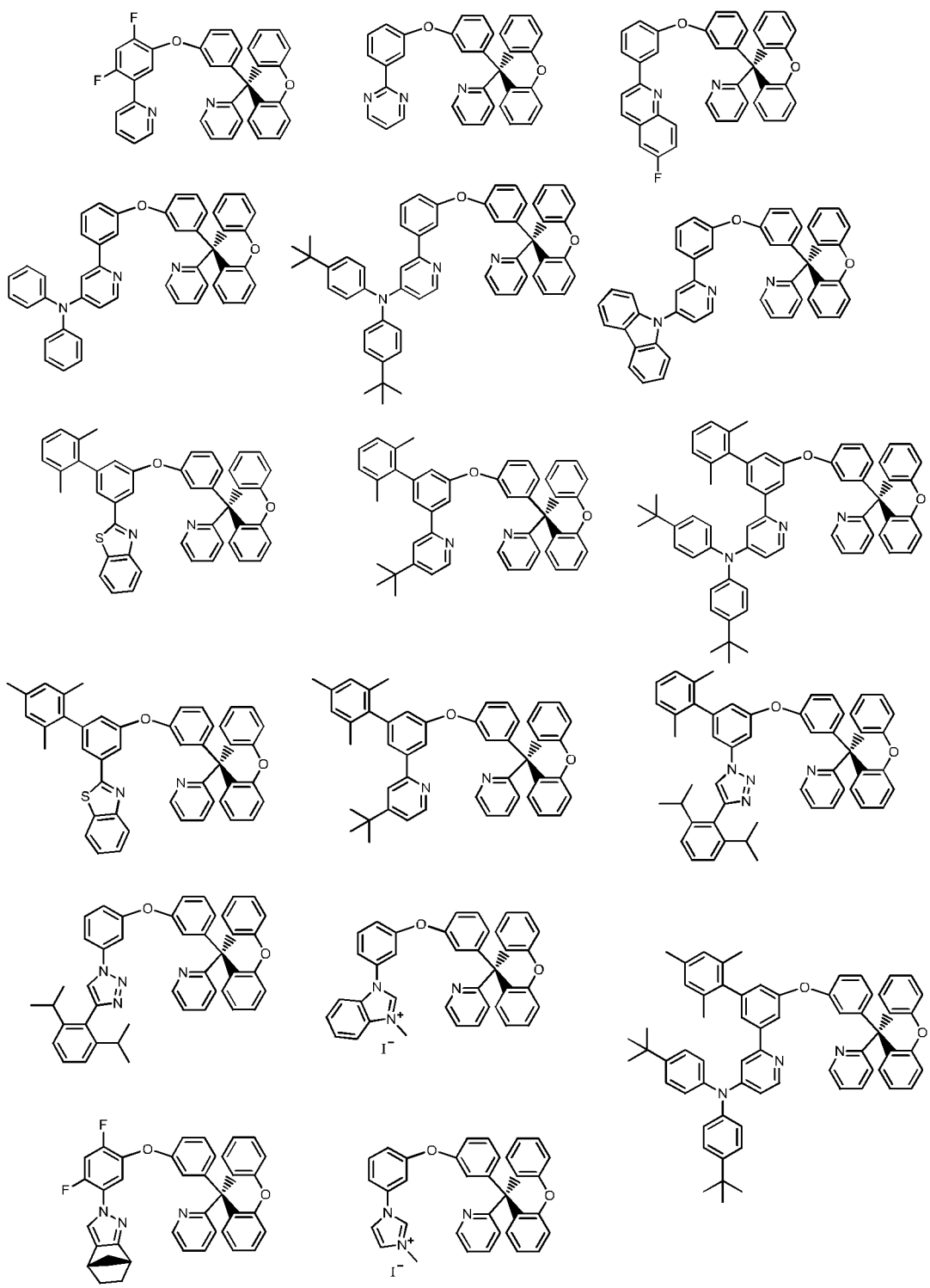
Figure 12:
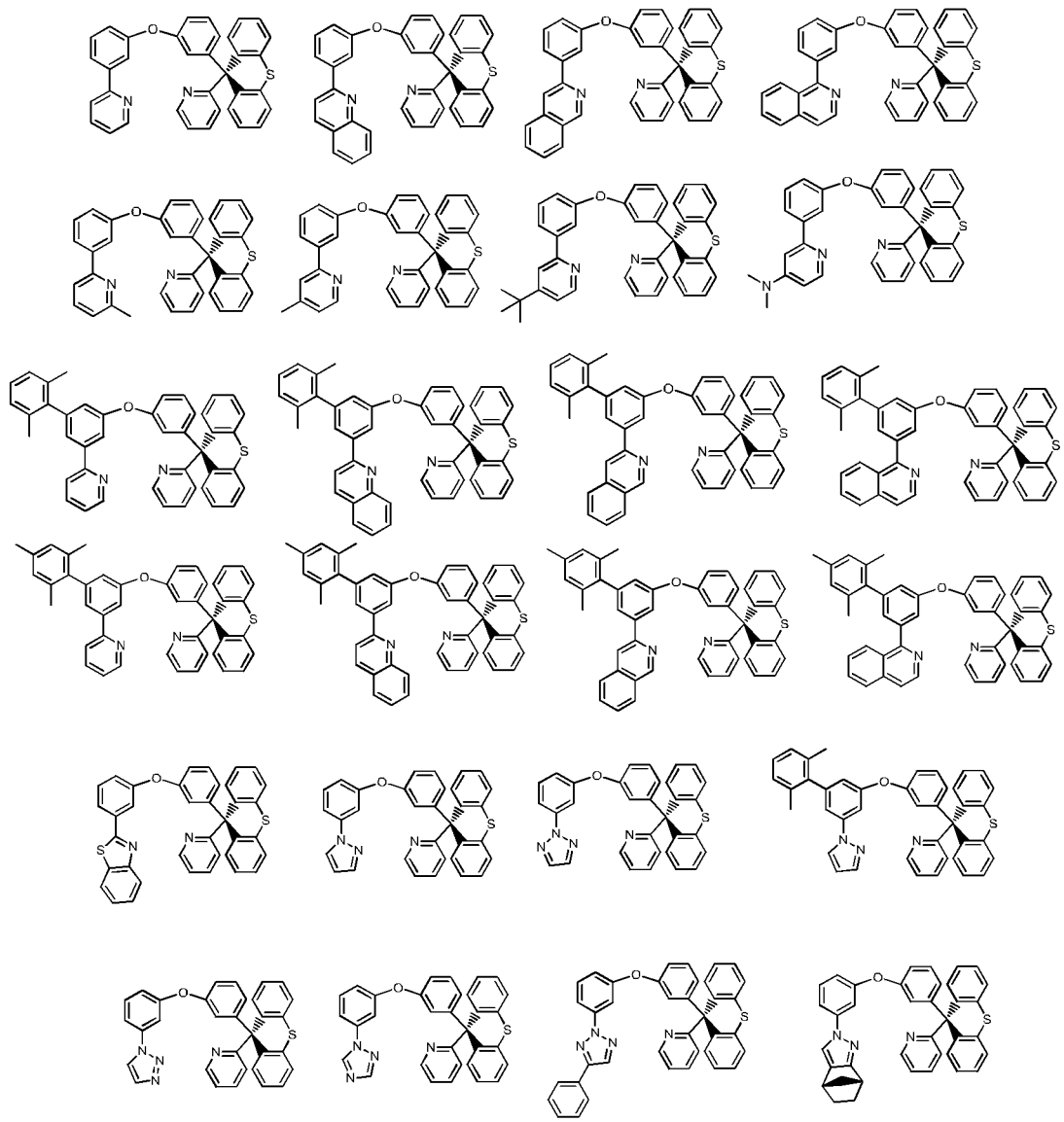
Figure 12:
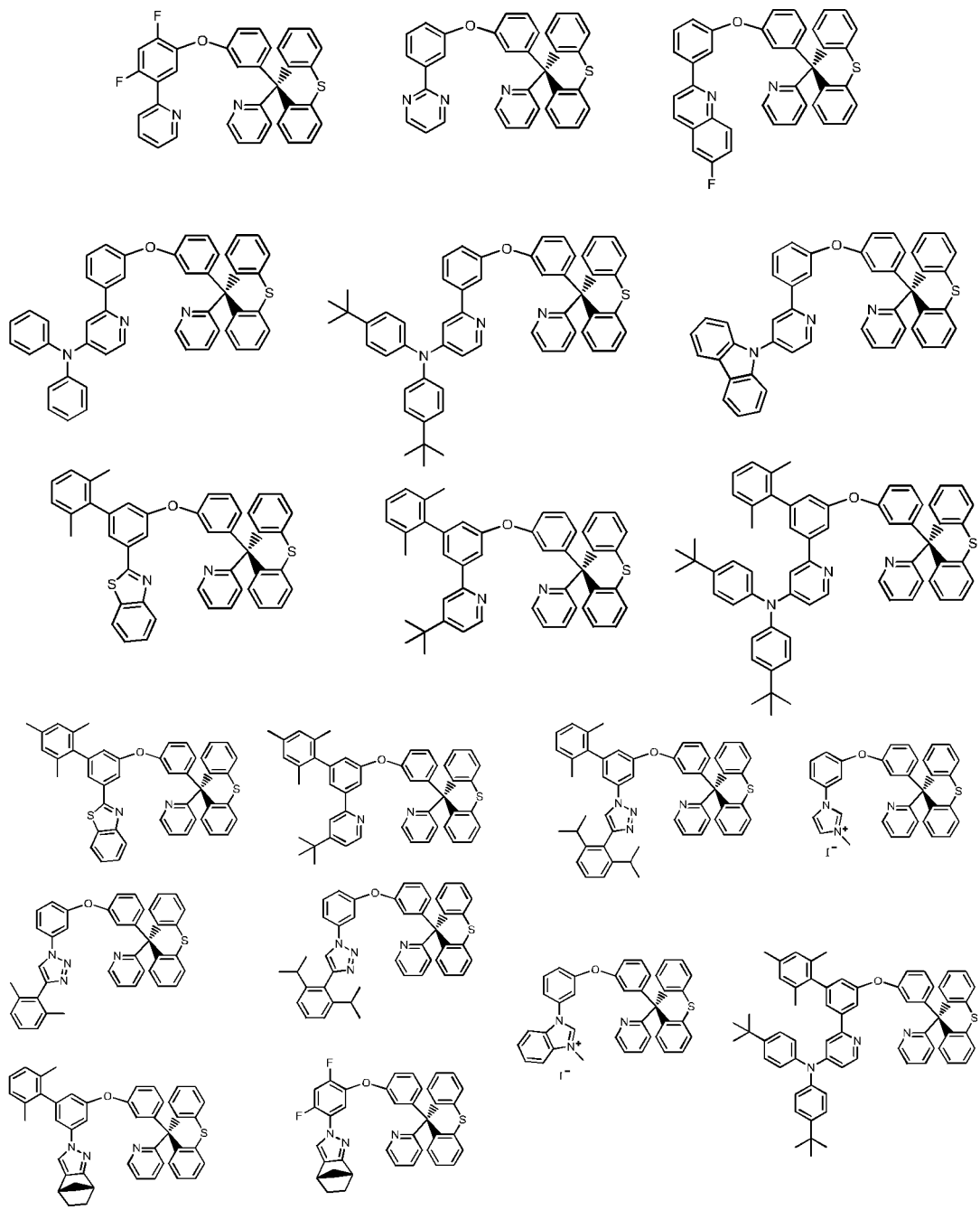
Figure 12:
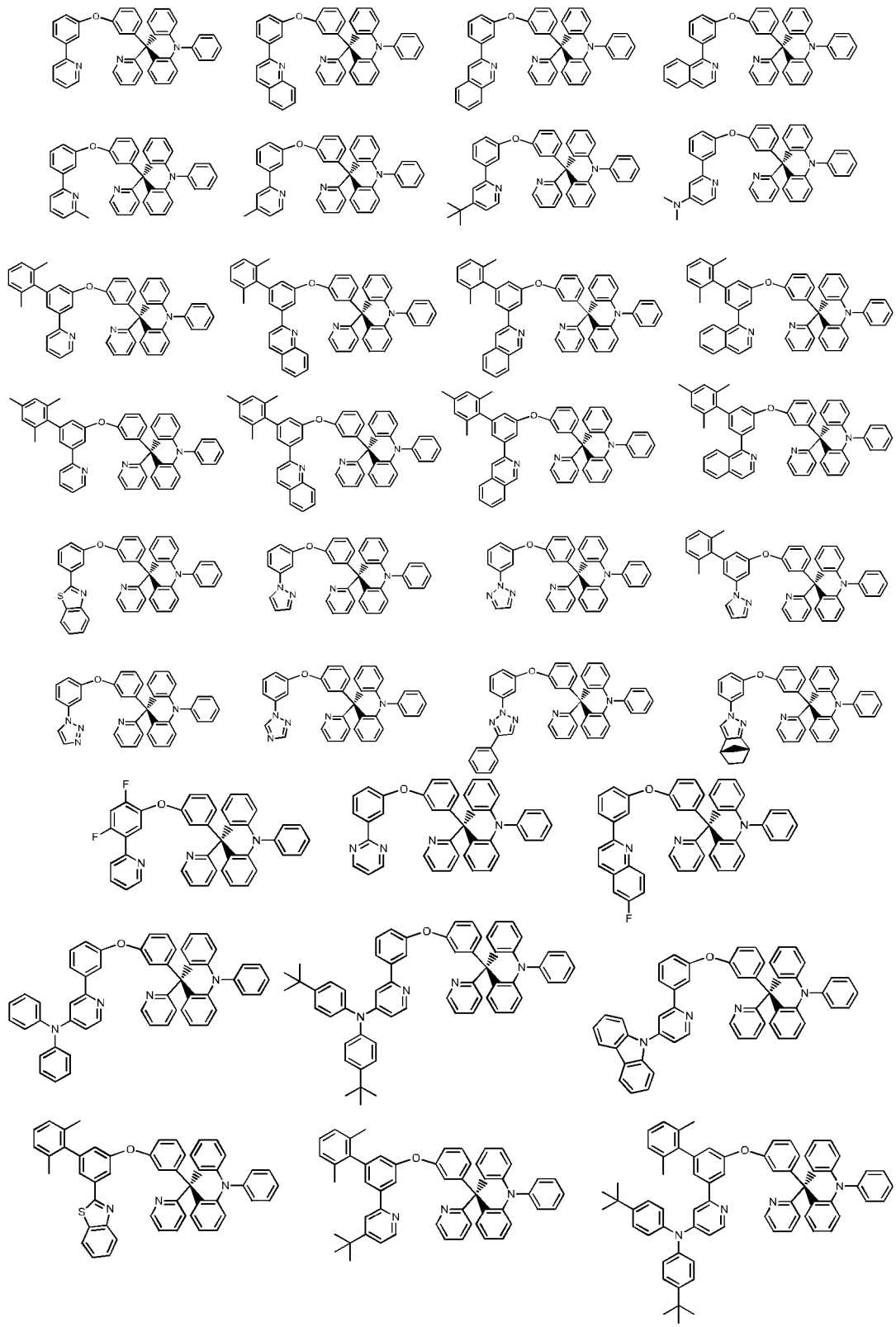
Figure 12:
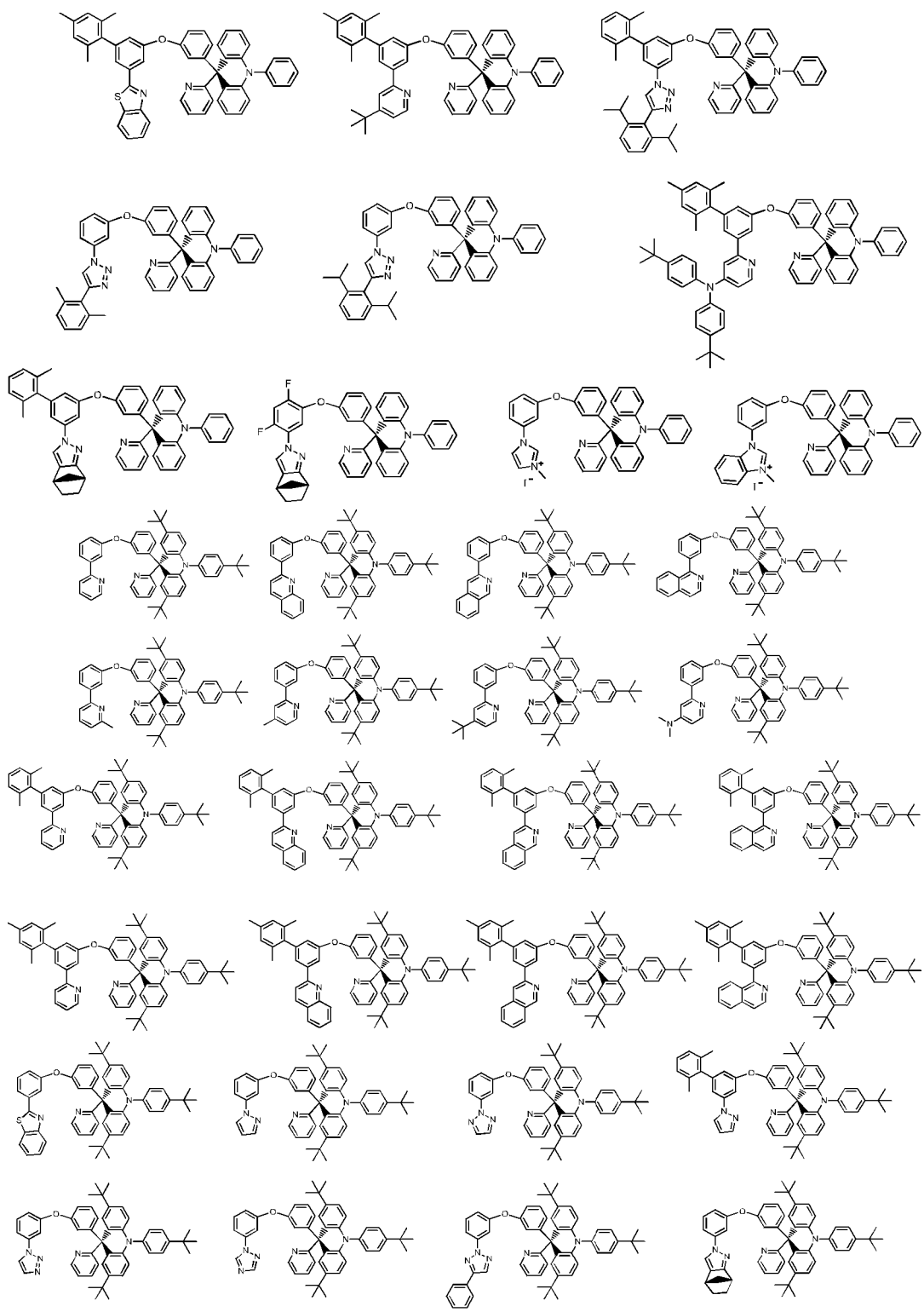
Figure 12:
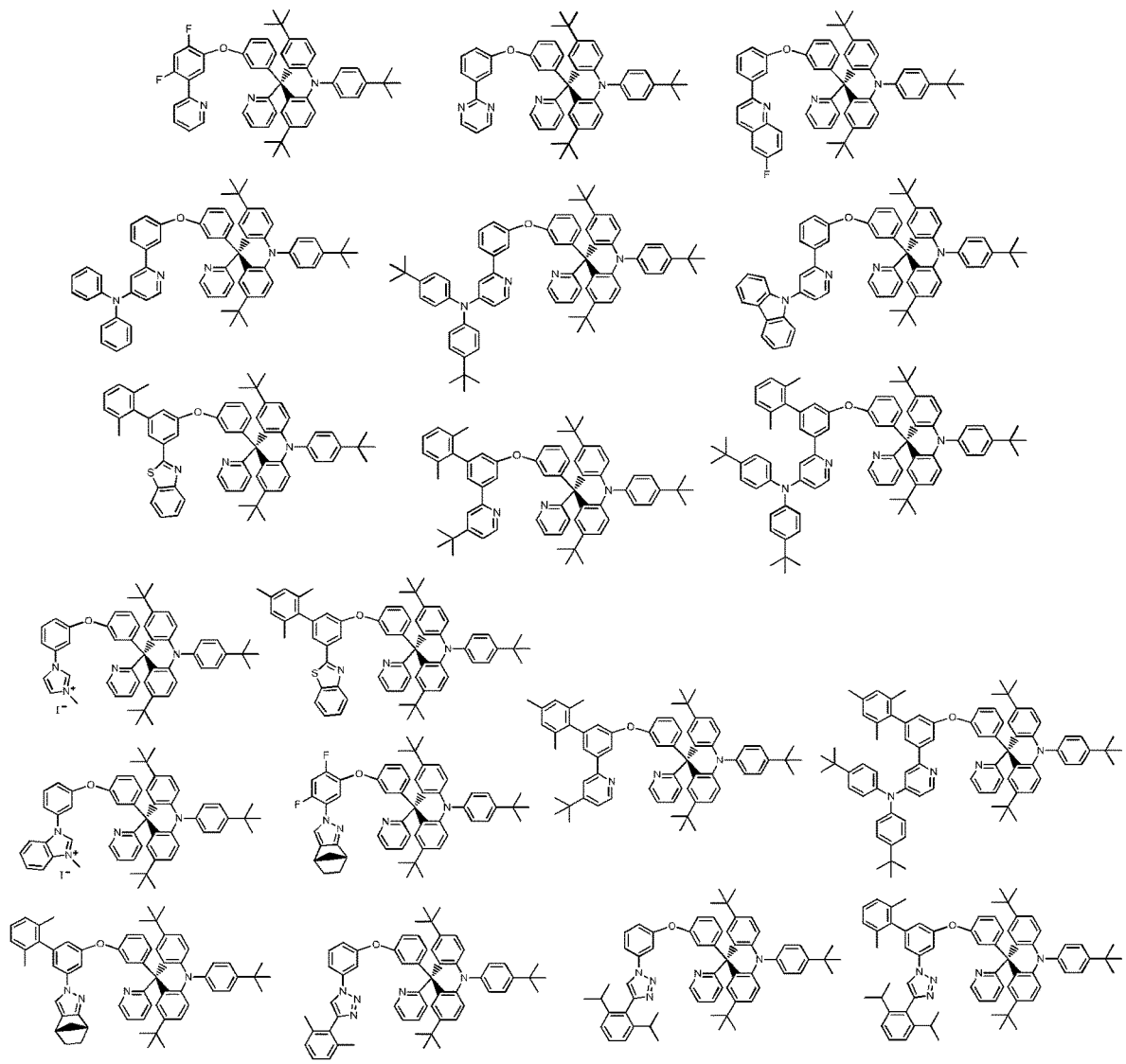
Figure 12:
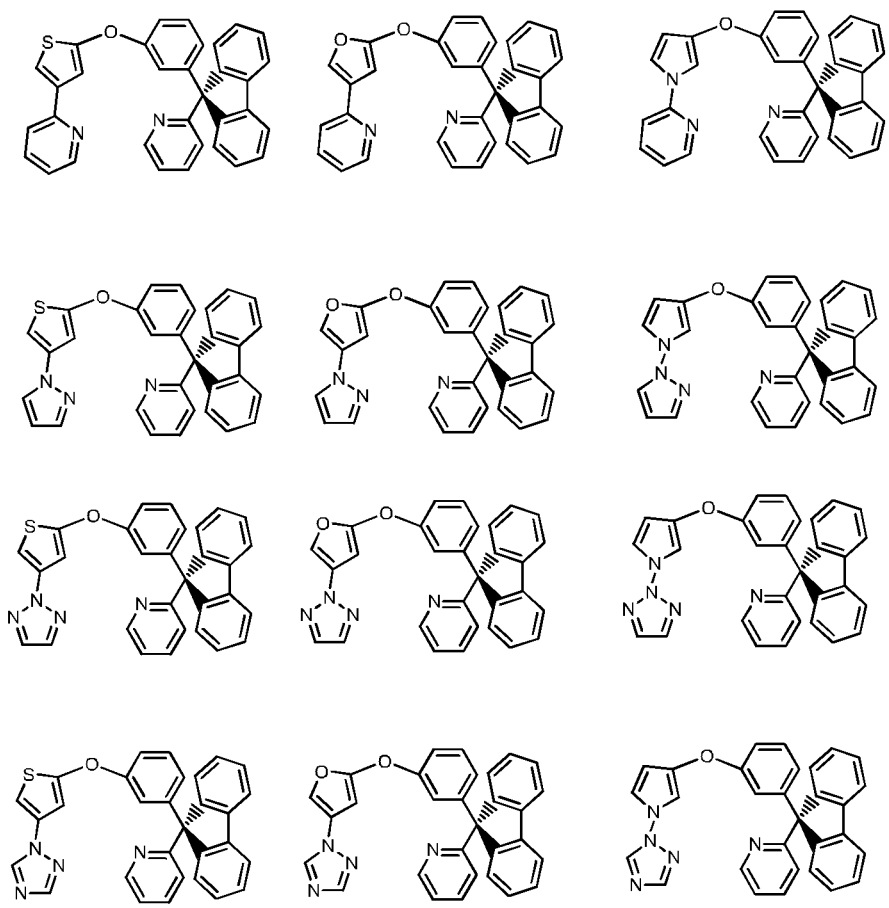
Figure 12:
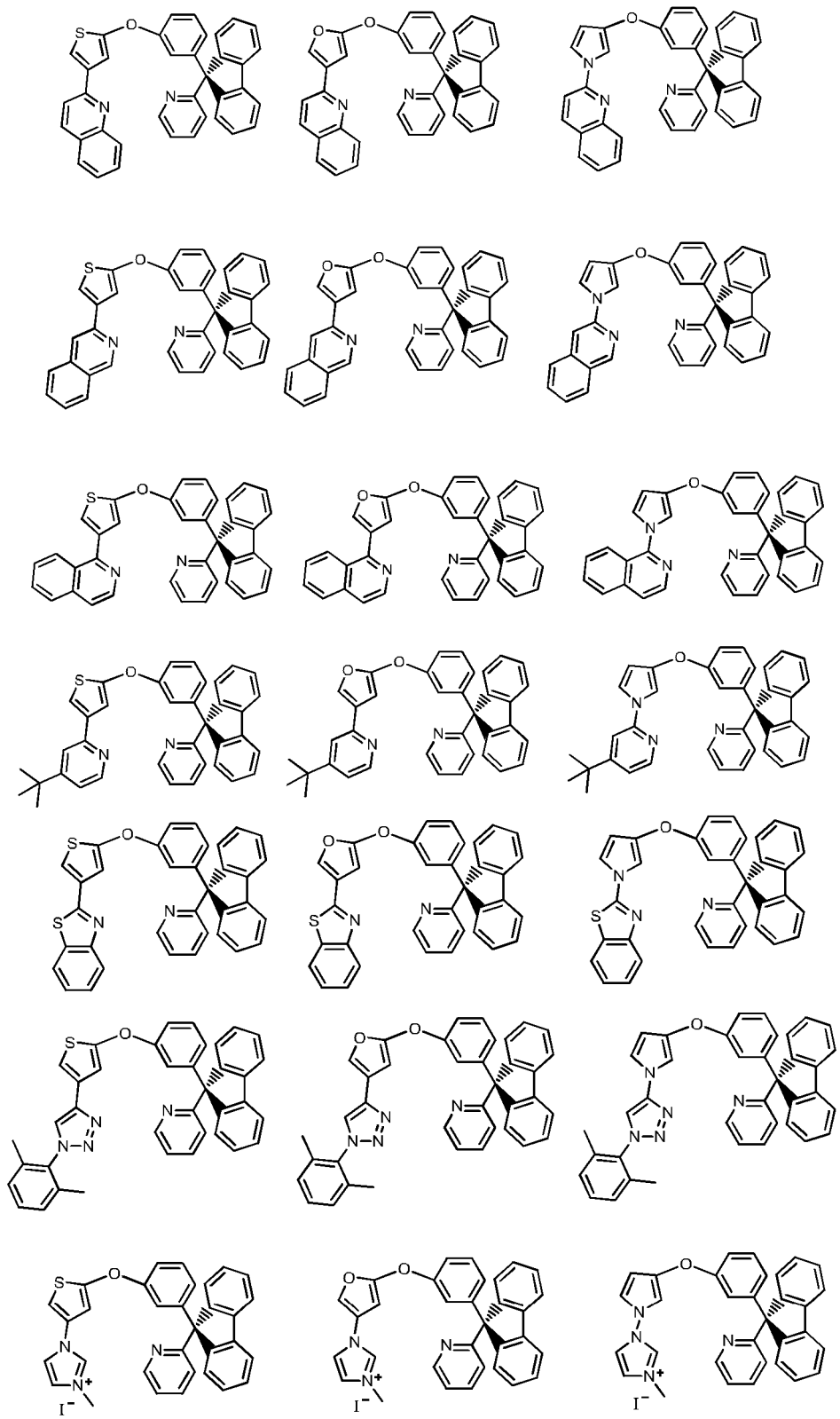
Figure 12:
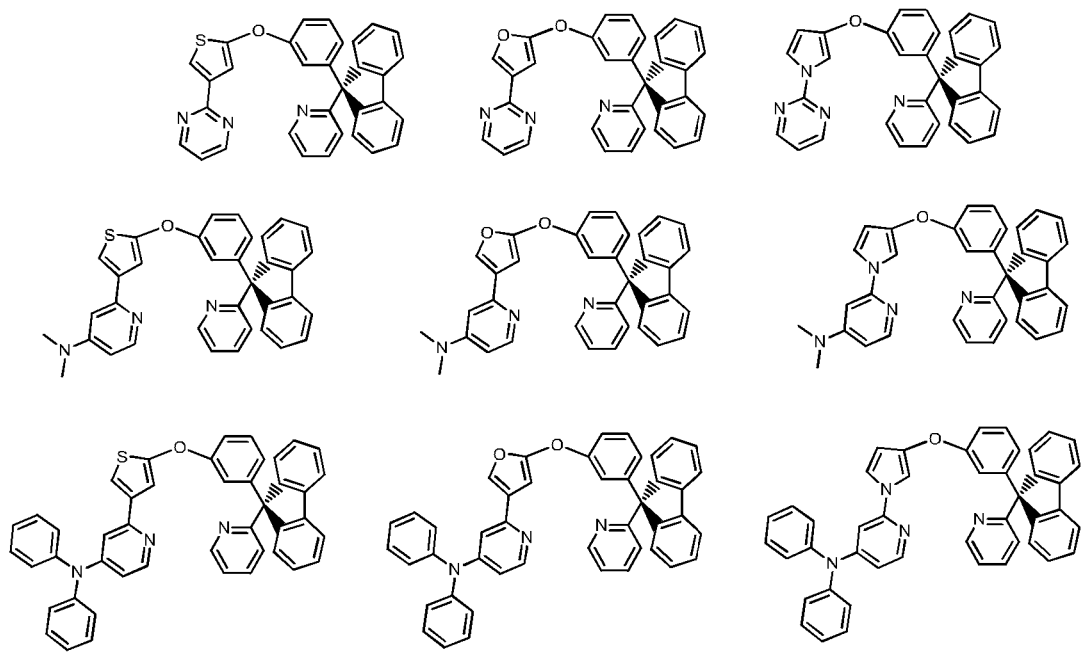

FIG. 11 shows non-limiting asymmetric tetradentate metal complexes, according to embodiments of the invention. These Pt(II) complexes can all have different emission spectra, covering a wide pallet of colors. The colors are defined by the structure of the non-limiting asymmetric tetradentate ligands.

Definitions

"Alkyl" refers to a radical of a straight-chain or branched saturated hydrocarbon group having from 1 to 6 carbon atoms, and it is also referred to herein as "lower alkyl". In some embodiments, $C_1$-$C_4$ alkyl is particularly preferred. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Unless otherwise specified, each instance of an alkyl group is independently optionally substituted, i.e., unsubstituted (an "unsubstituted alkyl") or substituted (a "substituted alkyl") with one or more substituents; e.g., for instance from 1 to 5 substituents, 1 to 3 substituents, or 1 substituent. In certain embodiments, the alkyl group is unsubstituted $C_{1-6}$ alkyl (e.g., —CH$_3$). In certain embodiments, the alkyl group is substituted $C_{1-6}$ alkyl.

"Alkenyl" refers to a radical of a straight-chain or branched hydrocarbon group having from 2 to 6 carbon atoms, one or more carbon-carbon double bonds (e.g., 1, 2, or 3 carbon-carbon double bonds). The one or more carbon-carbon double bonds can be internal (such as in 2-butenyl) or terminal (such as in 1-butenyl). In some embodiments, $C_{2-4}$ alkenyl is particularly preferred. Examples of alkenyl groups include, but are not limited to, ethenyl ($C_2$), 1-propenyl ($C_3$), 2-propenyl ($C_3$), 1-propen-2-yl ($C_3$), 1-butenyl ($C_4$), 2-butenyl ($C_4$), butadienyl ($C_4$), pentenyl ($C_5$), pentadienyl ($C_5$), hexenyl ($C_6$), and the like. Unless otherwise specified, each instance of an alkenyl group is independently optionally substituted, i.e., unsubstituted (an "unsubstituted alkenyl") or substituted (a "substituted alkenyl") with one or more substituents e.g., for instance from 1 to 5 substituents, 1 to 3 substituents, or 1 substituent. In certain embodiments, the alkenyl group is unsubstituted $C_{2-6}$ alkenyl. In certain embodiments, the alkenyl group is substituted $C_{2-6}$ alkenyl.

"Alkynyl" refers to a radical of a straight-chain or branched hydrocarbon group having from 2 to 6 carbon atoms, one or more carbon-carbon triple bonds (e.g., 1, 2, or 3 carbon-carbon triple bonds), and optionally one or more carbon-carbon double bonds (e.g., 1, 2, or 3 carbon-carbon double bonds). In some embodiments, $C_{2-4}$ alkynyl is particularly preferred. In certain embodiments, alkynyl does not contain any double bonds. The one or more carbon-carbon triple bonds can be internal (such as in 2-butynyl) or terminal (such as in 1-butynyl). Examples of the alkynyl groups include, without limitation, ethynyl ($C_2$), 1-propynyl ($C_3$), 2-propynyl ($C_3$), 1-butynyl ($C_4$), 2-butynyl ($C_4$), pentynyl ($C_5$), 3-methylbut-1-ynyl ($C_5$), hexynyl ($C_6$), and the like. Unless otherwise specified, each instance of an alkynyl group is independently optionally substituted, i.e., unsubstituted (an "unsubstituted alkynyl") or substituted (a "substituted alkynyl") with one or more substituents; e.g., for instance from 1 to 5 substituents, 1 to 3 substituents, or 1 substituent. In certain embodiments, the alkynyl group is unsubstituted $C_{2-6}$ alkynyl. In certain embodiments, the alkynyl group is substituted $C_{2-6}$ alkynyl.

"Alkoxy" refers to the group —OR wherein R is a substituted or unsubstituted $C_1$-$C_6$ alkyl group. In some embodiments, $C_1$-$C_4$ alkoxy group is particularly preferred. Specific alkoxy groups include, but are not limited to, methoxy, ethoxy, n-propoxy, isopropoxy, n-butoxy, tert-butoxy, sec-butoxy, n-pentyloxy, n-hexyloxy and 1,2-dimethylbutoxy.

"Acyl" refers to the group —(=O)R, wherein R is optionally substituted $C_1$-$C_6$ alkyl. In some embodiments, $C_1$-$C_4$ alkanoyl group is particularly preferred. Exemplary $C_1$-$C_6$ alkanoyl groups include, but are not limited to, —(=O)CH$_3$, —(=O)CH$_2$CH$_3$, —(=O)CH$_2$CH$_2$CH$_3$ and —(=O)CH(CH$_3$)$_2$.

"Halo" or "halogen" means fluorine (F), chlorine (Cl), bromine (Br) and iodine (I). In some embodiments, the halo group is F, —Cl or Br. In some embodiments, the halogen group is F or Cl. In some embodiments, the halogen group is F.

Thus, "haloalkyl" refers to the above "$C_1$-$C_6$ alkyl", which is substituted by one or more halo groups. In some embodiments, $C_1$-$C_4$ haloalkyl group is particularly preferred, and more preferably $C_1$-$C_2$ haloalkyl group. Exemplary haloalkyl groups include, but are not limited to, —CF$_3$, —CH$_2$F, —CHF$_2$, —CHFCH$_2$F, —CH$_2$CHF$_2$, —CF$_2$CF$_3$, —CCl$_3$, —CH$_2$Cl, —CHCl$_2$, 2,2,2-trifluoro-1,1-dimethylethyl, and the like.

"Cycloalkyl" refers to a radical of a non-aromatic cyclic hydrocarbon group having from 3 to 8 ring carbon atoms and zero heteroatoms. In some embodiments, $C_5$-$C_8$ cycloalkyl is preferred, which is a radical of a non-aromatic cyclic hydrocarbon group having from 5 to 8 ring carbon atoms and zero heteroatoms. In some embodiments, $C_3$-$C_6$ cycloalkyl is preferred, which is a radical of a non-aromatic cyclic hydrocarbon group having from 3 to 6 ring carbon atoms and zero heteroatoms. In some embodiments, $C_5$ cycloalkyl is preferred, which is a radical of a non-aromatic cyclic hydrocarbon group having 5 ring carbon atoms and zero heteroatoms. Cycloalkyl also includes ring systems wherein the cycloalkyl ring, as defined above, is fused with one or more aryl or heteroaryl groups wherein the point of attachment is on the cycloalkyl ring, and in such instances, the number of carbons continue to designate the number of carbons in the carbocyclic ring system. Exemplary cycloalkyl groups include, but is not limited to, cyclopropyl ($C_3$), cyclopropenyl ($C_3$), cyclobutyl ($C_4$), cyclobutenyl ($C_4$), cyclopentyl ($C_5$), cyclopentenyl ($C_5$), cyclopentadienyl ($C_5$), cyclohexyl ($C_6$), cyclohexenyl ($C_6$), cyclohexadienyl ($C_6$), as well as cycloheptyl ($C_7$), cycloheptenyl ($C_7$), cycloheptadienyl ($C_7$), cycloheptatrienyl ($C_7$), cyclooctyl ($C_8$), cyclooctenyl ($C_8$), bicyclo[2.2.1]heptanyl ($C_7$), bicyclo[2.2.2]octanyl ($C_8$), and the like. Unless otherwise specified, each instance of a cycloalkyl group is independently optionally substituted, i.e., unsubstituted (an "unsubstituted cycloalkyl") or substituted (a "substituted cycloalkyl") with one or more substituents. In certain embodiments, the cycloalkyl group is unsubstituted $C_{3-8}$ cycloalkyl. In certain embodiments, the cycloalkyl group is a substituted $C_{3-8}$ cycloalkyl.

"Heterocyclyl" refers to a radical of a 3- to 8-membered non-aromatic ring system having ring carbon atoms and 1 to 3 ring heteroatoms, wherein each heteroatom is independently selected from nitrogen, oxygen, sulfur, boron, phosphorus, and silicon, wherein the carbon, nitrogen, sulfur and phosphorus atoms may be present in the oxidation state, such as C(O), S(O), S(O)$_2$, P(O), and the like. In heterocyclyl groups that contain one or more nitrogen atoms, the point of attachment can be a carbon or nitrogen atom, as valency permits. In some embodiments, 4- to 7-membered heterocyclyl is preferred, which is a radical of a 4- to 7-membered non-aromatic ring system having ring carbon atoms and 1 to 3 ring heteroatoms. In some embodiments, 5- to 8-membered heterocyclyl is preferred, which is a radical of a 5- to 8-membered non-aromatic ring system having ring carbon atoms and 1 to 3 ring heteroatoms. In some embodiments, 4- to 6-membered heterocyclyl is preferred, which is a radical of a 4- to 6-membered non-aromatic ring system having ring carbon atoms and 1 to 3 ring heteroatoms. In some embodiments, 5- to 6-membered heterocyclyl is preferred, which is a radical of a 5- to 6-membered non-aromatic ring system having ring carbon atoms and 1 to 3 ring heteroatoms. In some embodiments, 5-membered heterocyclyl is more preferred, which is a radical of a 5-membered non-aromatic ring system having ring carbon atoms and 1 to 3 ring heteroatoms. In some embodiments, the 3- to 8-membered heterocyclyl, 4- to 7-membered heterocyclyl, 5- to 8-membered heterocyclyl, 4- to 6-membered heterocyclyl, 5- to 6-membered heterocyclyl and 5-membered heterocyclyl contain 1 to 3 (more preferably 1 or 2) ring heteroatoms selected from nitrogen, oxygen and sulfur (preferably nitrogen and oxygen). Unless otherwise specified, each instance of heterocyclyl is independently optionally substituted, i.e., unsubstituted (an "unsubstituted heterocyclyl") or substituted (a "substituted heterocyclyl") with one or more substituents. In certain embodiments, the heterocyclyl group is unsubstituted 3-8 membered heterocyclyl. In certain embodiments, the heterocyclyl group is substituted 3-8 membered heterocyclyl. Heterocyclyl also includes ring systems wherein the heterocyclyl ring, as defined above, is fused with one or more carbocyclyl groups wherein the point of attachment is on the carbocyclyl ring, or ring systems wherein the heterocyclyl ring, as defined above, is fused with one or more aryl or heteroaryl groups, wherein the point of attachment is on the heterocyclyl ring; and in such instances, the number of ring members continue to designate the number of ring members in the heterocyclyl ring system. Exemplary 3-membered heterocyclyl groups containing one heteroatom include, without limitation, azirdinyl, oxiranyl, thiorenyl. Exemplary 4-membered heterocyclyl groups containing one heteroatom include, without limitation, azetidinyl, oxetanyl and thietanyl. Exemplary 5-membered heterocyclyl groups containing one heteroatom include, without limitation, tetrahydrofuranyl, dihydrofuranyl, tetrahydrothiophenyl, dihydrothiophenyl, pyrrolidinyl, dihydropyrrolyl and pyrrolyl-2,5-dione. Exemplary 5-membered heterocyclyl groups containing two heteroatoms include, without limitation, dioxolanyl, oxathiolanyl, oxathiolyl (1,2-oxathiolyl, 1,3-oxathiolyl), dithiolanyl, dihydropyrazolyl, dihydroimidazolyl, dihydrothiazolyl, dihydroisothiazolyl, dihydrooxazolyl, dihydroisoxazolyl, dihydrooxadiazolyl and oxazolidin-2-one. Exemplary 5-membered heterocyclyl groups containing three heteroatoms include, without limitation, triazolinyl, oxadiazolinyl, and thiadiazolinyl. Exemplary 6-membered heterocyclyl groups containing one heteroatom include, without limitation, piperidinyl, tetrahydropyranyl, dihydropyridinyl, tetrahydropyridinyl, and thianyl. Exemplary 6-membered heterocyclyl groups containing two heteroatoms include, without limitation, dihydropyrazinyl, piperazinyl, morpholinyl, dithianyl, dioxanyl. Exemplary 6-membered heterocyclyl groups containing two heteroatoms include, without limitation, triazinanyl. Exemplary 7-membered heterocyclyl groups containing one or two heteroatoms include, without limitation, azepanyl, diazepanyl, oxepanyl and thiepanyl. Exemplary 8-membered heterocyclyl groups containing one or two heteroatoms include, without limitation, azocanyl, oxecanyl, thiocanyl, octahydrocyclopenta[c]pyrrolyl and octahydropyrrolo[3,4-c]pyrrolyl. Exemplary 5-membered heterocyclyl groups fused to a $C_6$ aryl ring (also referred to herein as a 5,6-bicyclic heterocyclic ring) include, without limitation, indolinyl, isoindolinyl, dihydrobenzofuranyl, dihydrobenzothienyl, benzoxazolinonyl, and the like. Exemplary 6-membered heterocyclyl groups fused to an $C_6$ aryl ring (also referred to herein as a 6,6-bicyclic heterocyclic ring) include, without limitation, tetrahydroquinolinyl, tetrahydroisoquinolinyl, and the like.

"Aryl" refers to a radical of a monocyclic or polycyclic (e.g., bicyclic or tricyclic) 4n+2 aromatic ring system (e.g., having 6, 10, or 14 n electrons shared in a cyclic array) having 6-14 ring carbon atoms and zero heteroatoms provided in the aromatic ring system. In some embodiments, an aryl group has six ring carbon atoms ("$C_6$ aryl"; e.g., phenyl). In some embodiments, an aryl group has ten ring carbon atoms ("$C_{10}$ aryl"; e.g., naphthyl such as 1-naphthyl and 2-naphthyl). In some embodiments, an aryl group has fourteen ring carbon atoms ("$C_{14}$ aryl"; e.g., anthracyl). "$C_6$-$C_{14}$ aryl" also includes ring systems wherein the aryl ring, as defined above, is fused with one or more carbocyclyl or heterocyclyl groups wherein the radical or point of attachment is on the aryl ring, and in such instances, the number of carbon atoms continue to designate the number of carbon atoms in the aryl ring system. Typical aryl groups include, but are not limited to, groups derived from aceanthrylene, acenaphthylene, acephenanthrylene, anthracene, azulene, benzene, chrysene, coronene, fluoranthene, fluorene, hexacene, hexaphene, hexalene, as-indacene, s-indacene, indane, indene, naphthalene, octacene, octaphene, octalene, ovalene, penta-2,4-diene, pentacene, pentalene, pentaphene, perylene, phenalene, phenanthrene, picene, pleiadene, pyrene, pyranthrene, rubicene, triphenylene, and trinaphthalene. Particularly aryl groups include phenyl, naphthyl, indenyl, and tetrahydronaphthyl. Unless otherwise specified, each instance of an aryl group is independently optionally substituted, i.e., unsubstituted (an "unsubstituted aryl") or substituted (a "substituted aryl") with one or more substituents. In certain embodiments, the aryl group is unsubstituted $C_{6-14}$ aryl. In certain embodiments, the aryl group is substituted $C_{6-14}$ aryl.

"Heteroaryl" refers to a radical of a 5-10 membered monocyclic or bicyclic 4n+2 aromatic ring system (e.g., having 6 or 10 π electrons shared in a cyclic array) having ring carbon atoms and 1-4 ring heteroatoms provided in the aromatic ring system, wherein each heteroatom is independently selected from nitrogen, oxygen and sulfur. In some embodiments, 5-membered heteroaryl is preferred, which is a radical of a 5-membered monocyclic 4n+2 aromatic ring system (e.g., having 6 n electrons shared in a cyclic array) having ring carbon atoms and 1-4 ring heteroatoms, wherein each heteroatom is independently selected from nitrogen, oxygen and sulfur. In heteroaryl groups that contain one or more nitrogen atoms, the point of attachment can be a carbon or nitrogen atom, as valency permits. Heteroaryl bicyclic ring systems can include one or more heteroatoms in one or both rings. Heteroaryl includes ring systems wherein the heteroaryl ring, as defined above, is fused with one or more carbocyclyl or heterocyclyl groups wherein the point of attachment is on the heteroaryl ring, and in such instances, the number of ring members continue to designate the number of ring members in the heteroaryl ring system. Unless otherwise specified, each instance of a heteroaryl group is independently optionally substituted, i.e., unsubstituted (an "unsubstituted heteroaryl") or substituted (a "substituted heteroaryl") with one or more substituents. In certain embodiments, the heteroaryl group is unsubstituted 5- to 10-membered heteroaryl. In certain embodiments, the heteroaryl group is substituted 5- to 10-membered heteroaryl.

Exemplary 5-membered heteroaryl groups containing one heteroatom include, without limitation, pyrrolyl, furanyl and thiophenyl. Exemplary 5-membered heteroaryl groups containing two heteroatoms include, without limitation, imidazolyl, pyrazolyl, oxazolyl, isoxazolyl, thiazolyl, and isothiazolyl. Exemplary 5-membered heteroaryl groups containing three heteroatoms include, without limitation, triazolyl, oxadiazolyl, and thiadiazolyl. Exemplary 5-membered heteroaryl groups containing four heteroatoms include, without limitation, tetrazolyl. Exemplary 6-membered heteroaryl groups containing one heteroatom include, without limitation, pyridinyl. Exemplary 6-membered heteroaryl groups containing two heteroatoms include, without limitation, pyridazinyl, pyrimidinyl, and pyrazinyl. Exemplary 6-membered heteroaryl groups containing three or four heteroatoms include, without limitation, triazinyl and tetrazinyl, respectively. Exemplary 7-membered heteroaryl groups containing one heteroatom include, without limitation, azepinyl, oxepinyl, and thiepinyl. Exemplary 5,6-bicyclic heteroaryl groups include, without limitation, indolyl, isoindolyl, indazolyl, benzotriazolyl, benzothiophenyl, isobenzothiophenyl, benzofuranyl, benzoisofuranyl, benzimidazolyl, benzoxazolyl, benzisoxazolyl, benzoxadiazolyl, benzthiazolyl, benzisothiazolyl, benzthiadiazolyl, indolizinyl, and purinyl. Exemplary 6,6-bicyclic heteroaryl groups include, without limitation, naphthyridinyl, pteridinyl, quinolinyl, isoquinolinyl, cinnolinyl, quinoxalinyl, phthalazinyl, and quinazolinyl.

Methods and Materials

Synthesis of Ligands and Complexes

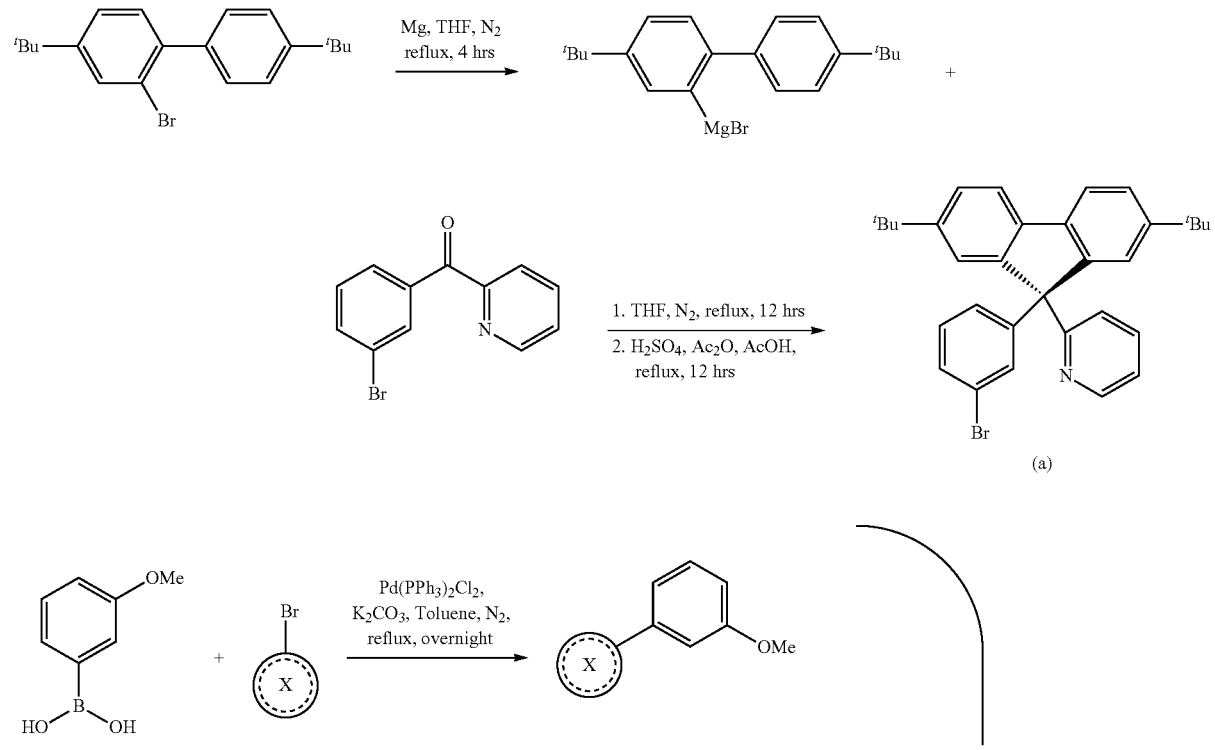

-continued
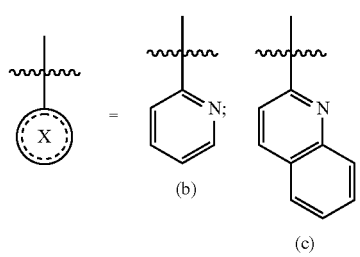
(b) (c)
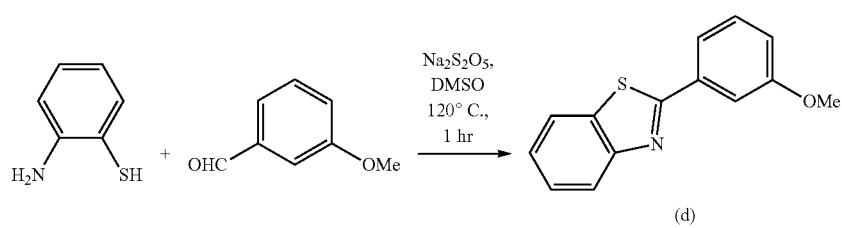
(d)
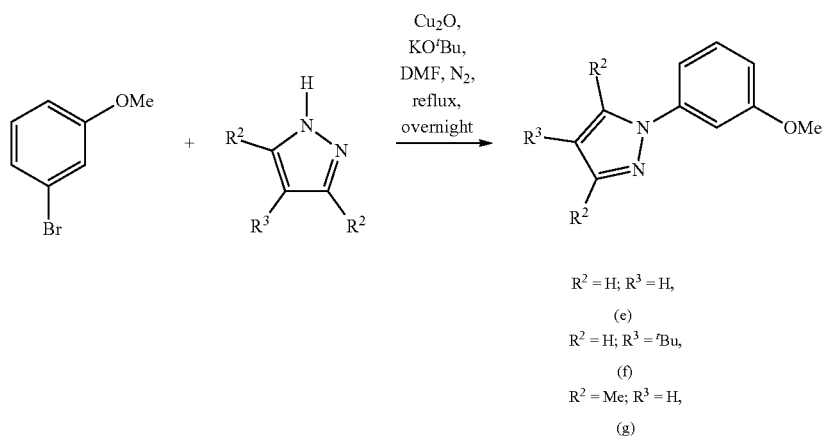
$R^2 = H; R^3 = H,$
(e)
$R^2 = H; R^3 = {}^tBu,$
(f)
$R^2 = Me; R^3 = H,$
(g)
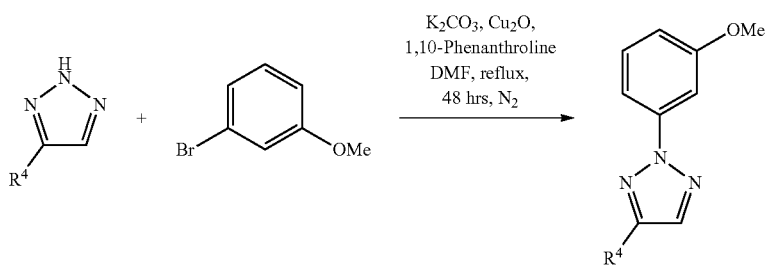
$R^4 = H;$
(h)
(i)
BBr$_3$, DCM, 2 hrs

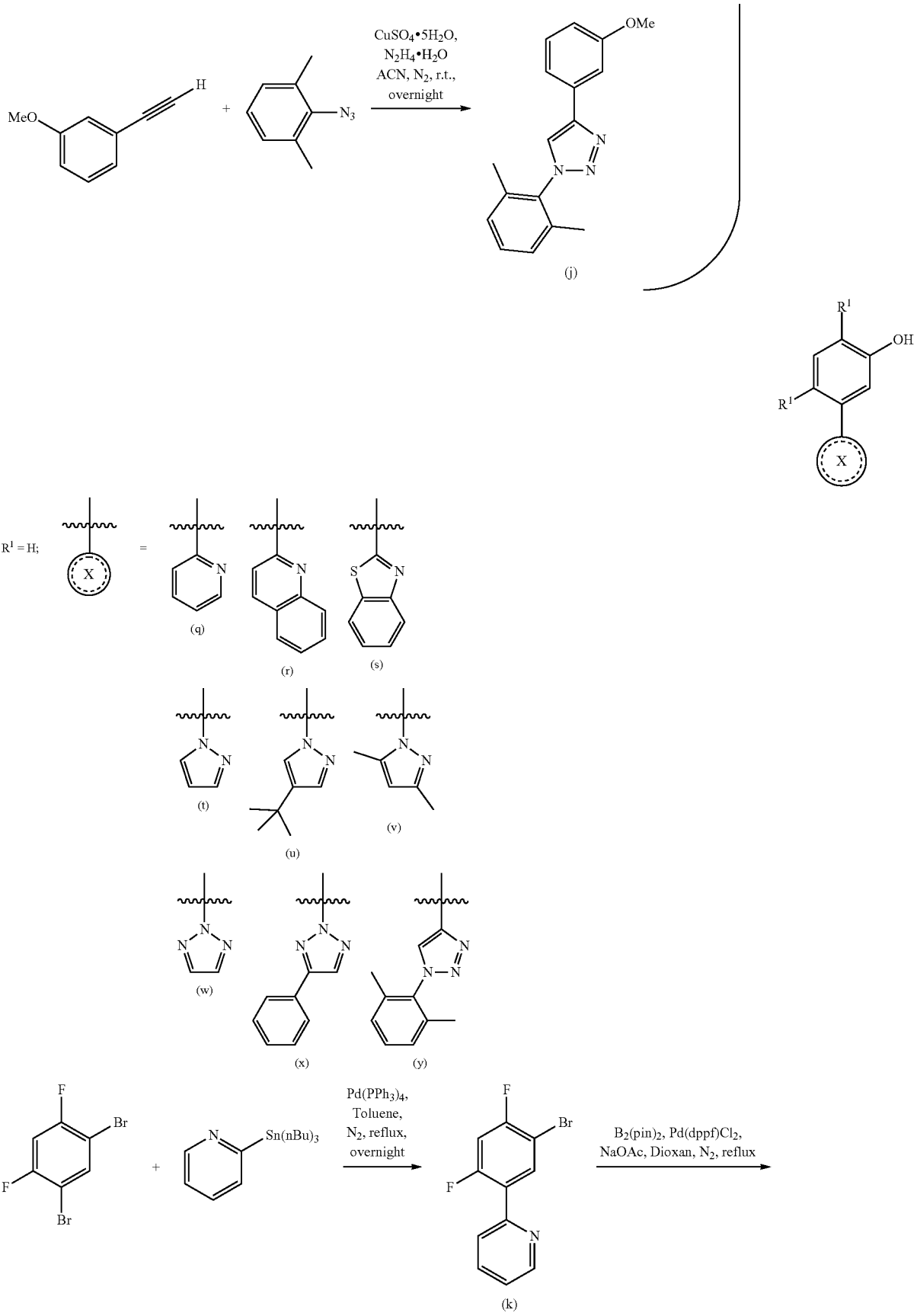

-continued
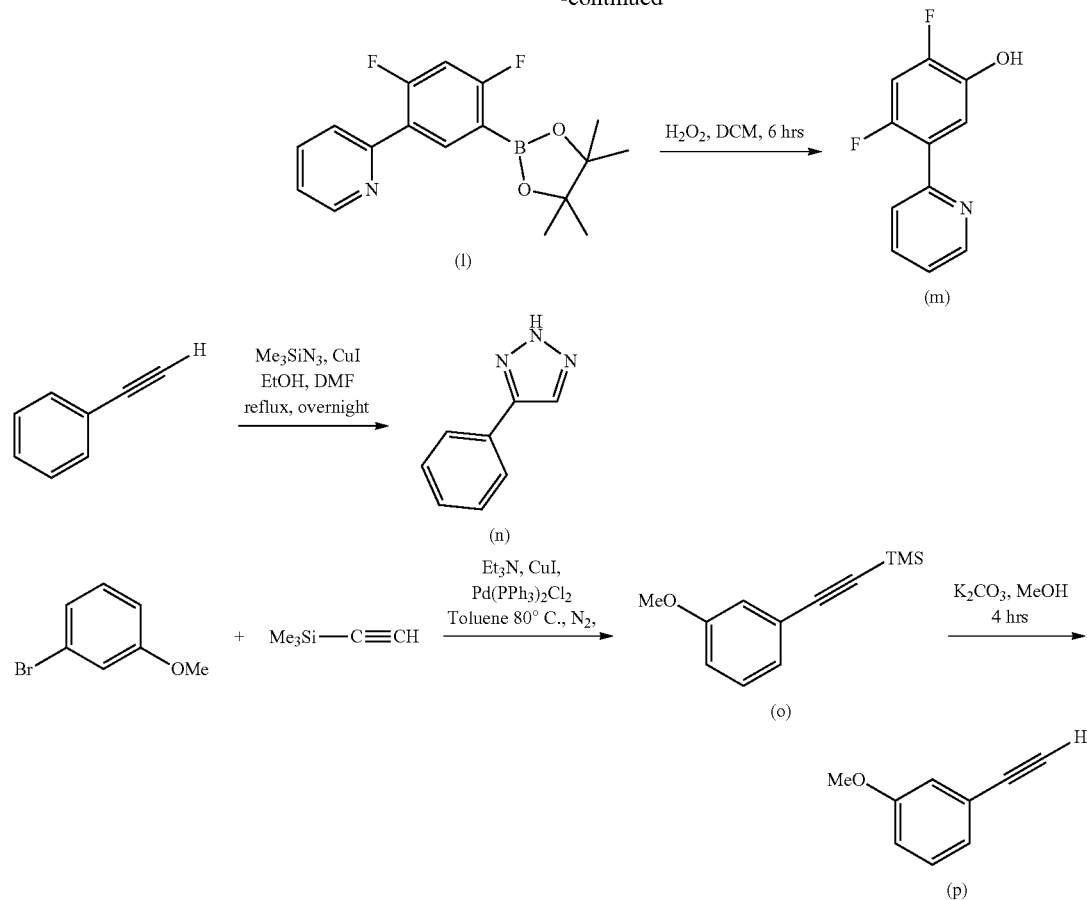
Scheme S2 Synthetic scheme for ligand L1-L10
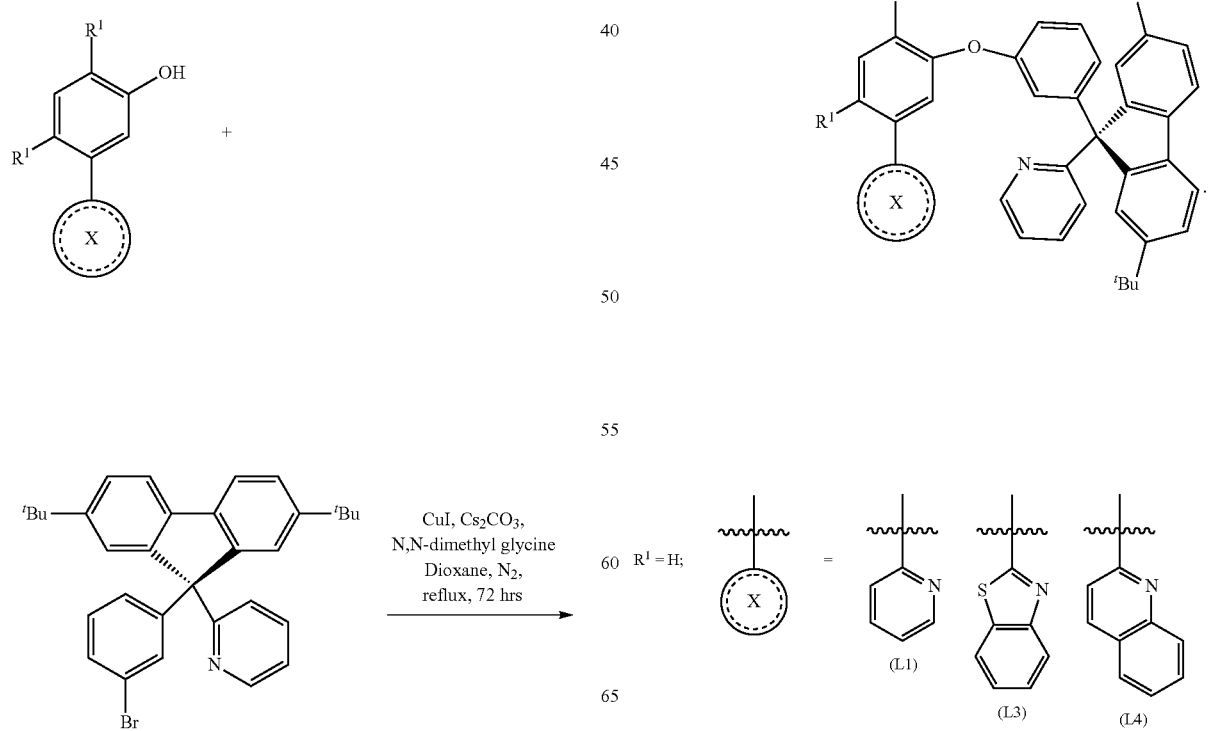

-continued

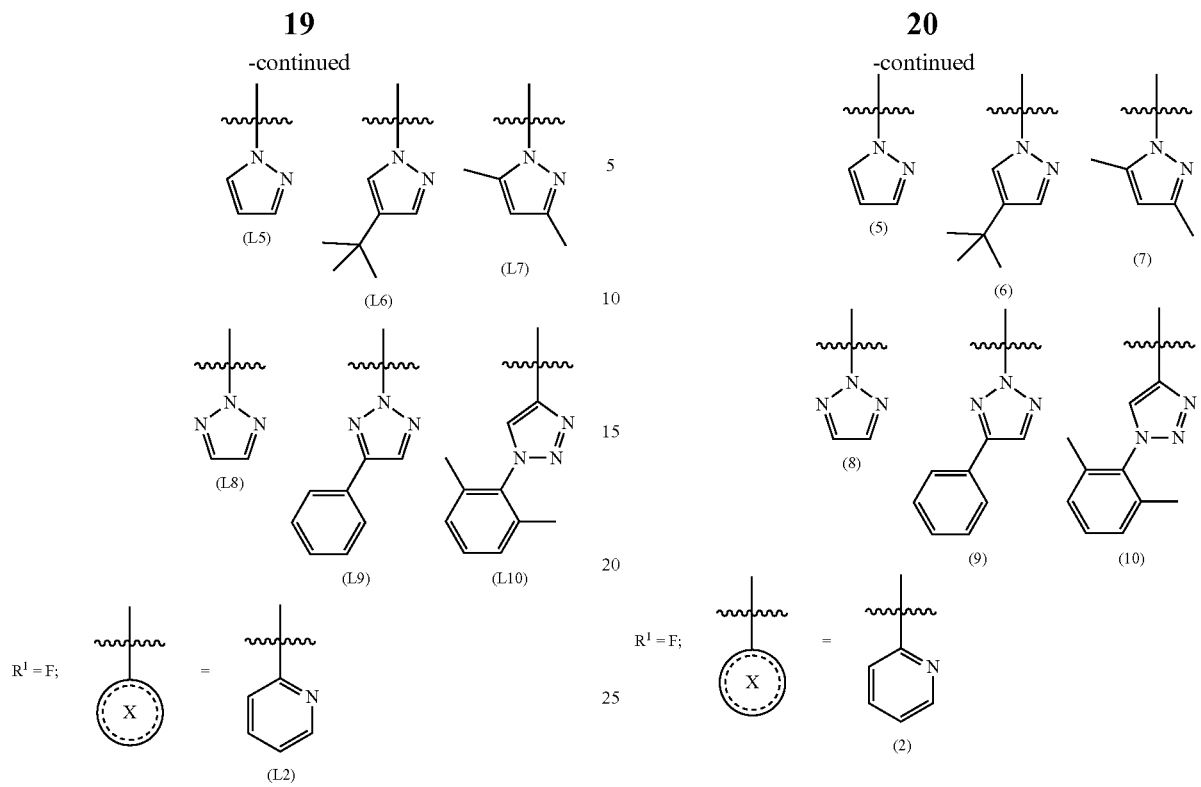

Synthetic Procedures for Complexes 1-10

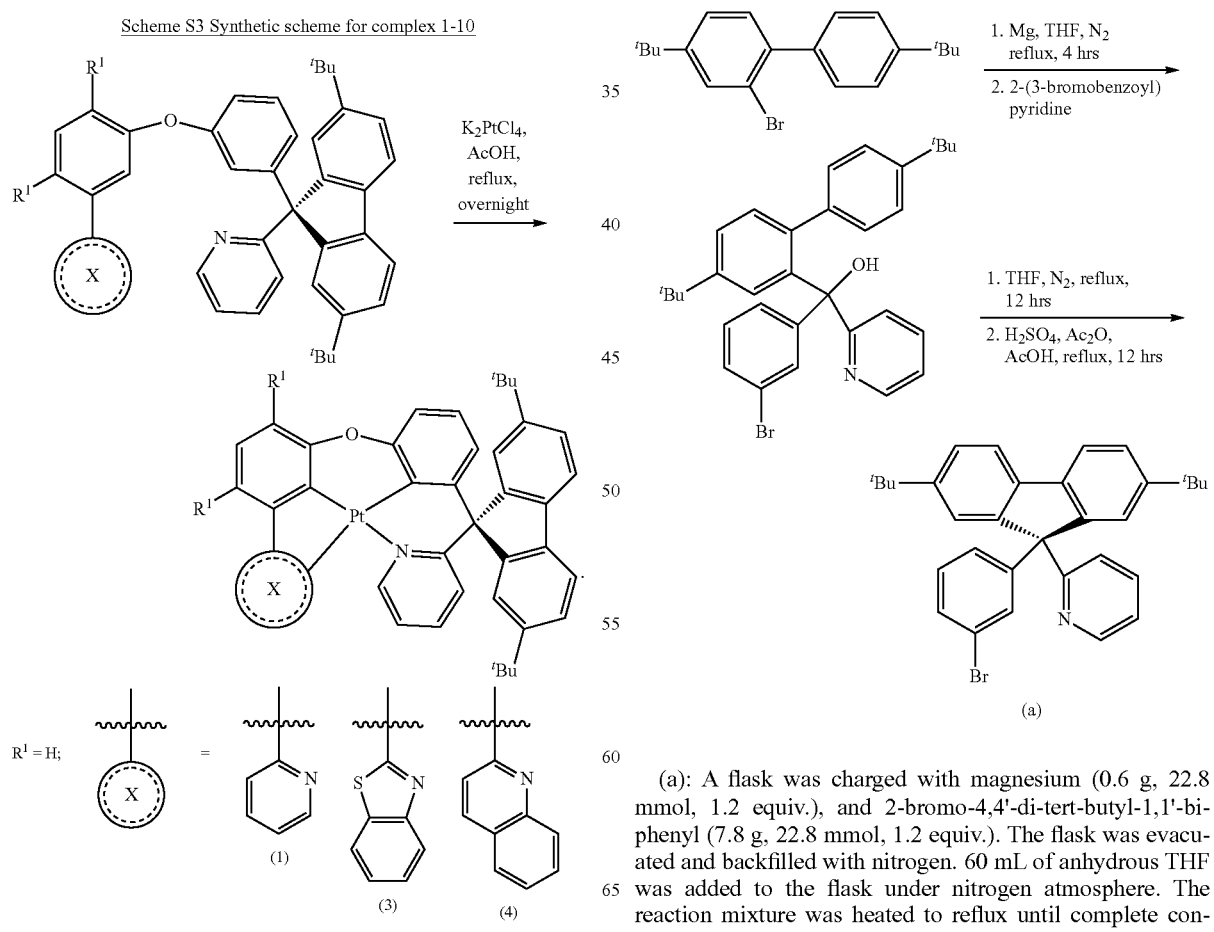

(a): A flask was charged with magnesium (0.6 g, 22.8 mmol, 1.2 equiv.), and 2-bromo-4,4'-di-tert-butyl-1,1'-biphenyl (7.8 g, 22.8 mmol, 1.2 equiv.). The flask was evacuated and backfilled with nitrogen. 60 mL of anhydrous THF was added to the flask under nitrogen atmosphere. The reaction mixture was heated to reflux until complete consumption of magnesium and then cooled down to ambient temperature. A solution of 2-(3-bromobenzoyl)pyridine (5 g, 19.1 mmol, 1 equiv.) in 30 mL anhydrous THF was slowly added to the above Grignard reagent at room temperature under nitrogen atmosphere. After complete addition, the reaction mixture was heated to reflux overnight. The solvent was removed under reduced pressure and then poured into a solution containing 5 mL concentrated $H_2SO_4$, 5 mL acetic anhydride and 90 mL glacial acetic acid. The reaction mixture was stirred at 150° C. for 6 hours. The mixture was then poured into cool methanol. After filtration and washing with cool methanol twice, the product was obtained as pale yellow solid. Yield: 6.3 g, 83%. $^1$H NMR (400 MHz, $CDCl_3$): δ 8.72 (d, J=5.1 Hz, 2H), 8.04 (q, J=8.8 Hz, J=7.9 Hz, 4H), 7.90 (dt, J=8.0 Hz, J=8.0 Hz, 2H), 7.70 (d, J=8.0 Hz, 2H), 7.50 (dd, J=7.6 Hz, J=4.8 Hz, 2H), 7.36 (t, J=7.9 Hz, 2H), 1.26 (s, $^t$Bu, 18H).

General Procedure A. Formation of N^C—OMe

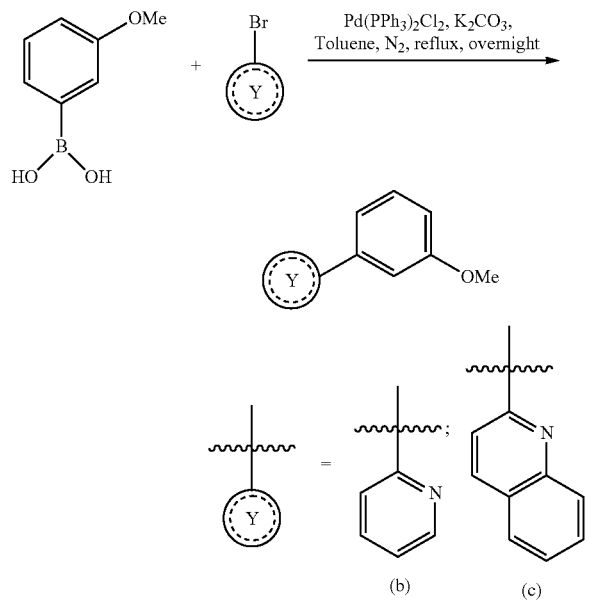

A flask was charged with $Pd(PPh_3)Cl_2$ (5 mol %), $K_2CO_3$ (3 equiv.), 3-methoxyphenylboronic acid (1 equiv.), 2-bromopyridine (1 equiv.) and 100 mL of anhydrous toluene under nitrogen atmosphere. The reaction mixture was heated to reflux for 20 hours. After cooling down to ambient temperature, the mixture was diluted with dichloromethane and washed with 30 mL water three times. The combined organic extracts were dried over $MgSO_4$, concentrated under reduced pressure and the resulting residue was purified by flash chromatography on silica gel to provide the desired product.

(b): Following procedure A. $Pd(PPh_3)Cl_2$ (1.2 g, 1.6 mmol, 5 mol %), $K_2CO_3$ (13.6 g, 98.7 mmol, 3 equiv.), 3-methoxyphenylboronic acid (5 g, 32.9 mmol, 1 equiv.) and 2-bromopyridine (3.1 mL, 32.9 mmol, 1 equiv.). The crude product was purified by flash chromatography on silica gel using n-hexane/ethyl acetate (12:1) as eluent to give the product as yellow oil. Yield: 5.2 g, 85%. $^1$H NMR (400 MHz, $CDCl_3$): δ 8.68 (d, J=4.5 Hz, 1H), 7.76-7.70 (m, 2H), 7.58 (s, 1H), 7.54 (d, J=7.7 Hz, 1H), 7.38 (t, J=8.0 Hz, 1H), 7.26-7.21 (m, 1H), 6.96 (d, J=8.1 Hz, 1H), 3.89 (s, 3H).

(c): Following procedure A. $Pd(PPh_3)Cl_2$ (1.1 g, 1.5 mmol, 5 mol %), $K_2CO_3$ (21.1 g, 90.3 mmol, 3 equiv.), 3-methoxyphenylboronic acid (4.7 g, 30.1 mmol, 1 equiv.) and 2-bromoquinoline (5 g, 30.1 mmol, 1 equiv.). The crude product was purified by flash chromatography on silica gel using n-hexane/ethyl acetate (10:1) as eluent to give the product as yellow oil. Yield: 6.5 g, 91%. $^1$H NMR (400 MHz, $CDCl_3$): δ 8.19 (dd, J=8.7 Hz, J=3.5 Hz, 2H), 7.86 (d, J=8.6 Hz, 1H), 7.83 (d, J=8.1 Hz, 1H), 7.76 (d, J=9.3 Hz, 1H), 7.72 (t, J=6.2 Hz, 2H), 7.53 (t, J=7.8 Hz, 1H), 7.44 (t, J=7.9 Hz, 1H), 7.02 (dd, J=8.2 Hz, J=2.4 Hz, 1H), 3.94 (s, 3H).

General Procedure B. Formation of N^C—OMe

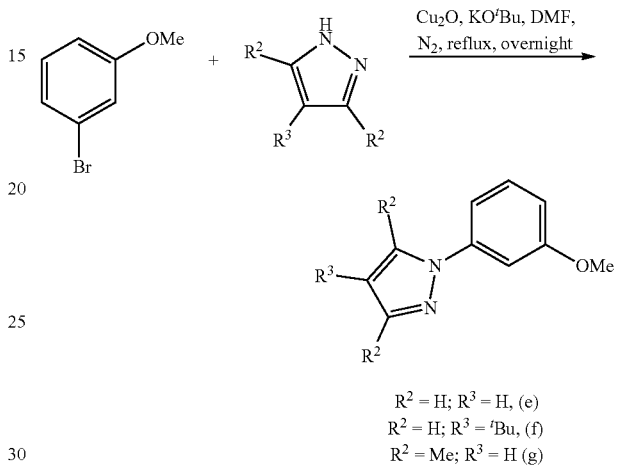

$R^2$ = H; $R^3$ = H, (e)
$R^2$ = H; $R^3$ = $^t$Bu, (f)
$R^2$ = Me; $R^3$ = H (g)

A flask was charged with $Cu_2O$ (10 mol %), KO$^t$Bu (2.5 equiv.), 3-bromoanisole (1 equiv.), 1H-pyrazole (1 equiv.) and 100 mL of anhydrous DMF was added to the flask under nitrogen atmosphere. The reaction mixture was heated to reflux for 20 hours. After cooling down to ambient temperature, the mixture was diluted with dichloromethane and washed with 30 mL water three times. The combined organic extracts were dried over $MgSO_4$, concentrated under reduced pressure and the resulting residue was purified by flash chromatography on silica gel to provide the desired product.

(e): Following general procedure B. $Cu_2O$ (0.84 g, 5.9 mmol, 10 mol %), KO$^t$Bu (16 g, 146.8 mmol, 2.5 equiv.), 3-bromoanisole (7.5 mL, 58.7 mmol, 1 equiv.) and 1H-pyrazole (4 g, 58.7 mmol, 1 equiv.). The crude product was purified by flash chromatography on silica gel using hexan/ethyl acetate (8:2) as eluent to provide the desired product as pale brown oil. Yield: 4.1 g, 40%. $^1$H NMR (400 MHz, $CDCl_3$): δ 7.86 (d, J=2.4 Hz, 1H), 7.69 (s, 1H), 7.30-7.18 (m, 3H), 6.78 (d, J=8.2 Hz, 1H), 6.40 (s, 1H), 3.80 (s, 3H).

(f): Following general procedure B. $Cu_2O$ (0.6 g, 4.0 mmol, 10 mol %), $K_2CO_3$ (16.7 g, 120.9 mmol, 3 equiv.), 3-bromoanisole (5.1 mL, 40.3 mmol, 1 equiv.) and 4-tert-butylpyrazole (5 g, 40.3 mmol, 1 equiv.). The crude product was filtered through a plug of silica gel and washed with dichloromethane. The filtrate was concentrated and used in next step without further purification.

(g): Following general procedure B. $Cu_2O$ (0.6 g, 4.0 mmol, 10 mol %), $K_2CO_3$ (16.7 g, 120.9 mmol, 3 equiv.), 3-bromoanisole (5.1 mL, 40.3 mmol, 1 equiv.) and 3,5-dimethylpyrazole (3.9 g, 40.3 mmol, 1 equiv.). The crude product was filtered through a plug of silica gel and washed with dichloromethane. The filtrate was concentrated and used in next step without further purification.

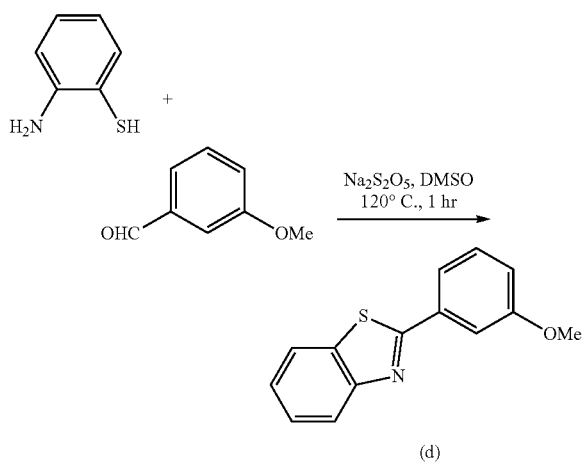

(d): A flask was charged with 2-aminothiophenol (5.3 mL, 49.2 mmol, 1 equiv.) 3-methoxybenzaldehyde (6 mL, 49.2 mmol, 1 equiv.) and sodium metabisulfite (9.4 g, 49.2 mmol, 1 equiv.). 50 mL of DMSO was added to dissolve the solid and the mixture was stirred at 120° C. for 1 hour. The crude product was diluted with dichloromethane and washed with 50 mL water three times. The combined organic extracts were dried over MgSO$_4$, concentrated under reduced pressure and the resulting residue was purified by flash chromatography on silica gel using n-hexane/ethyl acetate (10:1) as eluent to provide the pale brown oil. Yield: 8.5 g, 71%. $^1$H NMR (400 MHz, CDCl$_3$): δ 8.08 (d, J=8.2 Hz, 1H), 7.90 (d, J=8.0 Hz, 1H), 7.68 (s, 1H), 7.65 (d, J=7.8 Hz, 1H), 7.50 (t, J=7.8 Hz, 1H), 7.42-7.38 (m, 2H), 7.05 (dd, J=8.2 Hz, J=2.2 Hz, 1H), 3.93 (s, 3H).

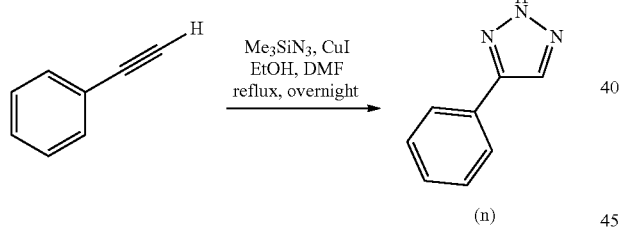

(n): A flask loaded with phenylacetylene (5 mL, 45.5 mmol, 1 equiv.), trimethylsilyl azide (7.3 mL, 55.0 mmol, 1.2 equiv.) and copper(I) iodide (88 mg, 0.46 mmol, 10 mol %) was evacuated and filled with nitrogen 3 times. Absolute ethanol (50 mL) and DF (50 mL) were added to the flask and the mixture was refluxed for overnight. The crude product was diluted with dichloromethane and washed with 50 mL water three times. The combined organic extracts were dried over MgSO$_4$, concentrated under reduced pressure and the resulting residue was purified by flash chromatography on silica gel using n-hexane/ethyl acetate (10:1 to 2:1) as eluent to white solid. Yield: 3.6 g, 55%. $^1$H NMR (300 MHz, CDCl$_3$): δ 7.38 (t, J=7.0 Hz, 1H), 7.46 (t, J=7.0 Hz, 2H), 7.83 (d, J=7.0 Hz, 2H), 7.98 (s, 1H).

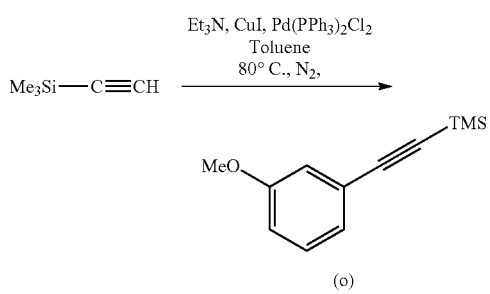

(o): To a solution of 3-bromoanisole (5 mL, 39.5 mmol, 1 equiv.), triethylamine (22 mL, 158 mmol, 4 equiv.), CuI (0.75 g, 4.0 mmol, 10 mol %), and Pd(PPh$_3$)$_2$Cl$_2$ (1.4 g, 2.0 mmol, 5 mol %) in toluene (50 mL) was added (trimethylsilyl)acetylene (6 mL, 43.5 mmol, 1.1 equiv.). The reaction mixture was stirred at 80° C. for 5 hours and then diluted with EA and washed with H$_2$O (3×50 mL). The organic extract was dried over MgSO$_4$ and concentrated under reduced pressure. The crude product was purified by flash column chromatography on silica gel using n-hexane/ethyl acetate (10:1) as eluent to afford o as colorless oil. Yield: 6.0 g, 75%. $^1$H NMR (400 MHz, CDCl$_3$): δ 7.20 (d, J=8.0 Hz, 1H), 7.06 (d, J=8.0 Hz, 1H), 6.99 (d, J=6.7 Hz, 1H), 6.87 (d, J=8.0 Hz, 1H), 3.75 (s, 3H), 0.19 (s, 9H).

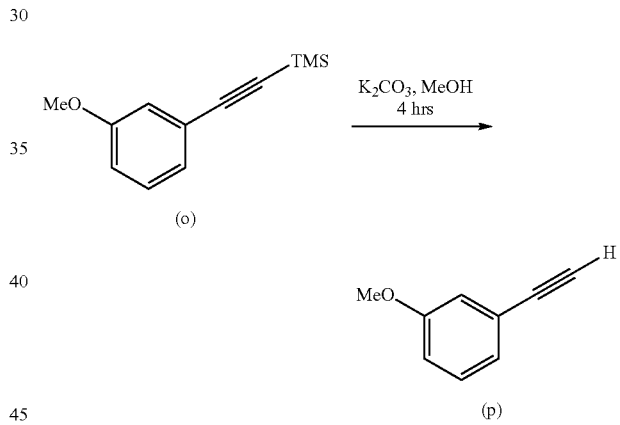

(p): To a solution of o (6 g, 29.6 mmol, 1 equiv.) in MeOH (40 mL) was added K$_2$CO$_3$ (2 g, 14.8 mmol, 0.5 equiv.). After stirring at room temperature for 4 hours, the mixture was diluted with Et$_2$O and washed with H$_2$O (3×50 mL). The organic extract was dried over MgSO$_4$ and concentrated under reduced pressure. The product obtained at pale yellow oil and was used in next step without further purification. Yield: 3.5 g, 90%. $^1$H NMR (400 MHz, CDCl$_3$): δ 7.21 (t, J=8.0 Hz, 1H), 7.08 (d, J=7.8 Hz, 1H), 7.00 (d, J=7.8 Hz, 1H), 6.79 (d, J=7.8 Hz, 1H), 3.86 (s, 3H), 3.08 (s, 1H).

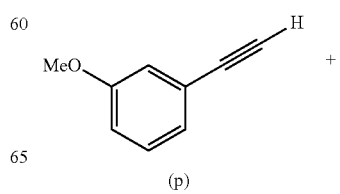

-continued

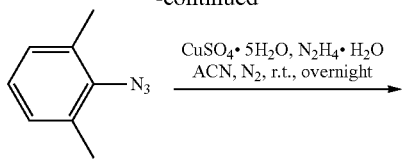

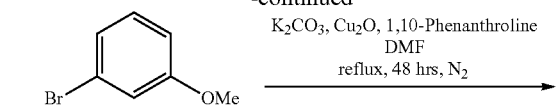

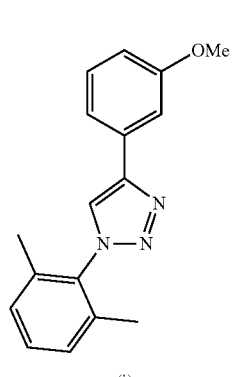

(j)

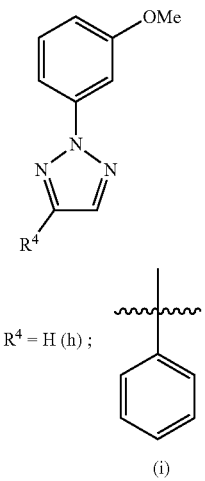

$R^4$ = H (h);

(i)

(j): To a flask containing p (1.63 g, 13.2 mmol, 1.5 equiv.), CuSO$_4$·5H$_2$O (0.22 g, 0.88 mmol, 0.1 equiv.), and hydrazine hydrate (0.28 mL, 8.8 mmol, 1 equiv.) in acetonitrile (50 mL) was added 2-azido-1,3-dimethylbenzene (1.30 g, 8.8 mmol, 1 equiv.). The mixture was allowed to stir at room temperature under N$_2$ atmosphere for 12 hours. The mixture was then diluted with dichloromethane and washed with H$_2$O (3×50 mL). The organic extract was dried over MgSO$_4$ and concentrated under reduced pressure. The crude product was purified by flash column chromatography on silica gel using n-hexane/ethyl acetate (10:1) as eluent to afford j as colorless oil. Yield: 1.7 g, 71%. $^1$H NMR (400 MHz, CDCl$_3$): δ 7.93 (s, 1H), 7.64 (s, 1H), 7.51 (d, J=6.6 Hz, 1H), 7.43 (d, 8.0 Hz, 1H), 7.38 (s, 1H), 7.30-7.25 (m, 2H), 7.00-6.95 (m, 1H), 3.96 (s, 3H, —OMe), 2.12 (s, 6H).

General Procedure C. Formation of N^C—OMe

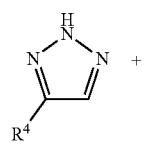 +

A flask was charged with Cu$_2$O (10 mol %), 1,10-phenanthroline (20 mol %), 3-bromoanisole (1 equiv.), K$_2$CO$_3$ (3 equiv.) and 2H-1,2,3-triazole (1.5 equiv.). Anhydrous DMF (50 mL) was added to the flask and the mixture was refluxed for 48 hours under nitrogen atmosphere. After cooling to room temperature, the mixture was diluted with 100 mL dichloromethane and filtered through a plug of Celite. The filtrate was concentrated under reduced pressure and further purified by flash column chromatography on silica gel with n-hexane/EA (10:1 to 8:2) as eluent to afford the products.

(h): Following the general procedure C. 2H-1,2,3-triazole (3 g, 43.4 mmol) and 3-bromoanisole (3.7 mL, 29.0 mmol). Yield: 3.3 g, 65%. $^1$H NMR (400 MHz, CDCl$_3$): δ 7.81 (s, 2H), 7.67 (d, J=7.3 Hz, 2H), 7.38 (t, J=8.0 Hz, 1H), 6.93-6.88 (m, 1H), 3.89 (s, 3H).

(i): Following the general procedure C. n (7.3 g, 50.0 mmol) and 3-bromoanisole (4.2 mL, 33.3 mmol). The product was used in next step without further purification.

General Procedure D. Formation of N^C—OH

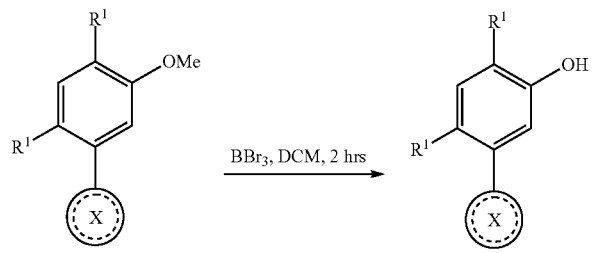

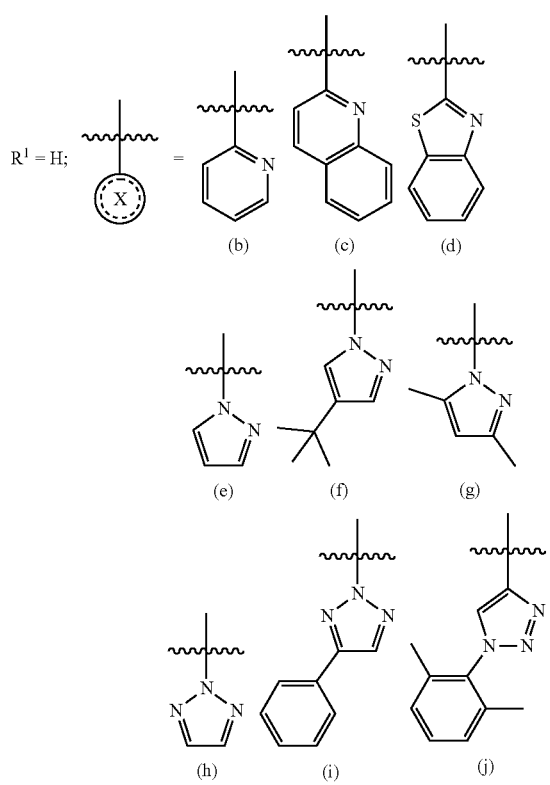
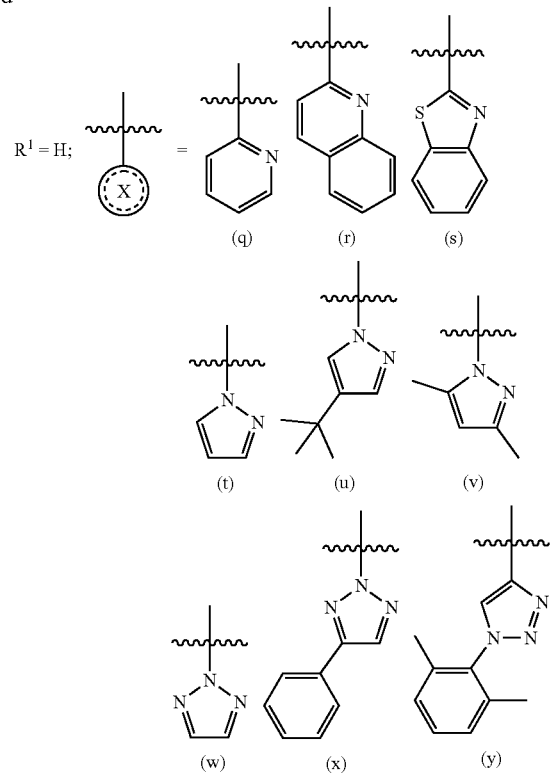

To a solution of aryl methyl ether (1 equiv.) in 30 mL of dry dichloromethane, BBr$_3$ (1M in dichloromethane, 3 equiv.) was slowly added under ice bath. The mixture was allowed to stir at room temperature for 2 hours. The crude mixture was slowly poured into crushed ice and neutralized with saturated Na$_2$CO$_3$ solution. The organic layer was washed with water twice and extracted with dichloromethane. The solvent was removed under reduced pressure. The crude was purified by flash column chromatography on silica gel using n-hexane/ethyl acetate (7:3) as eluent to provide the product. Recrystallization from n-hexane/diethyl ether mixture gave white solid as product.

(q): Following the general procedure D. b (1.5 g, 8.1 mmol, 1 equiv.) and BBr$_3$ (24.3 mL, 24.3 mmol, 3 equiv.). Yield: 1.0 g, 73%. $^1$H NMR (400 MHz, CDCl$_3$): δ 8.68 (d, J=4.2 Hz, 1H), 7.77 (t, J=7.2 Hz, 1H), 7.70 (d, J=7.9 Hz, 1H), 7.57 (s, 1H), 7.46 (d, J=7.7 Hz, 1H), 7.34 (t, J=7.9 Hz, 1H), 7.25 (s, 1H), 6.90 (d, J=8.0 Hz, 1H), 6.03 (s, —OH).

(r): Following the general procedure D. c (4.0 g, 17.0 mmol, 1 equiv.) and BBr$_3$ (51.0 mL, 51.0 mmol, 3 equiv.). Yield: 3.2 g, 84%. $^1$H NMR (300 MHz, CDCl$_3$): δ 8.25-8.17 (m, 2H), 7.87-7.73 (m, 4H), 7.63-7.54 (m, 2H), 7.38 (t, J=9.6 Hz, 1H), 6.91 (d, J=7.1 Hz, 1H), 6.10 (s, —OH).

(s): Following the general procedure D. d (5.0 g, 20.6 mmol, 1 equiv.) and BBr$_3$ (61.7 mL, 61.7 mmol, 3 equiv.). Yield: 3.6 g, 77%. $^1$H NMR (300 MHz, CD$_3$OD): δ 7.95 (t, J=8.0 Hz, 2H), 7.54-7.48 (m, 3H), 7.41 (t, J=8.1 Hz, 1H), 7.33 (t, J=8.1 Hz, 1H), 6.98-6.89 (m, 1H).

(t): Following the general procedure D. e (4.2 g, 24.1 mmol, 1 equiv.) and BBr$_3$ (72.3 mL, 72.3 mmol, 3 equiv.). Yield: 2.9 g, 76%. The product was used for next step without further purification.

(u): Following the general procedure D. f (3.5 g, 15.2 mmol, 1 equiv.) and BBr$_3$ (45.6 mL, 45.6 mmol, 3 equiv.). Yield: 2.2 g, 68%. $^1$H NMR (300 MHz, CDCl$_3$): δ 8.51 (s, —OH), 7.62 (d, J=7.3 Hz, 2H), 7.26-7.16 (m, 2H), 7.05 (d, J=8.0 Hz, 1H), 6.74 (d, J=7.2 Hz, 1H), 1.29 (s, tbu, 9H).

(v): Following the general procedure D. g (3.5 g, 15.2 mmol, 1 equiv.) and BBr$_3$ (45.6 mL, 45.6 mmol, 3 equiv.). Yield: 2.2 g, 68%. $^1$H NMR (400 MHz, CDCl$_3$): δ 7.23 (t, J=8.1 Hz, 1H), 7.11 (s, 1H), 6.81-6.75 (m, 2H), 5.99 (s, 1H), 2.31 (s, —CH$_3$, 3H), 2.26 (s, —CH$_3$, 3H).

(w): Following the general procedure D. h (3.3 g, 18.6 mmol, 1 equiv.) and BBr$_3$ (55.9 mL, 55.9 mmol, 3 equiv.). Yield: 2.1 g, 70%. $^1$H NMR (300 MHz, CDCl$_3$): δ 7.80 (s, 2H), 7.62 (d, J=7.8 Hz, 2H), 7.32 (t, J=8.2 Hz, 1H), 6.84 (dd, J=6.8 Hz, 1.7 Hz, 1H), 6.53 (s, 1H).

(x): Following the general procedure D. i (4 g, 15.9 mmol, 1 equiv.) and BBr$_3$ (47.8 mL, 47.8 mmol, 3 equiv.). Yield: 2.8 g, 75%. $^1$H NMR (400 MHz, CDCl$_3$): δ 8.05 (s, 1H), 7.90-7.88 (m, 2H), 7.71 (dd, J=8.2 Hz, 1.9 Hz, 1H), 7.66 (s, 1H), 7.49-7.45 (m, 2H), 7.41-7.33 (m, 1H), 6.83 (d, J=6.6 Hz, 1H), 5.39 (s, 1H).

(y): Following the general procedure D. j (2.5 g, 9.0 mmol, 1 equiv.) and BBr$_3$ (26.9 mL, 26.9 mmol, 3 equiv.). Yield: 1.7 g, 72%. $^1$H NMR (300 MHz, CDCl$_3$): δ 8.16 (s, 1H), 7.29-7.11 (m, 4H), 6.93 (d, J=7.9 Hz, 1H), 6.78-6.71 (m, 2H), 1.96 (s, 6H).

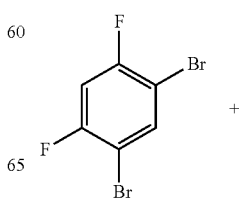

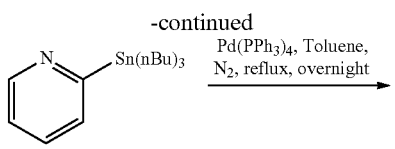

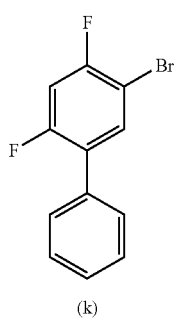

(k): A flask was charged with Pd(PPh₃)₂Cl₂ (1.3 g, 1.8 mmol, 5 mol %), 1,5-dibromo-2,4-difluorobenzene (10 g, 36.8 mmol, 1 equiv.) and 2-(tributylstannyl)pyridine (11.9 mL, 36.8 mmol, 1 equiv.). The flask was evacuated and backfilled with nitrogen. 80 mL of anhydrous toluene was added under nitrogen atmosphere and the mixture was heated to reflux overnight. The crude mixture was filtered through a small portion of celite and then concentrated under reduced pressure. The crude product was purified by flash chromatography on silica gel using n-hexane/ethyl acetate (15:1) as eluent to give the product as yellow solid. Yield: 7.4 g, 75%. ¹H NMR (400 MHz, CDCl₃): δ 8.63 (d, J=4.8 Hz, 1H), 8.21 (t, J=8.0 Hz, 1H), 7.68 (s, 2H), 7.25-7.19 (m, 1H), 6.91 (t, J=9.4 Hz, 1H); ¹⁹F NMR (376 MHz, CDCl₃): δ=−102.62, −113.78.

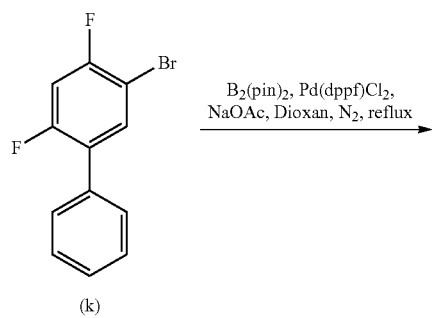

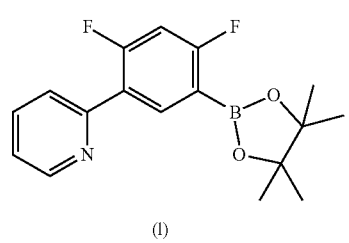

(l): A flask was charged with Pd(dppf)Cl₂ (2 g, 2.5 mmol, 10 mol %), NaOAc (7.3 g, 73.6 mmol, 3 equiv.), bis (pinacolato)diboron (9.5 g, 36.8 mmol, 1.5 equiv.) and compound k (6.6 g, 24.5 mmol, 1 equiv.). The flask was evacuated and backfilled with nitrogen. 100 mL of anhydrous 1,4-dioxane was added under nitrogen atmosphere and the mixture was heated to reflux overnight. The crude mixture was filtered through a small portion of celite and then concentrated under reduced pressure. The crude product was purified by flash chromatography on silica gel using n-hexane/ethyl acetate (10:1) as eluent to give the product as pale yellow solid. Yield: 4.7 g, 60%. ¹H NMR (400 MHz, CDCl₃): δ 8.72 (d, J=4.6 Hz, 1H), 8.34 (t, J=8.2 Hz, 1H), 7.77-7.69 (m, 2H), 7.30-7.24 (m, 1H), 6.88 (t, J=10.1 Hz, 1H), 1.60 (s, 12H); ¹⁹F NMR (376 MHz, CDCl₃): δ=−98.41, −108.81.

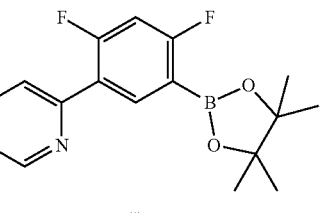

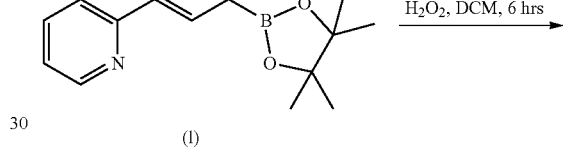

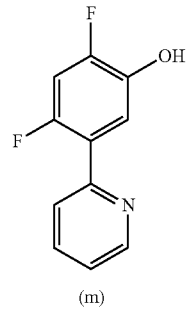

(m): A flask was charged with compound l (2 g, 6.3 mmol, 1 equiv.), 40 mL of dichloromethane was added to dissolve the solid. 20 mL of 30% (w/w) (10 equiv.) H₂O₂ was added and the mixture was allowed to stir at room temperature overnight. The crude product was diluted with dichloromethane and washed with 50 mL water three times. The combined organic extracts were dried over MgSO₄, concentrated under reduced pressure and the resulting residue was purified by flash chromatography on silica gel using n-hexane/ethyl acetate (10:1) as eluent to provide the pale brown solid. Yield: 0.8 g, 65%. ¹H NMR (400 MHz, CDCl₃): δ 8.69 (d, J=4.7 Hz, 1H), 8.48 (s, —OH), 7.80 (t, J=7.7 Hz, 1H), 7.72 (d, J=8.1 Hz, 1H), 7.54 (t, J=8.6 Hz, 1H), 7.31 (t, J=6.2 Hz, 1H), 6.89 (t, J=10.3 Hz, 1H); ¹⁹F NMR (376 MHz, CDCl₃): δ=−124.41, −133.16.

General Procedure E. Synthesis of Ligands

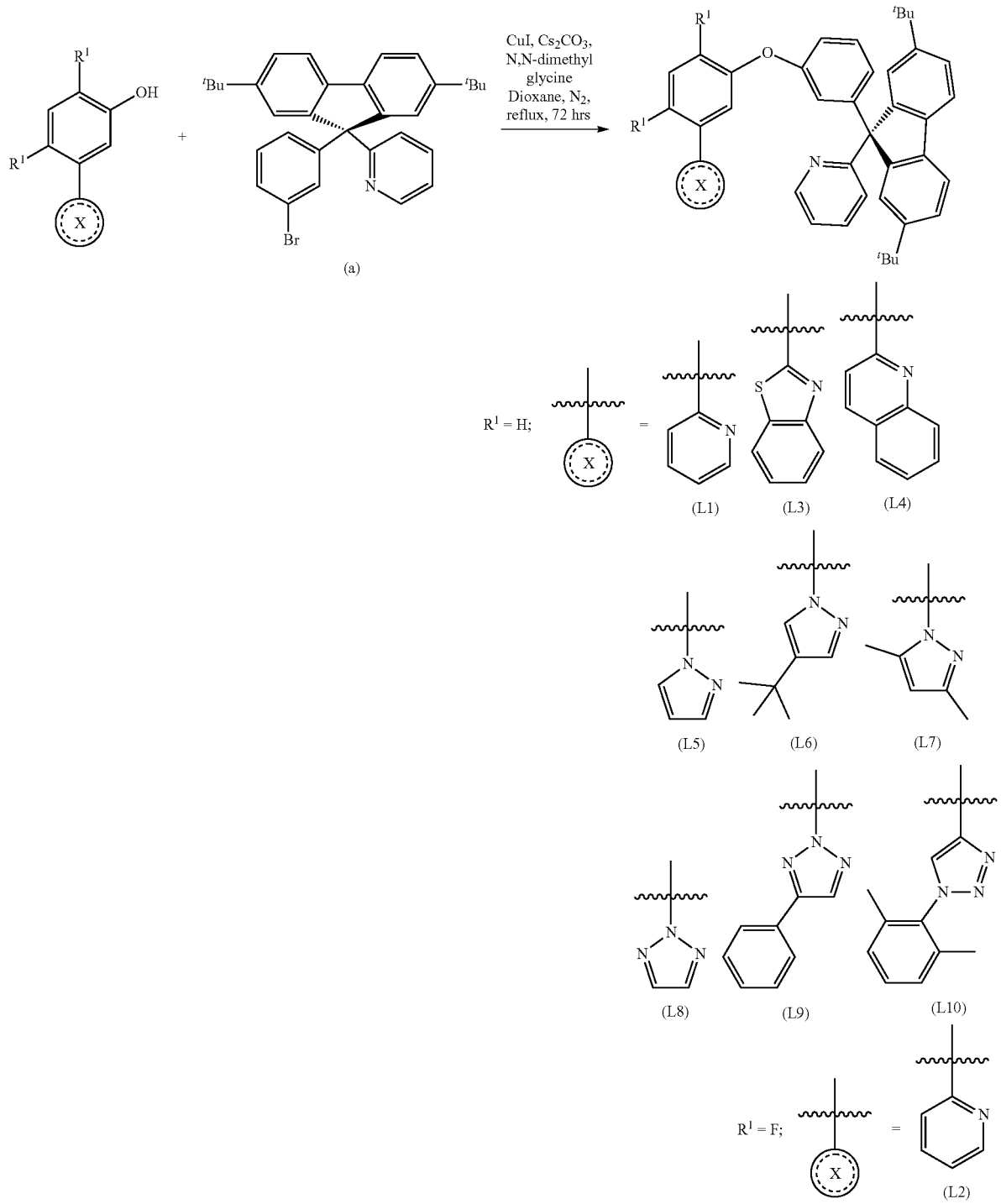

A flask was charged with CuI (10 mol %), Cs₂CO₃ (3 equiv.), N,N-dimethyl glycine (30 mol %), aryl alcohol (1 equiv.) and a (1 equiv.). The flask was evacuated and backfilled with nitrogen. 100 mL of anhydrous 1,4-dioxane or anhydrous DMSO was added to the flask under nitrogen atmosphere. The mixture was stirred at 150° C. for 2-3 days. The solid was filtered off and the filtrate was washed with water for three times, extracted with dichloromethane and then dried over MgSO₄. The mixture was concentrated and purified by flash chromatography on silica gel using n-hexane/ethyl acetate as eluent to give desired product.

(L1): Following the general procedure E. CuI (0.06 g, 0.3 mmol, 10 mol %), Cs₂CO₃ (2.9 g, 8.8 mmol, 3 equiv.), N,N-dimethyl glycine (0.09 g, 0.9 mmol, 30 mol %), compound q (0.5 g, 2.9 mmol, 1 equiv.) and compound a (1.5 g, 2.9 mmol, 1 equiv.). Yield: 0.71 g, 41%. ¹H NMR (500

MHz, CDCl$_3$): δ 8.66 (m, 2H, H$^1$, H$^{23}$), 7.70 (t, J=7.1 Hz, 1H, H$^3$), 7.70 (d, J=8.2 Hz, 1H, H$^9$), 7.67-7.58 (m, 6H, H$^{28}$, H$^{25}$, H$^{17}$, H$^4$), 7.42-7.32 (m, 4H, H$^{27}$, H$^{21}$, H$^8$), 7.22 (dt, J=2.1 Hz, J=6.5 Hz, 1H, H$^2$), 7.20 (t, J=8.1 Hz, 1H, H$^{14}$), 7.15 (t, J=7.5 Hz, 1H, H$^{22}$), 6.96-6.92 (m, 2H, H$^{20}$, H$^7$), 6.84-6.79 (m, 3H, H$^{15}$, H$^{13}$, H$^{11}$), 1.27 (s, 18H, $^t$Bu).

(L2): Following the general procedure E. CuI (0.92 g, 0.2 mmol, 5 mol %), Cs$_2$CO$_3$ (3.2 g, 9.7 mmol, 2 equiv.), N,N-dimethyl glycine (1.0 g, 1.4 mmol, 30 mol %), compound m (1.0 g, 4.8 mmol, 1 equiv.) and compound a (2.5 g, 4.8 mmol, 1 equiv.). Yield: 1.9 g, 61%. $^1$H NMR (600 MHz, CDCl$_3$): δ 8.64 (d, J=4.4 Hz, 1H, H$^1$), 8.64 (d, J=6.2 Hz, 1H, H$^{23}$), 7.77-7.69 (m, 3H, H$^8$, H$^4$, H$^3$), 7.61 (d, J=8.0 Hz, 2H, H$^{28}$), 7.58 (s, 2H, H$^{25}$, H$^{21}$), 7.40 (t, J=7.5 Hz, 1H, H$^9$), 7.37 (d, 8.0 Hz, 2H, H$^{27}$), 7.22 (t, J=5.6 Hz, 1H, H$^2$), 7.14 (t, J=7.9 Hz, 1H, H$^{14}$), 7.07 (t, J=5.2 Hz, 1H, H$^{22}$), 6.96-6.92 (m, 2H, H$^{20}$, H$^{17}$), 6.79-6.74 (m, 3H, H$^{15}$, H$^{13}$, H$^{11}$), 1.26 (s, 18H, $^t$Bu). $^{19}$F NMR (376 MHz, CDCl$_3$): δ −115.36, −125.14.

(L3): Following the general procedure E. CuI (0.05 g, 0.2 mmol, 10 mol %), Cs$_2$CO$_3$ (2.2 g, 6.6 mmol, 3 equiv.), N,N-dimethyl glycine (0.07 g, 0.7 mmol, 30 mol %), compound s (0.5 g, 2.2 mmol, 1 equiv.) and compound a (1.1 g, 2.2 mmol, 1 equiv.). Yield: 0.5 g, 37%. $^1$H NMR (500 MHz, CDCl$_3$): δ 8.70 (d, J=4.1 Hz, 1H, H$^{25}$), 8.05 (d, J=8.0 Hz, 1H, H$^2$), 7.86 (d, J=8.0 Hz, 1H, H$^5$), 7.74 (d, J=6.1 Hz, 1H, H$^{11}$), 7.71 (s, 1H, H$^{13}$), 7.63-7.59 (m, 3H, H$^{27}$, H$^{15}$), 7.46 (t, J=7.9 Hz, 1H, H$^3$), 7.44-7.32 (m, 6H, H$^{29}$, H$^{23}$, H$^{17}$, H$^{10}$, H$^4$), 7.20 (t, J=8.1 Hz, 1H, H$^{16}$), 7.08-7.01 (m, 2H, H$^{24}$, H$^9$), 6.93 (d, J=7.9 Hz, 1H, H$^{22}$), 6.88-6.82 (m, 3H, H$^{30}$, H$^{19}$), 1.26 (s, 18H, $^t$Bu).

(L4): Following the general procedure E. CuI (0.04 g, 0.2 mmol, 10 mol %), Cs$_2$CO$_3$ (1.9 g, 2.2 mmol, 3 equiv.), N,N-dimethyl glycine (0.1 g, 0.7 mmol, 30 mol %), compound r (0.5 g, 2.3 mmol, 1 equiv.) and compound a (1.2 g, 2.3 mmol, 1 equiv.). Yield: 0.66 g, 44%. $^1$H NMR (500 MHz, CDCl$_3$): δ 8.65 (d, J=4.5 Hz, 1H, H$^{27}$), 8.14 (t, J=6.7 Hz, 2H, H$^7$, H$^2$), 7.84 (d, J=5.2 Hz, 1H, H$^{11}$), 7.80-7.74 (m, 3H, H$^{15}$, H$^8$, H$^5$), 7.69 (t, J=7.0 Hz, 1H, H$^4$), 7.63-7.61 (m, 4H, H$^{32}$, H$^{29}$), 7.49 (t, J=6.9 Hz, 1H, H$^3$), 7.39-7.35 (m, 4H, H$^{31}$, H$^{25}$, H$^{12}$), 7.19-7.15 (m, 1H, H$^{18}$), 7.04-6.98 (m, 2H, H$^{26}$, H$^{13}$), 6.92 (d, J=8.0 Hz, 1H, H$^{24}$), 6.88-6.86 (m, 2H, H$^{21}$, H$^{17}$), 6.81 (d, J=7.9 Hz, 1H, H$^{19}$), 1.26 (s, 18H, $^t$Bu).

(L5): Following the general procedure E. CuI (0.06 g, 0.3 mmol, 10 mol %), Cs$_2$CO$_3$ (3.0 g, 9.3 mmol, 3 equiv.), N,N-dimethyl glycine (0.1 g, 0.9 mmol, 30 mol %), compound t (0.5 g, 3.1 mmol, 1 equiv.) and compound a (1.6 g, 3.1 mmol, 1 equiv.). Yield: 0.9 g, 51%. $^1$H NMR (600 MHz, CDCl$_3$): δ 8.70 (d, J=5.7 Hz, 1H, H$^{21}$), 7.83 (s, 1H, H$^1$), 7.69-7.67 (m, 5H, H$^{26}$, H$^{23}$, H$^3$), 7.44-7.36 (m, 5H, H$^{25}$, H$^{19}$, H$^{15}$, H$^5$), 7.30 (t, J=8.1 Hz, 1H, H$^6$), 7.24 (t, J=4.4 Hz, 1H, H$^{12}$), 7.08-7.05 (m, 1H, H$^{20}$), 6.98 (d, J=8.1 Hz, 1H, H$^{18}$), 6.91-6.89 (m, 3H, H$^{13}$, H$^{11}$, H$^9$), 6.83 (d, J=8.2 Hz, 1H, H$^7$), 6.42 (s, 1H, H$^2$), 1.33 (s, 18H, $^t$Bu).

(L6): Following the general procedure E. CuI (0.06 g, 0.3 mmol, 10 mol %), Cs$_2$CO$_3$ (3.0 g, 9.3 mmol, 3 equiv.), N,N-dimethyl glycine (0.1 g, 0.9 mmol, 30 mol %), compound u (0.5 g, 3.1 mmol, 1 equiv.) and compound a (1.6 g, 3.1 mmol, 1 equiv.). Yield: 1.1 g, 55%. $^1$H NMR (600 MHz, CDCl$_3$): δ 8.65 (d, J=4.6 Hz, 1H, H$^{21}$), 7.64-7.58 (m, 6H, H$^{26}$, H$^{23}$, H$^3$, H$^1$), 7.41-7.36 (m, 4H, H$^{25}$, H$^{19}$, H$^5$), 7.30-7.25 (m, 2H, H$^9$, H$^6$), 7.18 (t, J=8.3 Hz, 1H, H$^{12}$), 7.06 (dt, J=6.1 Hz, J=2.4 Hz, 1H, H$^{20}$), 6.91 (d, J=7.9 Hz, 1H, H$^{18}$), 6.85-6.81 (m, 3H, H$^{15}$, H$^{13}$, H$^{11}$), 6.75 (d, J=8.1 Hz, 1H, H$^7$), 1.30 (s, 9H, $^t$Bu), 1.27 (s, 18H, $^t$Bu).

(L7): Following the general procedure E. CuI (0.06 g, 0.3 mmol, 10 mol %), Cs$_2$CO$_3$ (3.0 g, 9.3 mmol, 3 equiv.), N,N-dimethyl glycine (0.1 g, 0.9 mmol, 30 mol %), compound v (0.6 g, 3.1 mmol, 1 equiv.) and compound a (1.6 g, 3.1 mmol, 1 equiv.). Yield: 0.90 g, 47%. $^1$H NMR (500 MHz, CDCl$_3$): δ 8.67 (d, J=4.6 Hz, 1H, H$^{21}$), 7.67-7.63 (m, 4H, H$^{26}$, H$^{23}$), 7.43-7.40 (m, 3H, H$^{25}$, H$^{19}$), 7.30 (t, J=8.1 Hz 1H, H$^6$), 7.19 (t, J=8.3 Hz, 1H, H$^{12}$), 7.13 (d, J=7.2 Hz, 1H, H$^5$), 7.10-7.05 (m, 1H, H$^{20}$), 7.05 (s, 1H, H$^9$), 6.94 (d, J=8.0 Hz, 1H, H$^{18}$), 6.89-6.84 (m, 4H, H$^{15}$, H$^{13}$, H$^{11}$), 5.97 (s, 1H, H$^2$), 2.29 (s, 3H, —CH$_3$), 2.22 (s, 3H, —CH$_3$), 1.31 (s, 18H, $^t$Bu).

(L8): Following the general procedure E. CuI (0.18 g, 0.93 mmol, 10 mol %), Cs$_2$CO$_3$ (9.1 g, 27.9 mmol, 3 equiv.), N,N-dimethyl glycine (0.30 g, 2.8 mmol, 30 mol %), compound w (1.5 g, 9.3 mmol, 1 equiv.) and compound a (4.7 g, 9.3 mmol, 1 equiv.). Yield: 2.2 g, 40%. $^1$H NMR (600 MHz, CD$_2$Cl$_2$): δ 8.64-8.63 (m, 1H, H$^{14}$), 7.80 (s, 1H, H$^1$), 7.76 (d, J=8.1 Hz, 1H, H$^6$), 7.66 (d, J=6.9 Hz, 3H, H$^{25}$, H$^{25'}$, H$^{20}$), 7.61 (s, 3H, H$^{22}$, H$^{22'}$, H$^2$), 7.46 (dt, J=7.7 Hz, 1.9 Hz, 1H, H$^{11}$), 7.42 (dd, J=8.0 Hz, 1.9 Hz, 2H, H$^{24}$, H$^{24'}$), 7.37 (t, J=8.1 Hz, 1H, H$^5$), 7.23 (t, J=8.0 Hz, 1H, H$^{18}$), 7.13-7.11 (m, 1H, H$^{10}$), 6.99 (d, J=7.9 Hz, 1H, H$^{12}$), 6.93-6.89 (m, 2H, H$^{19}$, H$^4$), 6.86-6.84 (m, 2H, H$^{17}$, H$^8$), 1.29 (s, 18H, $^t$Bu).

(L9): Following the general procedure E. CuI (0.16 g, 0.84 mmol, 10 mol %), Cs$_2$CO$_3$ (8.2 g, 25.2 mmol, 3 equiv.), N,N-dimethyl glycine (0.26 g, 2.5 mmol, 30 mol %), compound x (2.0 g, 8.4 mmol, 1 equiv.) and compound a (4.3 g, 8.4 mmol, 1 equiv.). Yield: 2.1 g, 37%. Because of difficulties in purification, the crude product was used in next step without further purification.

(L10): Following the general procedure E. CuI (0.09 g, 0.49 mmol, 10 mol %), Cs$_2$CO$_3$ (4.8 g, 14.7 mmol, 3 equiv.), N,N-dimethyl glycine (0.15 g, 1.5 mmol, 30 mol %), compound y (1.3 g, 4.9 mmol, 1 equiv.) and compound a (2.5 g, 4.9 mmol, 1 equiv.). Yield: 0.92 g, 27%. Because of difficulties in purification, the crude product was used in next step without further purification. $^1$H NMR (400 MHz, CDCl$_3$): δ 8.65 (d, J=4.0 Hz, 1H), 7.78 (s, 1H), 7.69 (d, J=8.2 Hz, 1H), 7.62-7.61 (m, 3H), 7.51-7.31 (m, 7H), 7.21-7.18 (m, 3H), 7.09 (m, 1H), 7.05-7.02 (m, 1H), 6.94 (d, J=8.0 Hz, 1H), 6.92-6.84 (m, 3H).

Synthesis of Platinum(II) Complexes (1-10)

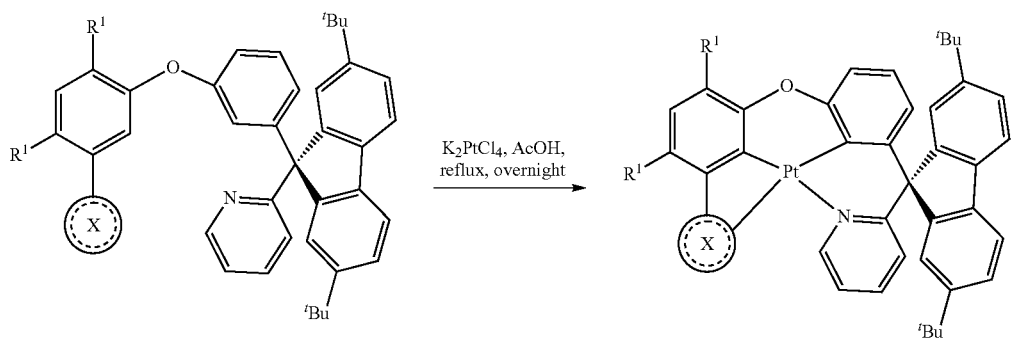

-continued

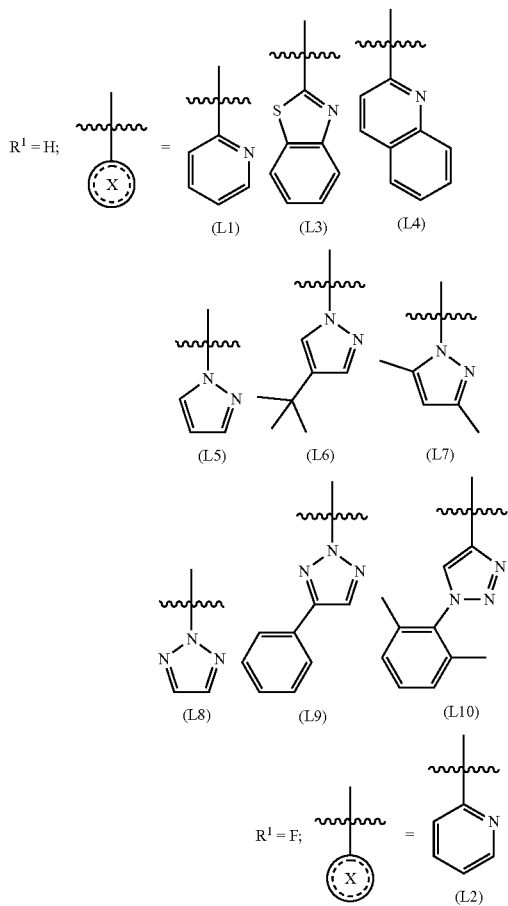

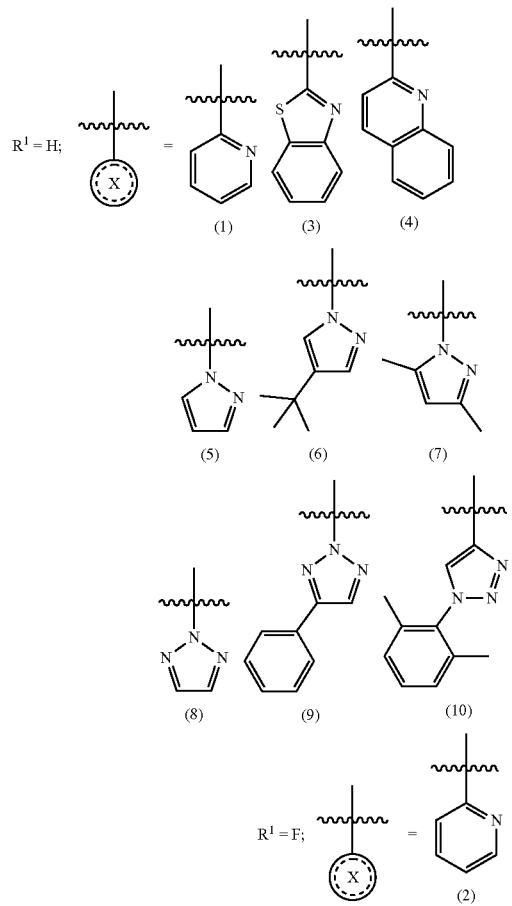

All the complexes were prepared by reaction of K₂PtCl₄ (1.2 equiv.), corresponding ligand (1 equiv.) and catalytic amount of "Bu₄NCl in 100 mL of refluxing glacial acetic acid for 24 hours. The solvent was distilled off and the crude was washed with water twice and extracted by dichloromethane. The organic layer was dried over MgSO₄, concentrated and purified by flash chromatography on silica gel using n-hexane/ethyl acetate (8:2 to 6:4) as eluent to give white to orange-yellow solid.

(1): L1 (0.6 g, 1.0 mmol, 1 equiv.) and K₂PtCl₄ (0.5 g, 1.2 mmol, 1.2 equiv.). Yield: 0.5 g, 62%. ¹H NMR (600 MHz, CDCl₃): δ 10.13 (s, 1H, H²⁵), 9.06 (d, J=5.4 Hz, 1H, H²³), 8.24 (d, J=5.3 Hz, 1H, H¹), 7.99 (d, J=8.1 Hz, 1H, H⁴), 7.92 (t, J=7.9 Hz, 1H, H³), 7.77 (d, J=8.0 Hz, 1H, H²⁸), 7.60-7.52 (m, 5H, H²⁷, H²⁵', H²¹, H⁹, H⁷), 7.29-7.16 (m, 6H, H²⁸', H²⁷', H²², H¹³, H⁸, H²), 7.02 (d, J=8.4 Hz, 1H, H²⁰), 6.79 (t, J=7.8 Hz, 1H, H¹⁴), 6.58 (d, J=7.8 Hz, 1H, H¹³), 1.40 (s, 9H, ᵗBu), 0.77 (s, 9H, ᵗBu). MS (FAB): 793.3 [M⁺]. Anal. Calcd for C₄₃H₃₈N₂OPt·0.5CH₃COOC₂H₅: C, 64.50; H, 5.05; N, 3.34. Found: C, 64.32; H, 4.72; N, 3.53.

(2): L2 (0.6 g, 1.0 mmol, 1 equiv.) and K₂PtCl₄ (0.5 g, 1.2 mmol, 1.2 equiv.). Yield: 0.3 g, 37%. ¹H NMR (600 MHz, CD₂Cl₂): δ 9.97 (s, 1H, H²⁵), 9.05 (d, J=6.4 Hz, 1H, H²³), 8.33 (d, J=4.8 Hz, 1H, H⁴), 8.23 (d, J=5.0 Hz, 1H, H¹), 7.98 (t, J=7.9 Hz, 1H, H³), 7.81 (d, J=8.0 Hz, H²⁸), 7.68-7.63 (m, 2H, H²⁷, H²¹), 7.56 (d, J=7.7 Hz, 1H, H²⁸'), 7.52 (s, 1H, H²⁵'), 7.37 (t, J=5.9 Hz, 1H, H²²), 7.25-7.16 (m, 3H, H²⁷', H¹³, H²), 7.05 (d, J=8.3 Hz, 1H, H²⁰), 6.83-6.76 (m, 2H, H¹⁴, H⁸), 6.52 (d, J=7.2 Hz, 1H, H¹⁵), 1.40 (s, 9H, ᵗBu), 0.75 (s, 9H, ᵗBu). ¹⁹F NMR (376 MHz, CDCl₃): δ −118.38, −127.05. ¹³C NMR (150 MHz, CD₂Cl₂): δ 162.98, 162.94, 154.41, 152.27, 151.64, 151.11, 150.87, 149.89, 148.24, 143.10, 139.70, 138.99, 138.60, 137.66, 137.63, 136.98, 134.05, 126.94, 126.12, 125.61, 125.52, 124.86, 124.58, 124.50, 124.08, 123.96, 123.17, 121.52, 78.09, 71.93, 66.23, 35.57, 35.20, 31.85, 31.15, 30.24. MS (FAB): 829.2 [M⁺]. Anal. Calcd for C₄₃H₃₆F₂N₂OPt·0.5H₂O: C, 61.57; H, 4.45; N, 3.34. Found: C, 61.49; H, 4.09; N, 3.50.

(3): L3 (0.7 g, 1.0 mmol, 1 equiv.) and K₂PtCl₄ (0.5 g, 1.2 mmol, 1.2 equiv.). Yield: 0.6 g, 77%. ¹H NMR (600 MHz, CD₂Cl₂): δ 10.32 (s, 1H, H²⁷), 9.23 (d, J=5.5 Hz, 1H, H²⁵), 7.98 (d, J=8.0 Hz, 1H, H²), 7.84 (d, J=7.9 Hz, 1H, H³⁰), 7.66-7.54 (m, 5H, H³⁰', H²⁹, H²⁷', H²³, H¹¹), 7.34 (t, J=7.3 Hz, 1H, H³), 7.26 (t, J=7.6 Hz, 1H, H¹⁰), 7.25-7.22 (m, 1H, H²⁹'), 7.17 (t, J=7.0 Hz, 1H, H²⁴), 7.16-7.10 (m, 3H, H²², H⁹, H⁴), 7.07 (d, J=6.7 Hz, 1H, H¹⁵), 6.90 (d, J=8.4 Hz, 1H, H⁵), 6.77 (t, J=6.9 Hz, 1H, H¹⁶), 6.53 (d, J=7.8 Hz, 1H, H¹⁷), 1.41 (s, 9H, ᵗBu), 0.66 (s, 9H, ᵗBu). ¹³C NMR (150 MHz, CD₂Cl₂) δ 181.13, 162.67, 154.83, 154.39, 153.10, 151.47, 151.32, 150.85, 150.54, 150.09, 142.95, 139.72, 138.85, 137.14, 133.78, 128.92, 127.17, 127.13, 126.07, 125.69, 125.64, 125.50, 124.94, 124.59, 124.21, 123.41, 123.15, 121.62, 121.12, 120.86, 120.25, 119.62, 118.90, 117.39, 116.57, 77.51, 34.99, 34.66, 31.55, 31.28, 30.40, 22.62, 13.85. MS (FAB): 851.3 [M⁺]. Anal. Calcd for C₄₅H₄₀N₂OPt: C, 63.44; H, 4.73; N, 3.29. Found: C, 63.72; H, 4.53; N, 3.50.

(4): L4 (0.7 g, 1.0 mmol, 1 equiv.) and K₂PtCl₄ (0.5 g, 1.2 mmol, 1.2 equiv.). Yield: 0.5 g, 54%. ¹H NMR (600 MHz, CDCl$_3$): δ 10.38 (s, 1H, H$^{29}$), 8.68 (d, J=5.3 Hz, 1H, H$^{27}$), 8.37 (d, J=8.7 Hz, 1H, H$^7$), 8.20 (d, J=8.7 Hz, 1H, H$^8$), 7.83 (t, J=7.7 Hz, 2H, H$^{32}$, H$^5$), 7.75 (d, J=7.6 Hz, 1H, H$^{11}$), 7.63-7.60 (m, 2H, H$^{31}$, H$^4$), 7.55 (s, 1H, H$^{29'}$), 7.48 (t, J=6.8 Hz, 1H, H$^{25}$), 7.34-7.18H (m, 6H, H$^{32'}$, H$^{31'}$, H$^{17}$, H$^{13}$, H$^3$, H$^2$), 7.02 (d, J=8.4 Hz, 1H, H$^{24}$), 6.91 (t, J=7.4 Hz, 1H, H$^{12}$), 6.86-6.82 (m, 2H, H$^{26}$, H$^{18}$), 6.66 (d, J=7.6 Hz, 1H, H$^{19}$), 1.40 (s, 9H, $^t$Bu), 0.67 (s, 9H, $^t$Bu). $^{13}$C NMR (150 MHz, CDCl$_3$) δ 166.36, 161.78, 153.72, 153.52, 152.51, 151.09, 150.68, 149.55, 147.85, 146.22, 141.69, 139.46, 138.42, 137.24, 136.45, 129.27, 128.79, 128.38, 128.13, 127.59, 126.58, 125.87, 125.26, 124.71, 124.41, 124.10, 123.86, 122.53, 120.78, 120.29, 119.57, 119.07, 118.29, 117.82, 116.92, 115.94, 76.69, 76.67, 76.64, 76.63, 76.61, 71.48, 31.62, 30.83. MS (FAB): 843.3 [M$^+$]. Anal. Calcd for C$_{47}$H$_{40}$N$_2$OPt·0.5H$_2$O: C, 66.18; H, 4.85; N, 3.28. Found: C, 66.27; H, 4.71; N, 3.50.

(5): L5 (0.6 g, 1.0 mmol, 1 equiv.) and K$_2$PtCl$_4$ (0.5 g, 1.2 mmol, 1.2 equiv.). Yield: 0.6 g, 72%. $^1$H NMR (500 MHz, C$_6$D$_6$): δ 9.61-9.01 (broad, 1H, H$^{23}$), 8.95 (d, J=5.6 Hz, 1H, H$^{21}$), 7.78 (d, J=8 Hz, 1H, H$^{26}$, H$^5$), 7.53 (d, J=3.3 Hz, 1H, H$^{11}$), 7.52 (s, 1H, H$^3$), 7.48-7.44 (m, 2H, H$^{25}$, H$^6$), 7.28-7.22 (m, 3H, H$^{13}$, H$^7$, H$^1$), 7.04-6.92 (m, 4H, H$^{26'}$, H$^{25'}$, H$^{18}$, H$^{12}$), 6.71 (t, J=6.9 Hz, 1H, H$^{19}$), 6.39 (t, J=6.9 Hz, 1H, H$^{20}$), 6.27 (s, 1H, H$^{23'}$), 6.12 (s, 1H, H$^2$), 1.18 (s, 18H, $^t$Bu). $^{13}$C NMR (150 MHz, C$_6$D$_6$) δ 204.19, 163.12, 156.09, 155.58, 152.41, 151.74, 151.22, 146.76, 142.72, 138.03, 137.31, 126.52, 126.40, 125.68, 125.51, 125.00, 124.63, 123.26, 121.67, 119.99, 119.16, 117.57, 116.36, 114.61, 107.09, 105.85, 81.28, 71.94, 34.77, 31.09. MS (FAB): 783.3.3 [M+H$^+$]. Anal. Calcd for C$_{41}$H$_{37}$N$_3$OPt: C, 62.90; H, 4.76; N, 5.37. Found: C, 62.99; H, 4.81; N, 5.54.

(6): L6 (0.6 g, 1.0 mmol, 1 equiv.) and K$_2$PtCl$_4$ (0.5 g, 1.2 mmol, 1.2 equiv.). Yield: 0.6 g, 67%. $^1$H NMR (600 MHz, CDCl$_3$): δ 9.20 (d, J=4.2 Hz, 1H, H$^{21}$), 9.17-8.86 (broad, 1H, H$^{23}$), 7.95 (s, 1H, H$^1$), 7.63-7.60 (m, 2H, H$^{26}$, H$^{23'}$), 7.58 (t, J=7.2 Hz, 1H, H$^{19}$), 7.39-7.25 (m, 5H, H$^{26'}$, H$^{25}$, H$^{25'}$, H$^{20}$, H$^3$), 7.17 (t, J=7.9 Hz, 1H, H$^6$), 7.12 (d, J=7.8 Hz, 1H, H$^{11}$), 7.08 (d, J=7.7 Hz, 1H, H$^5$), 7.01-6.99 (m, 2H, H$^{18}$, H$^7$), 6.78 (t, J=7.9 Hz, 1H, H$^{12}$), 6.57 (d, J=6.8 Hz, 1H, H$^{13}$), 2.17 (s, 9H, $^t$Bu), 1.23 (s, 18H, $^t$Bu). $^{13}$C NMR (150 MHz, CDCl$_3$) δ 207.03, 162.14, 154.99, 154.35, 151.84, 150.49, 149.96, 146.16, 142.01, 137.46, 135.17, 134.70, 125.72, 125.16, 124.92, 124.28, 123.61, 123.28, 122.45, 120.83, 119.17, 118.36, 116.18, 114.64, 113.06, 105.09, 76.98, 76.77, 71.55, 53.39, 35.03, 31.51, 31.32, 30.91, 29.85. MS (FAB): 739.3 [M+H$^+$]. Anal. Calcd for C$_{45}$H$_{45}$N$_3$OPt·0.5CHCl$_3$: C, 60.81; H, 5.10; N, 4.68. Found: C, 60.72; H, 5.29; N, 4.75.

(7): L7 (0.6 g, 1.0 mmol, 1 equiv.) and K$_2$PtCl$_4$ (0.5 g, 1.2 mmol, 1.2 equiv.). Yield: 0.53 g, 65%. $^1$H NMR (500 MHz, CDCl$_3$): δ 10.27 (s, 1H, H$^{23}$), 9.34 (d, J=4.3 Hz, 1H, H$^{21}$), 7.77 (d, J=8.0 Hz, 1H, H$^{26}$), 7.57 (t, J=8.4 Hz, 2H, H$^{26'}$, H$^{25}$), 7.50-7.46 (m, 2H, H$^{23'}$, H$^{19}$), 7.23 (d, J=8.0 Hz, 1H, H$^{25'}$), 7.20-7.16 (m, 2H, H$^7$, H$^5$), 7.10-7.07 (m, 3H, H$^{20}$, H$^{11}$, H$^6$), 7.01 (d, J=5.9 Hz, 1H, H$^{18}$), 6.75 (t, J=7.9 Hz, 1H, H$^{12}$), 6.53 (d, J=6.7 Hz, 1H, H$^{13}$), 6.05 (s, 1H, H$^2$), 2.76 (s, 3H, —CH$_3$), 1.87 (s, 3H, —CH$_3$), 1.37 (s, 9H, $^t$Bu), 0.90 (s, 9H, $^t$Bu). $^{13}$C NMR (150 MHz, CDCl$_3$) δ 162.37, 154.59, 154.39, 151.39, 151.18, 150.45, 150.10, 148.24, 142.57, 141.47, 139.81, 138.25, 137.14, 127.06, 125.98, 125.67, 125.63, 124.80, 124.47, 123.82, 122.87, 121.33, 121.20, 120.16, 120.00, 119.64, 116.09, 115.33, 112.81, 110.48, 107.98, 78.11, 71.90, 54.80, 54.69, 35.56, 31.88, 31.74, 31.43, 15.15, 14.88. MS (FAB): 811.2 [M+H$^+$]. Anal. Calcd for C$_{43}$H$_{41}$N$_3$OPt: C, 63.69; H, 5.10; N, 5.18. Found: C, 63.70; H, 5.10; N, 5.13.

(8): L8 (0.6 g, 1.0 mmol, 1 equiv.) and K$_2$PtCl$_4$ (0.5 g, 1.2 mmol, 1.2 equiv.). Yield: 0.31 g, 40%. $^1$H NMR (500 MHz, CDCl$_3$): δ 9.17 (s, 1H, H$^{20}$), 8.78 (br, 2H, H$^{22}$), 8.00 (s, 1H, H$^1$), 7.69-7.64 (m, 4H, H$^2$, H$^{19}$, H$^{25}$, H$^{25'}$), 7.58 (d, J=7.8 Hz, 1H, H$^4$), 7.42 (d, J=7.5 Hz, 2H, H$^{24}$, H$^{24'}$), 7.34-7.32 (m, 1H, H$^{18}$), 7.27 (t, J=7.9 Hz, 1H, H$^5$), 7.08 (d, J=8.0 Hz, 2H, H$^6$, H$^{10}$), 7.02 (d, J=8.2 Hz, 1H, H$^{17}$), 6.78 (t, J=7.9 Hz, 1H, H$^{11}$), 6.52 (d, J=7.9 Hz, 1H, H$^{12}$), 1.56 (s, 18H, $^t$Bu). $^{13}$C NMR (150 MHz, CD$_2$Cl$_2$) 162.50, 154.95, 153.87, 152.18, 151.39, 150.43, 145.30, 142.90, 138.78, 138.21, 135.62, 133.04, 125.83, 125.78, 125.36, 124.59, 124.42, 121.27, 120.00, 116.93, 116.50, 115.29, 113.77, 109.06, 54.36, 54.18, 53.99, 53.91, 53.71, 53.64, 35.50, 31.64, 31.57, 31.47, 31.44, 31.17. Anal. Calcd for C$_{40}$H$_{36}$N$_4$OPt: C, 61.29; H, 4.63; N, 7.15. Found: C, 61.31; H, 4.74; N, 7.19.

(9): L9 (0.7 g, 1.0 mmol, 1 equiv.) and K$_2$PtCl$_4$ (0.5 g, 1.2 mmol, 1.2 equiv.). Yield: 0.36 g, 42%. $^1$H NMR (500 MHz, CD$_2$Cl$_2$): δ 9.25 (d, J=5.6 Hz, 1H, H$^{26}$), 8.81 (br, 2H, H$^{28}$, H$^{28'}$), 7.92-7.91 (m, 3H, H8, H$^{31}$, H$^{31'}$), 7.70-7.65 (m, 4H, H$^1$, H$^4$, H$^{10}$, H$^{24}$), 7.52 (t, J=7.2 Hz, 2H, H$^5$, H$^7$), 7.46 (d, J=7.3 Hz, 1H, H$^6$), 7.42 (d, J=7.9 Hz, 2H, H$^{30}$, H$^{30'}$), 7.37 (t, J=7.1 Hz, 1H, H$^{25}$), 7.32-7.28 (m, 1H, H$^{11}$), 7.11-7.09 (m, 2H, H$^{12}$, H$^{16}$), 7.04 (d, J=8.2 Hz, 1H, H$^{23}$), 6.79 (t, J=7.9 Hz, 1H, H$^{17}$), 6.54 (d, J=7.7 Hz, 1H, H$^{18}$), 1.12 (s, 18H, Bu). $^{13}$C NMR (150 MHz, CD$_2$Cl$_2$) δ 162.57, 155.03, 153.90, 152.27, 151.42, 150.44, 149.15, 145.30, 142.92, 138.76, 138.25, 129.99, 129.73, 129.64, 126.58, 125.83, 125.45, 124.64, 124.54, 121.31, 120.02, 116.96, 116.67, 115.27, 113.96, 109.14, 78.11, 71.99, 55.60, 54.78, 54.43, 54.22, 53.57, 35.51, 32.16, 31.57, 23.22, 14.44. Anal. Calcd for C$_{46}$H$_{40}$N$_4$OPt·⅓H$_2$O: C, 63.80; H, 4.73; N, 6.47. Found: C, 63.83; H, 4.72; N, 6.55.

(10): L10 (0.7 g, 1.0 mmol, 1 equiv.) and K$_2$PtCl$_4$ (0.5 g, 1.2 mmol, 1.2 equiv.). Yield: 0.31 g, 35%. $^1$H NMR (600 MHz, CDCl$_3$): δ 9.49 (d, J=5.7 Hz, 1H, H$^{25}$), 8.95 (br, 2H, H$^{27}$, H$^{27'}$), 7.84 (s, 1H, H$^1$), 7.62 (d, J=7.9 Hz, 2H, H$^{30}$, H$^{30'}$), 7.45 (t, J=6.9 Hz, 1H, H$^{23}$), 7.38-7.35 (m, 3H, H$^5$, H$^{29}$, H$^{29'}$), 7.32 (d, J=7.2 Hz, 1H, H$^{11}$), 7.23-7.16 (m, 4H, H$^4$, H$^6$, H$^{10}$, H$^{15}$), 7.12-7.09 (m, 2H, H$^9$, H$^{24}$), 6.92 (d, J=8.1 Hz, 1H, H$^{22}$), 6.80 (t, J=7.8 Hz, 1H, H$^{16}$), 6.60 (d, J=7.8 Hz, 1H, H$^{17}$), 2.12 (s, 6H, —CH$_3$), 1.17 (s, 18H, $^t$Bu). $^{13}$C NMR (150 MHz, CDCl$_3$) δ 161.33, 156.79, 155.05, 153.92, 153.52, 150.32, 150.29, 142.73, 137.72, 137.28, 137.12, 135.88, 135.34, 130.61, 128.75, 125.82, 125.41, 124.90, 124.65, 124.46, 123.77, 122.90, 120.47, 119.35, 119.12, 117.36, 116.27, 116.19, 115.68, 77.02, 76.81, 71.55, 60.42, 35.06, 31.52, 31.50, 31.44, 31.39, 21.07, 17.68, 14.20. Anal. Calcd for C$_{48}$H$_{44}$N$_4$OPt·0.5CHCl$_3$: C, 61.47; H, 4.73; N, 5.91. Found: C, 61.71; H, 4.89; N, 5.83.

Photophysical, electrochemical data and thermodegradation temperature of complexes

| Complex | UV-vis absorption [a] $\lambda_{max}$/nm ($\varepsilon$/10$^3$ dm$^3$ mol$^{-1}$ cm$^{-1}$)[a] | emission [a] $\lambda_{max}$/nm (τ/μs) [b] | $\Phi_{solution}$; $\Phi_{film}$ | HOMO/ eV [h] | LUMO/ eV [h] | $T_d$/ °C [i] |
|---|---|---|---|---|---|---|
| 1 | 263 (2.95), 281 (2.56, sh), 317 (1.54), 345 (0.78, sh), 378 (0.69), 426 (0.12) | 519 (5.7) | 0.81[d]; 0.78[g] | −5.34 | −2.42 | 420 |
| 2 | 269 (3.23), 281 (2.82, sh), 299 (1.95, sh), 315 (1.56), 343 (0.93, br), 371 (0.91), 416 (0.18, sh) | 505 (5.4) | 0.70[d]; 0.75[g] | −5.47 | −2.52 | 404 |

Photophysical, electrochemical data and thermodegradation temperature of complexes

| Complex | UV-vis absorption [a], $\lambda_{max}$/nm ($\varepsilon$/10$^3$ dm$^3$ mol$^{-1}$ cm$^{-1}$)[a] | emission [a], $\lambda_{max}$/nm ($\tau$/µs) [b] | $\Phi_{solution}$; $\Phi_{film}$ | HOMO/ eV [h] | LUMO/ eV [h] | $T_d$/ °C [i] |
|---|---|---|---|---|---|---|
| 3 | 275 (3.51), 299 (2.27, sh), 318 (1.64), 338 (1.79), 357 (1.59, sh), 399 (0.80, br), 459 (0.11, sh) | 578 (4.0) | 0.37[e]; 0.51[g] | −5.22 | −2.70 | 417 |
| 4 | 267 (3.94), 2.81 (3.47, sh), 299 (2.12, sh), 317 (1.45), 335 (1.13, br), 356 (1.09, br), 374 (1.17), 417 (0.76), 470 (0.11, sh) | 613 (3.9) | 0.20[e]; 0.48[g] | −5.36 | −2.81 | 387 |
| 5 | 267 (4.40), 288 (3.31, sh), 298 (2.71, sh), 317 (1.52, sh), 338 (0.99), 379 (0.38, sh) | 452 (18.8) | 0.13[c]; 0.30[f] | −5.34 | −2.27 | 410 |
| 6 | 267 (3.59), 301 (2.01, sh), 318 (1.21, sh), 339 (0.75, sh), 382 (0.16) | 455 (54.7) | 0.37[c]; 0.28[f] | −5.34 | −2.35 | 417 |
| 7 | 267 (3.59), 301 (2.01, sh), 318 (1.21, sh), 339 (0.75, sh), 382 (0.16) | 478 (37.0) | 0.42[c]; 0.32[f] | −5.35 | −2.24 | 411 |
| 8 | 266 (3.19), 298 (2.12, sh), 3.18 (1.30, sh), 3.36 (0.87, br), 351 (0.90), 392 (0.20, sh) | 487 (7.8) | 0.59[c]; 0.63[f] | −5.46 | −2.34 | 403 |
| 9 | 272 (3.69), 300 (2.56, sh), 317 (2.07, sh), 336 (1.57, br), 357 (1.35, sh), 401 (0.18, sh) | 504 (9.0) | 0.49; 0.78[f] | −5.48 | −2.43 | 351 |
| 10 | 263 (3.11, sh), 283 (2.27, sh), 300 (1.78, sh), 317 (1.12, sh), 337 (0.87), 368 (0.34, br), 384 (0.27, sh) | 429 (70) | 0.17[c]; 0.087[f] | −5.34 | −2.36 | 419 |

[a] Determined in degassed CH$_2$Cl$_2$ solution (2 × 10$^{-5}$ mol dm$^{-3}$).
[b] $\tau_{obs}$ = emission lifetime.
[c] Emission quantum yield was estimated with quinine sulphate in 0.1M sulphuric acid as standard ($\Phi_{em}$ = 0.546).
[d] Emission quantum yield was estimated with BPEA (9,10-bis(phenylethynyl)anthracene) in degassed benzene as standard ($\Phi_{em}$ = 0.85).
[e] Emission quantum yield was estimated with [Ru(bpy)$_3$](PF$_6$)$_2$ (bpy = 2,2'-bipyridine) in degassed CH$_3$CN as standard ($\Phi_{em}$ = 0.062).
[f] 5 wt % in PMMA film; determined with Hamamatsu C11347 QY Absolute PL quantum yield measurement system.
[g] 5 wt % in mCP film; determined with Hamamatsu C11347 QY Absolute PL quantum yield measurement system.
[h] Estimated from onset of oxidation/reduction wave using a Cp$_2$Fe$^{+/0}$ value of 4.8 eV below the vacuum level.
[i] Estimated from the temparatre at which 5% of total wieght loss of complex in thermalgravimetric analysis.

X-ray Diffraction Analysis

X-ray diffraction data of single crystals were collected on Bruker X8 Proteum diffractometer. Both diffraction intensities and images were integrated and interpreted using the program SAINT. The crystal structure was solved by direct methods employing SHELXS-97 program and refined by a full-matrix least-squares method using program SHELXL-97. As shown in FIG. 8, the Pt(II) center adopts a highly distorted square planar geometry and the spiro-fluorene is forced to project on a face of the pyridine containing chelating ring.

Emitting Device Fabrication

A green-emitting device was fabricated with architecture of ITO/HAT-cn (5 nm)/TAPC (50 nm)/TCTA (10 nm)/TCTA:26DczPPy:Emitter (15 nm)/TMPYPB (50 nm)/LiF (1.2 nm)/Al (150 nm).

| Emitter | Max. current efficiency / cd A$^{-1}$ | Max. Luminance / cd m$^{-2}$ | Max. EQE | Emission peak / nm |
|---|---|---|---|---|
| | 72 | 59320 | 23% | 535 |

In like manner, a red-emitting device was fabricated with architecture of ITO/HAT-cn (5 nm)/TAPC (50 nm)/TCTA (10 nm)/TCTA:26DczPPy: emitter (15 nm)/TMPYPB (50 nm)/LiF (1.2 nm)/Al (150 nm).

| Emitter | Max. current efficiency / cd A$^{-1}$ | Max. Luminance / cd m$^{-2}$ | Max. EQE | Emission peak / nm |
|---|---|---|---|---|
| (structure) | 19.5 | 17570 | 14.5% | 616 |

A sky blue emitting device was fabricated with architecture of ITO/MoO$_x$/TAPC/TCTA/emitter:CzSi/TSPO1/TPBI/LiF/Al.

| Emitter | Max. current efficiency / cd A$^{-1}$ | Max. Power efficiency / lm W$^{-1}$ | Max. EQE / % | Emission peak / nm |
|---|---|---|---|---|
| (structure) | 53.9 | 37.6 | 18.0 | 500 |

A yellow emitting device was fabricated with architecture of ITO/MoO$_x$/TAPC/TCTA/emitter:CzSi/TSPO1/TPBI/LiF/Al.

| Emitter | Max. current efficiency / cd A$^{-1}$ | Max. Power efficiency / lm W$^{-1}$ | Max. EQE / % | Emission peak / nm |
|---|---|---|---|---|
| (structure) | 30.6 | 27.4 | 12.3 | 572 |

Theoretical Calculations on Metal Emitters

Figure 13:
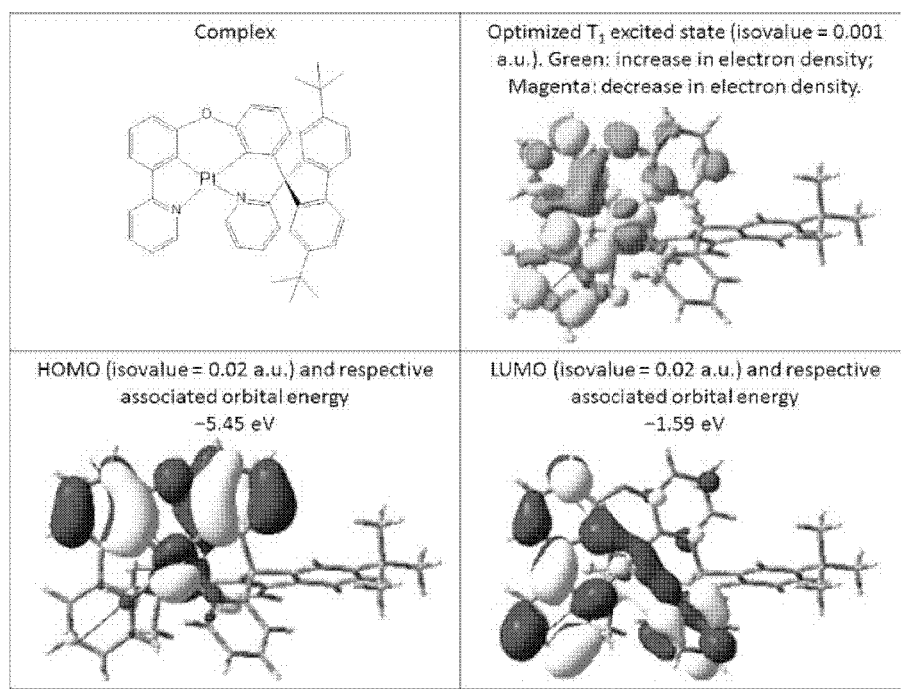
FIG. 13 shows the chemical structure and the calculated HOMO, LUMO and optimized T$_1$ excited state for complex 1, according to an embodiment of the invention.

Variation of the aromatic ring, $Ar_1$, in the asymmetric N^C^C^N comprising tetradentate ligand allows tuning of the lowest absorption energy of the resulting Pt(II) complexes, as well as emission color ranging from blue to red over a wide range in visible spectrum. Theoretical calculations were performed on 1 using a DFT/TDDFT method. The calculated lowest absorption energy, which corresponds to a $S_0 \rightarrow S_1$ transition, is 415 nm at the optimized ground state geometry. The calculated value is in good agreement with the experimental value of 426 nm. This absorption band is predominantly derived from HOMO→LUMO transition with the HOMO, illustrated in FIG. 13, mainly localized on the Pt(II) ion and the two phenyl rings on the oxygen linkage of the tetradentate ligand. The LUMO, illustrated in FIG. 13, is delocalized over the C^N fragment with minor contribution from the fluorenyl-pyridine portion. Further optimization of the lowest triplet excited state ($T_1$), illustrated in FIG. 13, reveals that the $T_1$ excited state is dominated by a triplet intra-ligand charge transfer ($^3$ILCT) nature leading to a vertical emission energy computed to be 569 nm. The radiative decay rate ($k_r$), calculated with the optimized $T_1$ geometry, is $1.97 \times 10^5$ s$^{-1}$, which compare well with the experimentally estimated $k_r$ of $1.42 \times 10^5$ s$^{-1}$.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. An asymmetric metal complex, comprising the structure:

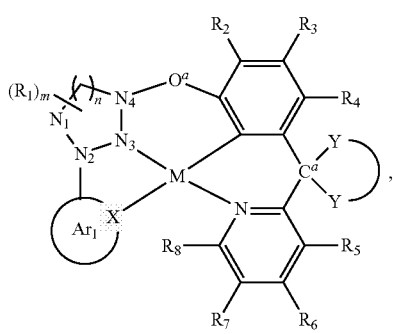

where M is Pt, Ir, W, Fe, Ru, Ni, Cu, Au or Zn; where $Ar_1$ is a substituted or unsubstituted aromatic or heteroaromatic ring where X is N or other electron pair donor;

is

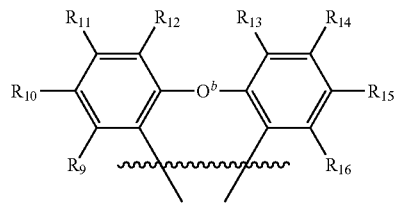

and forms a spiro unit with $C^a$, where $C^a$ is a bridging atom and can be independently: nitrogen, carbon, boron, phosphorus, silicon, sulfur, or a combination thereof and O b is a bond, O, S, $NR_{17}$, B $R_{17}$, $PR_{17}$, $CR_{17}R_{18}$, or $SiR_{17}R_{18}$; where $O^a$ is O, S, $NR_{19}$, B $R_{19}$, $PR_{19}$, $CR_{19}R_{20}$, or $SiR_{19}R_{20}$; where $N_1$, $N_2$ and $N_4$ are independently unsubstituted or substituted boron, carbon, nitrogen, oxygen, silicon, germanium, phosphorous, sulphur or selenium and n is 1 to 3; where $N_3$ is carbon, boron, nitrogen, oxygen, silicon, phosphorous, sulphur or selenium; and the ring containing $N_1$, $N_2$, $N_3$ and $N_4$ is a saturated, unsaturated or aromatic ring; where $R_1$ is independently hydrogen, substituted or unsubstituted alkyl, alkenyl, alkynyl, aryl, heteroaryl, cycloalkyl, heterocyclyl, amino, nitro, hydroxyl, halogen, thio, alkoxy, haloalkyl, arylalkane or arylalkene; where $R_2$, $R_3$, $R_4$, $R_5$, $R_6$, $R_7$, and $R_8$ are independently hydrogen, substituted or unsubstituted alkyl, alkenyl, alkynyl, aryl, heteroaryl, cycloalkyl, heterocyclyl, amino, nitro hydroxyl, halogen, thio, alkoxy, haloalkyl, arylalkane or arylalkene; where $R_9$, $R_{10}$, $R_{11}$, $R_{12}$, $R_{13}$, $R_{14}$, $R_{15}$, and $R_{16}$ are independently hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group and where a pair of adjacent R groups can independently form a 5-8 membered aryl or arylalkyl ring which may be interrupted one or more times with O, S, N, or $NR_{21}$; and where $R_{17}$, $R_{18}$, $R_{19}$, $R_{20}$, and $R_{21}$ are independently alkyl, alkenyl, alkynyl, aryl, heteroaryl, cycloalkyl, heterocyclyl, haloalkyl, arylalkane or arylalkene.

2. The metal complex according to claim 1, wherein $Ar_1$ is an aromatic ring or heteroaromatic ring which can be substituted or unsubstituted; wherein X is coordinated to the central metal atom, M.

3. The metal complex according to claim 1, wherein $N_1$, $N_2$ and $N_4$ are independently boron, carbon, nitrogen, oxygen, silicon, germanium, phosphorous, sulphur or selenium; wherein $N_3$ is independently carbon coordinated to the central metal atom, M; and the ring containing $N_1$, $N_2$, $N_3$ and $N_4$ is a saturated, unsaturated or aromatic ring; wherein $R_1$ is independently hydrogen, substituted or unsubstituted alkyl, alkenyl, alkynyl, aryl, heteroaryl, cycloalkyl, heterocyclyl, amino, nitro hydroxyl, halogen, thio, alkoxy, haloalkyl, arylalkane or arylalkene; wherein each of n and m are independently an integer 1, 2, or 3.

4. The metal complex according to claim 1, wherein is

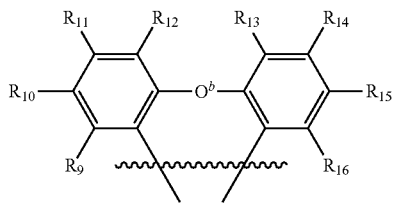

wherein $R_9$-$R_{16}$ are independently hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group; and each pair of adjacent R groups of $R_9$-$R_{16}$ can be independently form 5-8 membered ring(s) with 2 or 4 carbon atoms in the phenyl ring(s); wherein $O^b$ is a bond, nitrogen, carbon, boron, phosphorus, silicon, oxygen, sulfur.

5. The metal complex according to claim 1, wherein the M is Pt.

6. The metal complex according to claim 1, wherein $R_2$-$R_8$ are independently hydrogen, substituted or unsubstituted alkyl, alkenyl, alkynyl, aryl, heteroaryl, cycloalkyl, heterocyclyl, amino, nitro hydroxyl, halogen, thio, alkoxy, haloalkyl, arylalkane or arylalkene.

7. The metal complex according to claim 1, wherein $C^a$ can be independently nitrogen, carbon, boron, phosphorus, silicon, oxygen, sulfur or a combination thereof.

8. The metal complex according to claim 1, wherein the metal complex has one of the following structures:

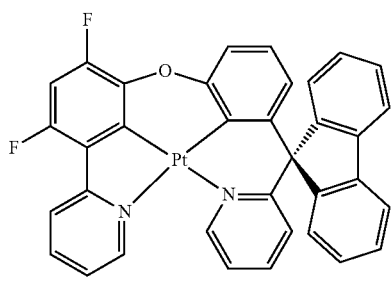

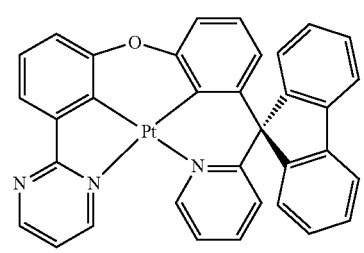

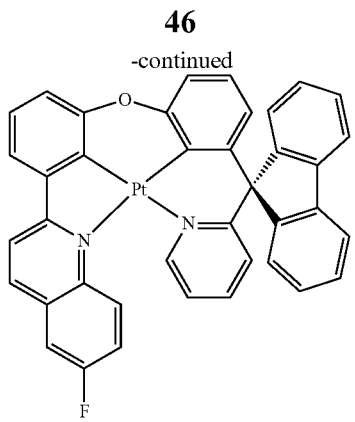

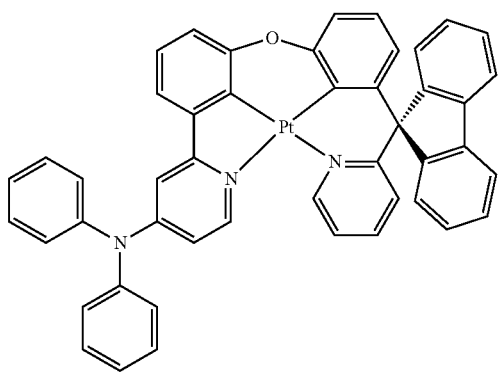

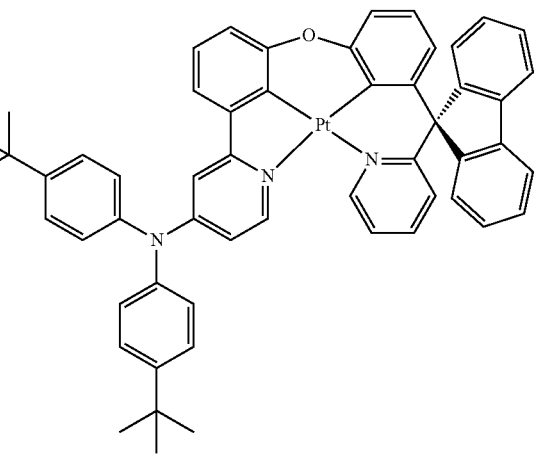

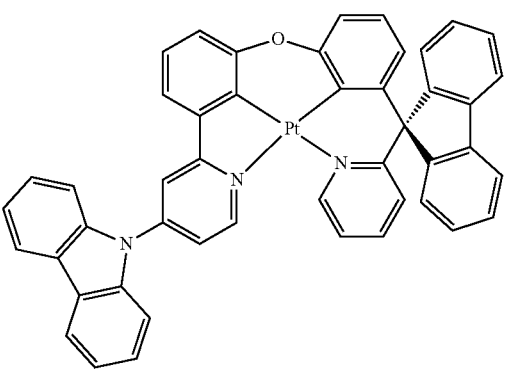

47
-continued
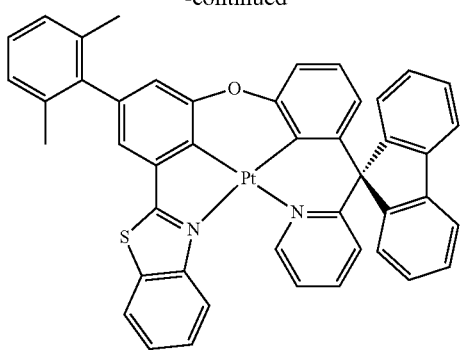
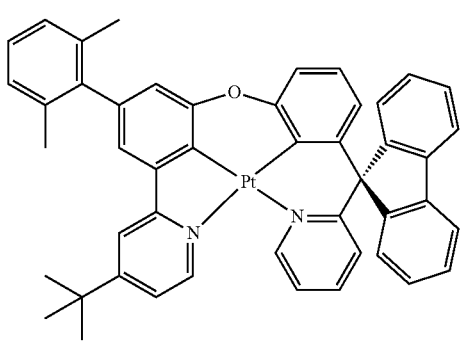
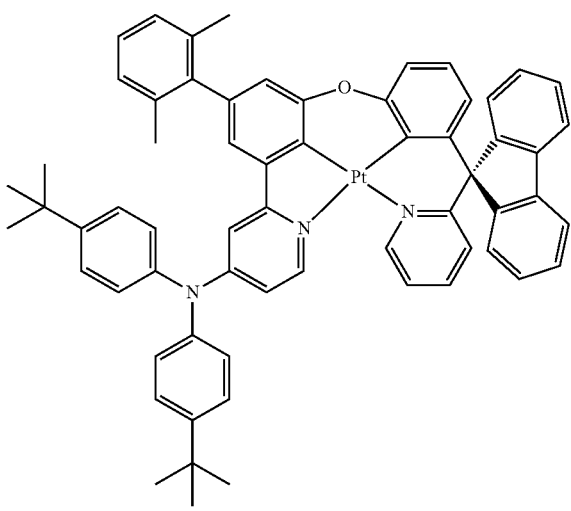
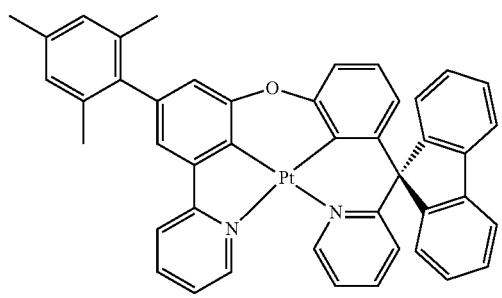
48
-continued
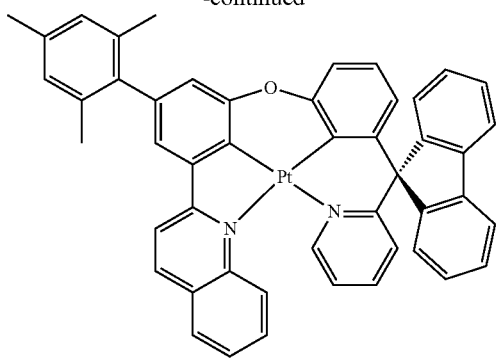
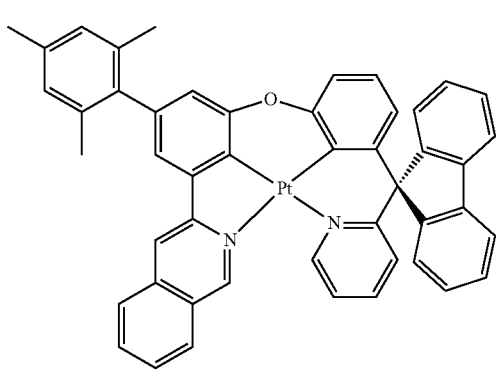
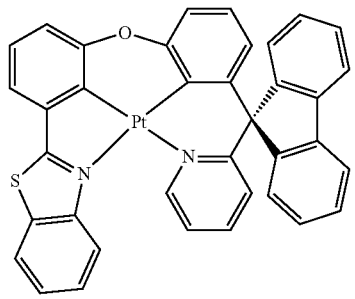
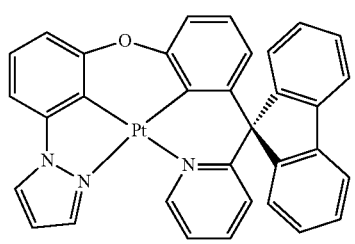
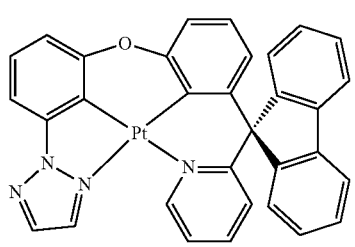

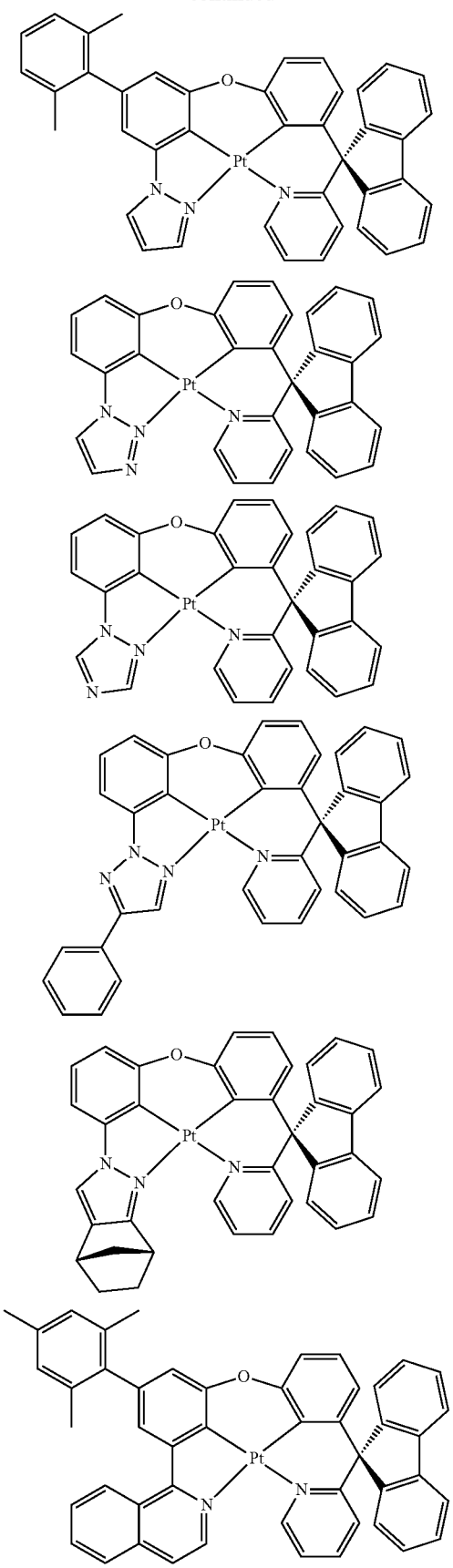
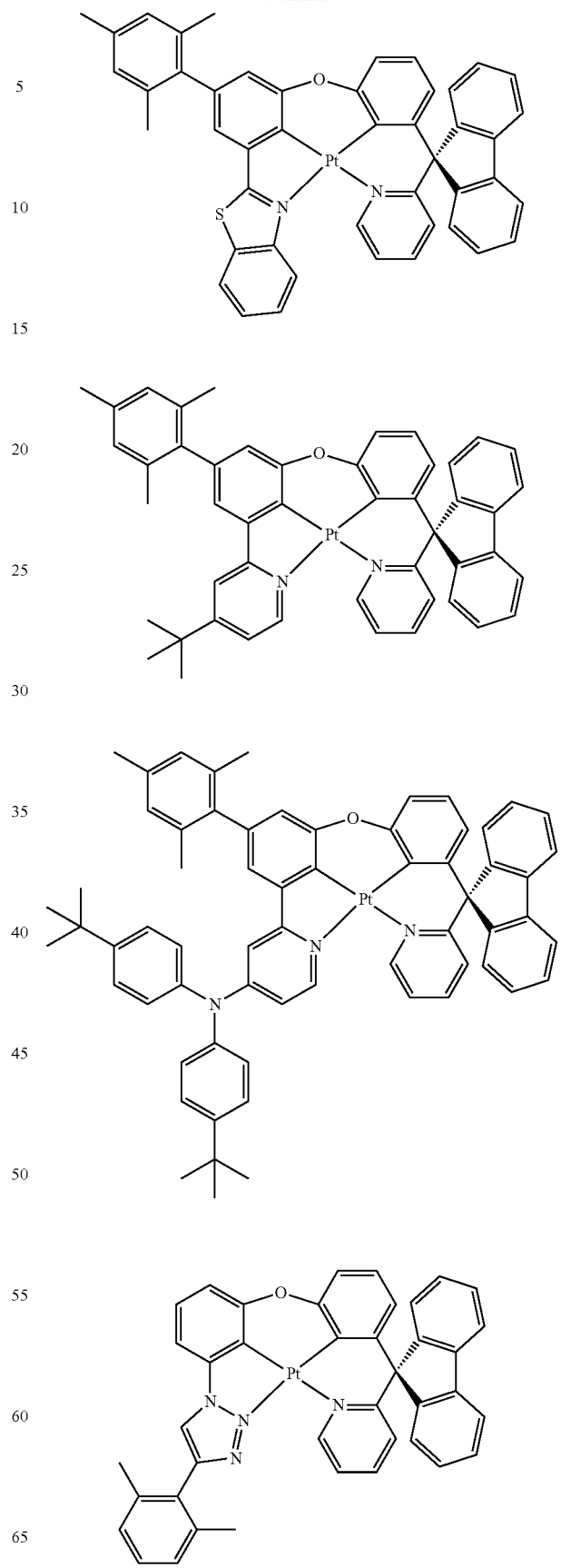

51
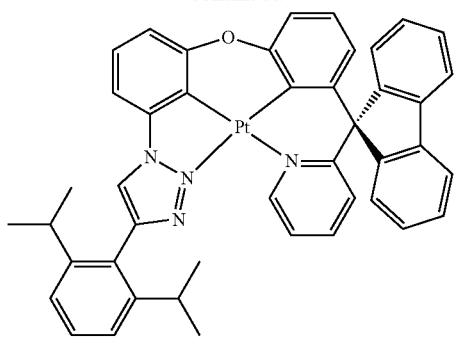
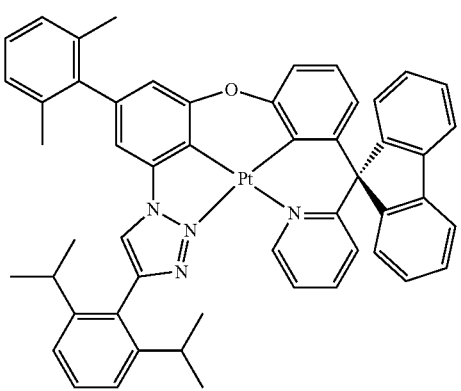
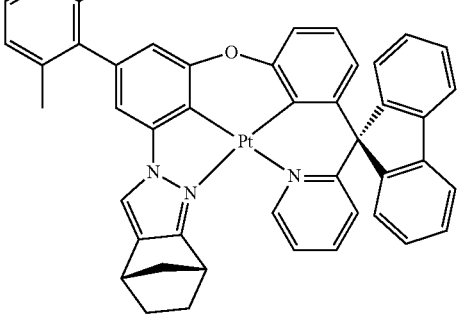
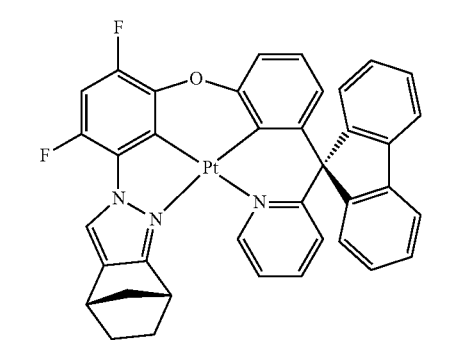
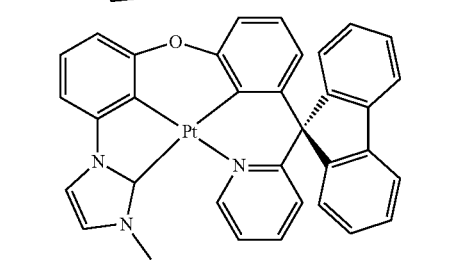
52
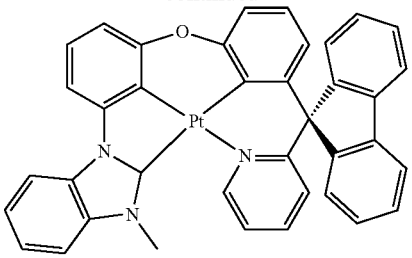
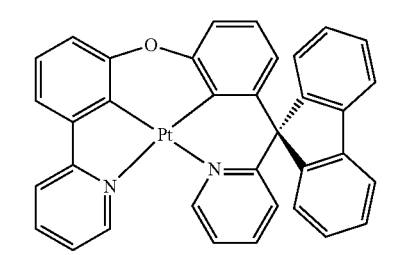
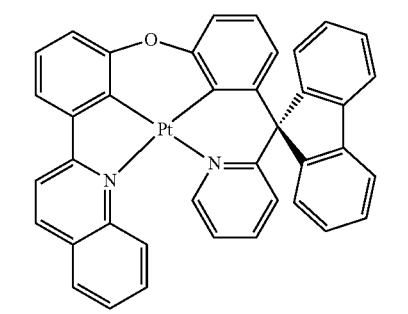
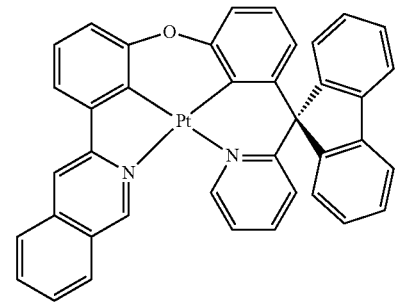
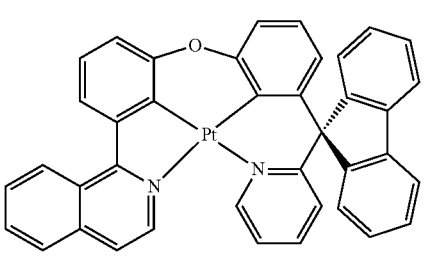
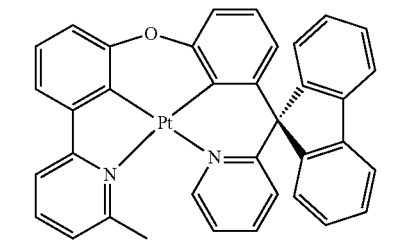

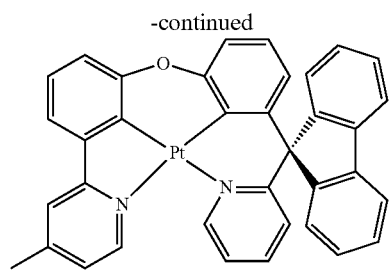
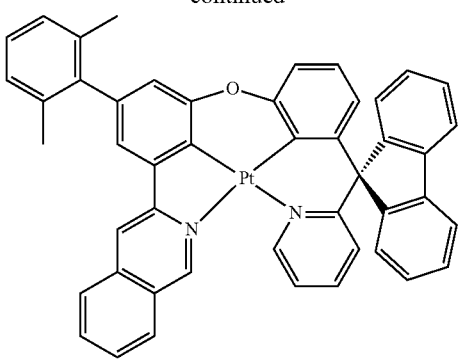
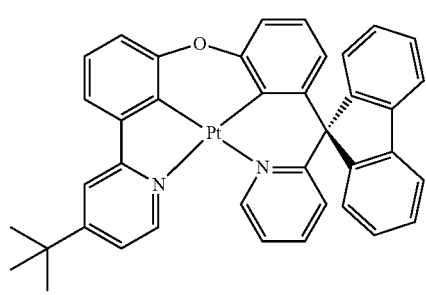
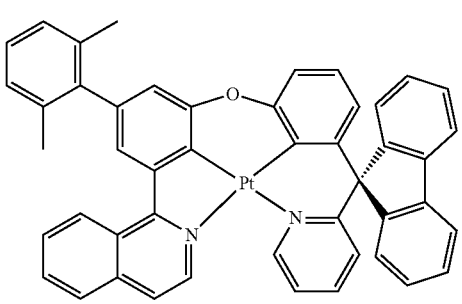
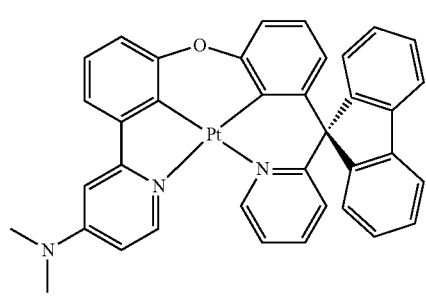
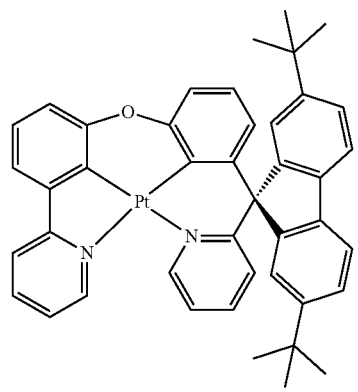
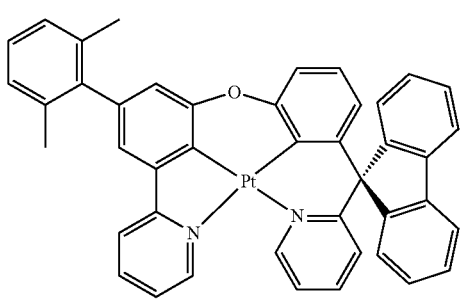
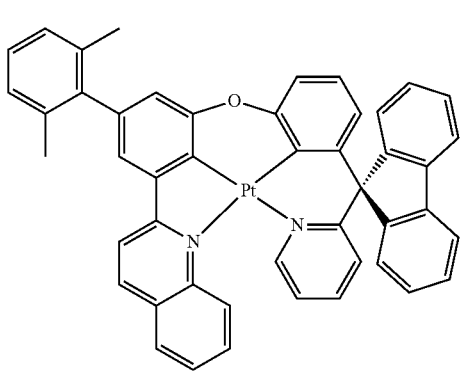
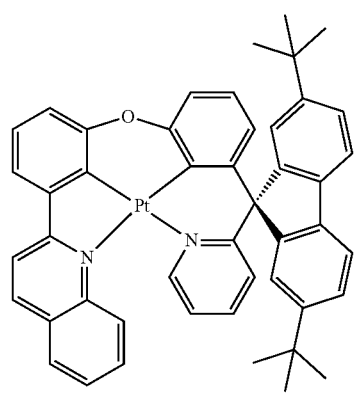

55
-continued
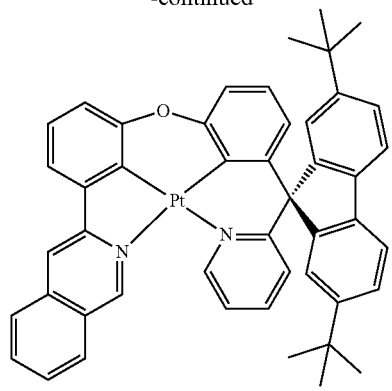
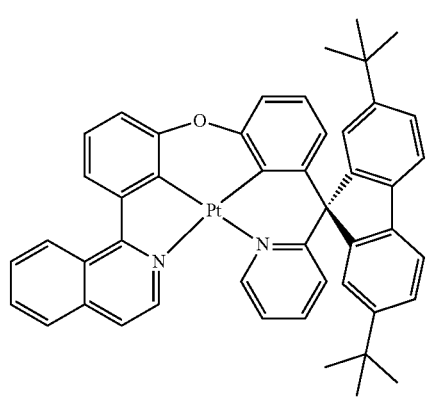
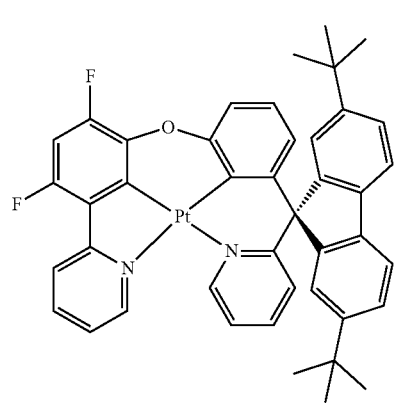
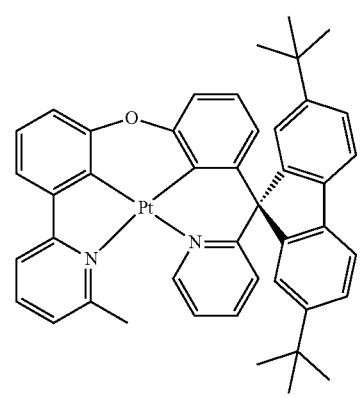
56
-continued
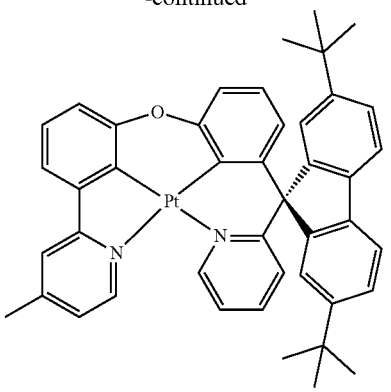
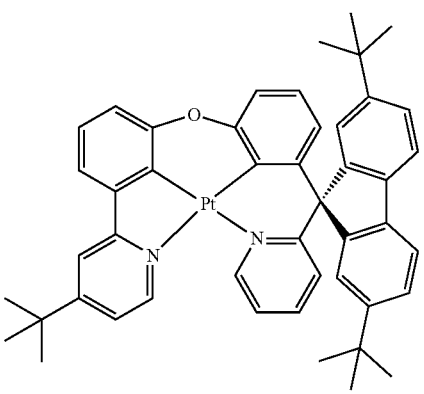
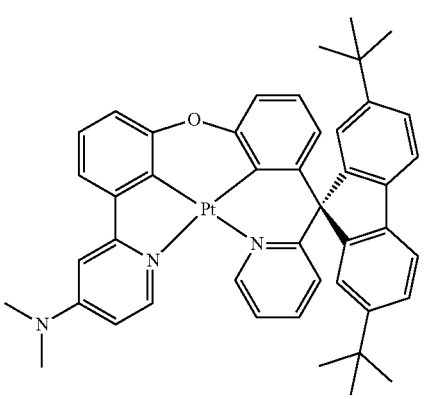
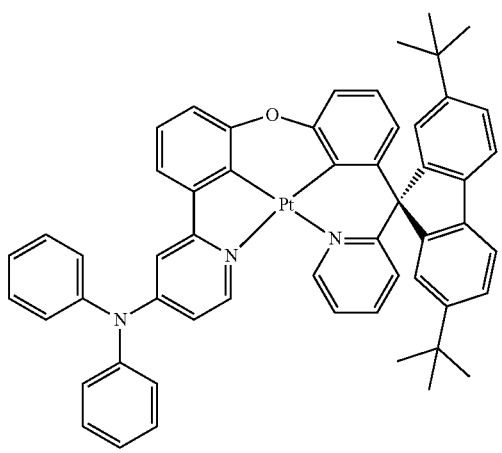

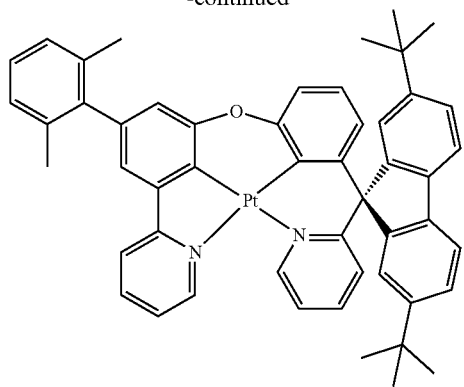
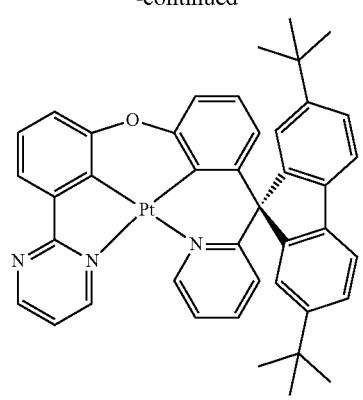
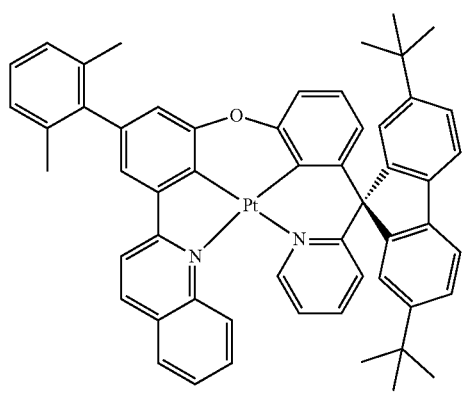
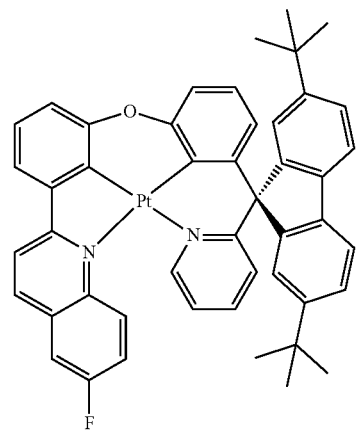
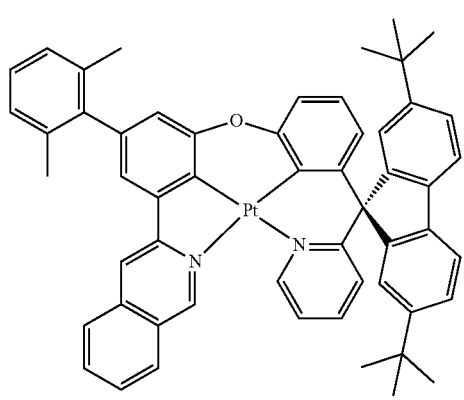
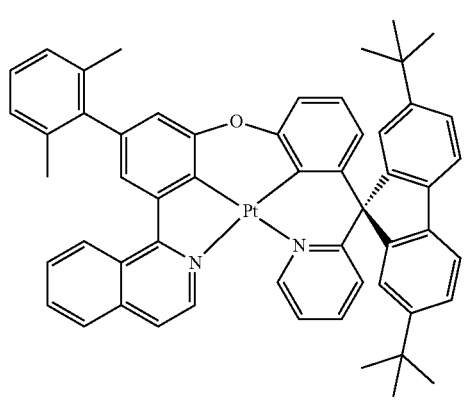
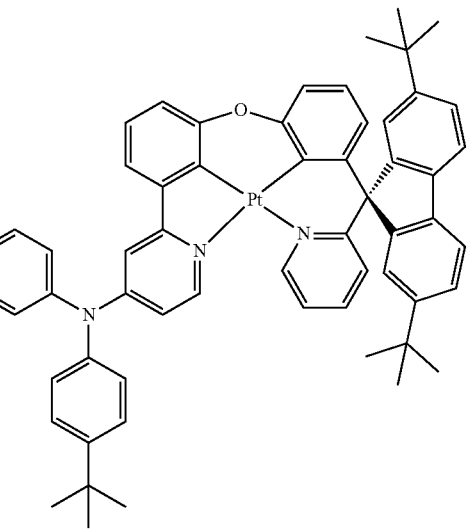

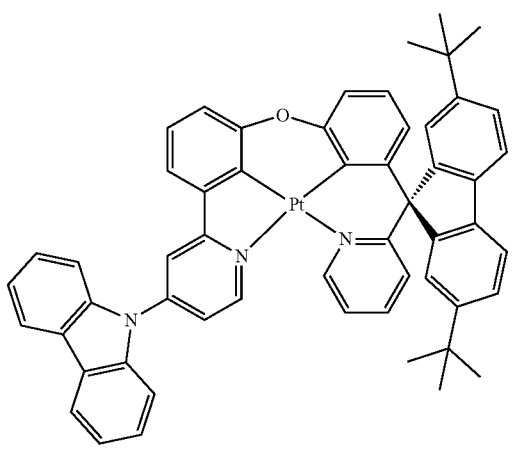
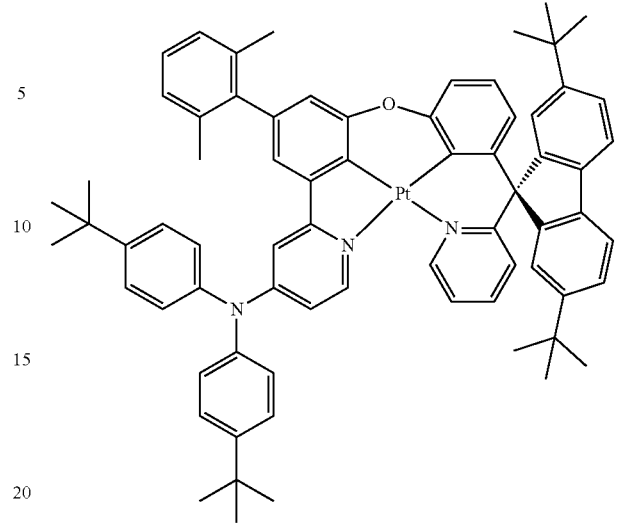
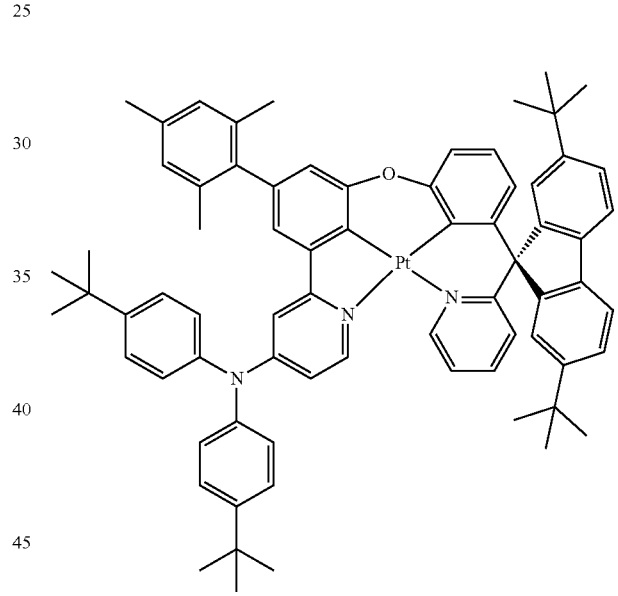
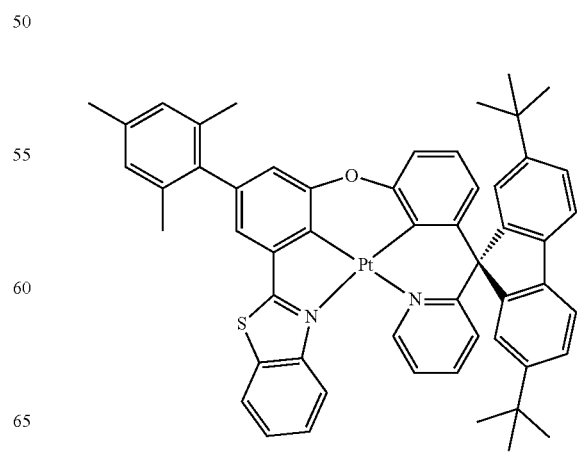

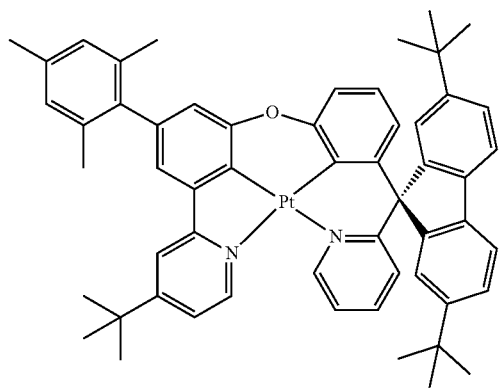
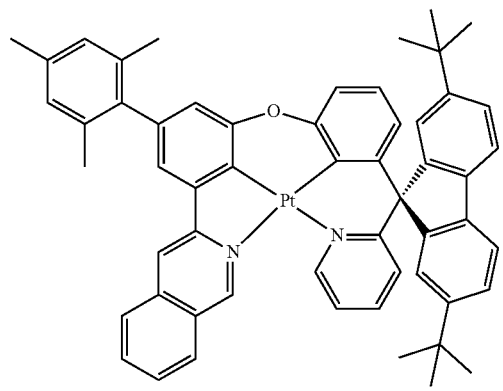
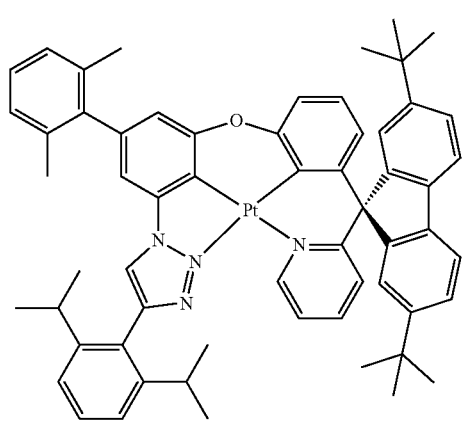
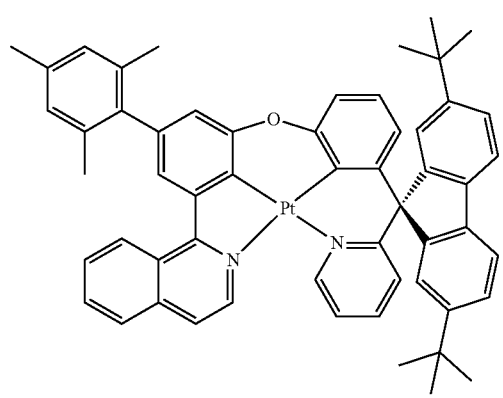
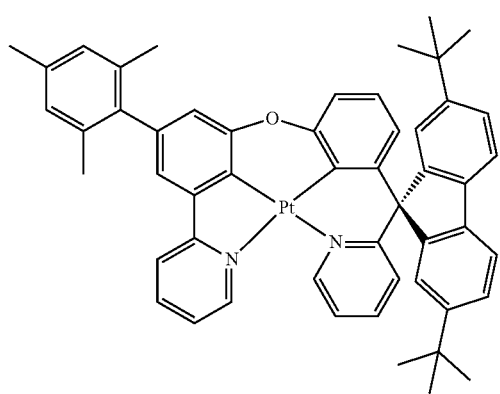
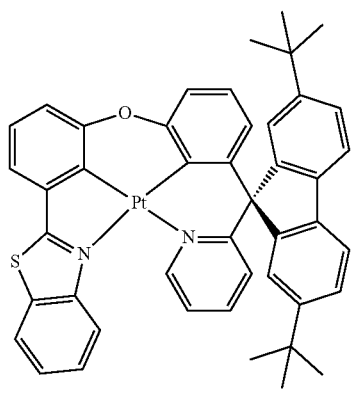
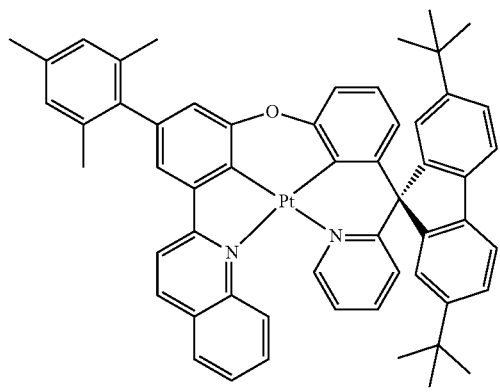
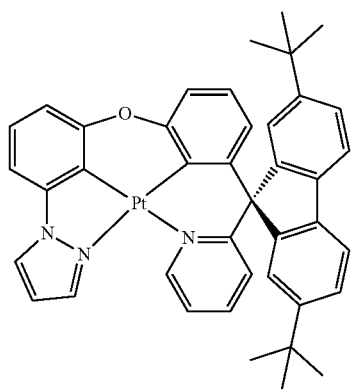

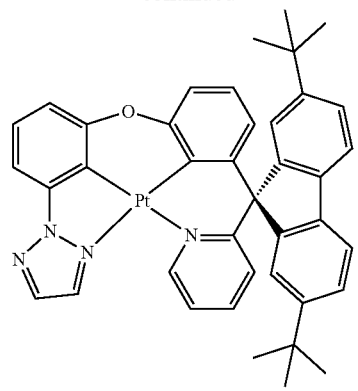
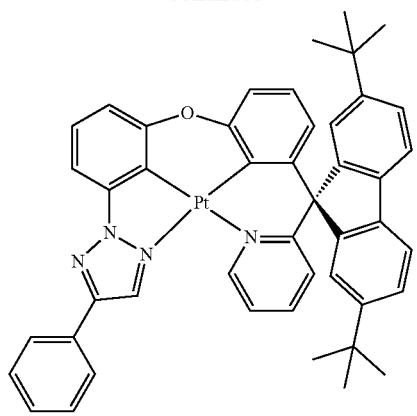
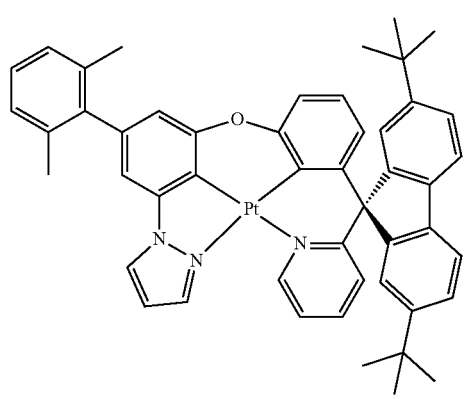
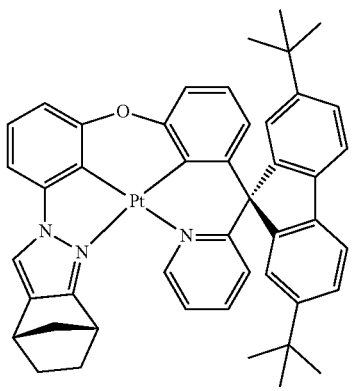
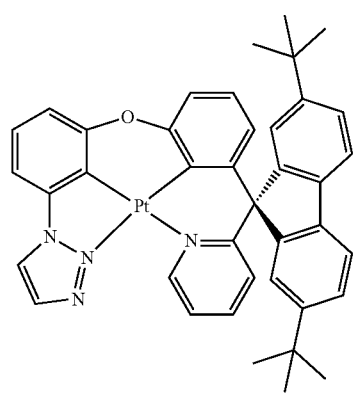
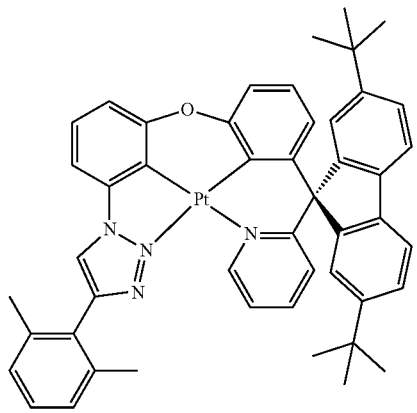
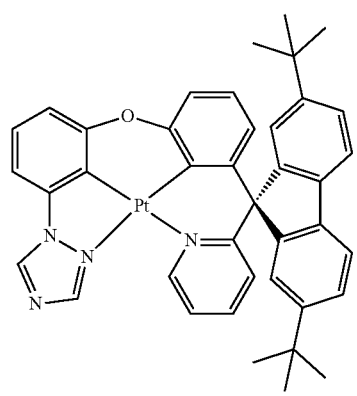
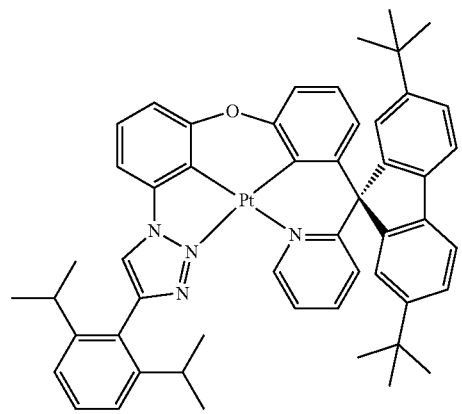

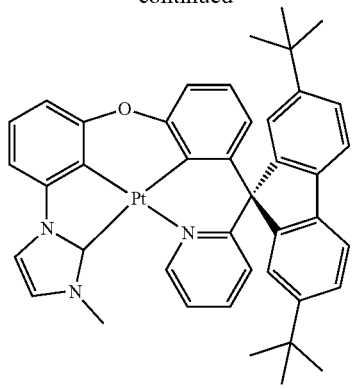
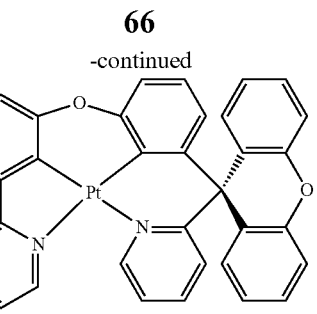
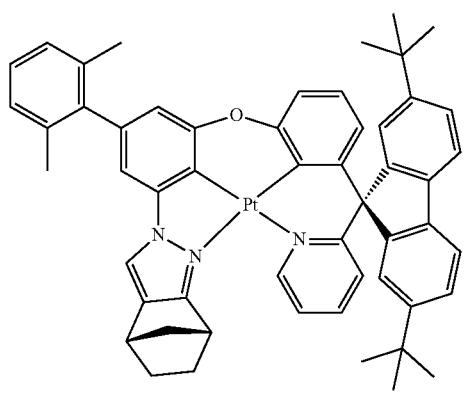
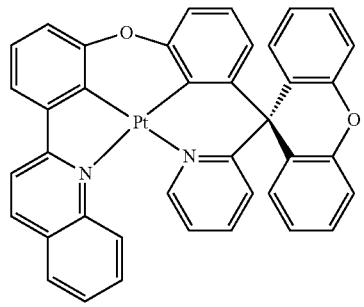
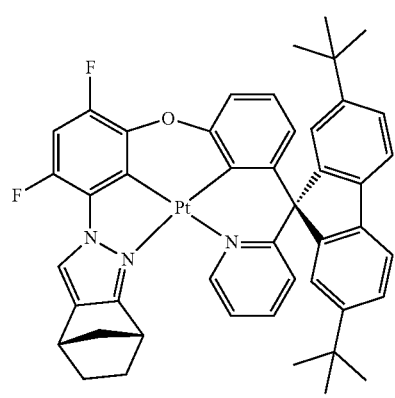
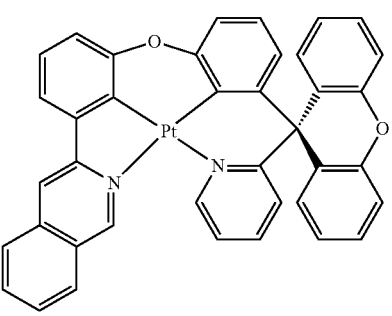
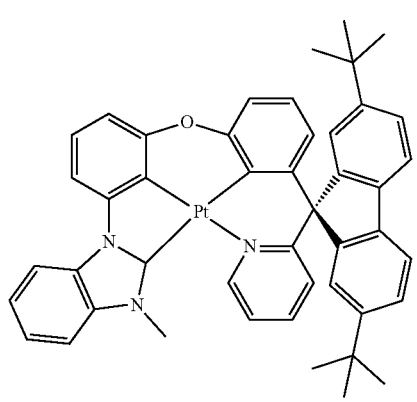
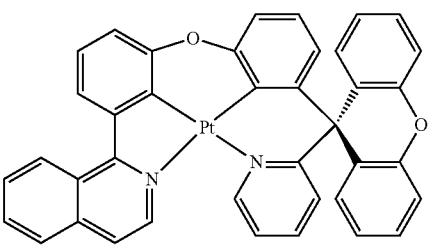
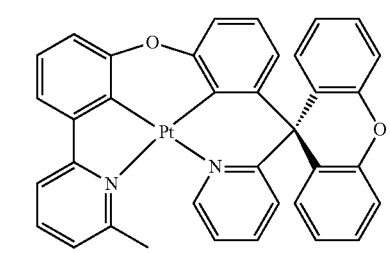

67
-continued
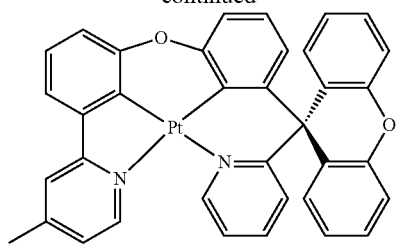
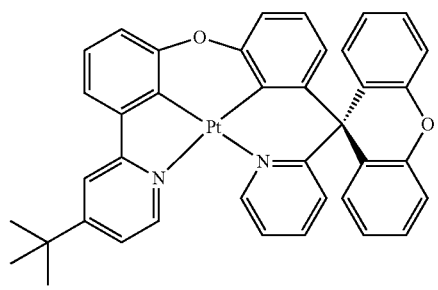
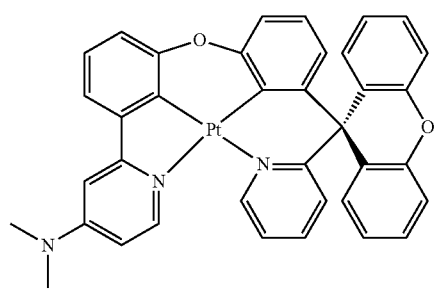
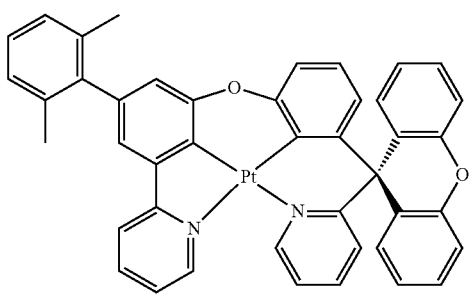
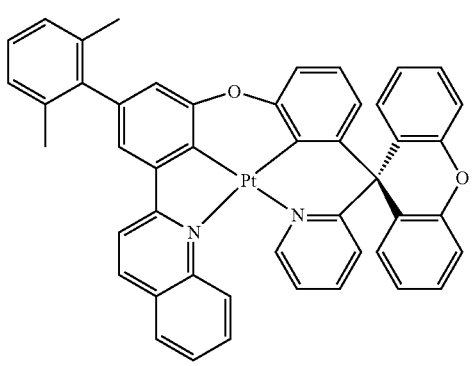
68
-continued
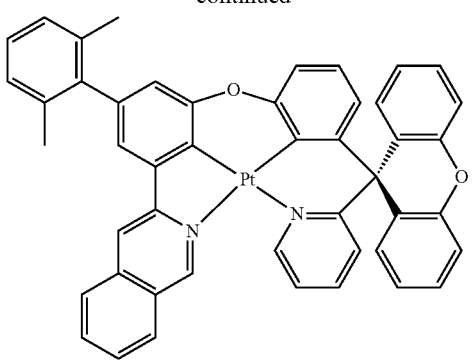
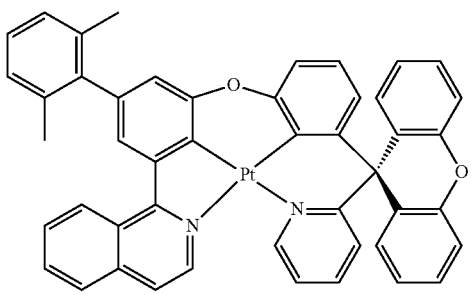
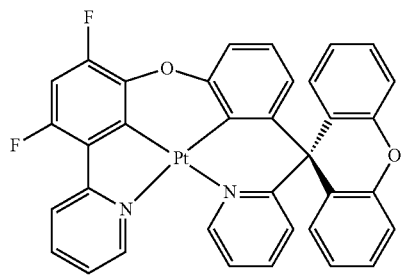
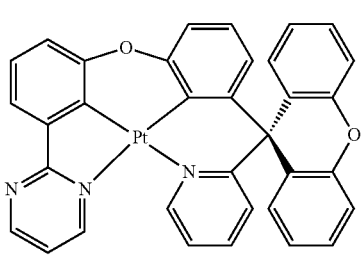

| 69 -continued | 70 -continued |
|---|---|
| 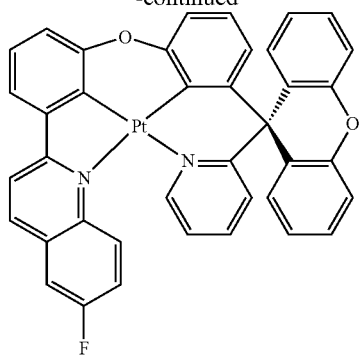 | 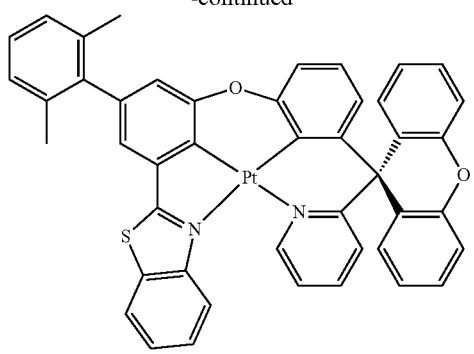 |
| 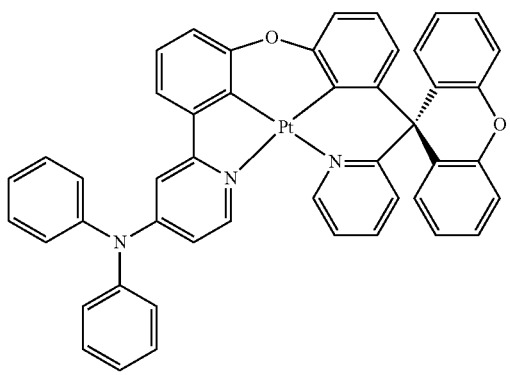 | 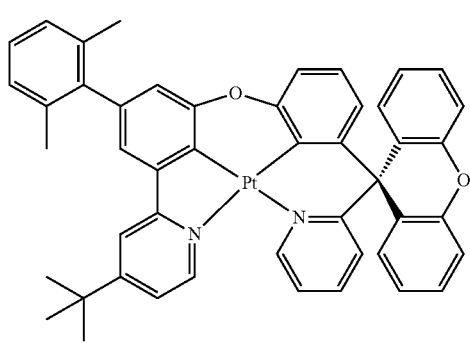 |
| 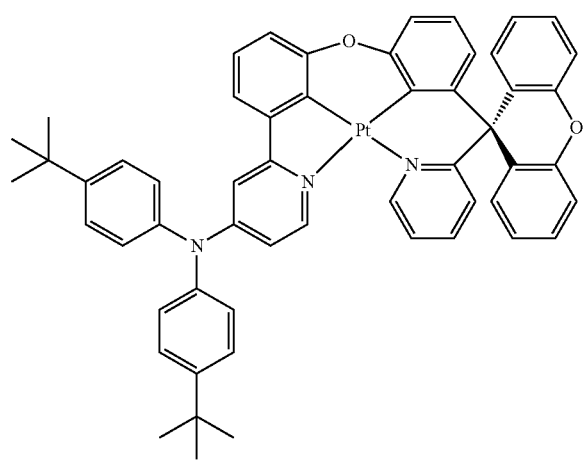 | 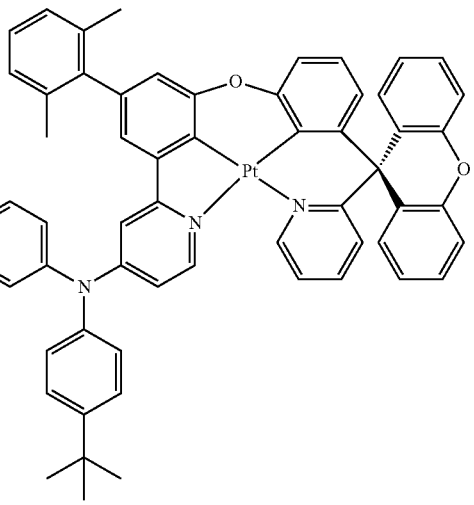 |
| 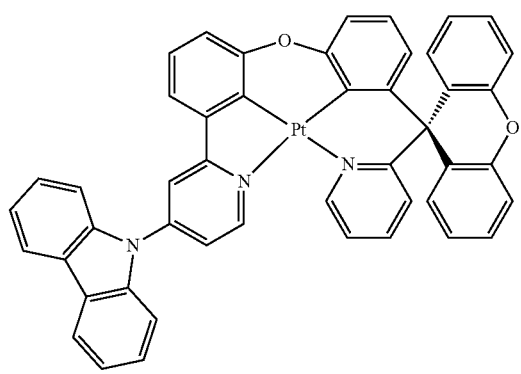 | 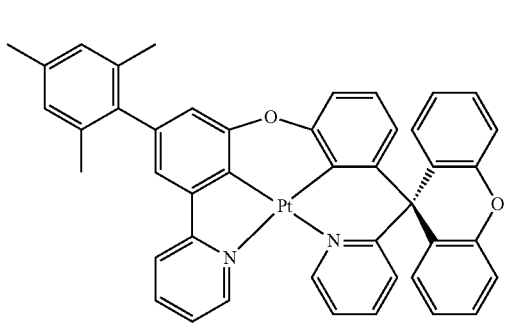 |

71
-continued
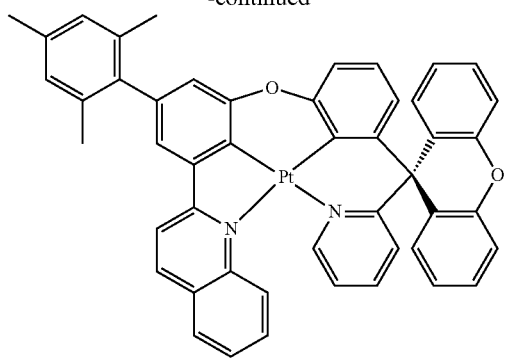
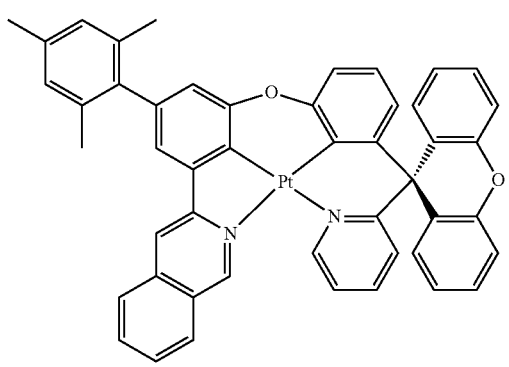
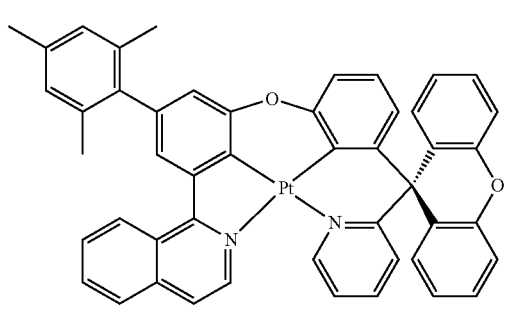
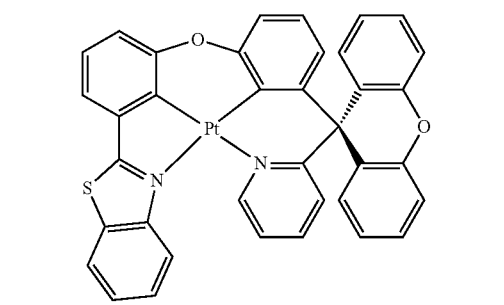
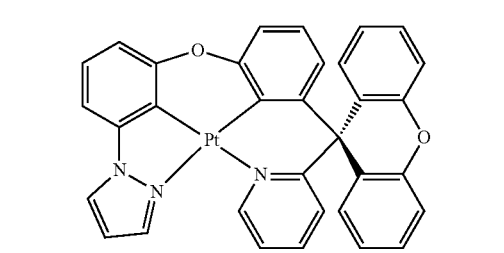
72
-continued
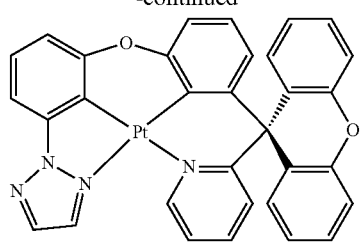
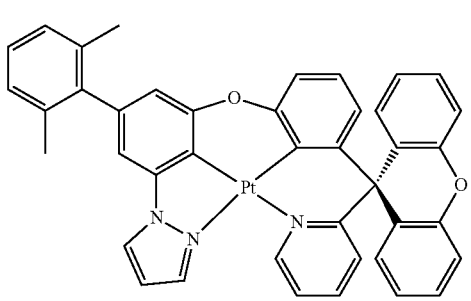
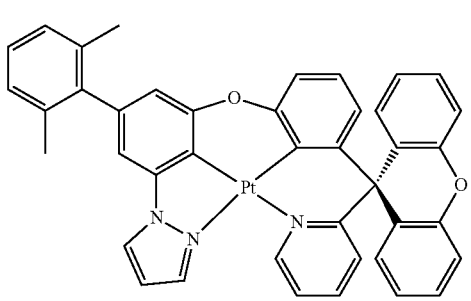
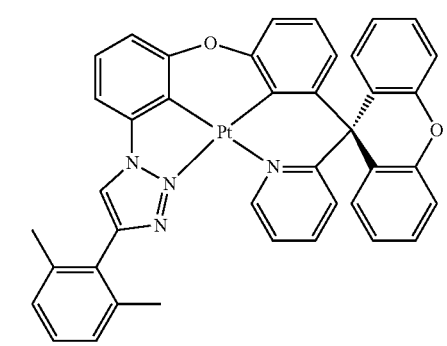
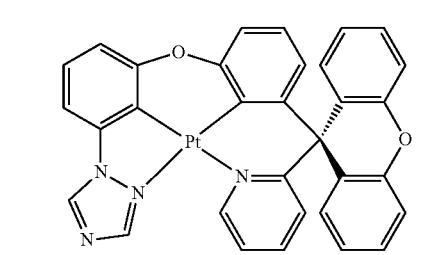

73
-continued
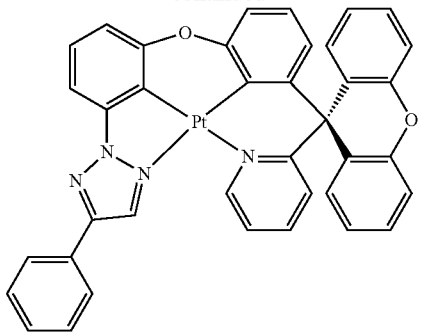
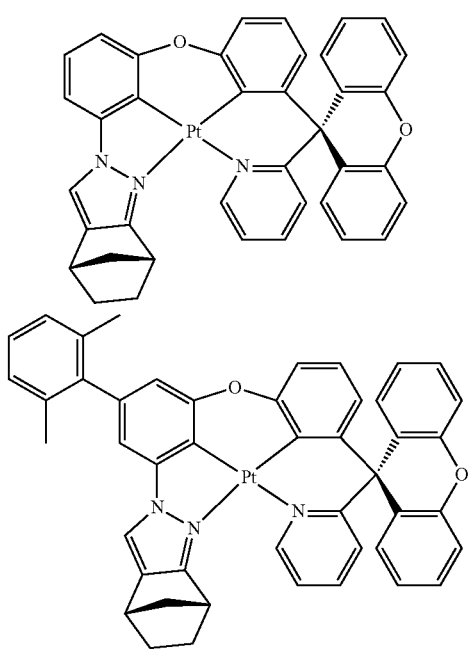
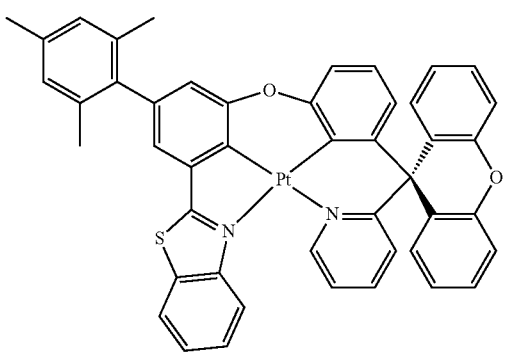
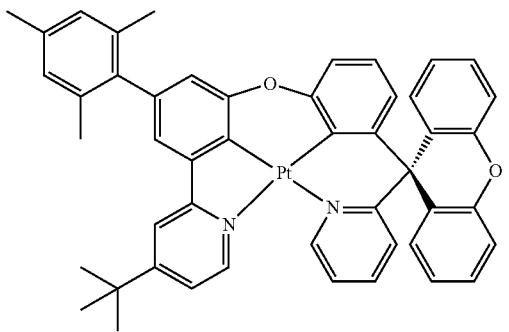
74
-continued
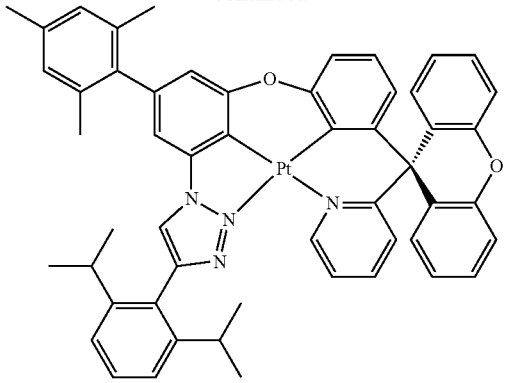
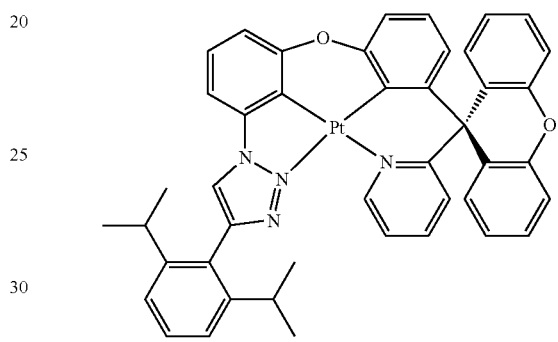
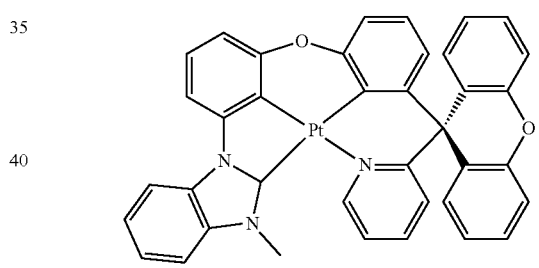
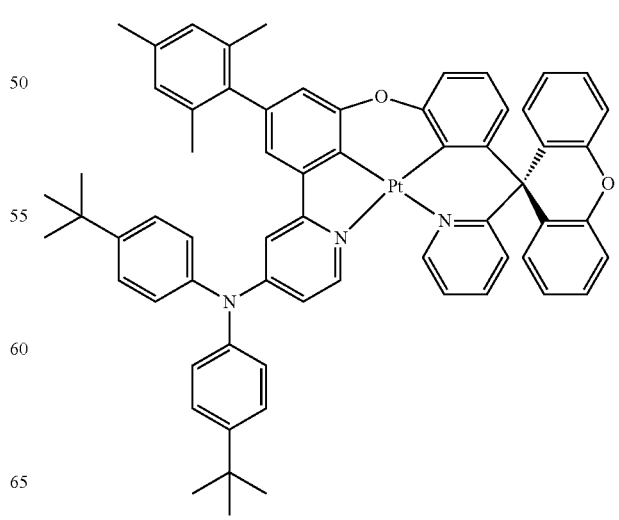

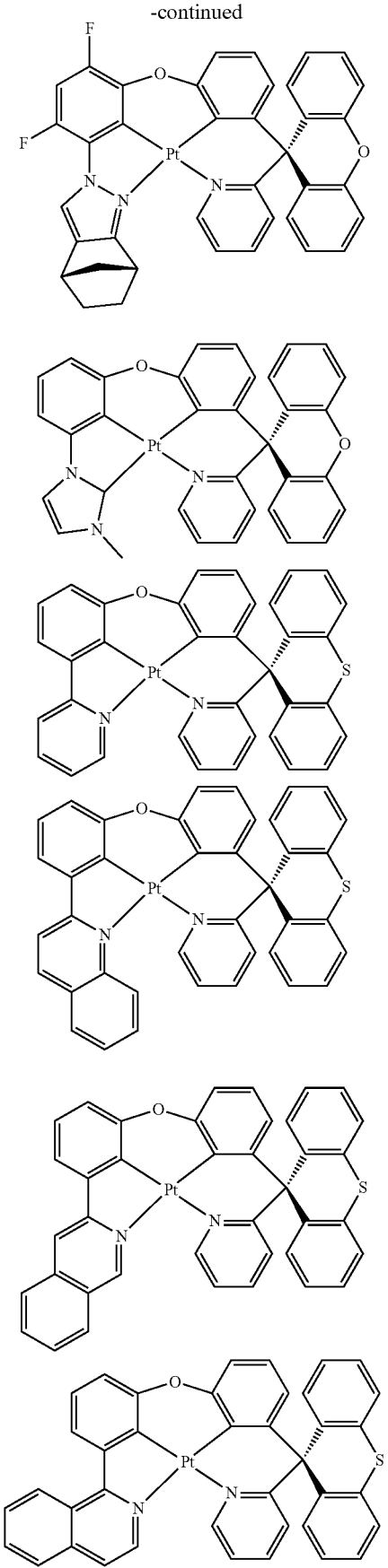
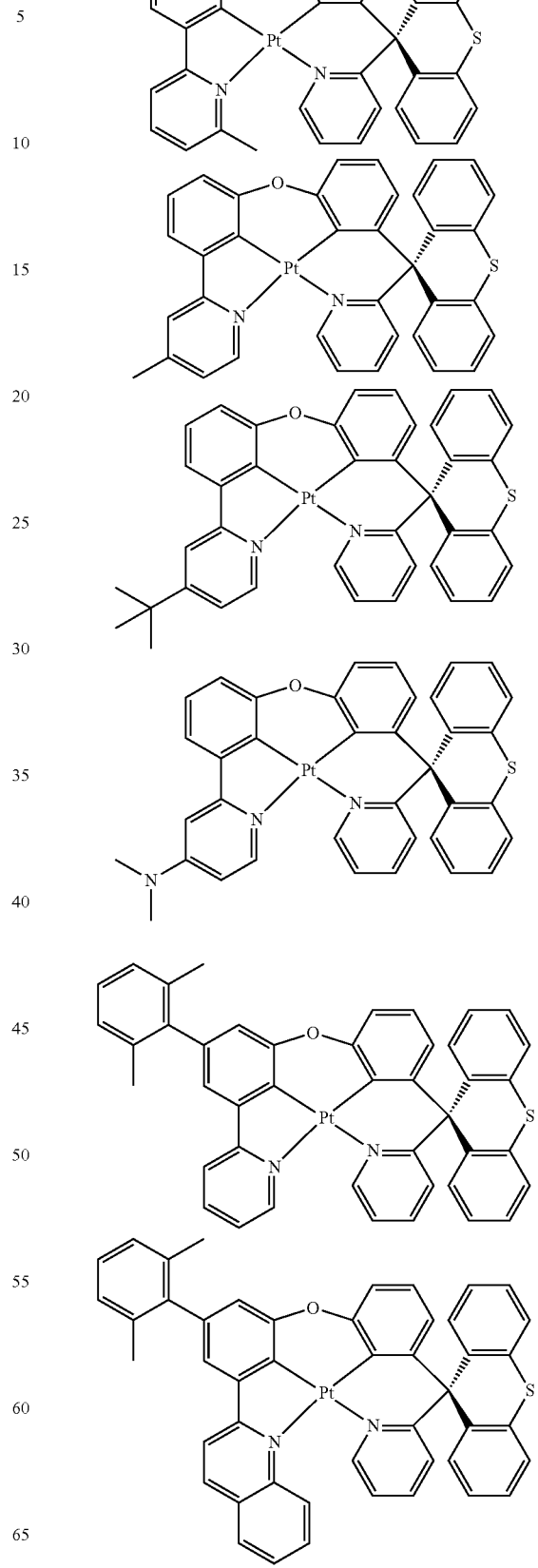

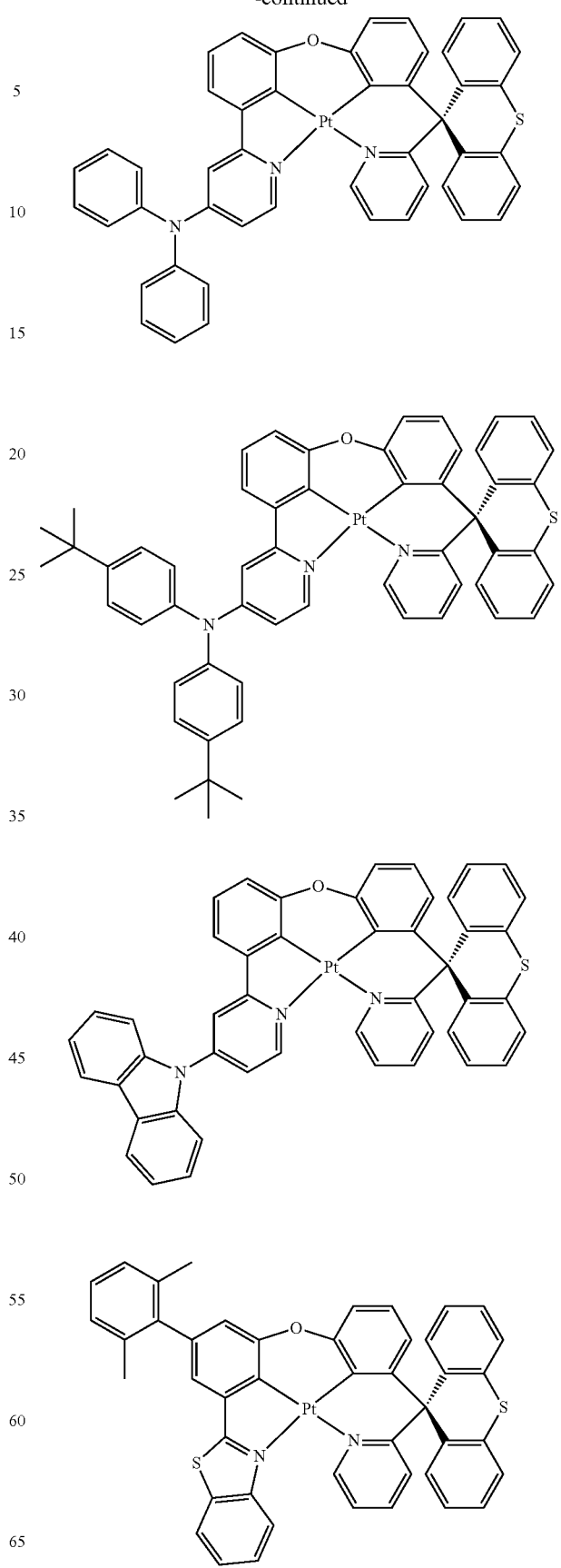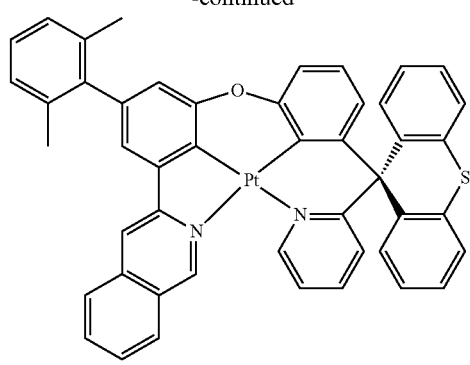

79
-continued
80
-continued
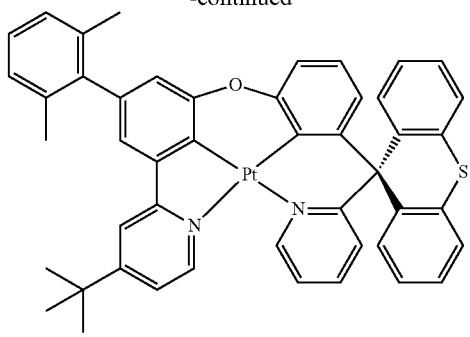
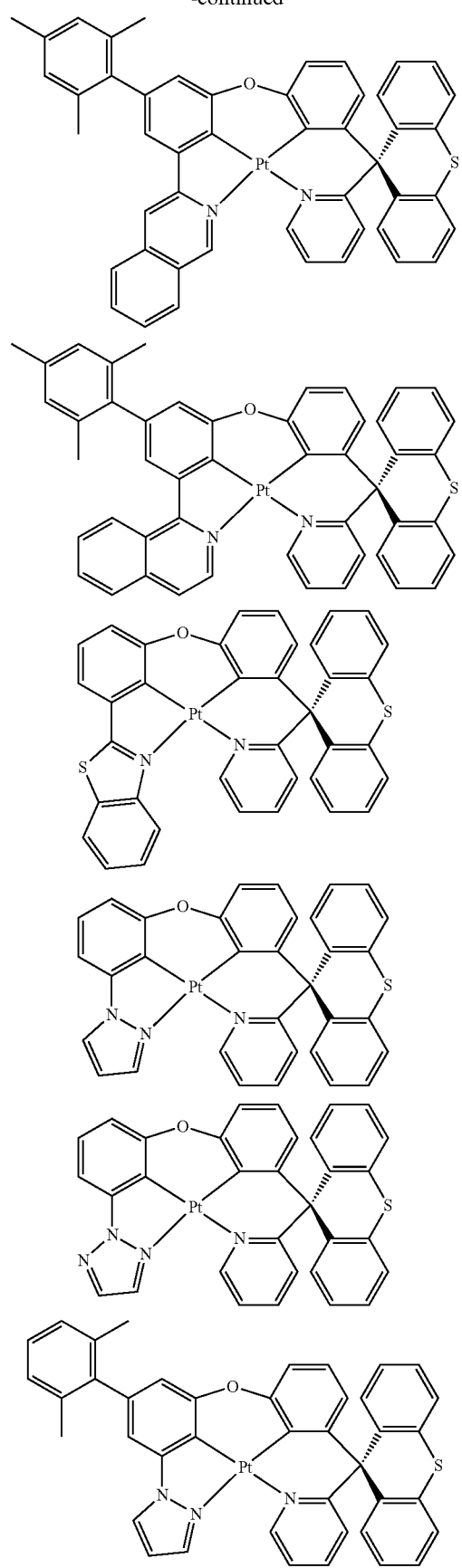

81
-continued
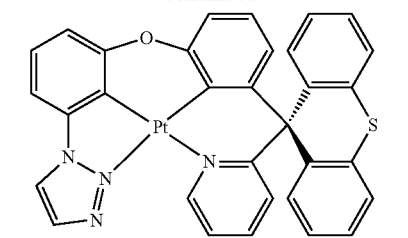
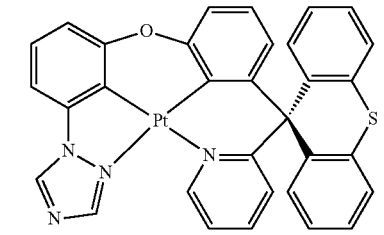
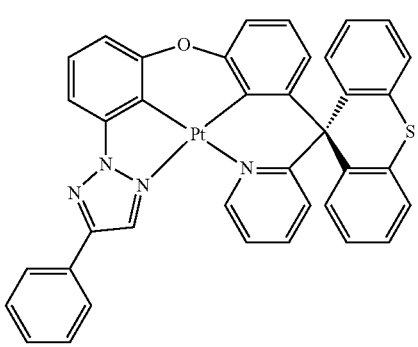
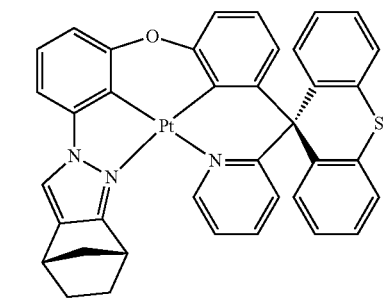
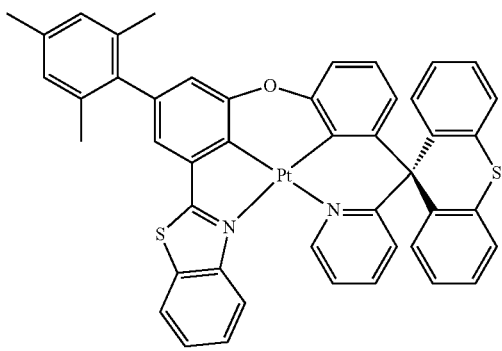
82
-continued
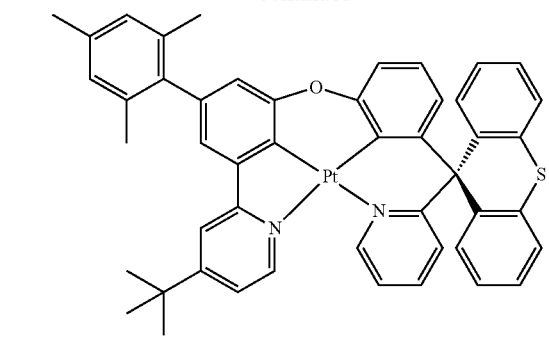
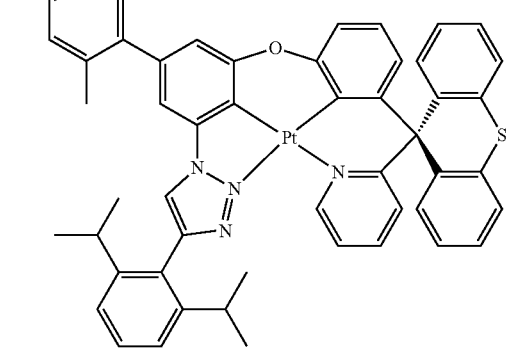
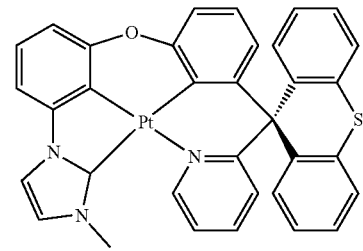
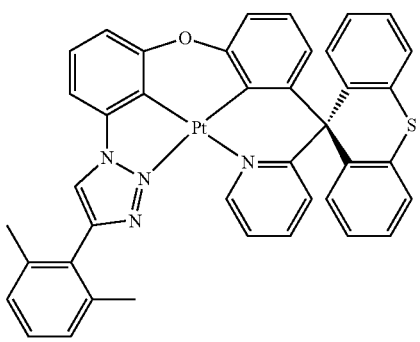
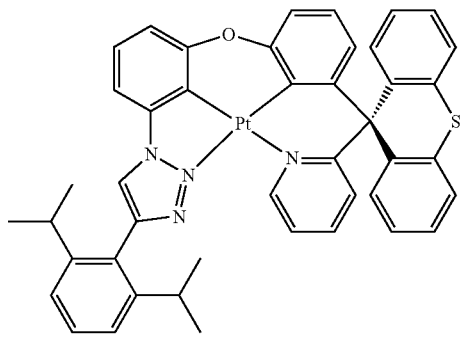

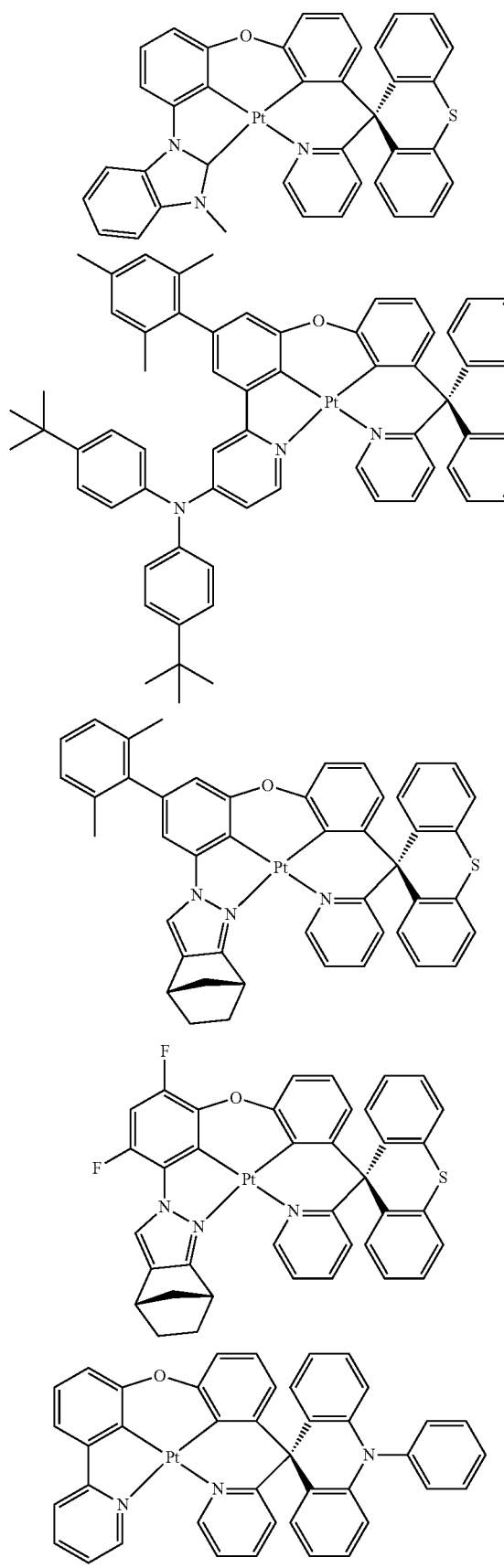
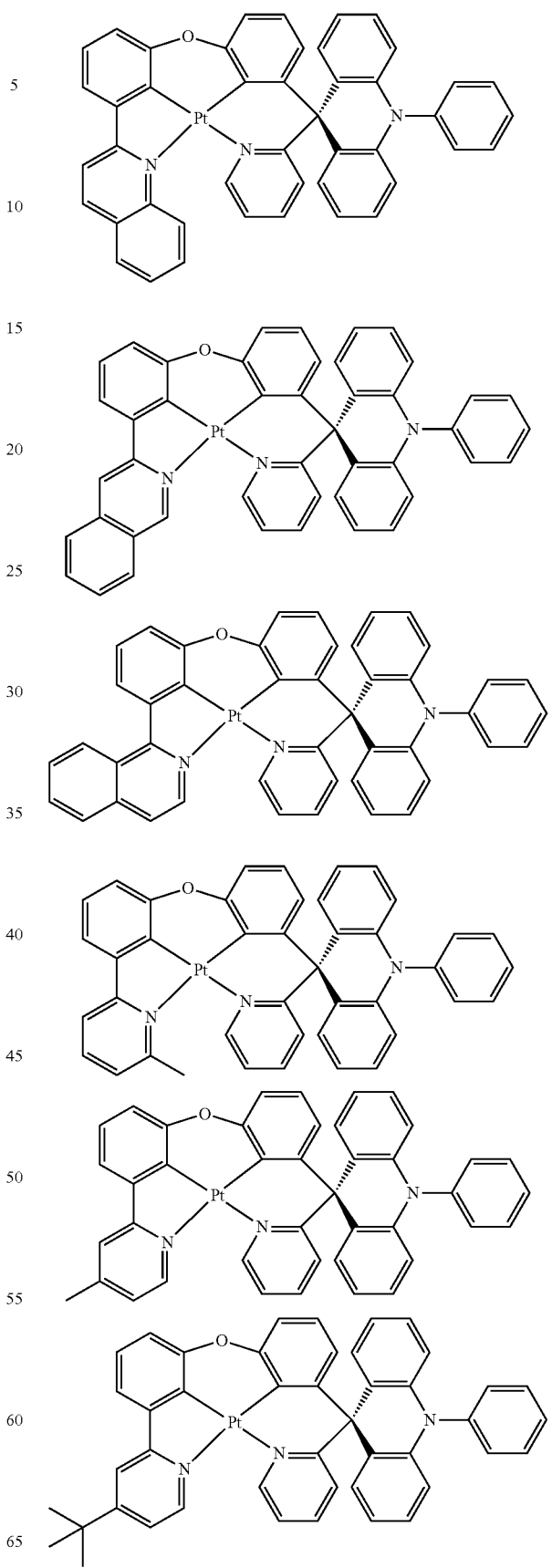

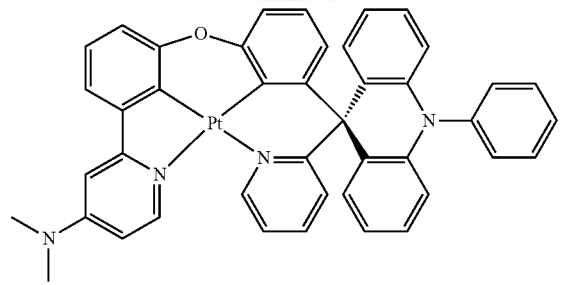
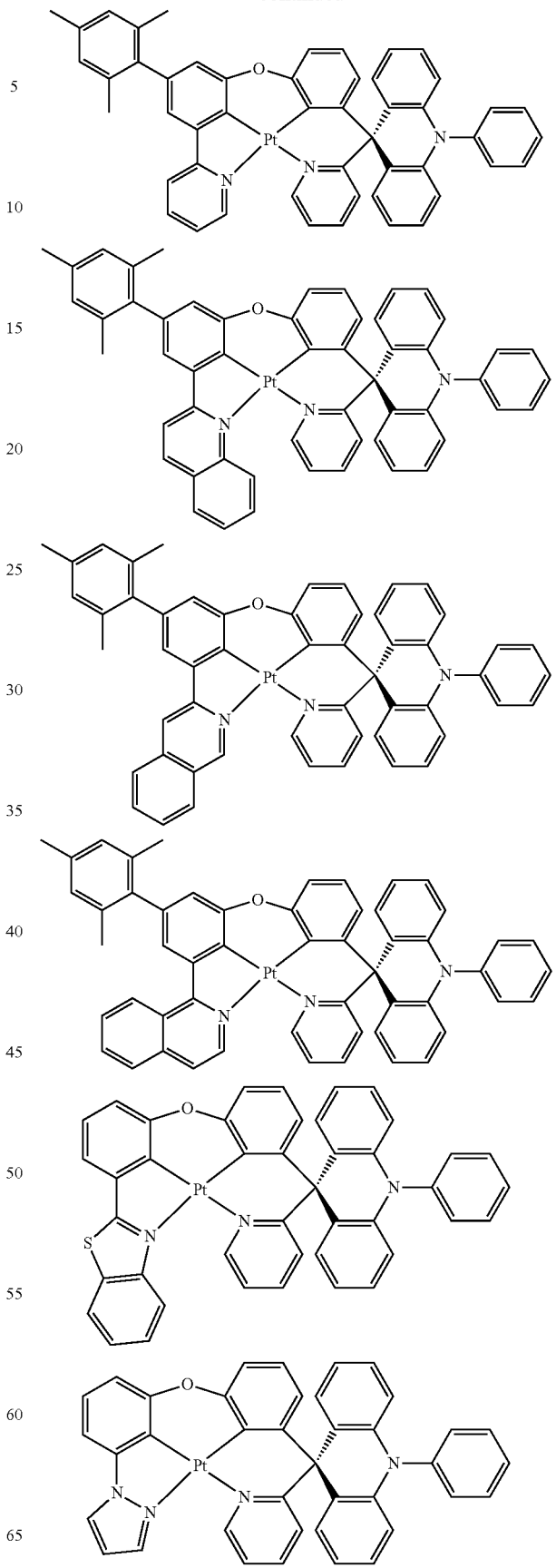

87
-continued
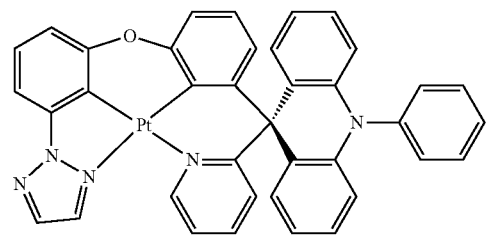
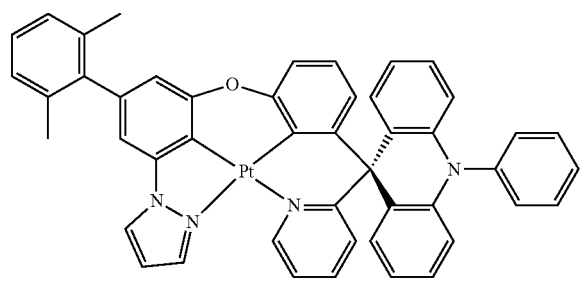
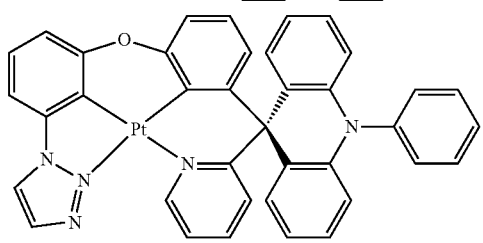
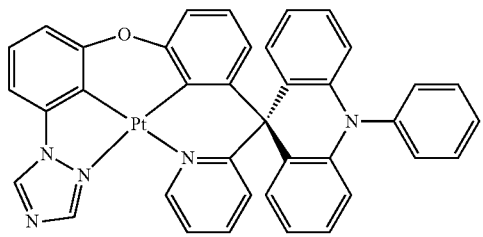
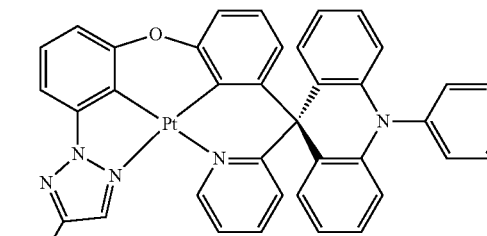
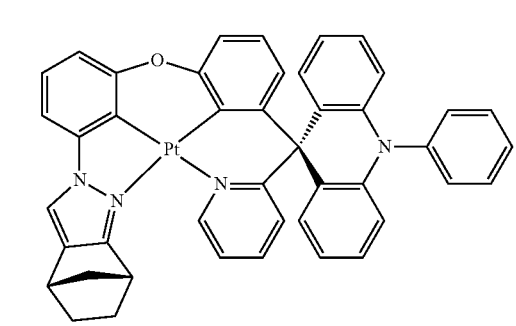
88
-continued
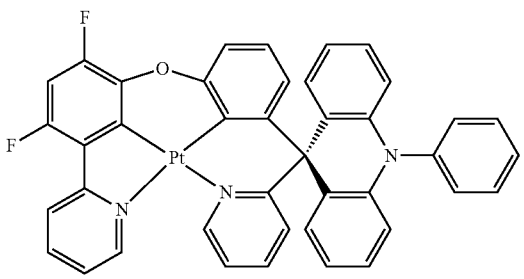
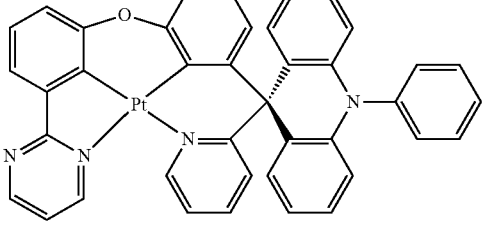
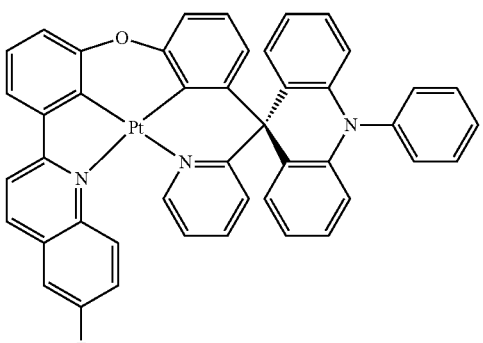
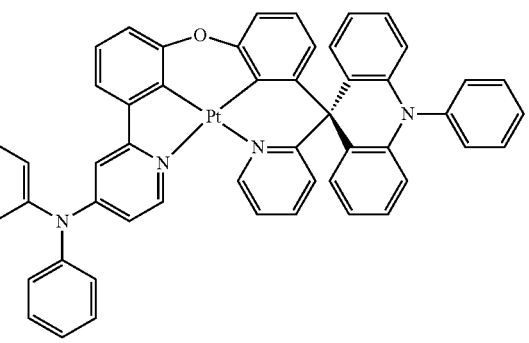
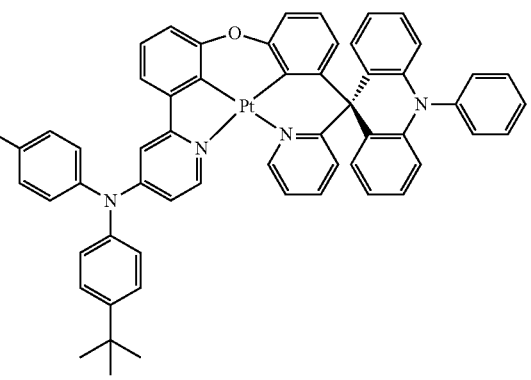

89
-continued
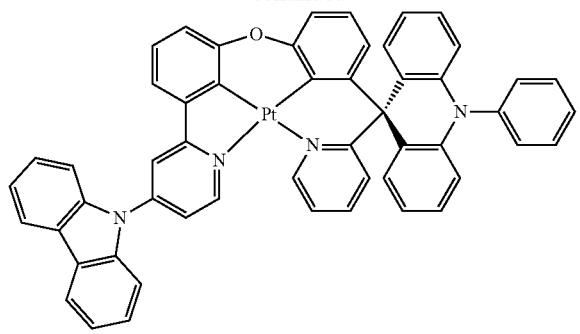
90
-continued
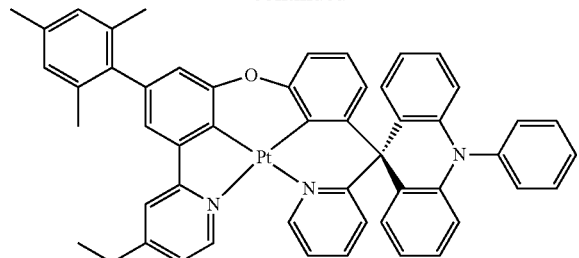
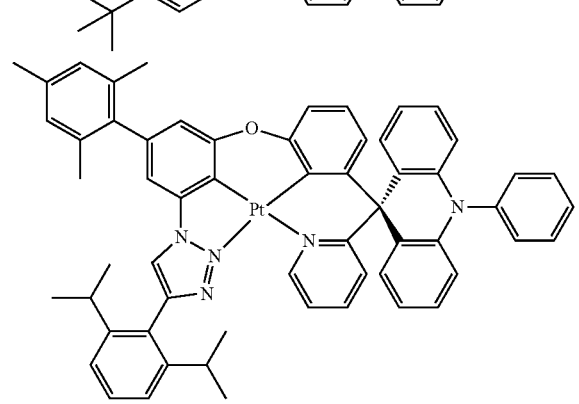
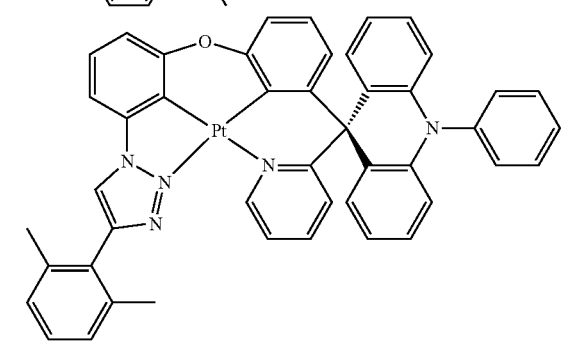
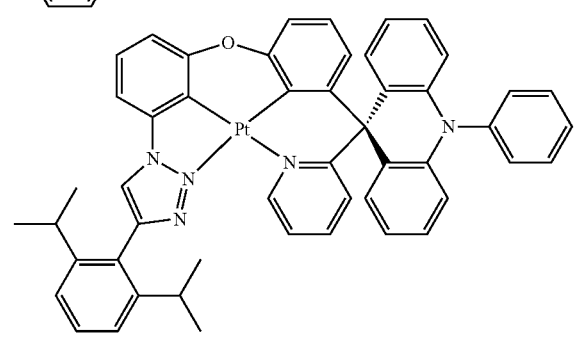
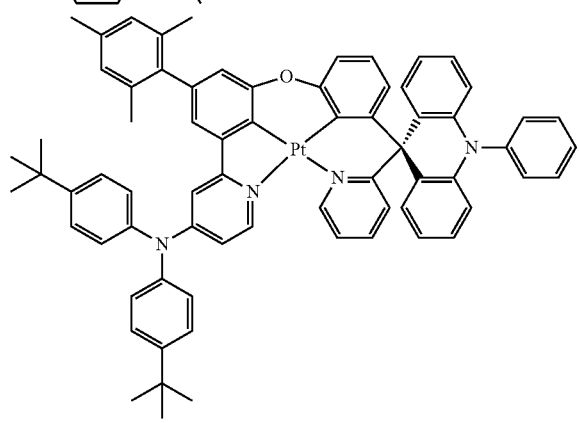

91
-continued
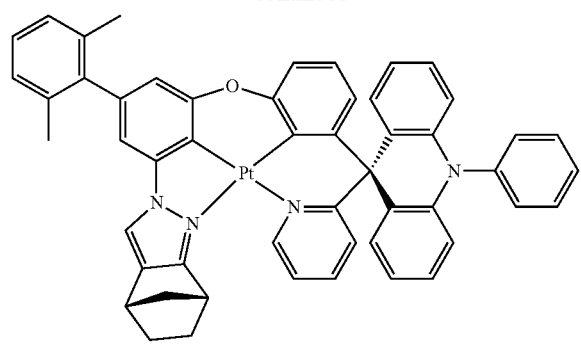
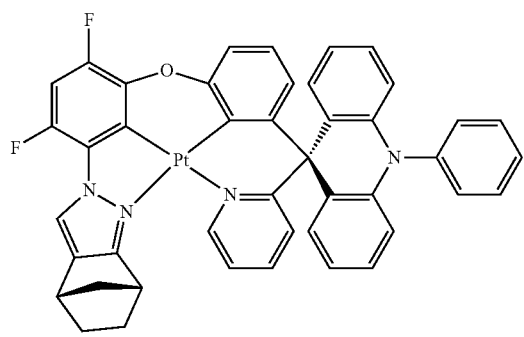
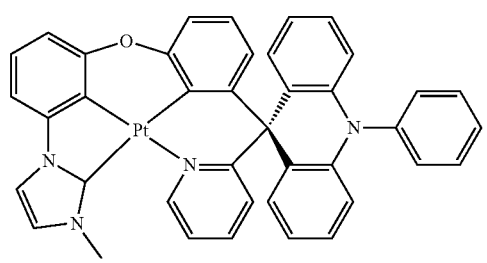
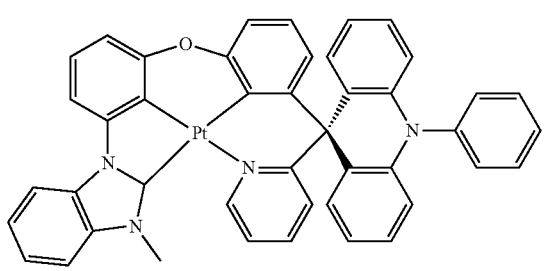
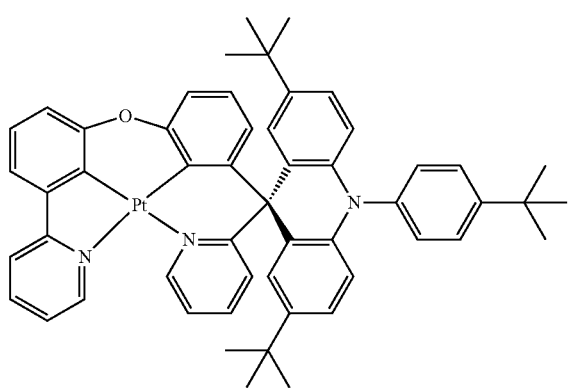
92
-continued
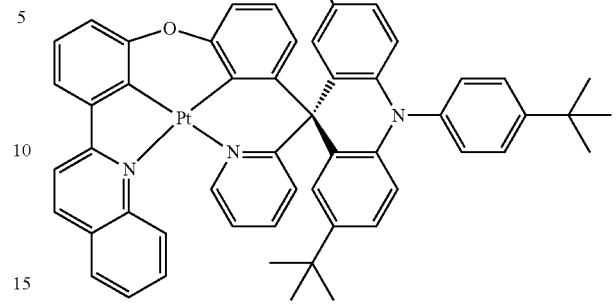
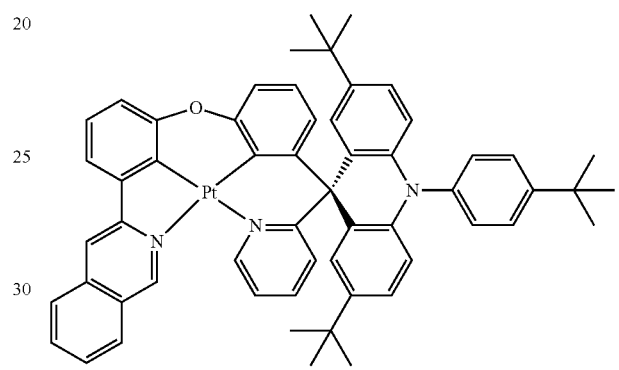
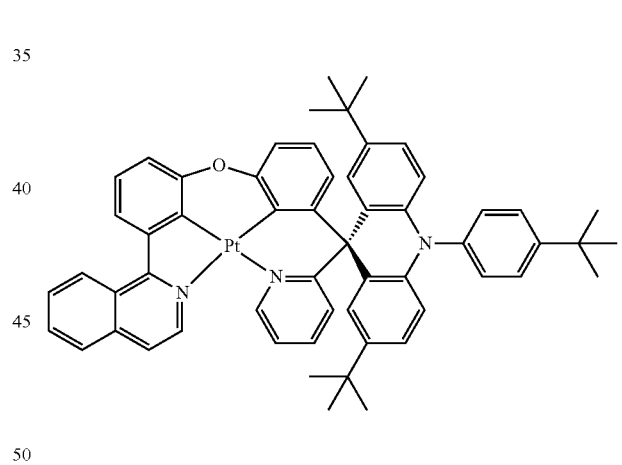
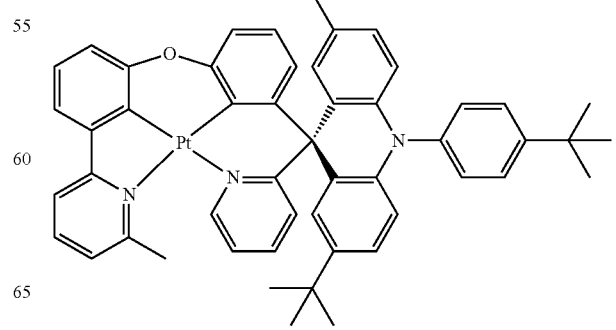

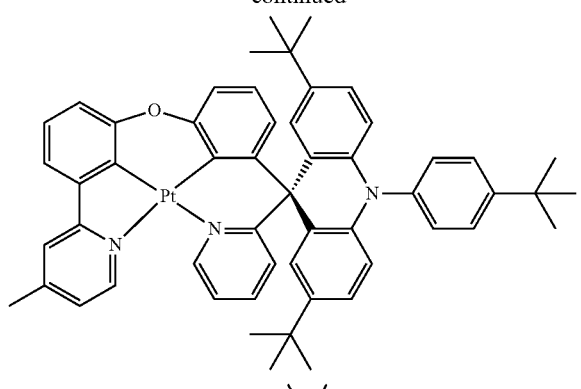
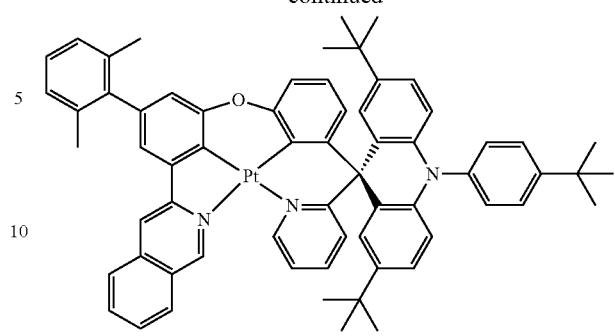
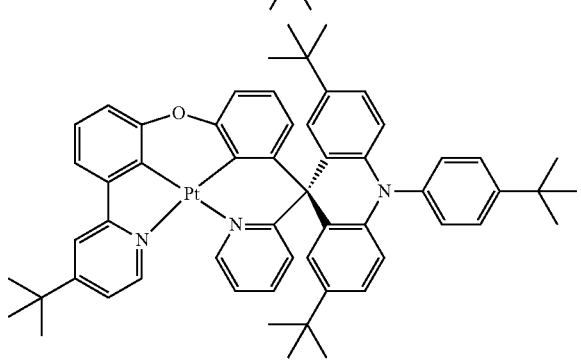
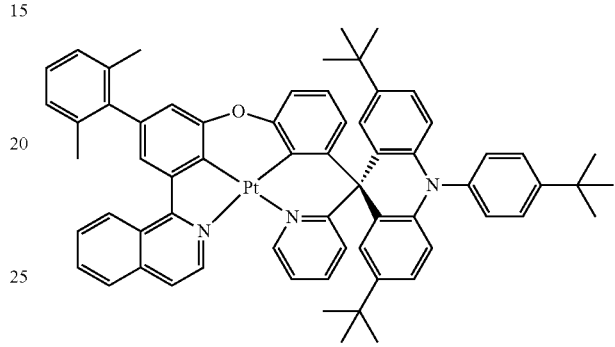
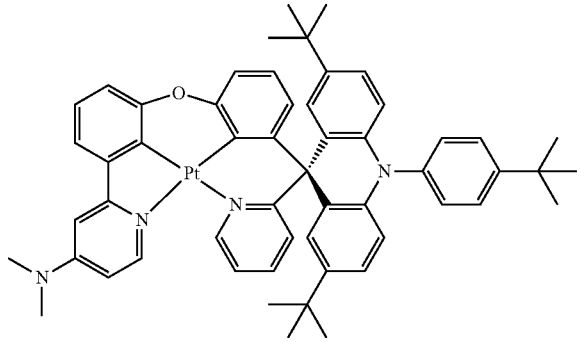
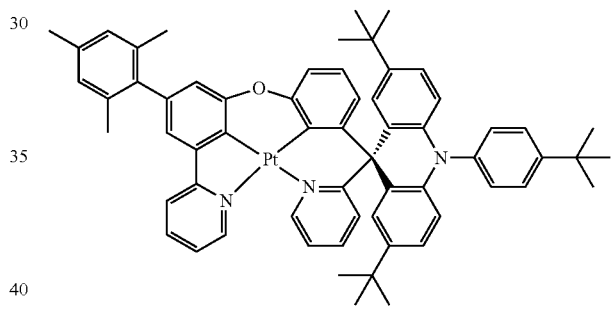
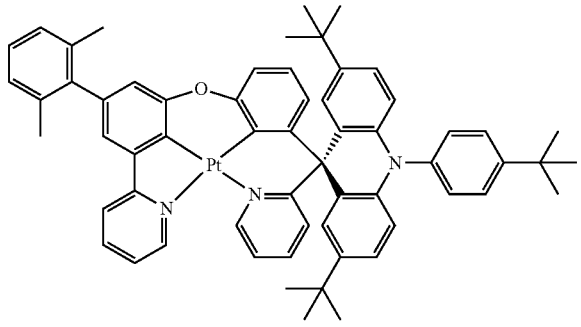
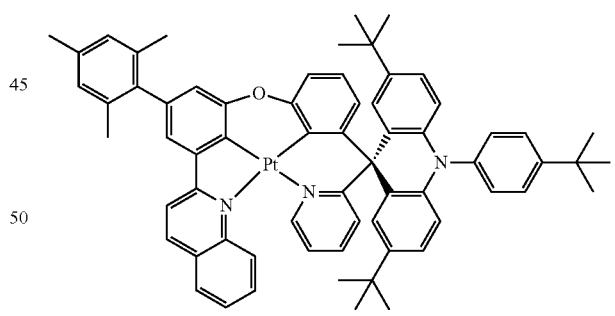
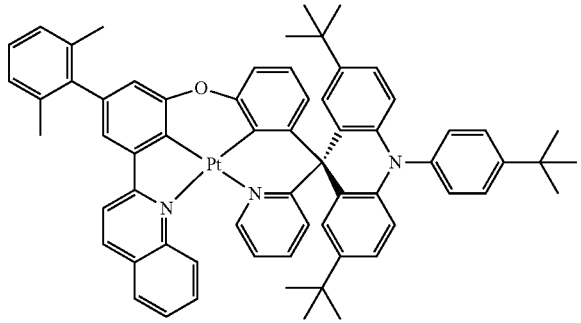
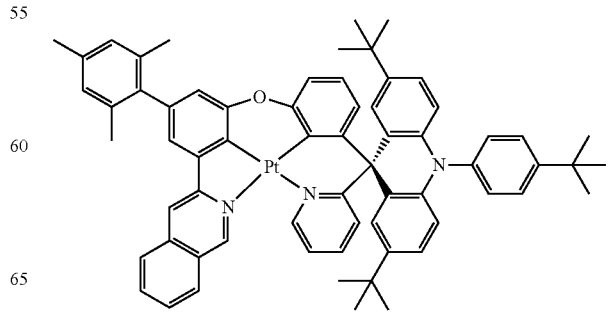

95
-continued
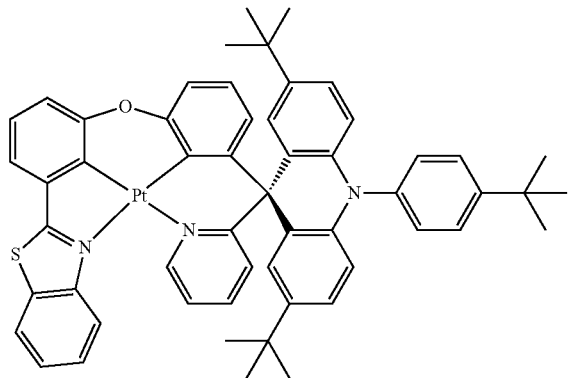
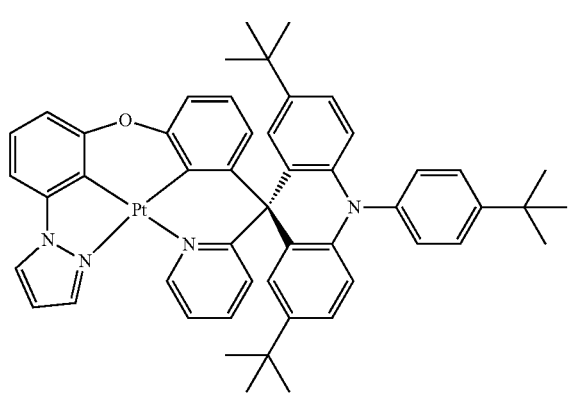
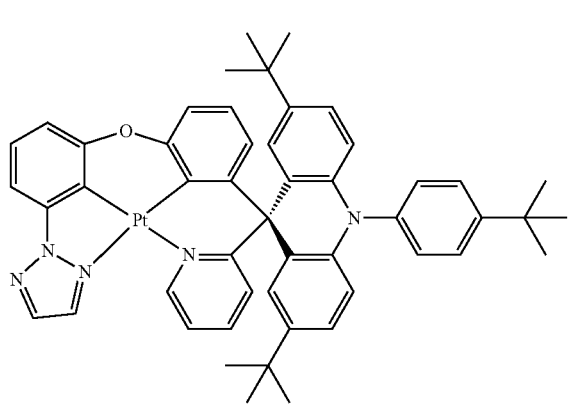
96
-continued
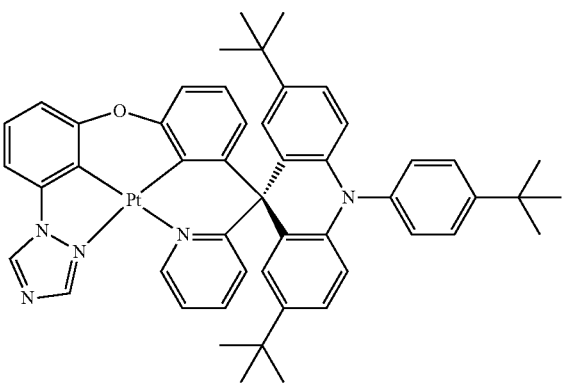
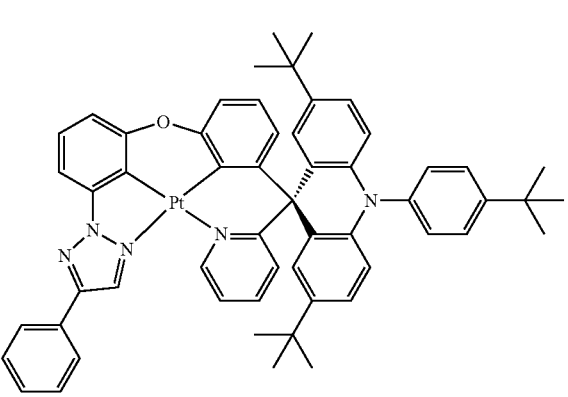
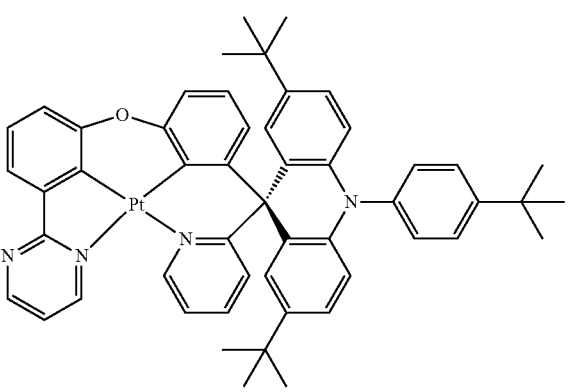

-continued
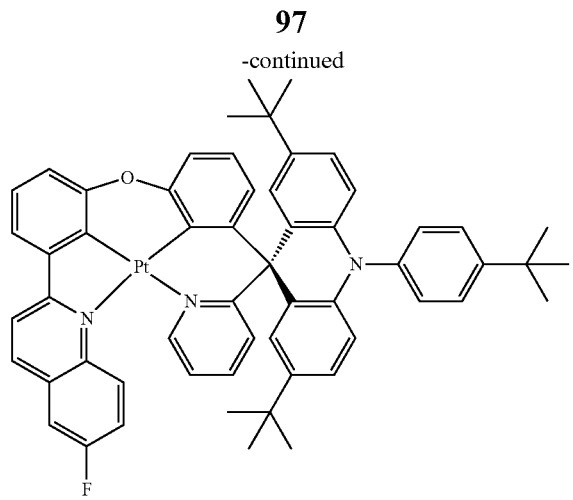
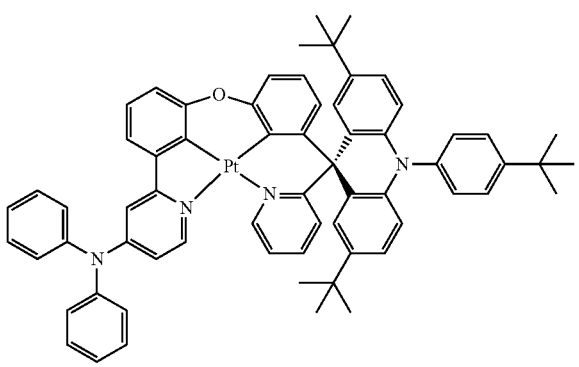
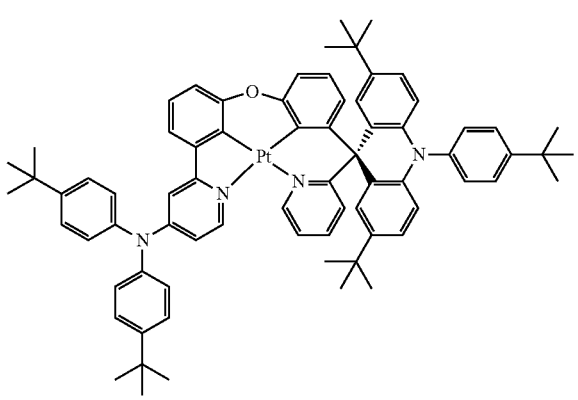
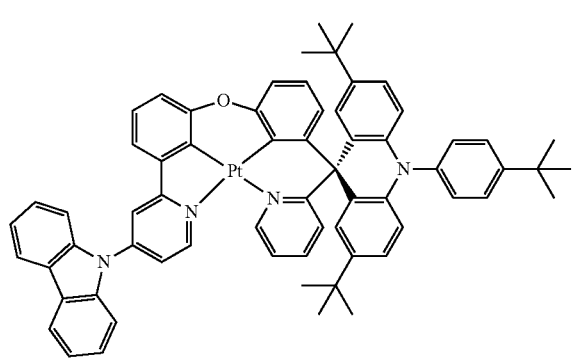
-continued
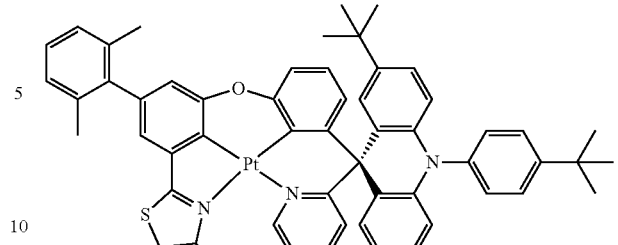
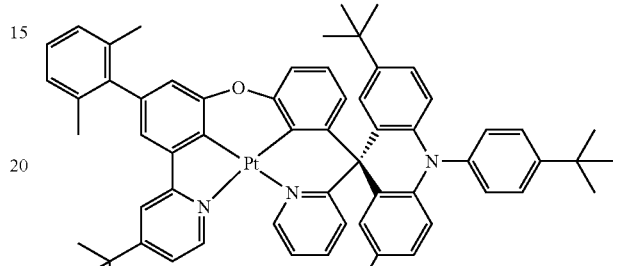
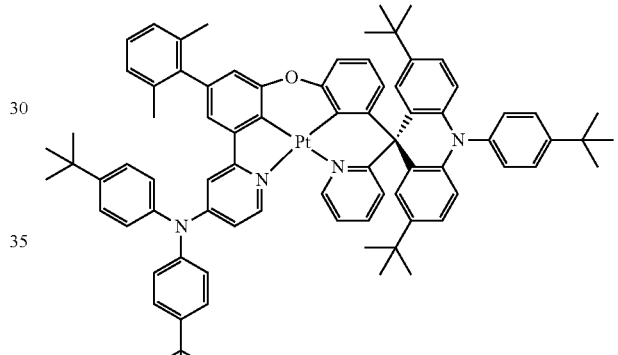
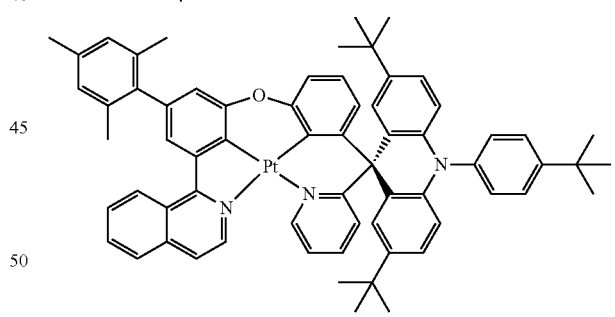
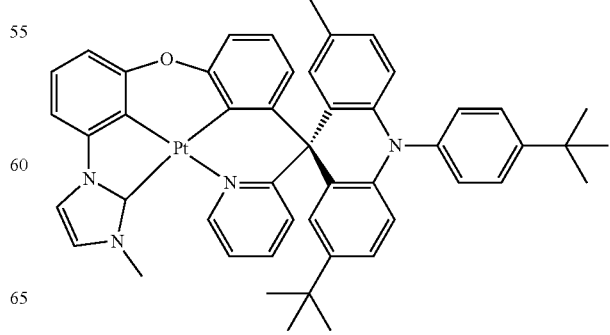

99
-continued
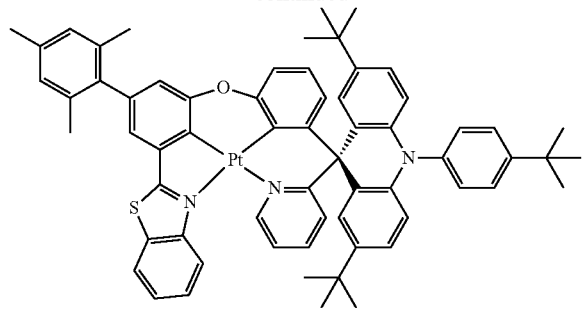
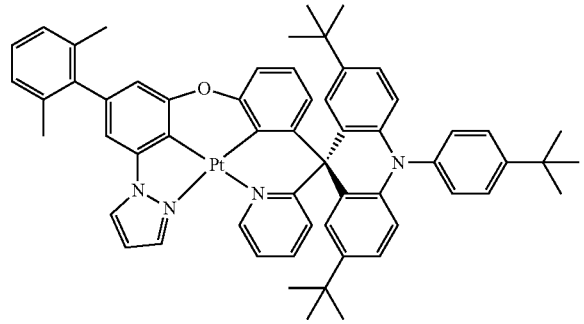
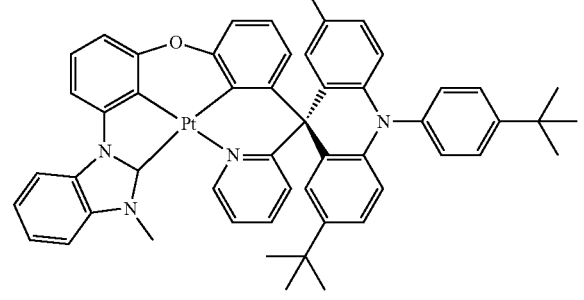
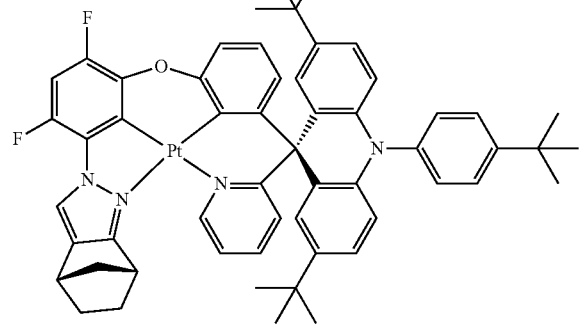
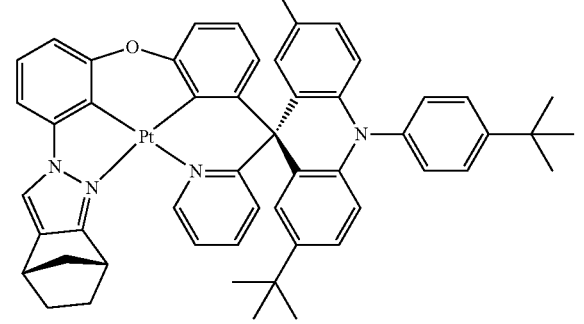
100
-continued
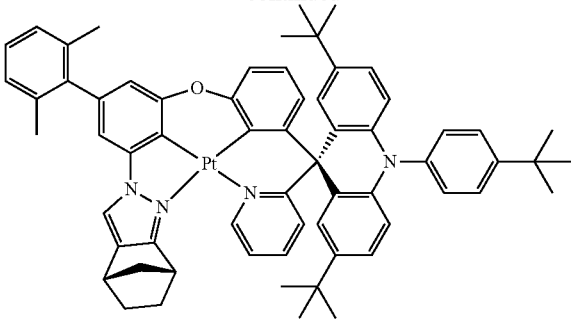
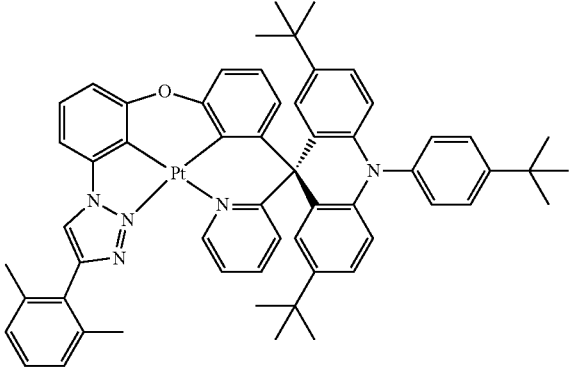
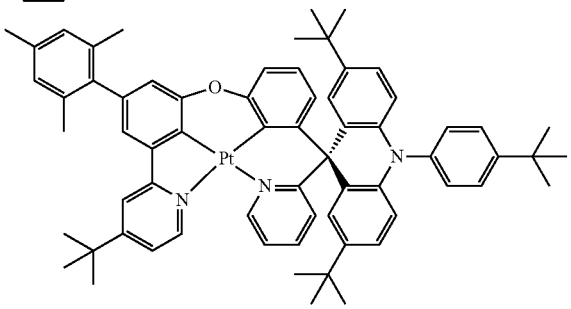
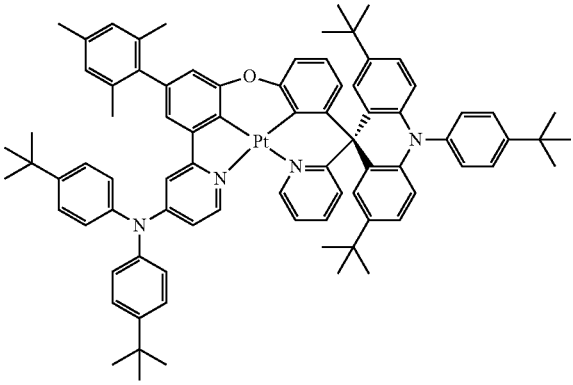
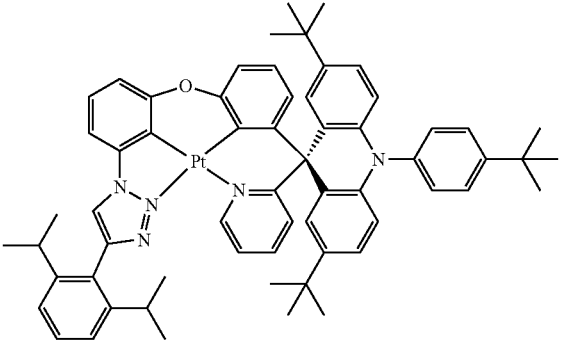

101
-continued
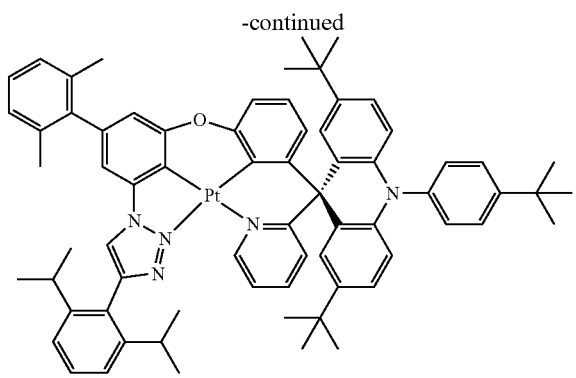
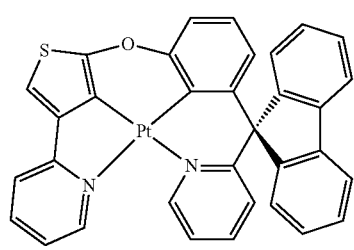
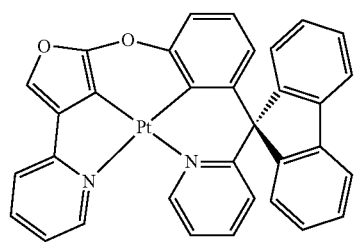
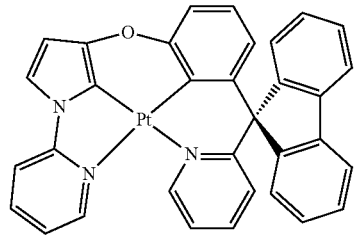
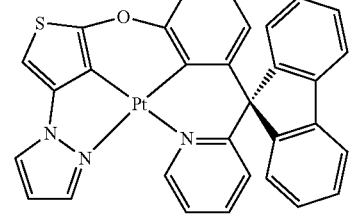
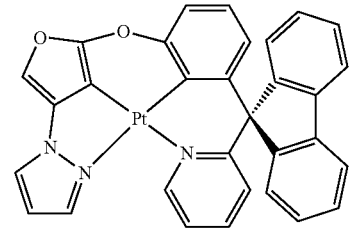
102
-continued
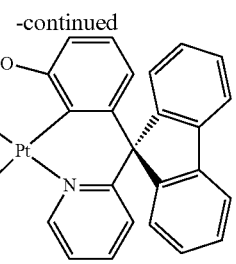
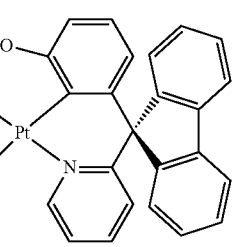
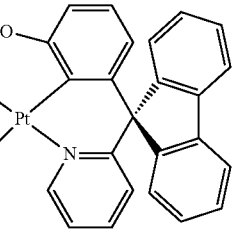
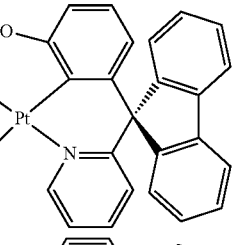
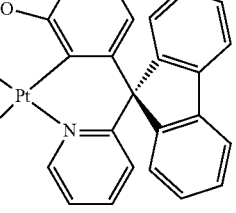
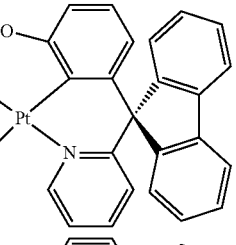
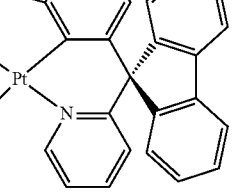

103
-continued
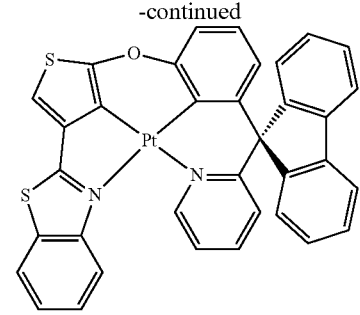
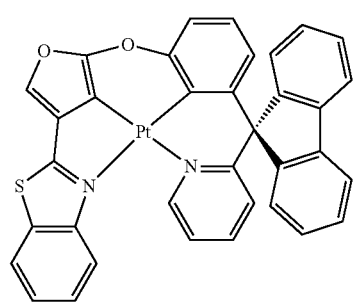
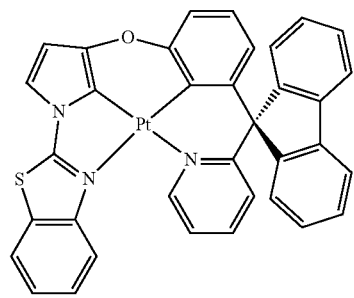
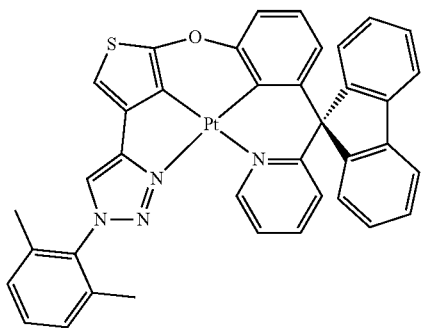
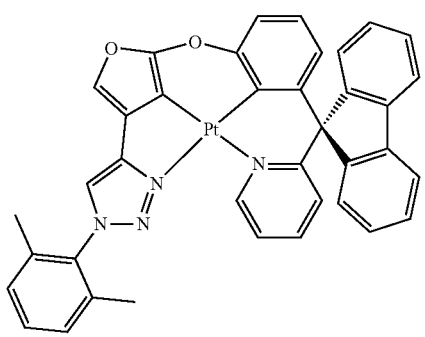
104
-continued
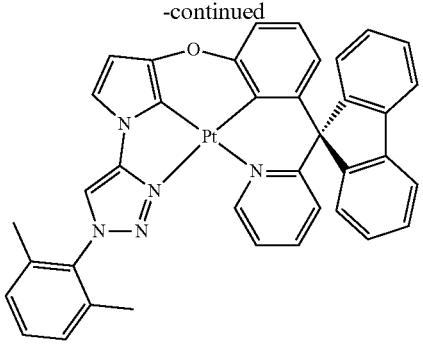
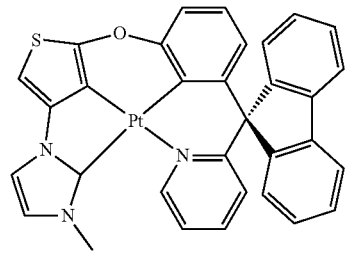
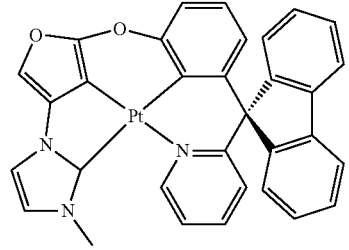
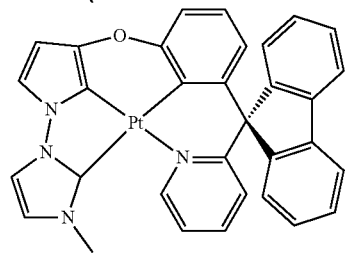
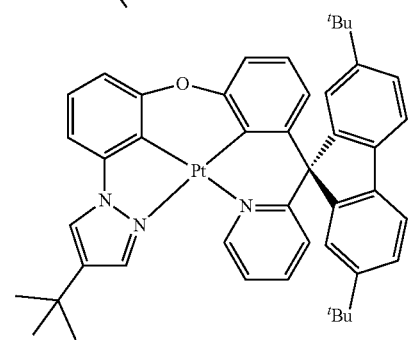
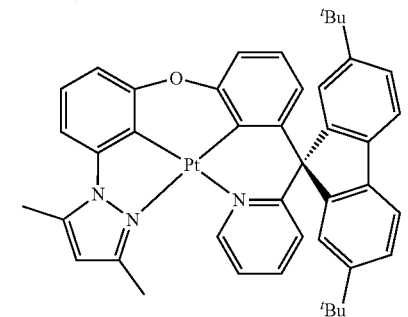

105
-continued
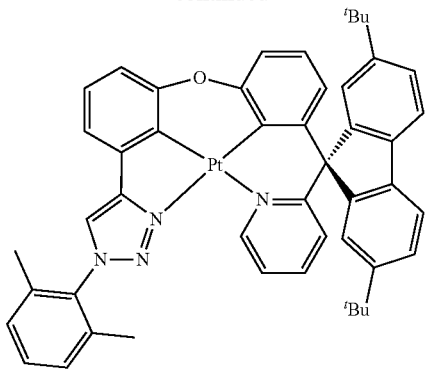
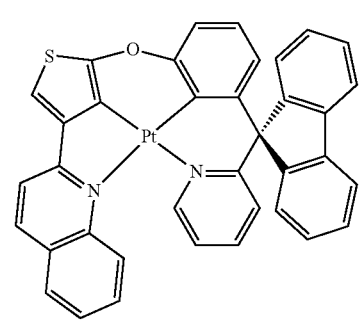
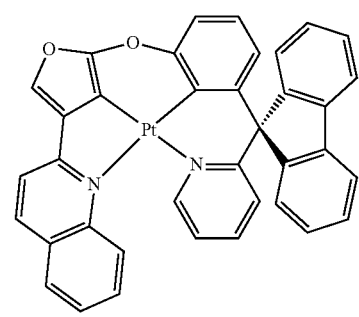
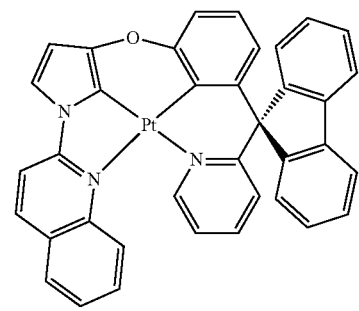
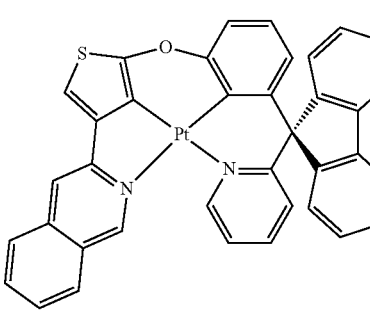
106
-continued
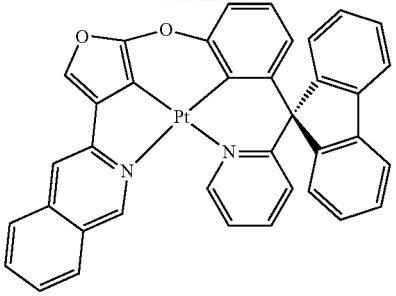
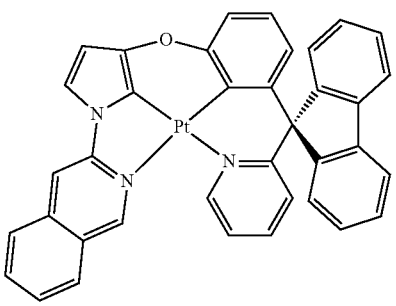
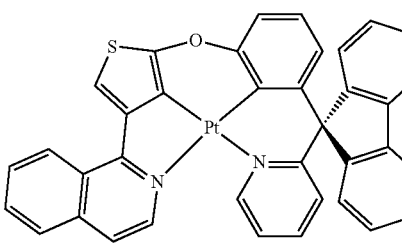
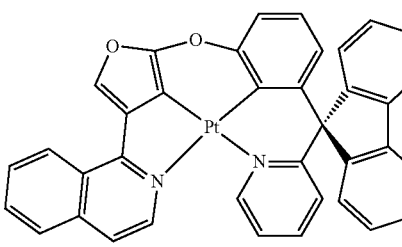
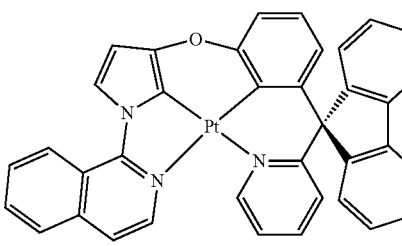
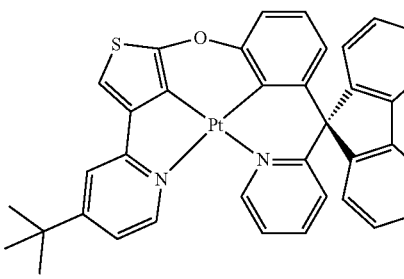

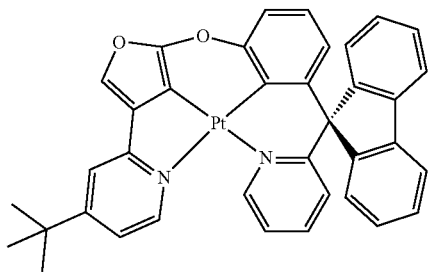
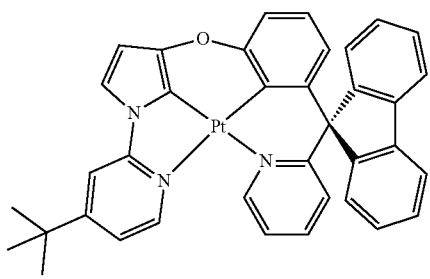
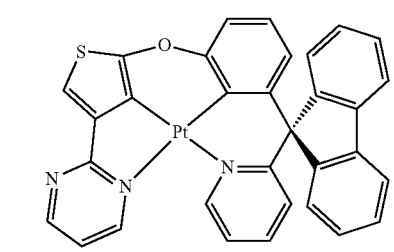
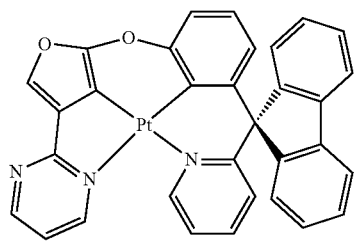
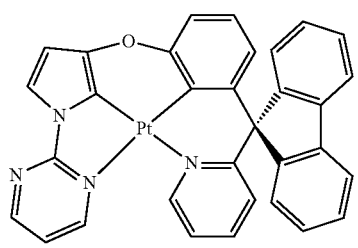
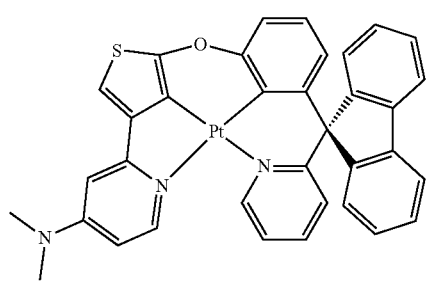
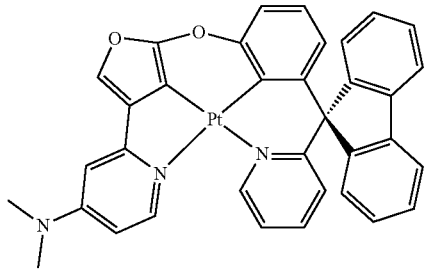
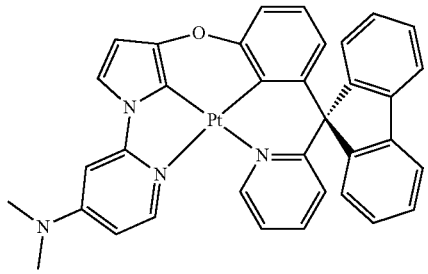
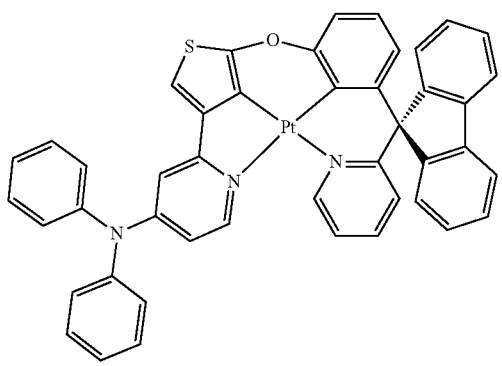
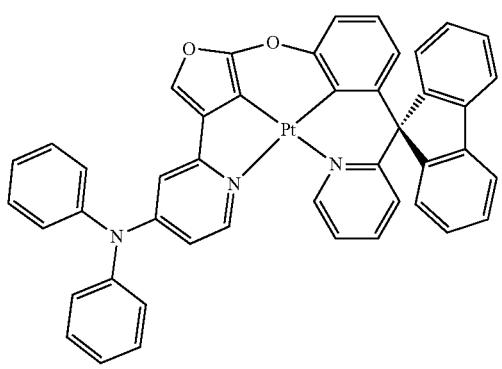
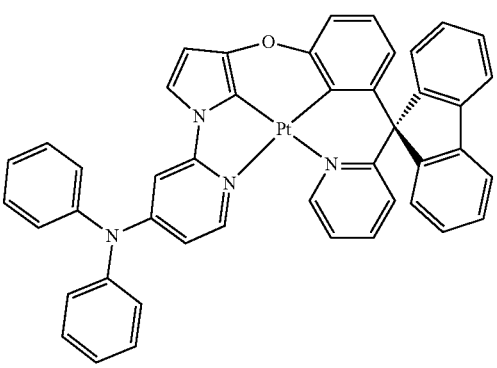

9. A tetradentate ligand, comprising the structure:

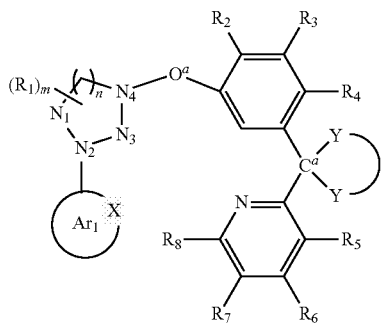

where Ar₁ is a substituted or unsubstituted aromatic or heteroaromatic ring where X is N or other electron pair donor;

is

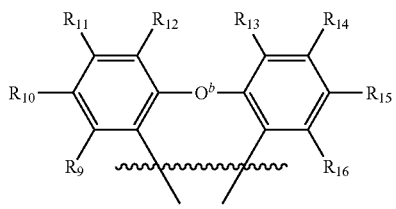

and forms a spiro unit with $C^a$, where $C^a$ is carbon or silicon and O b is a bond, O, S, NR$_{17}$, B R$_{17}$, PR$_{17}$, CR$_{17}$R$_{18}$, or SiR$_{17}$R$_{18}$, where $O^a$ is O, S, NR$_{19}$, B R$_{19}$, PR$_{19}$, CR$_{19}$R$_{20}$, or SiR$_{19}$R$_{20}$, where N$_1$, N$_2$ and N$_4$ are independently unsubstituted or substituted boron, carbon, nitrogen, oxygen, silicon, germanium, phosphorous, sulphur or selenium and n is 1 to 3; where N$_3$ is carbon, boron, nitrogen, oxygen, silicon, germanium, phosphorous, sulphur or selenium; and the ring containing N$_1$, N$_2$, N$_3$ and N$_4$ is a saturated, unsaturated or aromatic ring; where R$_1$ is independently hydrogen, substituted or unsubstituted alkyl, alkenyl, alkynyl, aryl, heteroaryl, cycloalkyl, heterocyclyl, amino, nitro, hydroxyl, halogen, thio, alkoxy, haloalkyl, arylalkane or arylalkene; where R$_2$, R$_3$, R$_4$, R$_5$, R$_6$, R$_7$, and R$_8$ are independently hydrogen, substituted or unsubstituted alkyl, alkenyl, alkynyl, aryl, heteroaryl, cycloalkyl, heterocyclyl, amino, nitro hydroxyl, halogen, thio, alkoxy, haloalkyl, arylalkane or arylalkene; where R$_9$, R$_{10}$, R$_{11}$, R$_{12}$, R$_{13}$, R$_{14}$, R$_{15}$, and R$_{16}$ are independently hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group and where a pair of adjacent R groups can independently form a 5-8 membered aryl or arylalkyl ring which may be interrupted one or more times with O, S, N, or NR$_{21}$; and where R$_{17}$, R$_{18}$, R$_{19}$, R$_{20}$, and R$_{21}$ are independently alkyl, alkenyl, alkynyl, aryl, heteroaryl, cycloalkyl, heterocyclyl, haloalkyl, arylalkane or arylalkene, and wherein when Ar₁ is pyridyl or isoquinyl or R$_1$ is halogen then at least one of R$_{10}$ and R$_{15}$ is not t-butyl when R$_9$, R$_{11}$, R$_{12}$, R$_{13}$, R$_{14}$, and R$_{16}$ are hydrogen.

10. The tetradentate ligand according to claim 9, wherein the tetradentate ligand has one of the following structures:

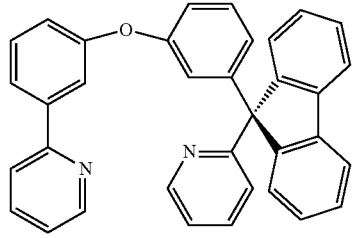

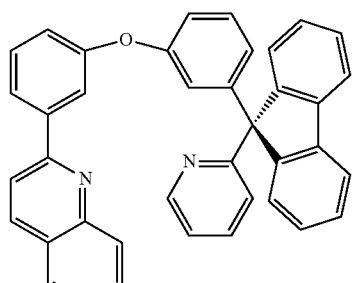

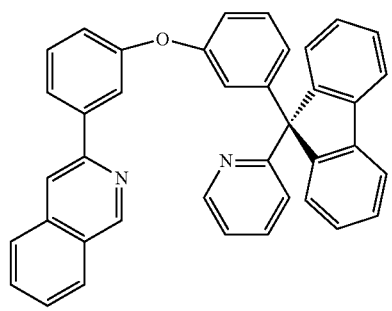

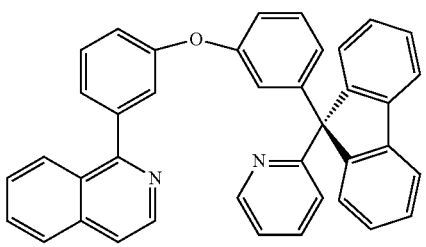

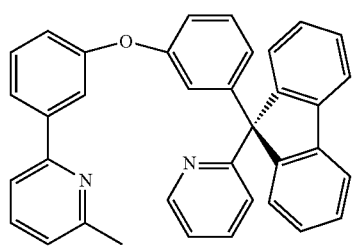

111
-continued
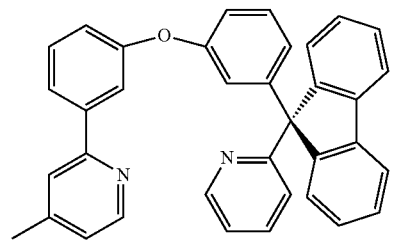
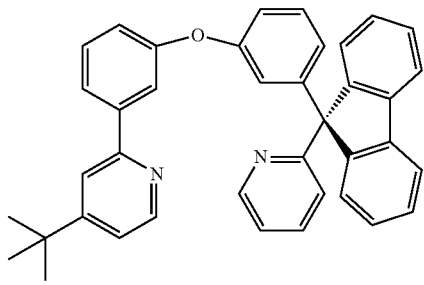
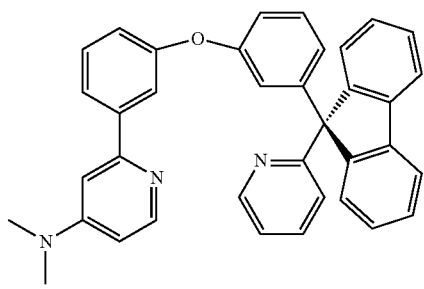
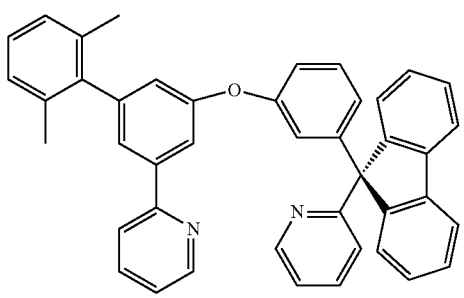
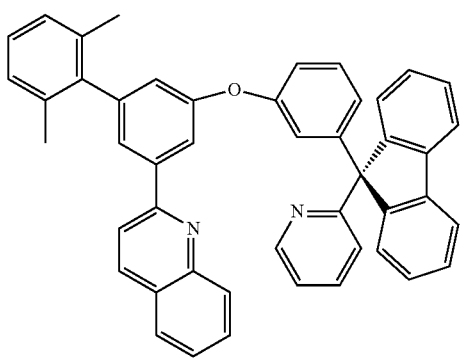
112
-continued
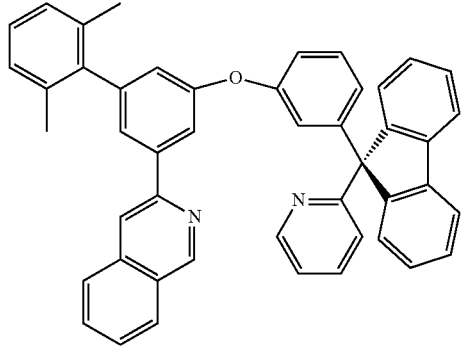
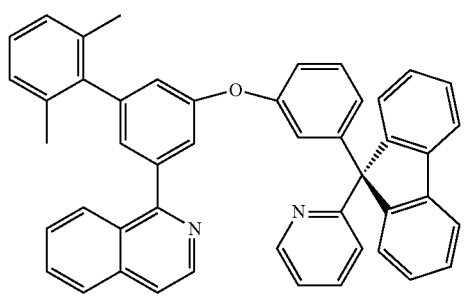
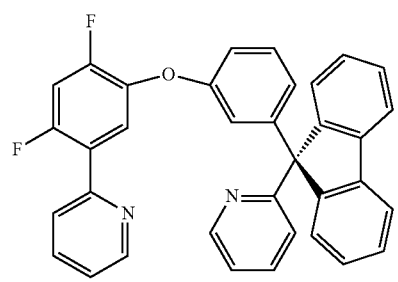
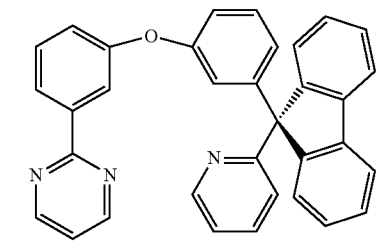
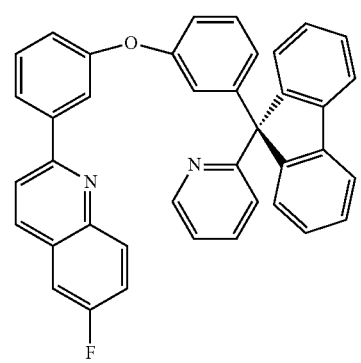

113
-continued
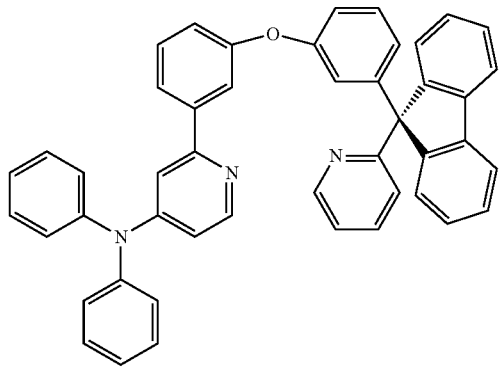
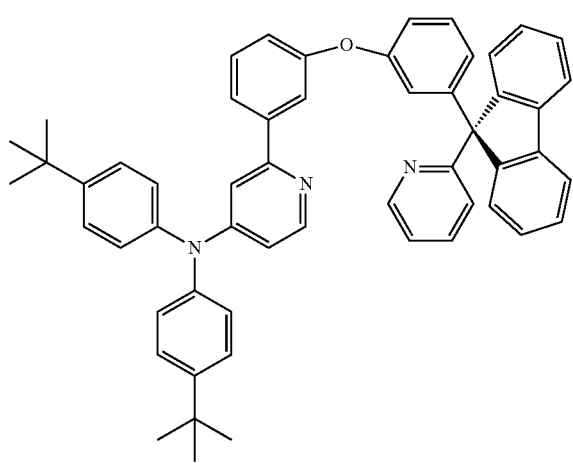
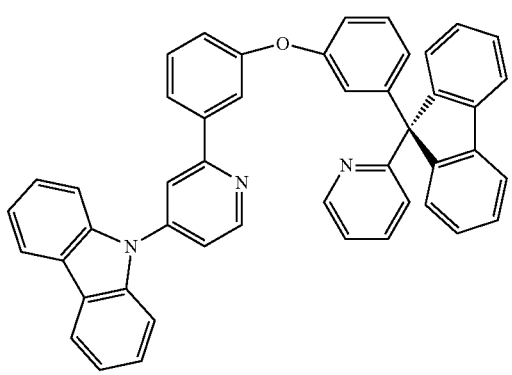
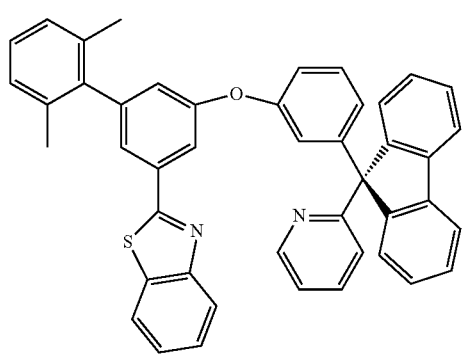
114
-continued
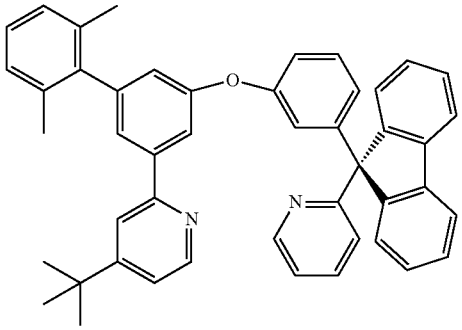
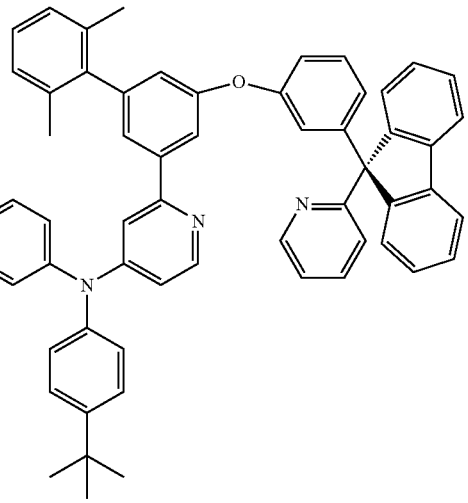
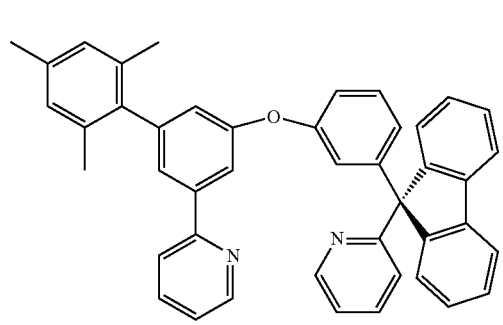
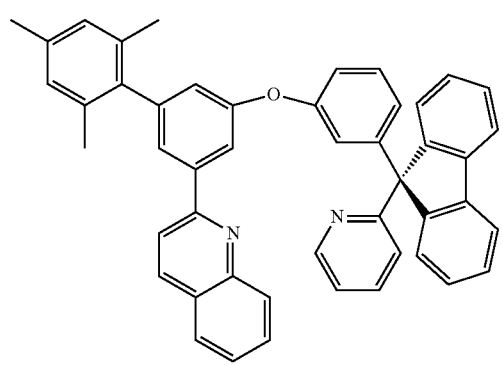

115
-continued
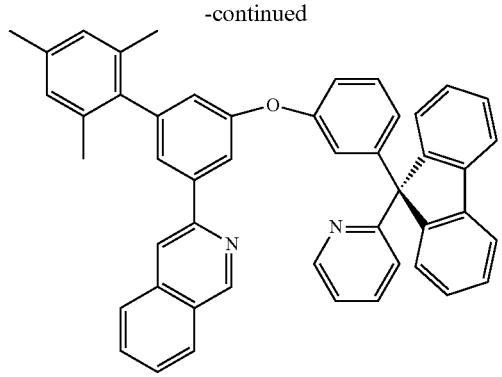
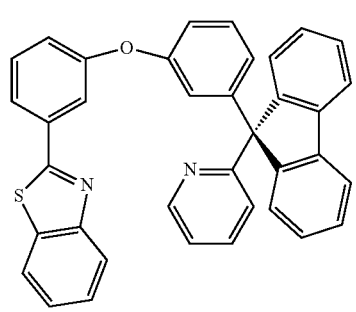
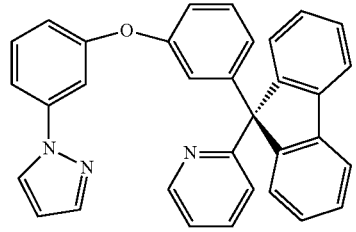
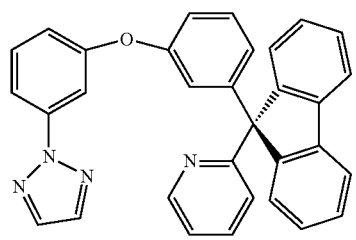
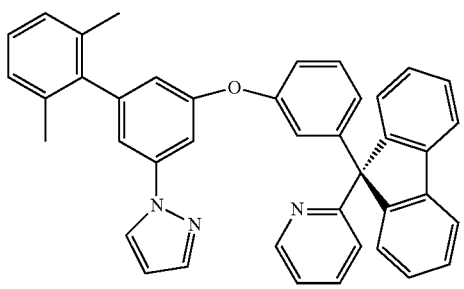
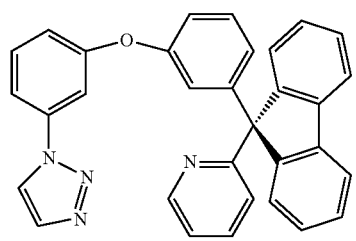
116
-continued
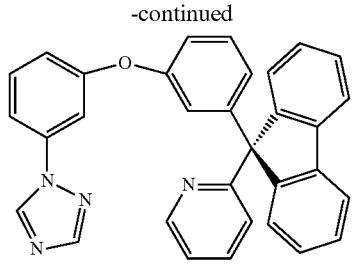
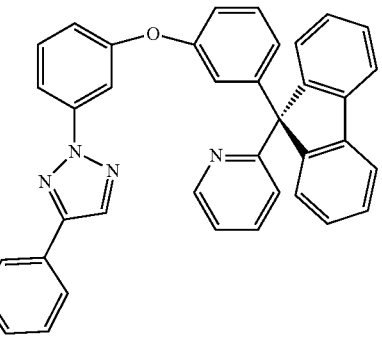
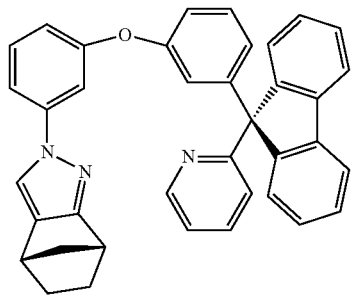
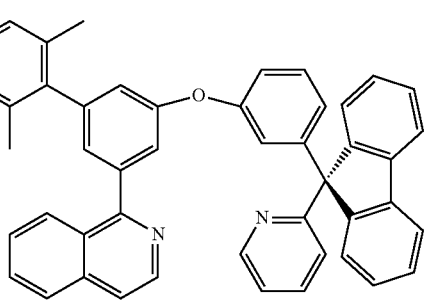
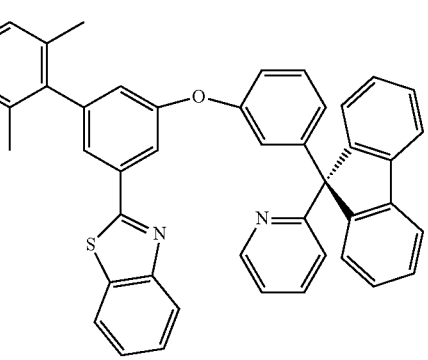

117
-continued
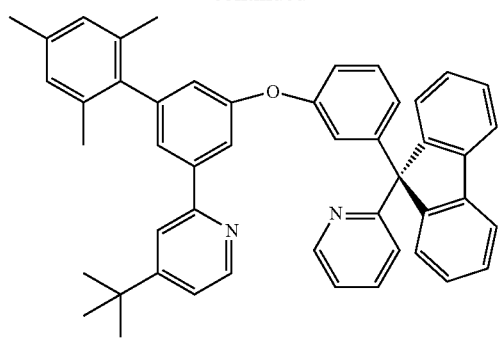
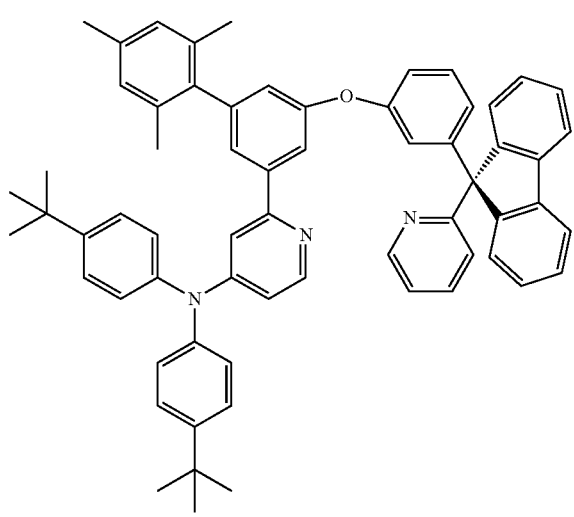
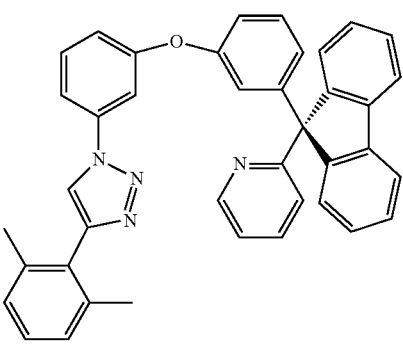
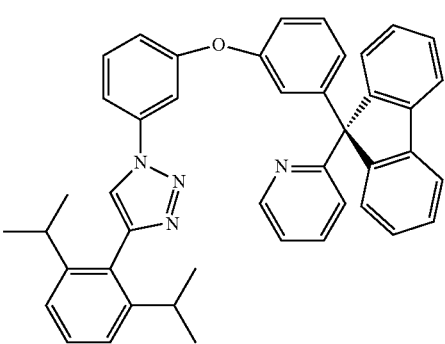
118
-continued
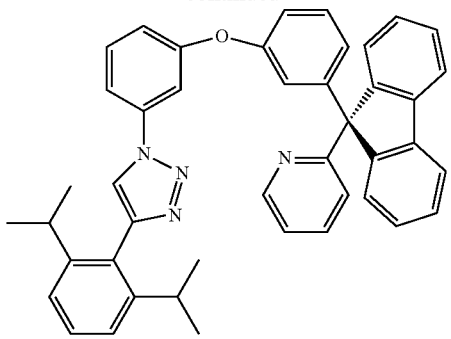
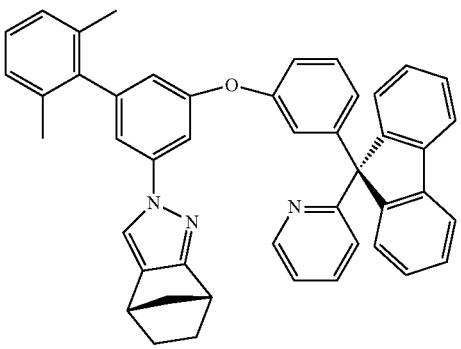
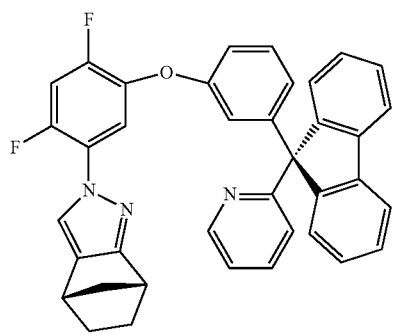
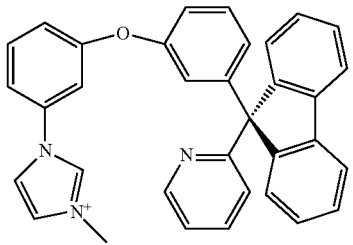
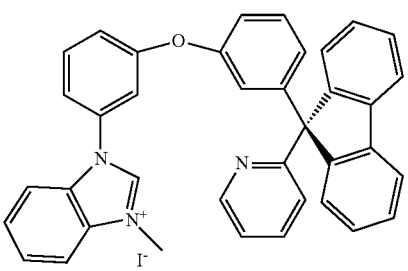

119
-continued
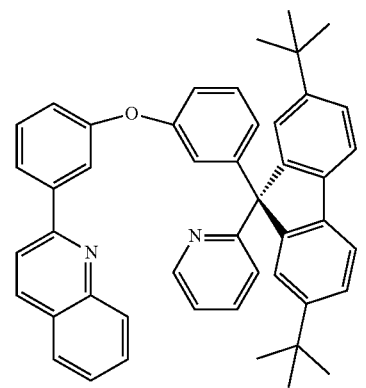
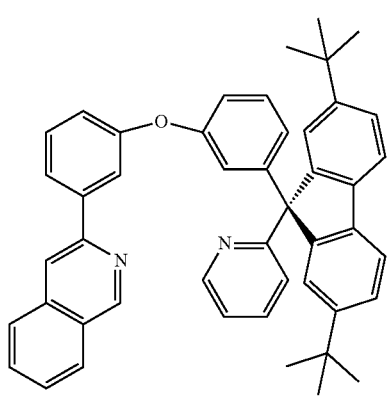
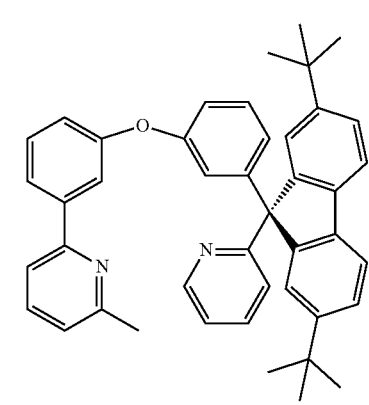
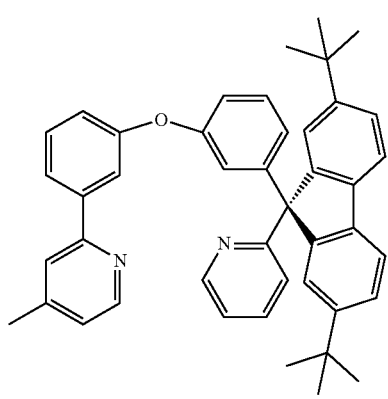
120
-continued
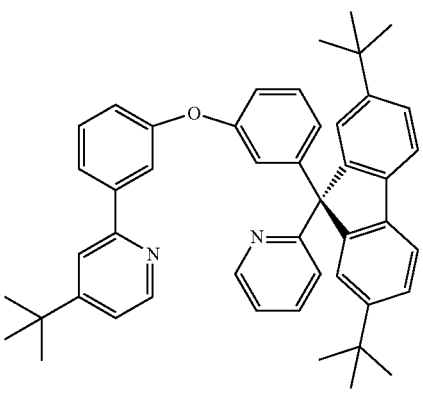
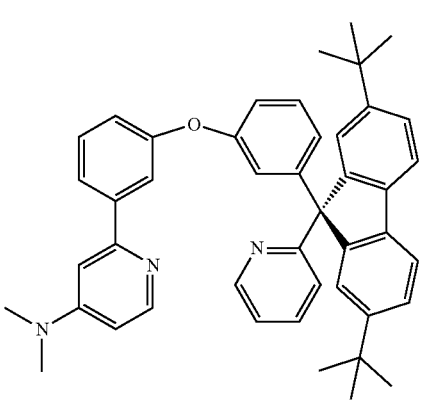
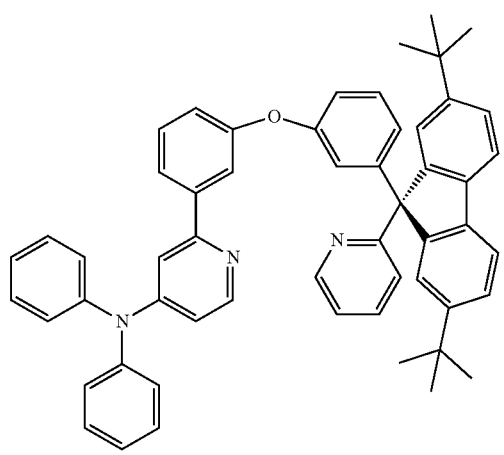
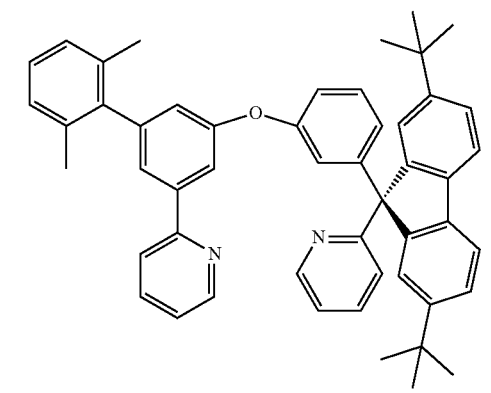

121
-continued
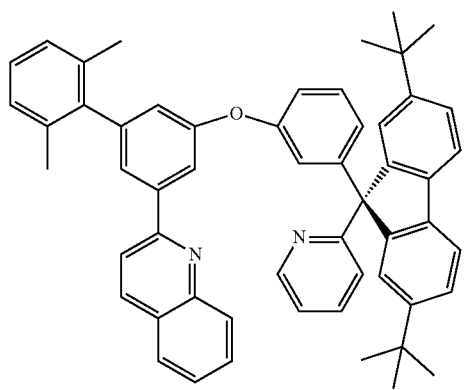
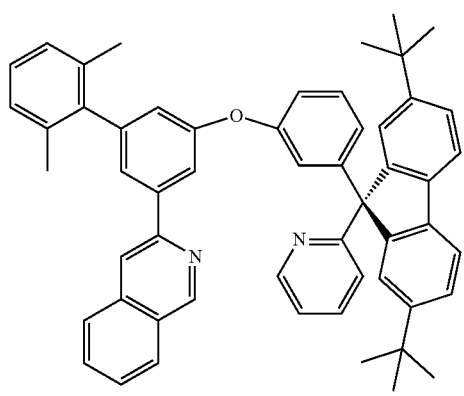
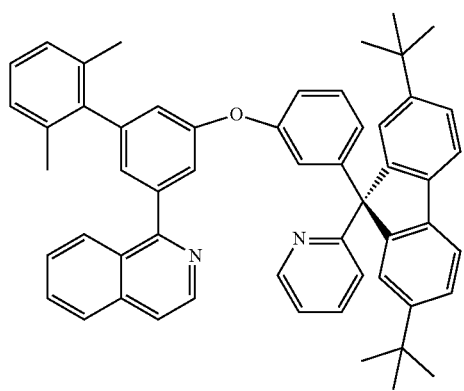
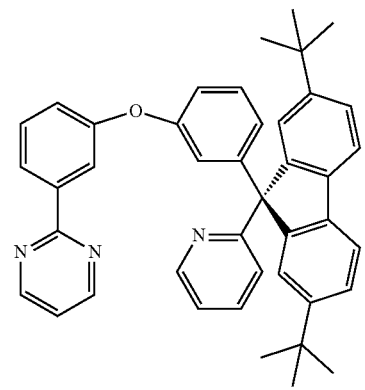
122
-continued
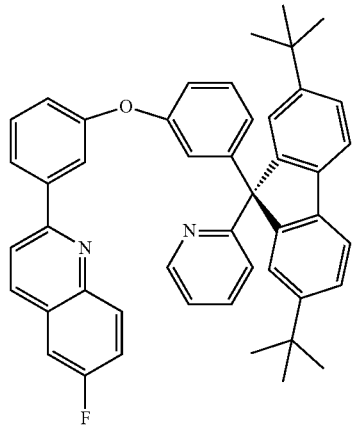
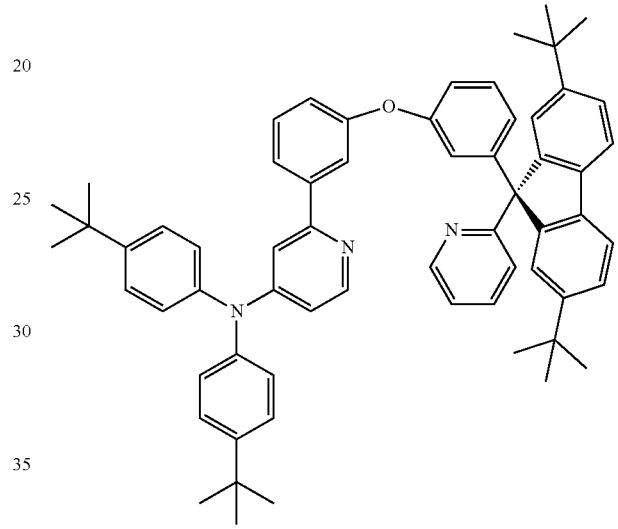
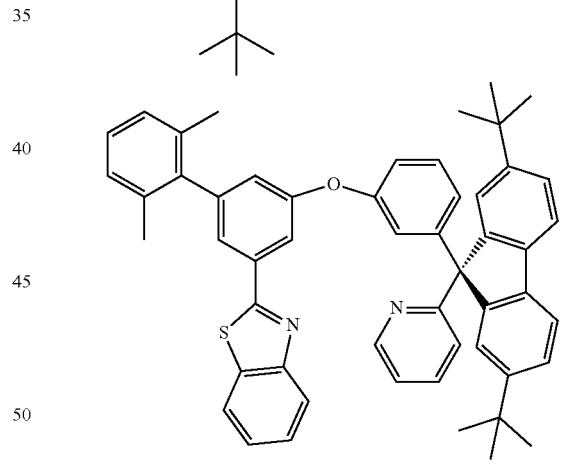
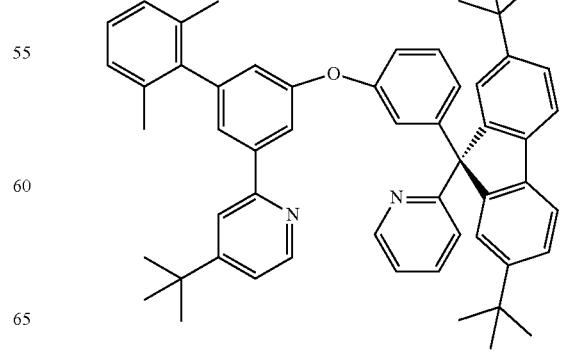

123
-continued
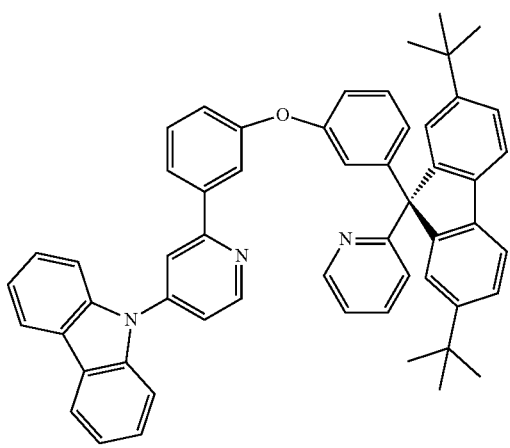
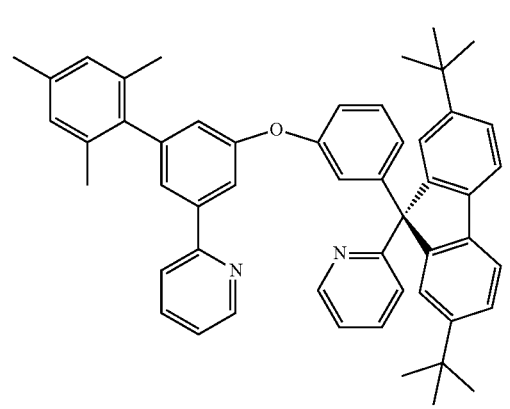
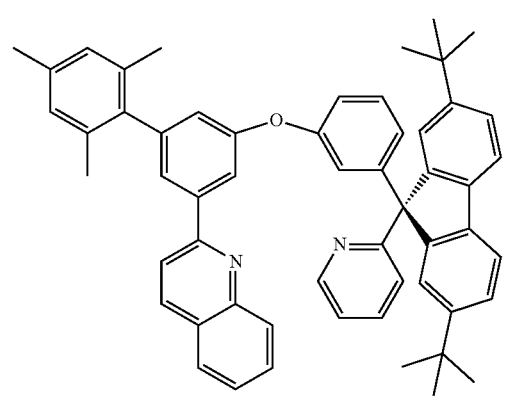
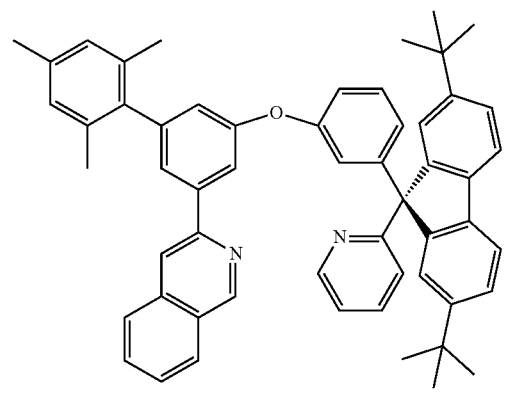
124
-continued
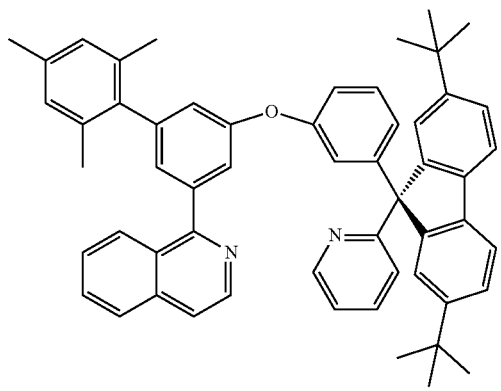
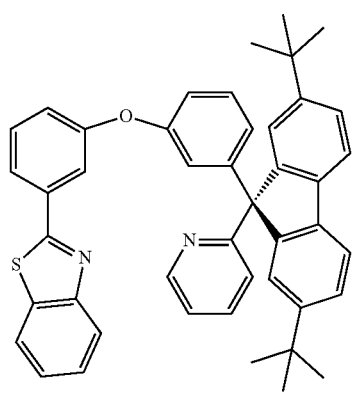
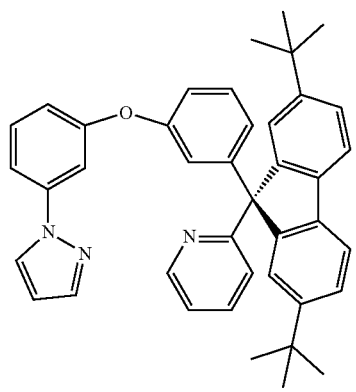
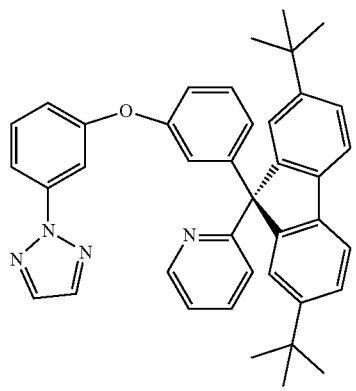

| 125 | 126 |
|---|---|
| -continued | -continued |
| 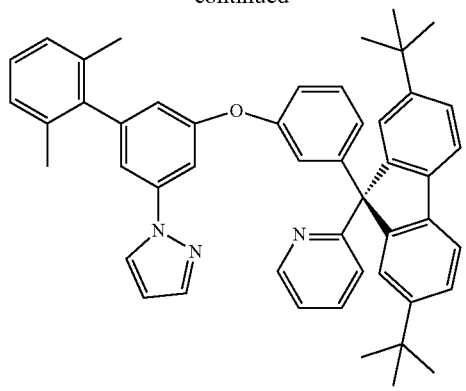 | 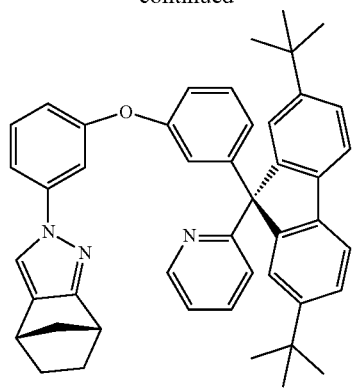 |
| 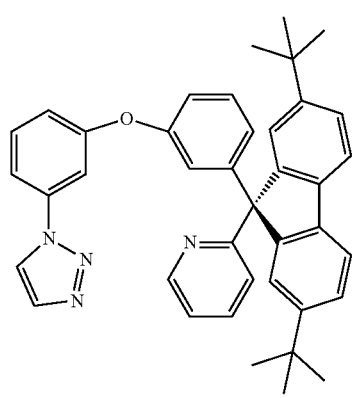 | 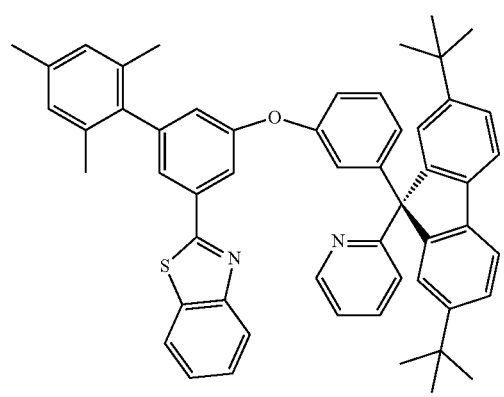 |
| 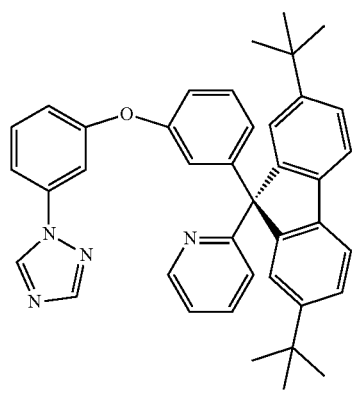 | 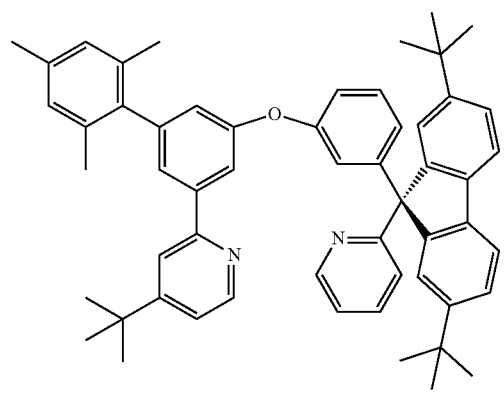 |
| 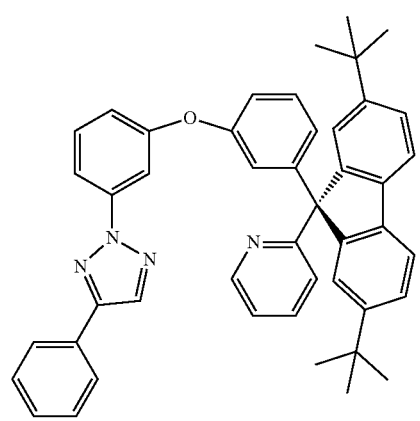 | 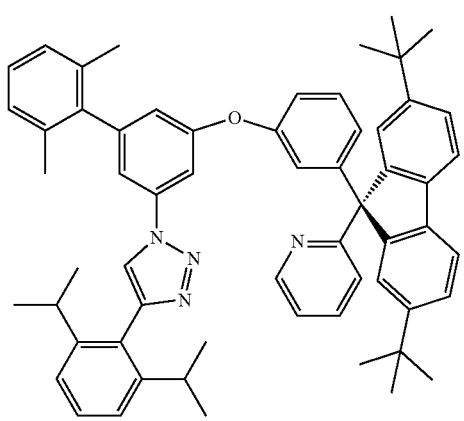 |

127
-continued
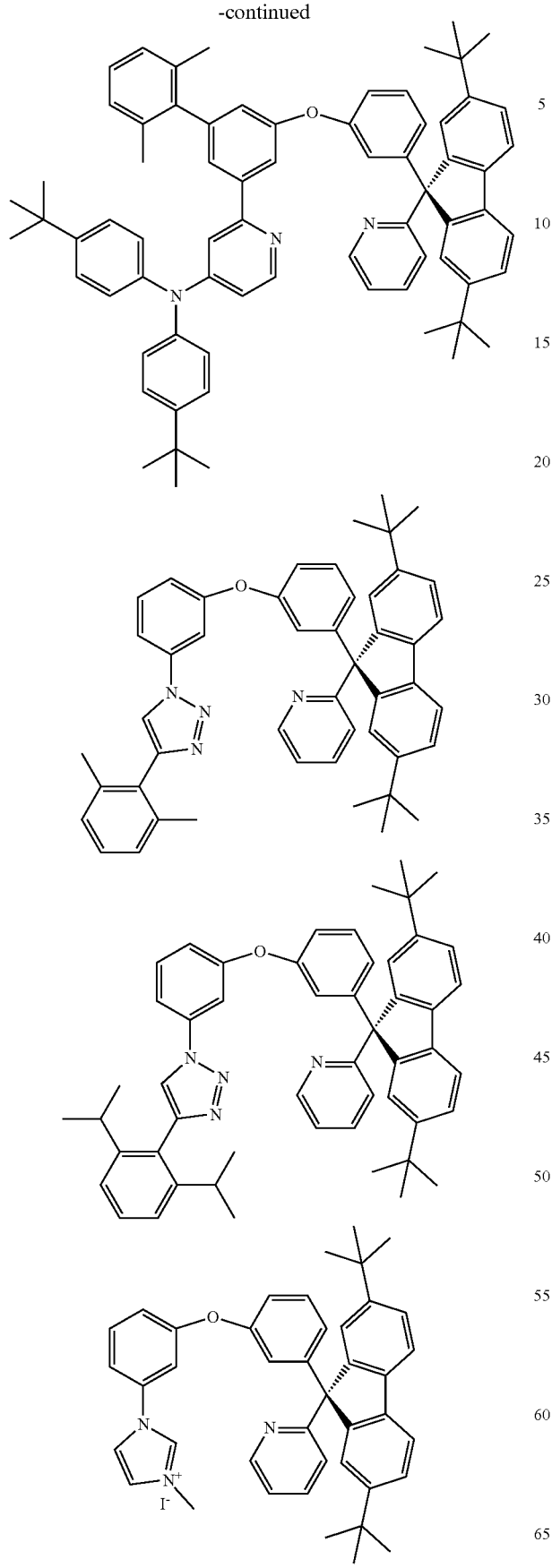
128
-continued
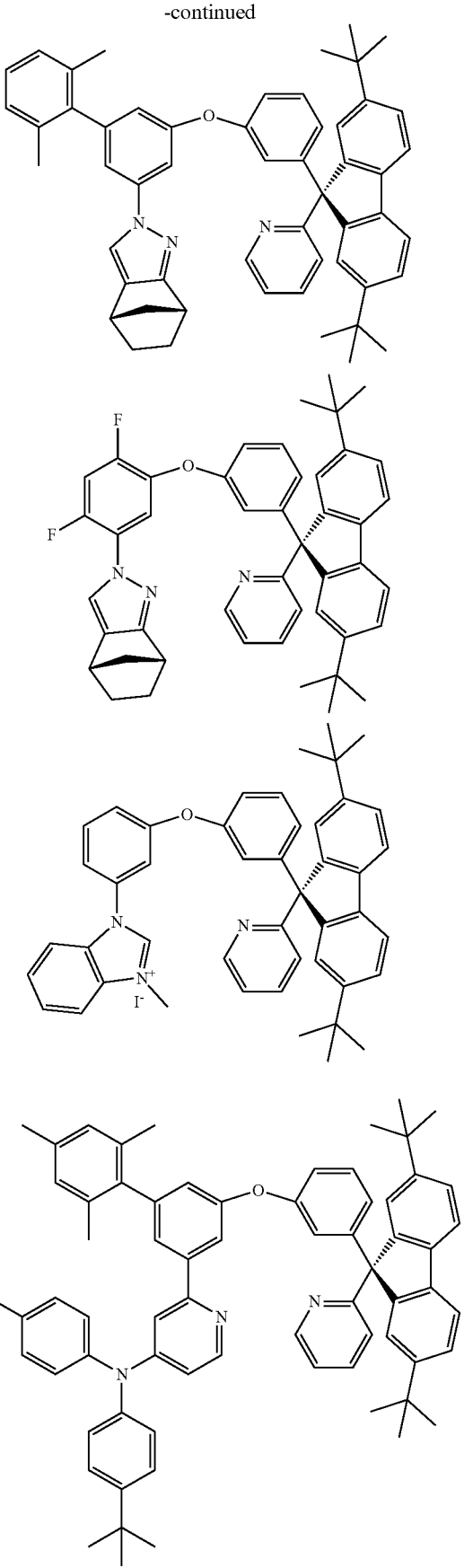

129
-continued
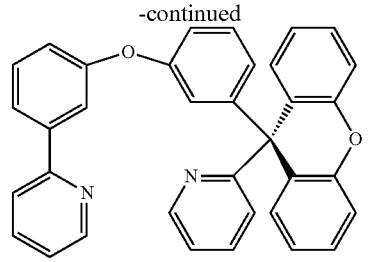
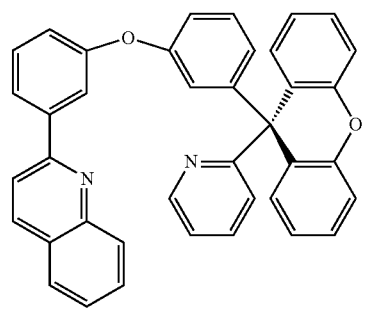
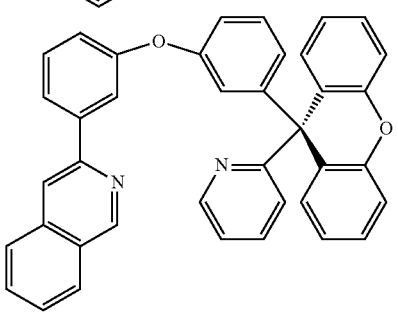
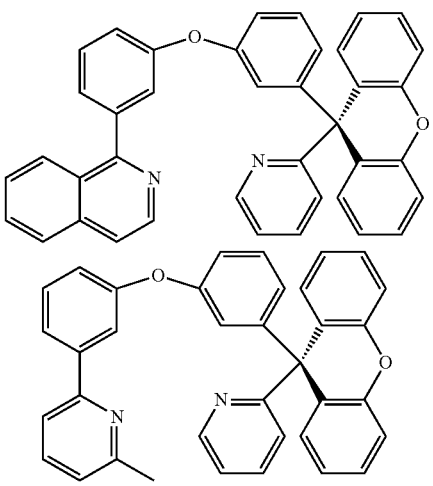
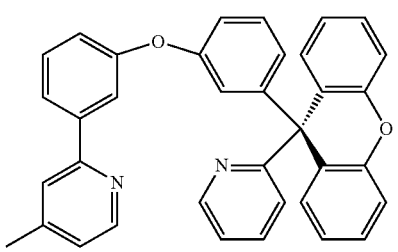
130
-continued
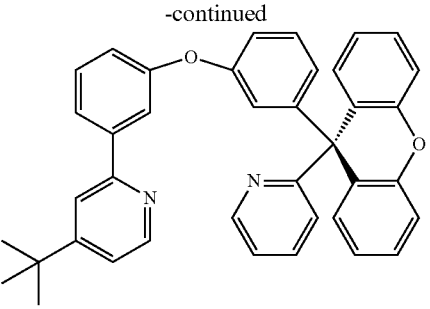
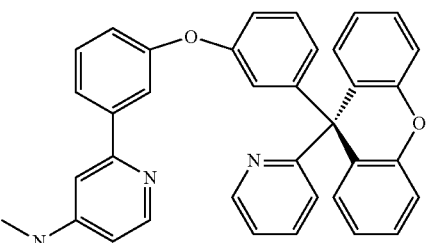
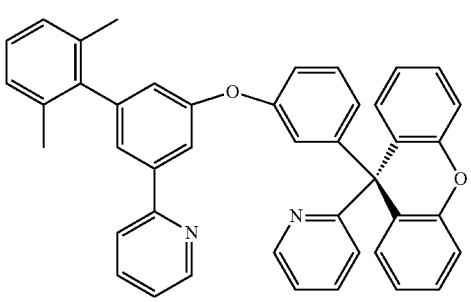
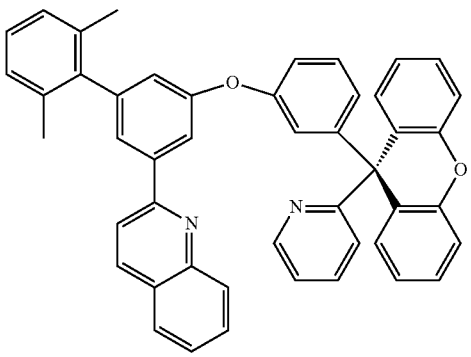
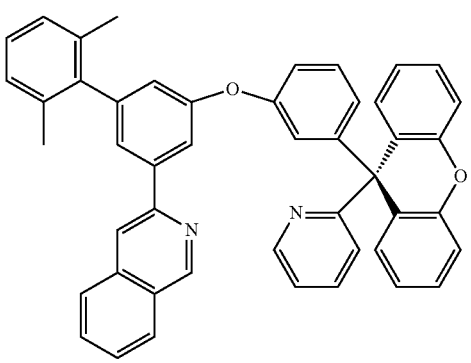

131
-continued
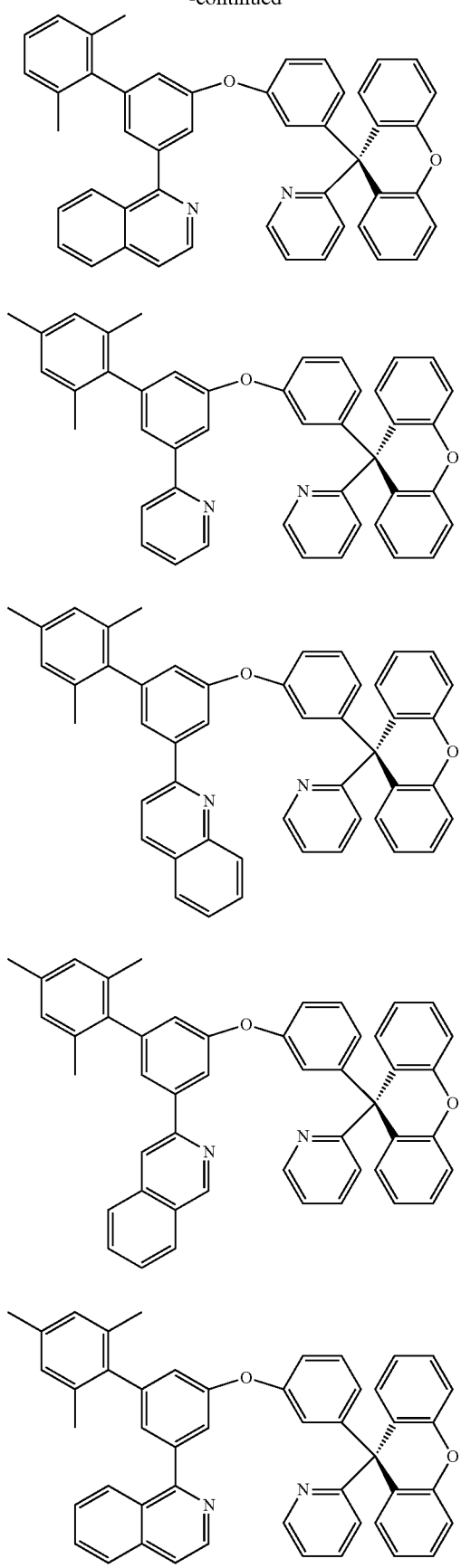
132
-continued
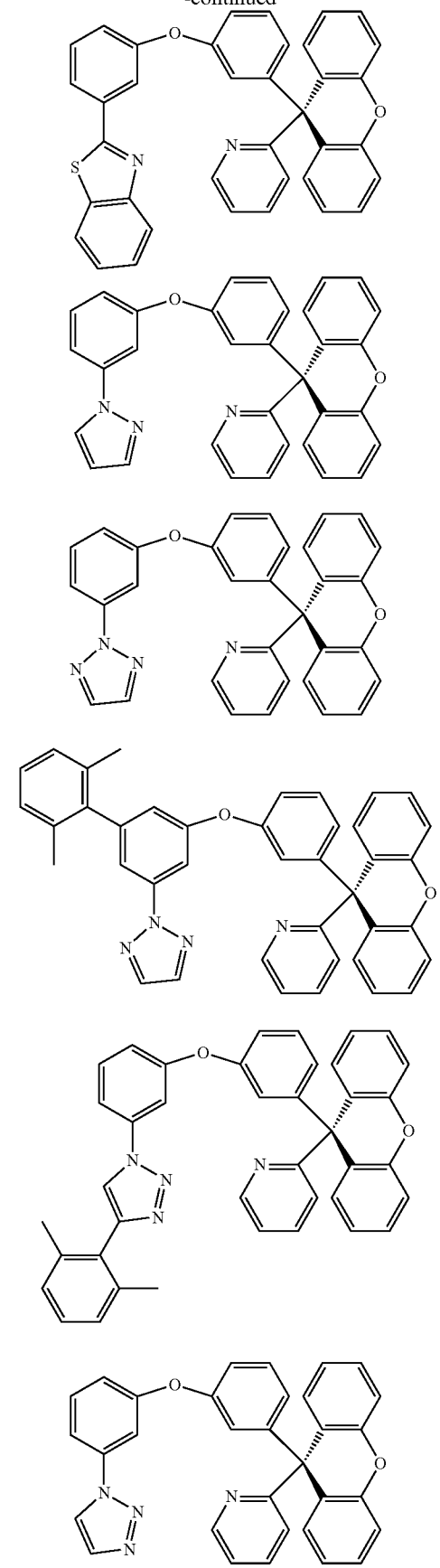

133
-continued
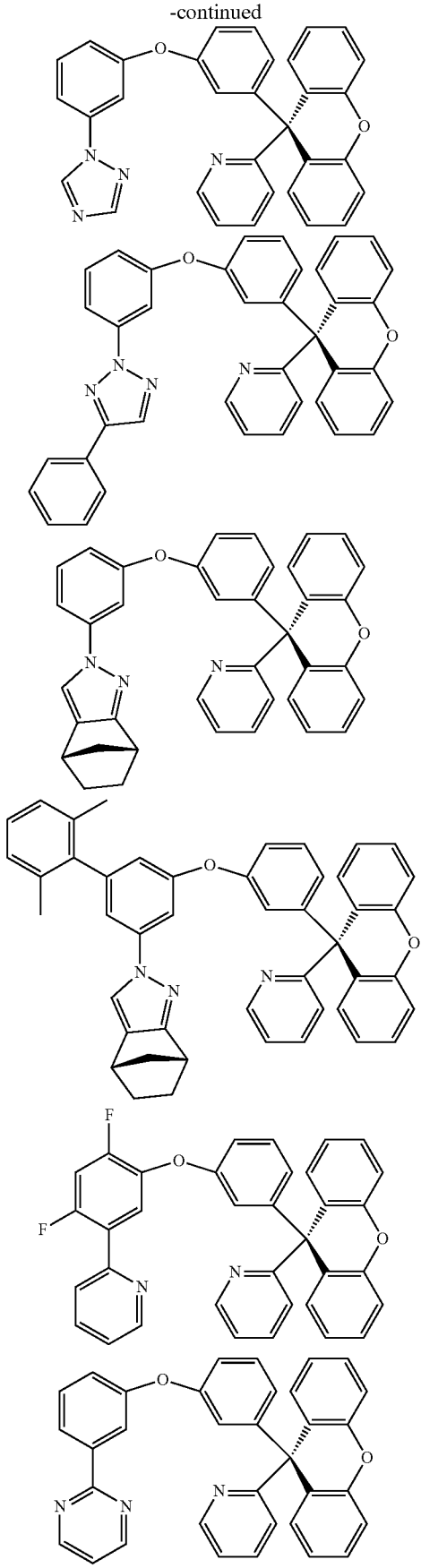
134
-continued
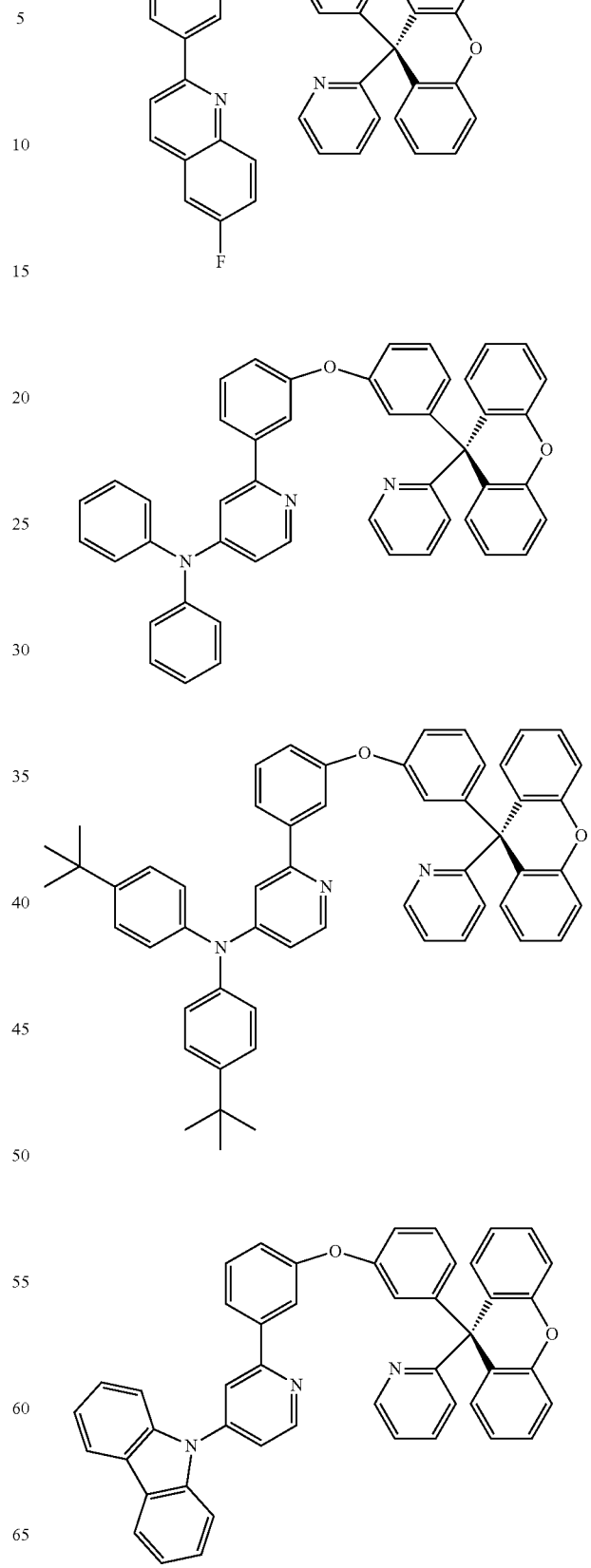

135
-continued
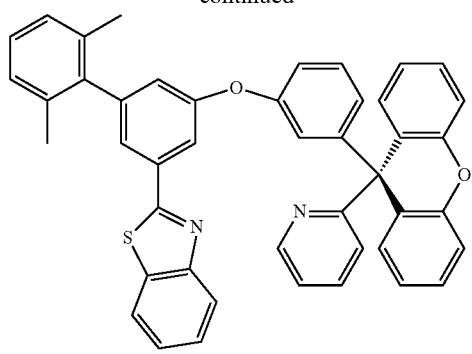
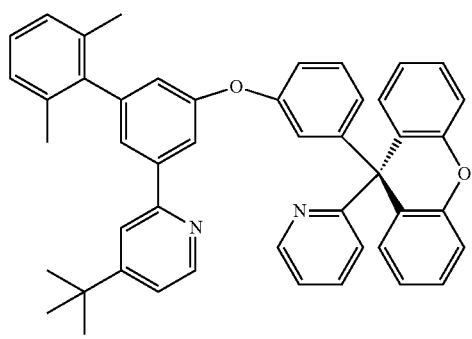
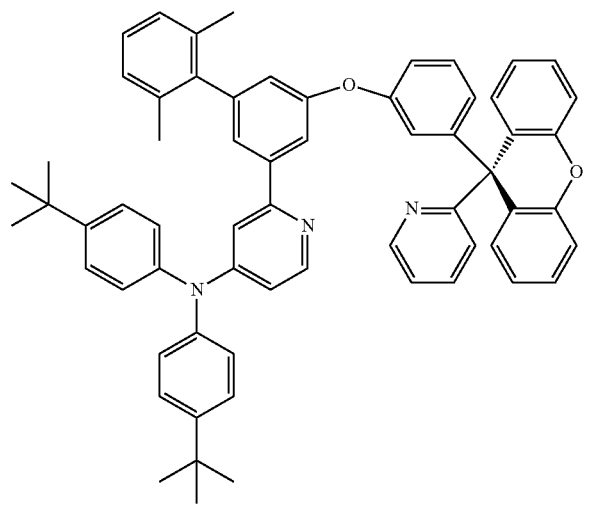
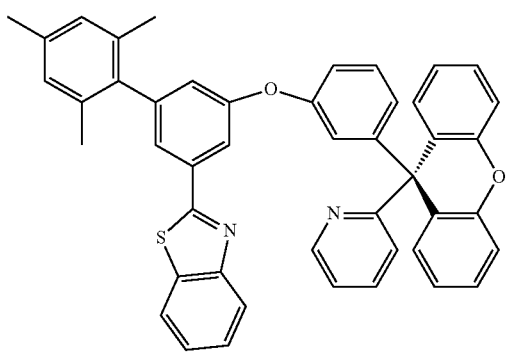
136
-continued
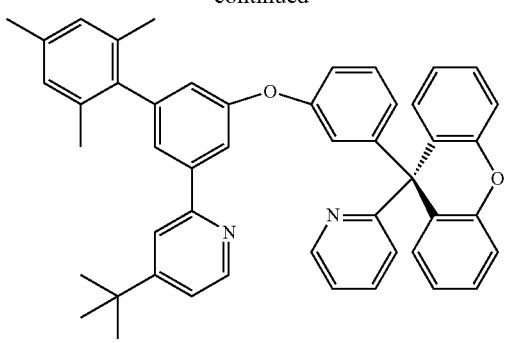
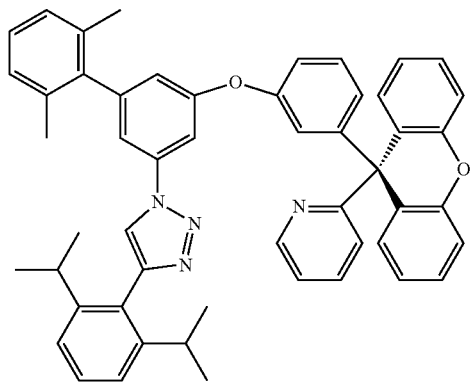
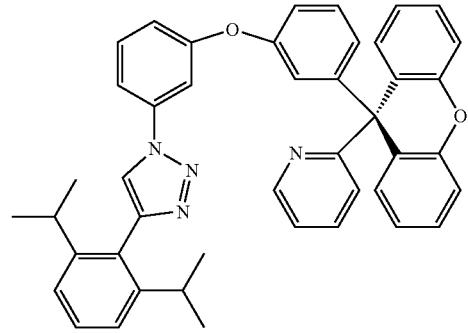
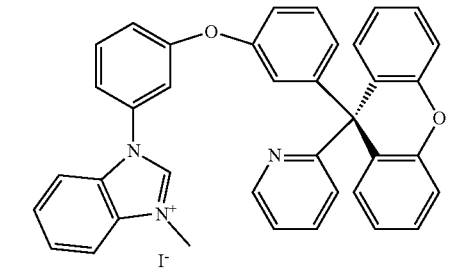

137
-continued
138
-continued
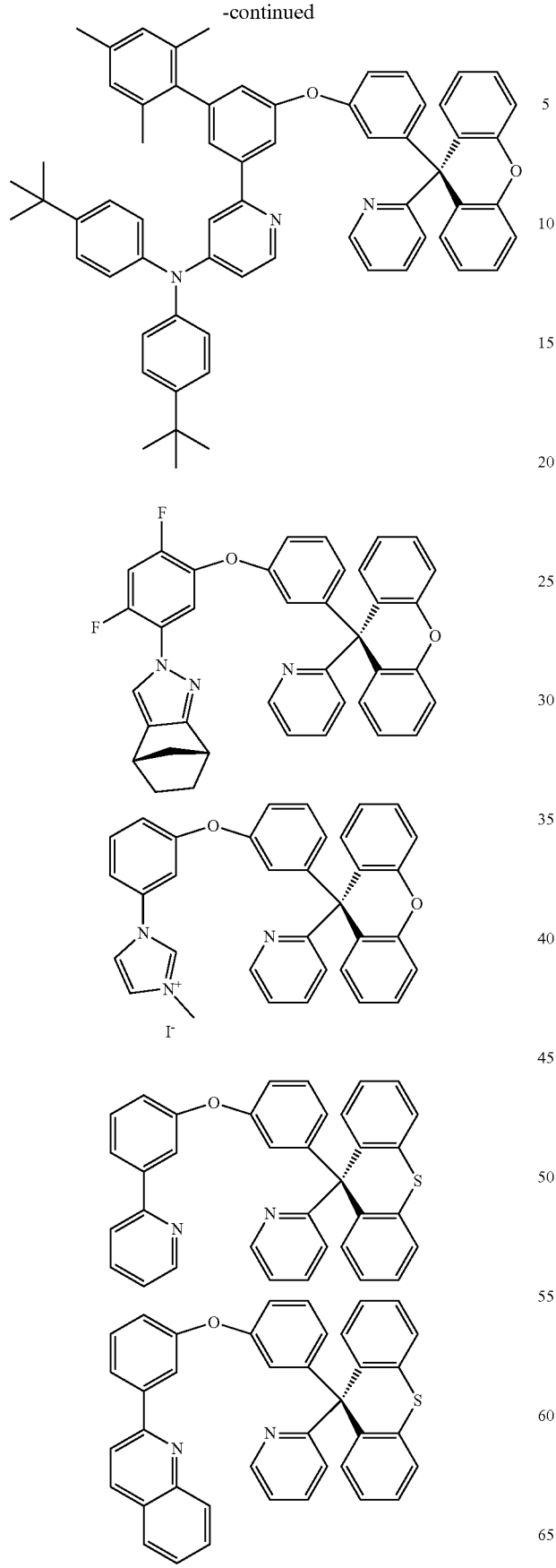
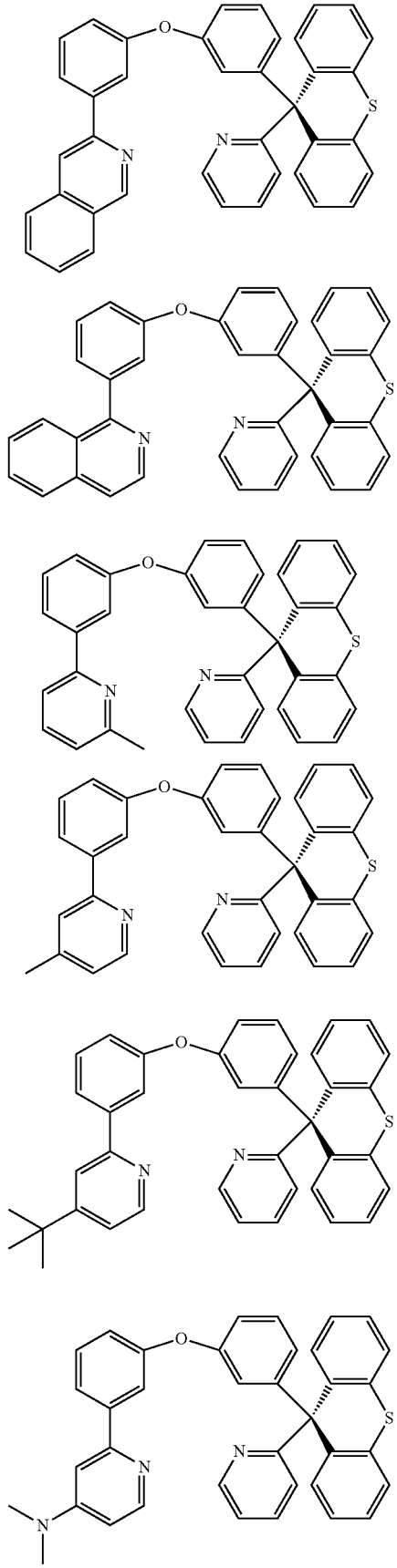

139
-continued
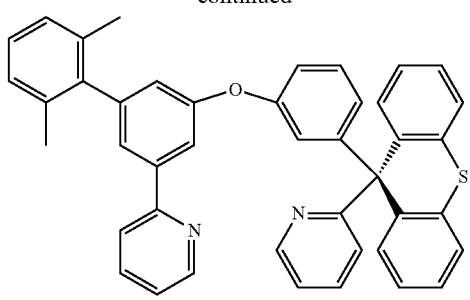
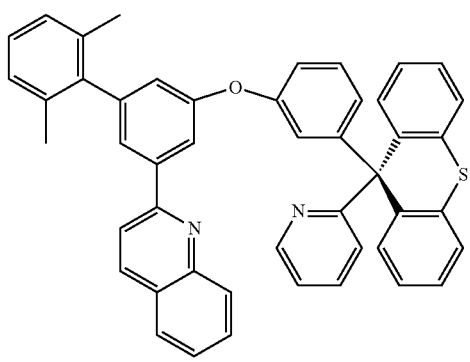
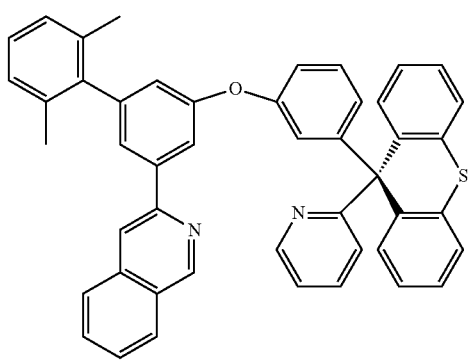
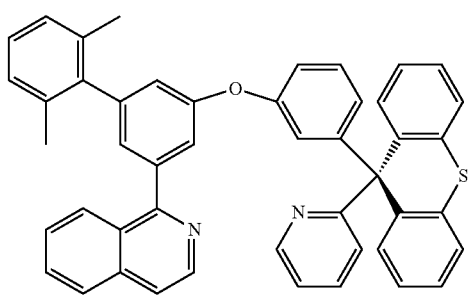
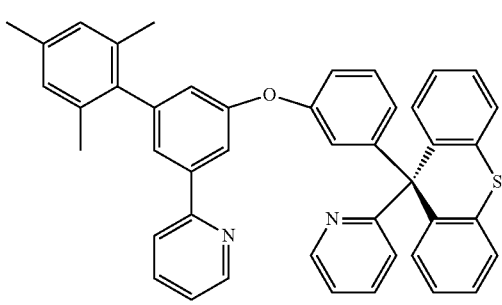
140
-continued
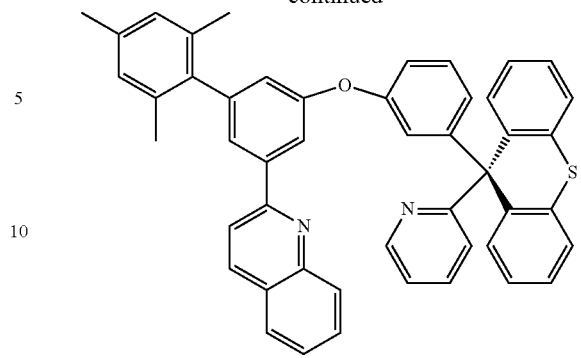
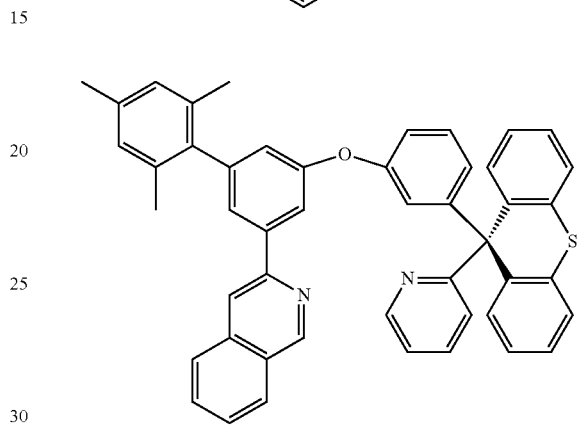
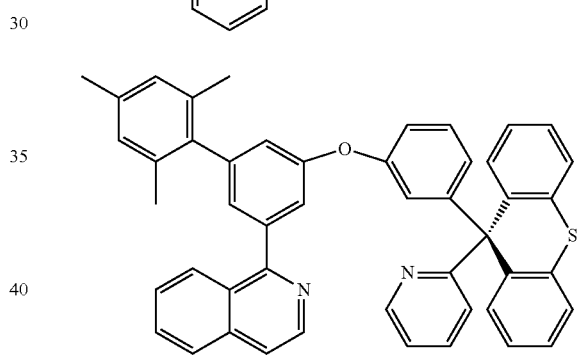
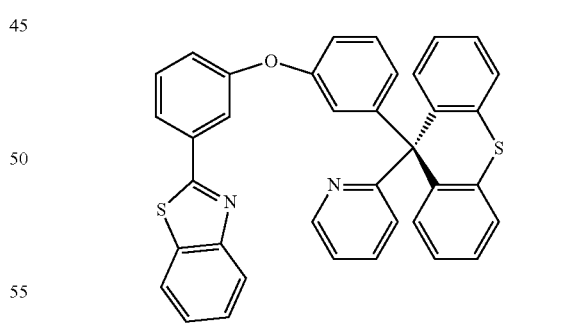
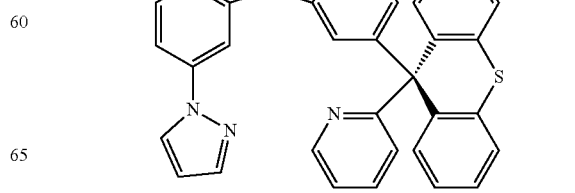

-continued
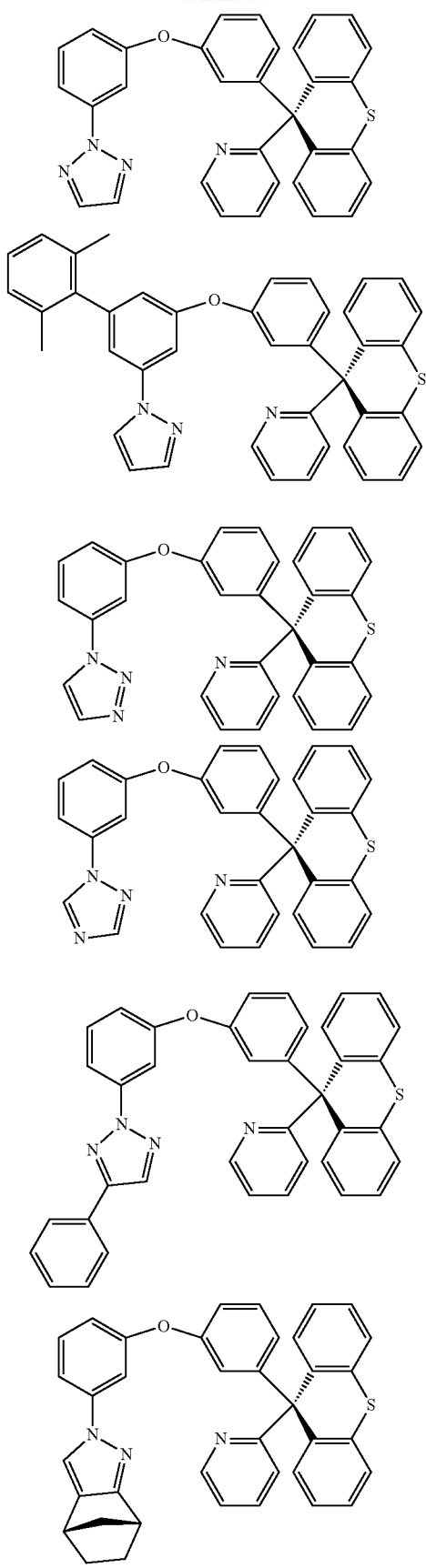
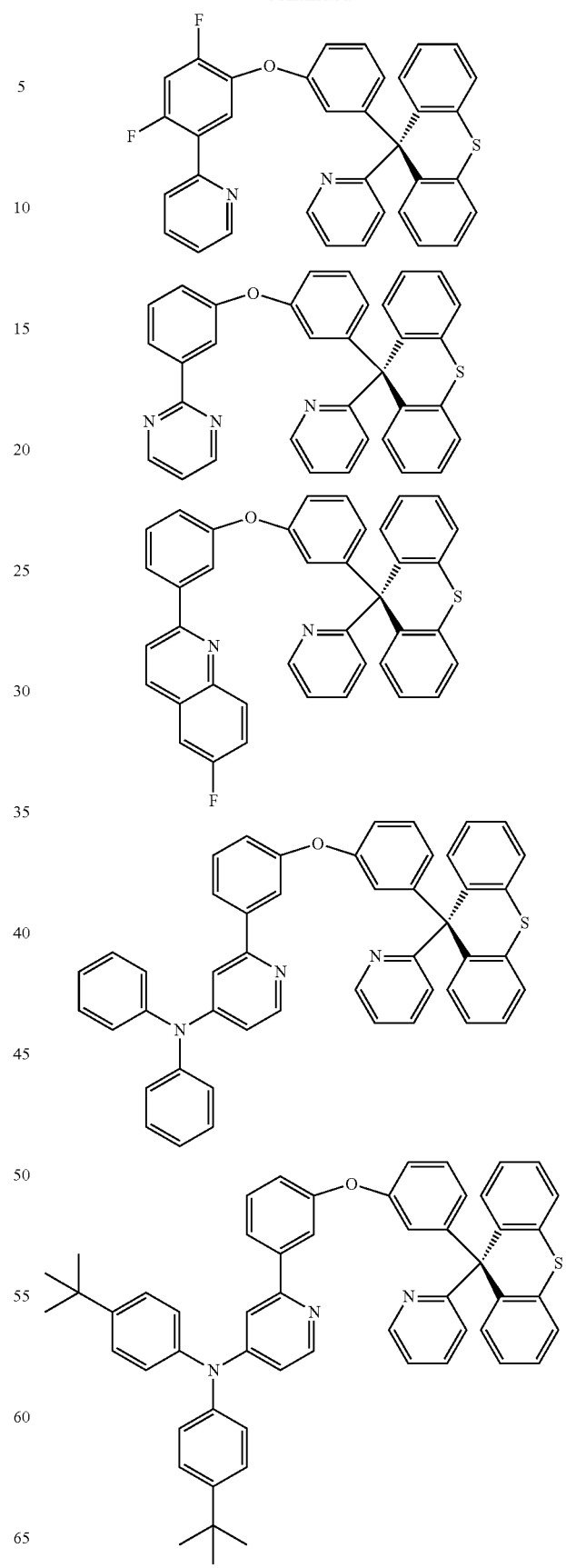

143
-continued
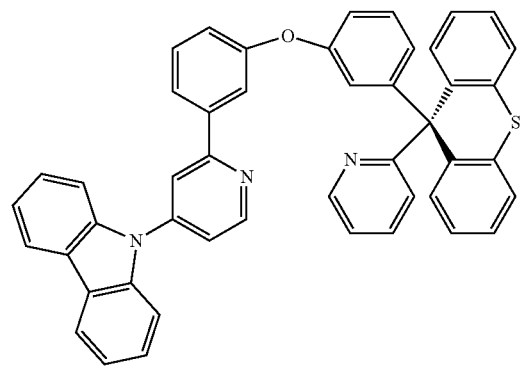
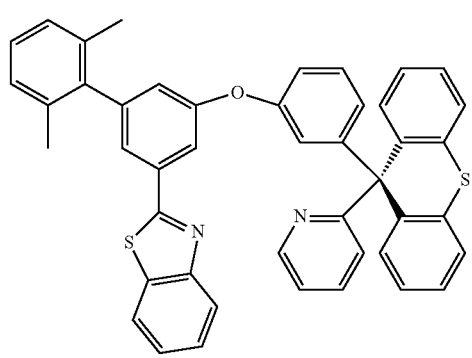
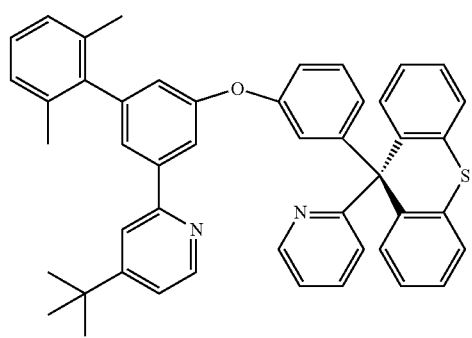
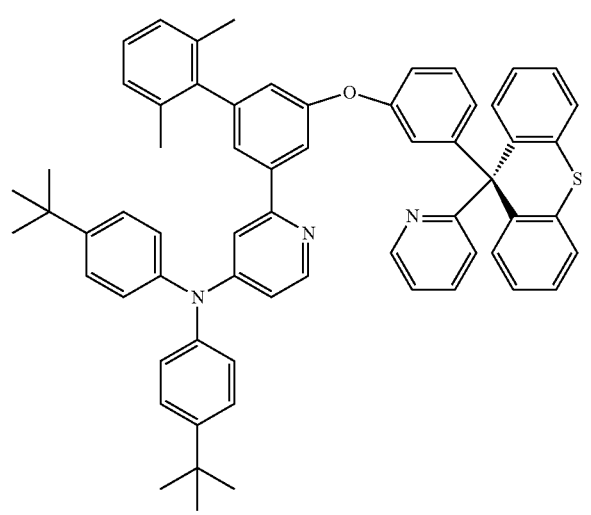
144
-continued
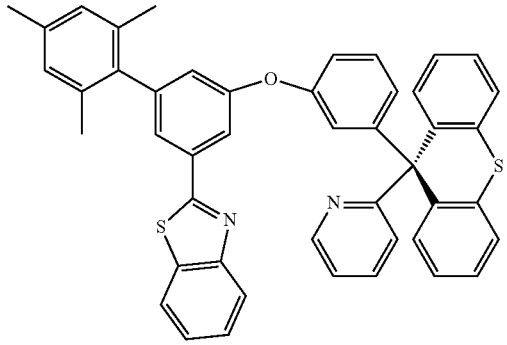
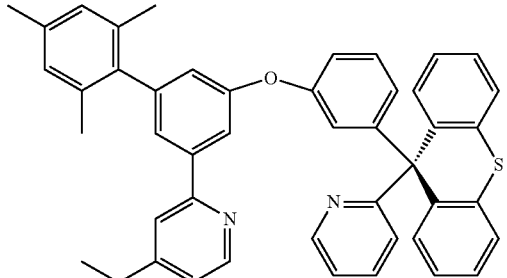
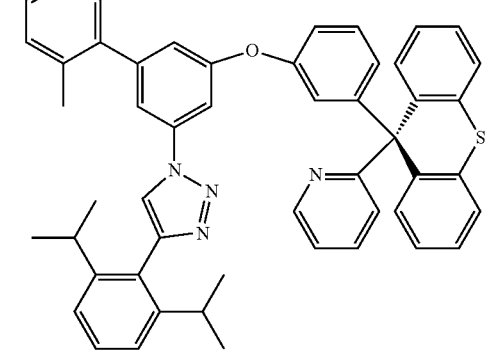
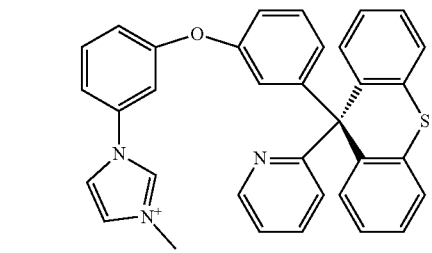
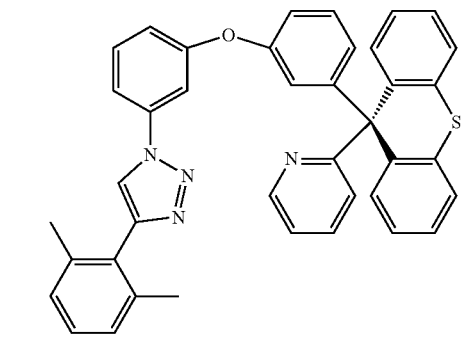

145
-continued
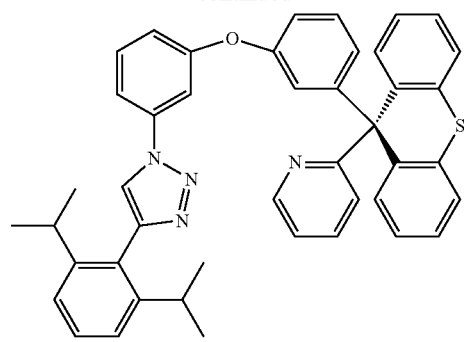
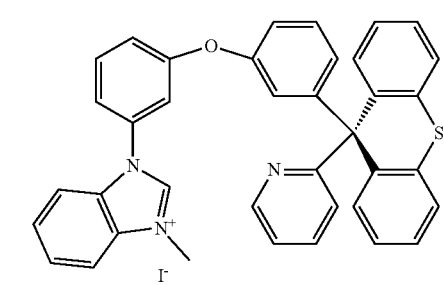
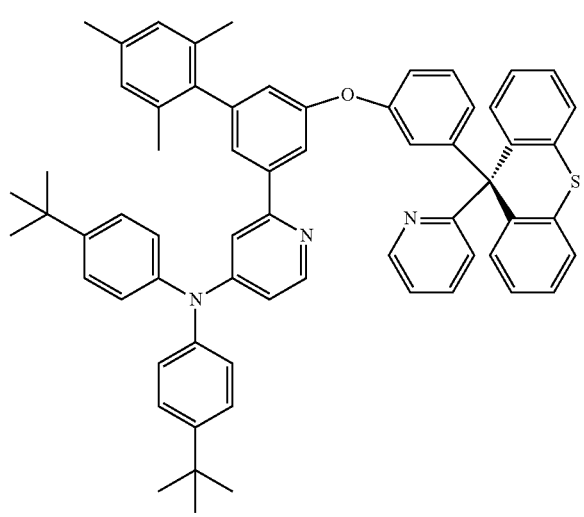
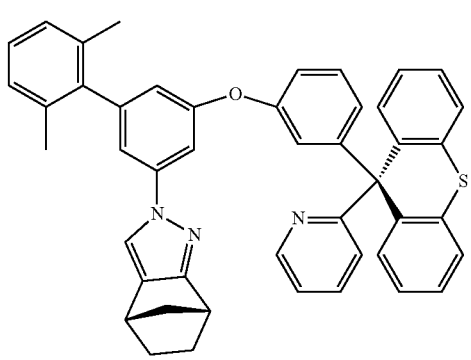
146
-continued
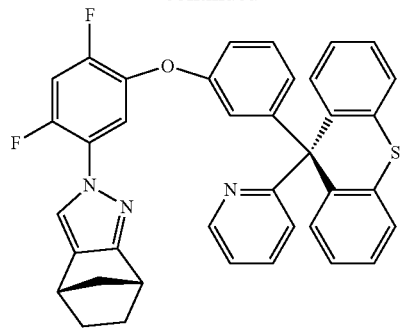
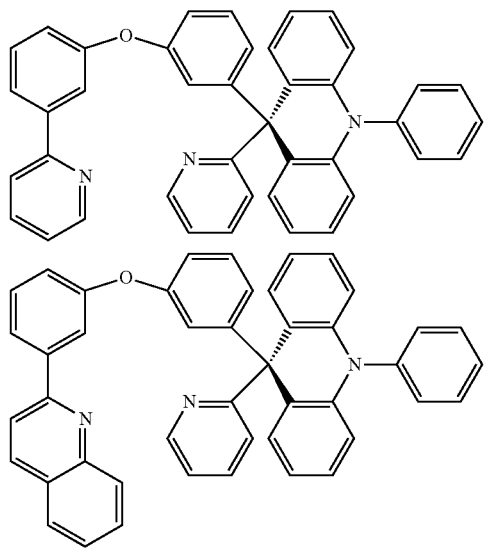
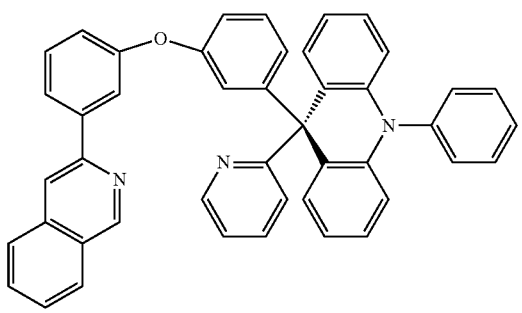
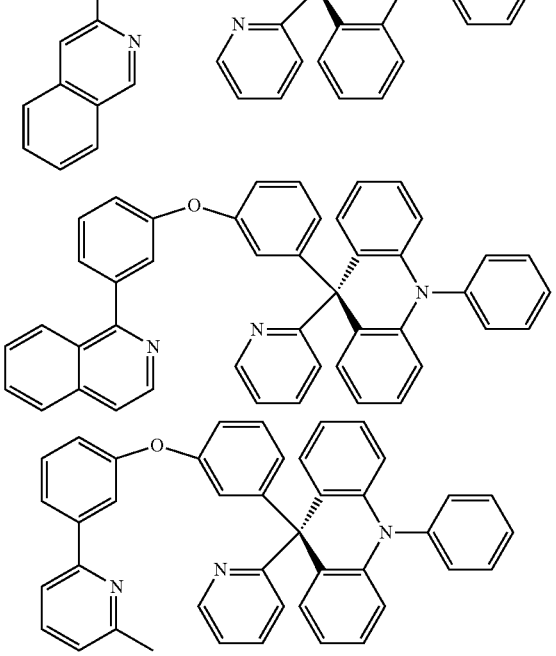

-continued
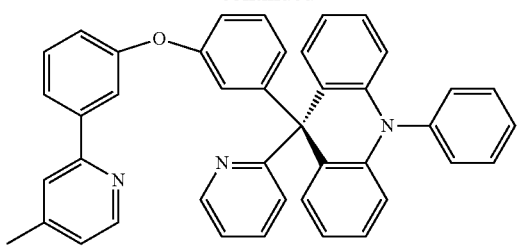
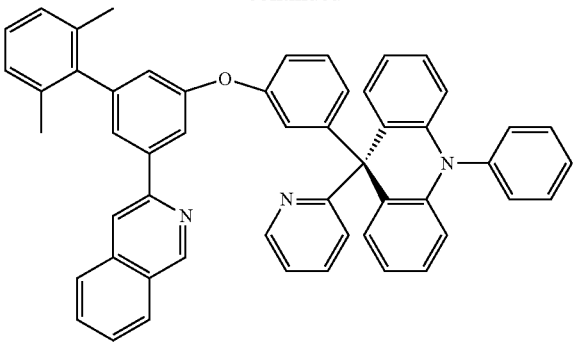
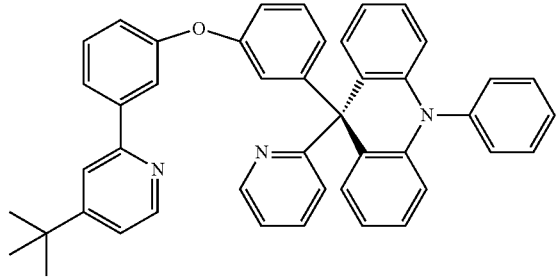
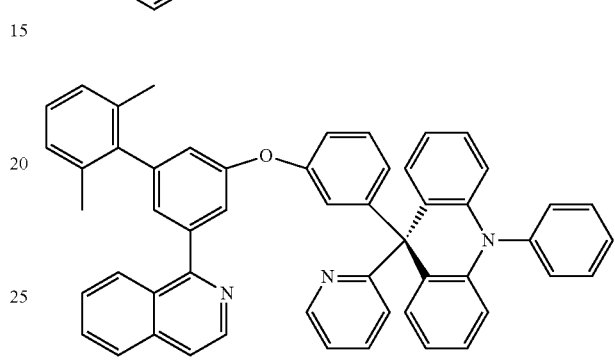
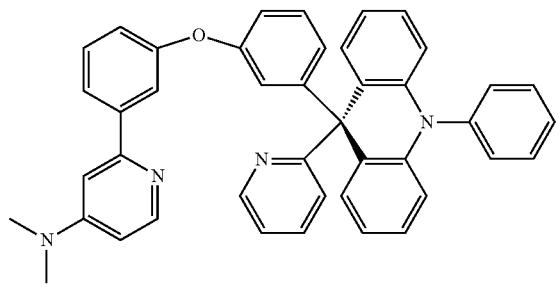
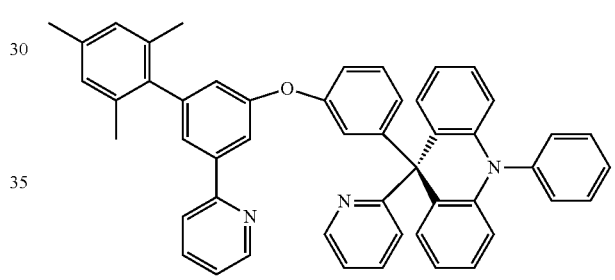
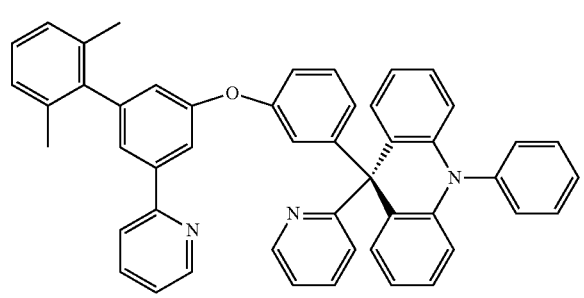
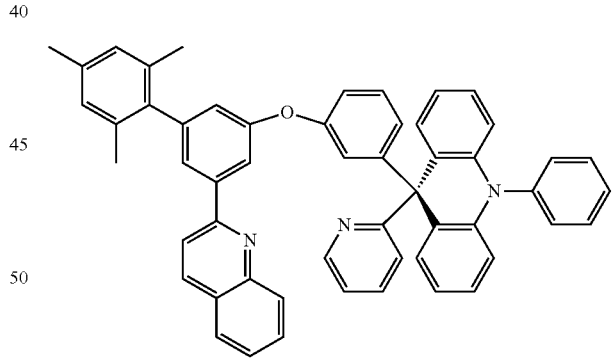
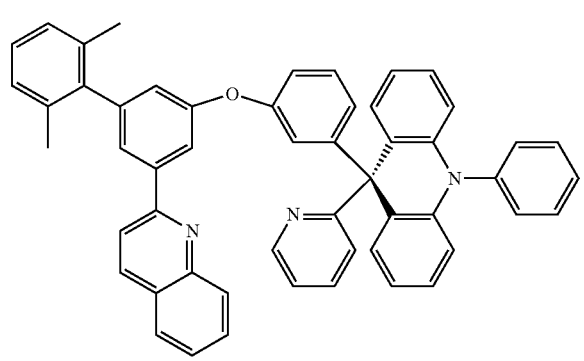
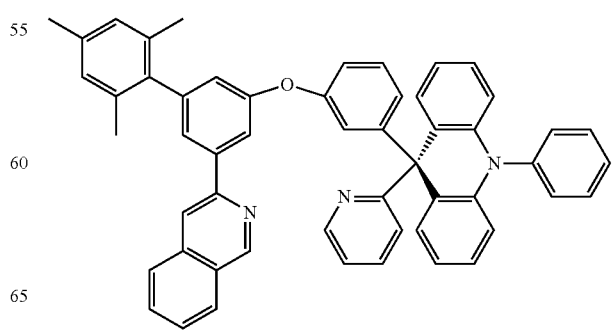

-continued
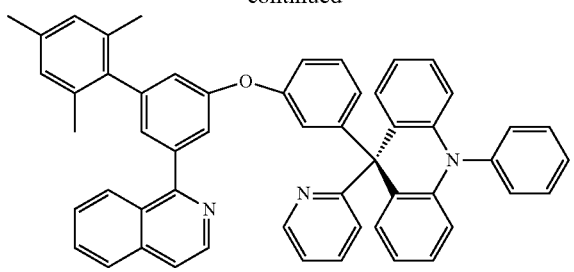
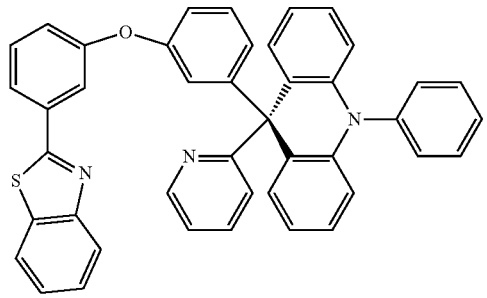
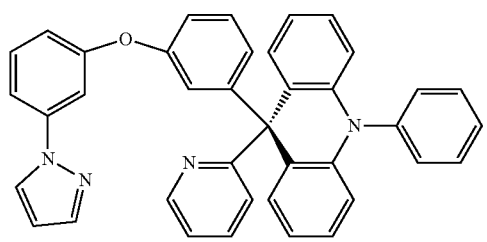
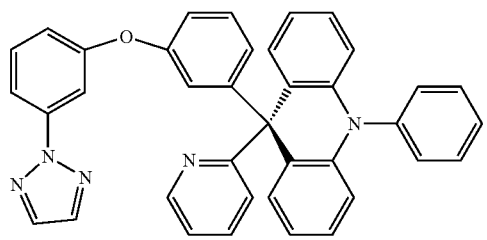
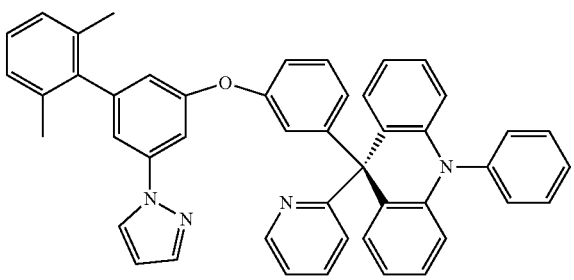
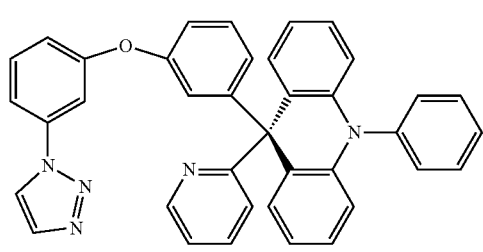
-continued
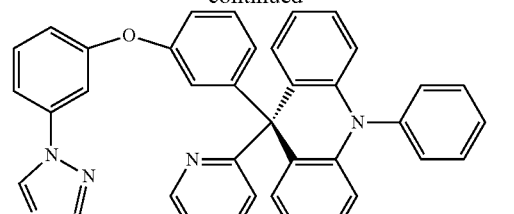
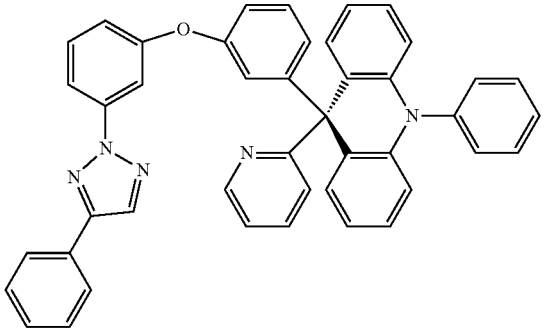
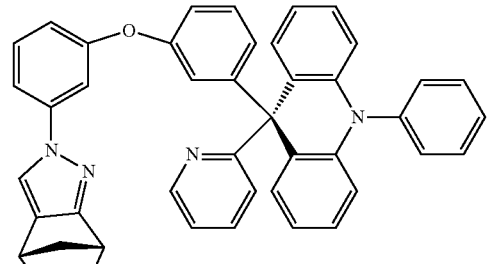
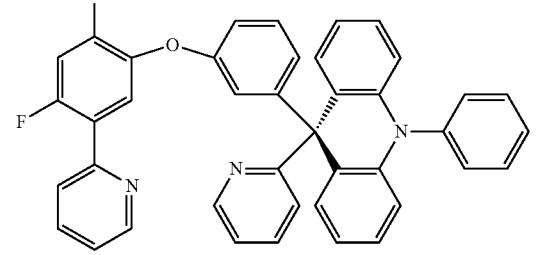
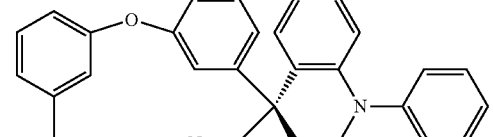
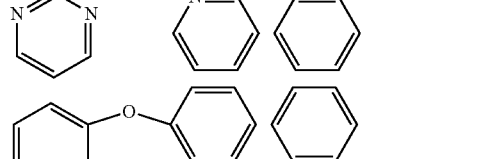
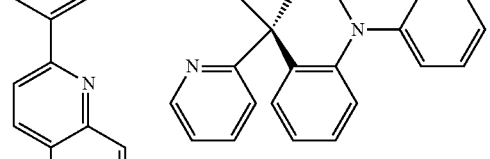

151
-continued
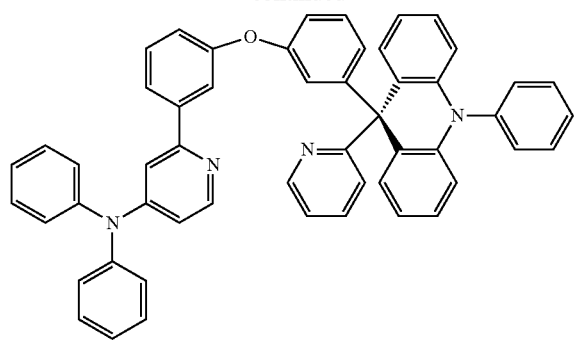
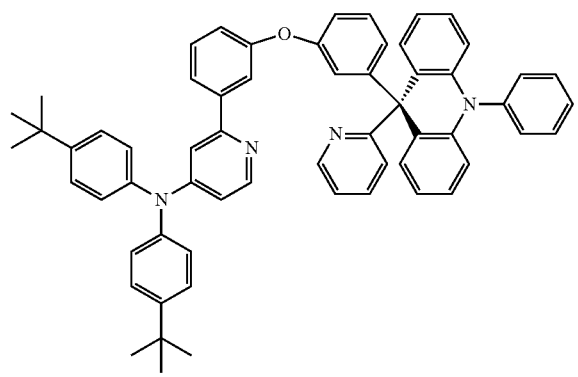
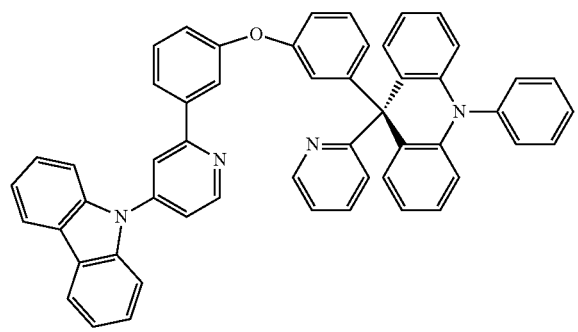
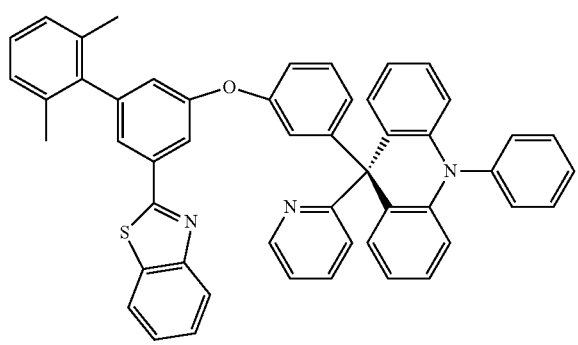
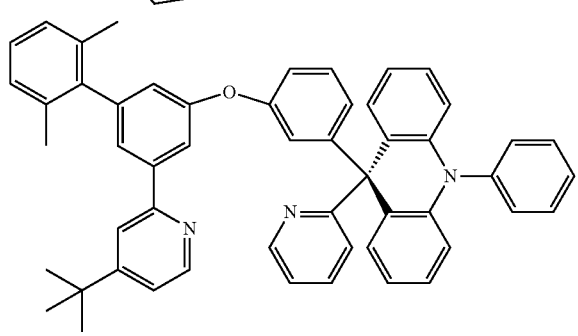
152
-continued
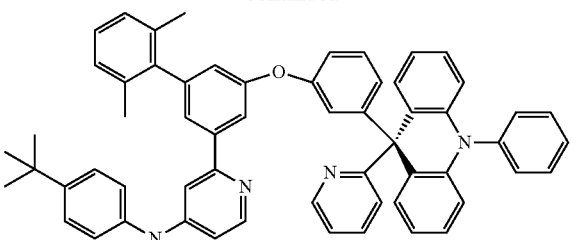
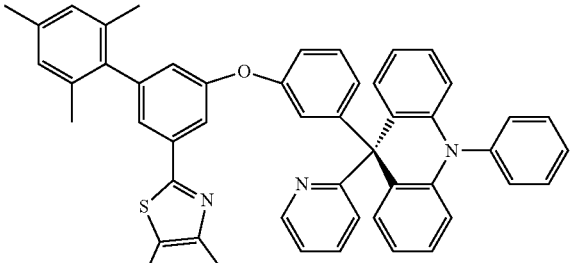
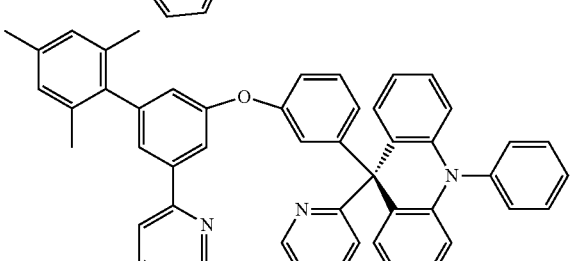
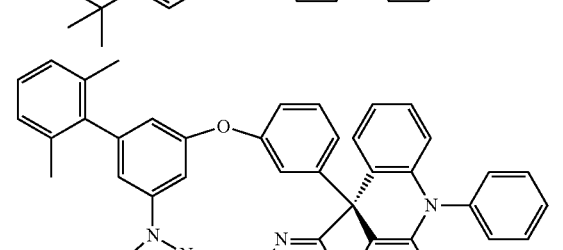
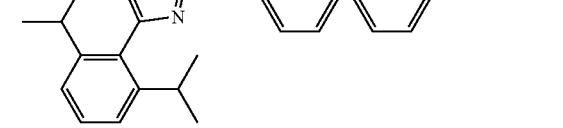
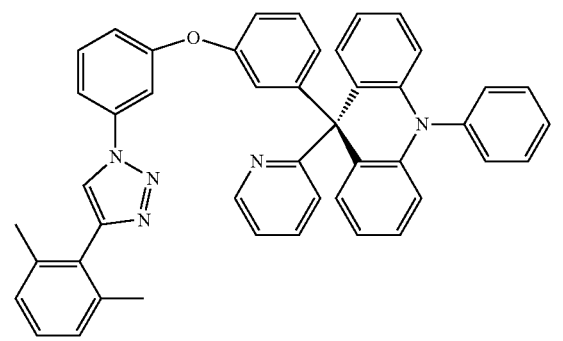

153
-continued
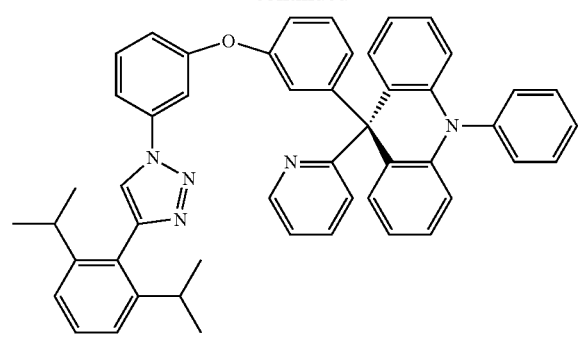
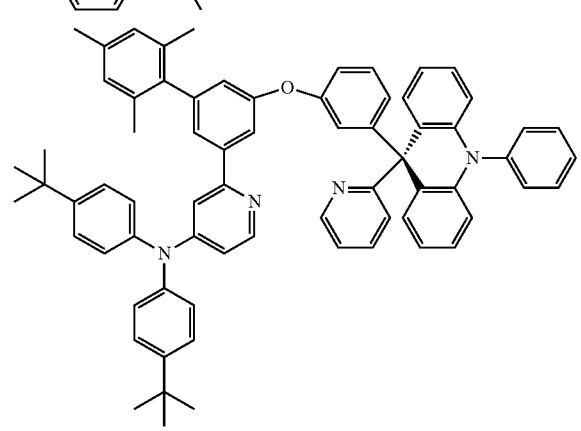
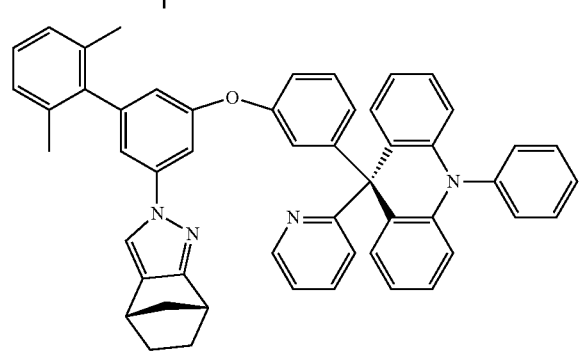
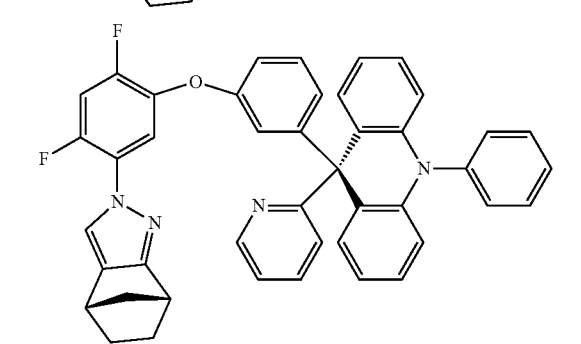
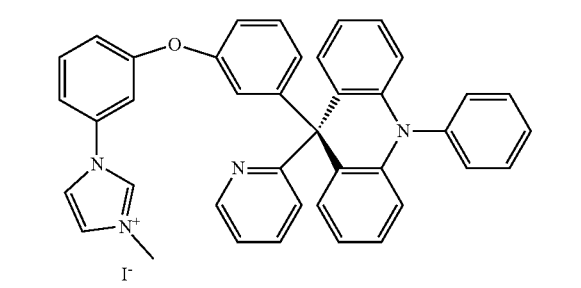
154
-continued
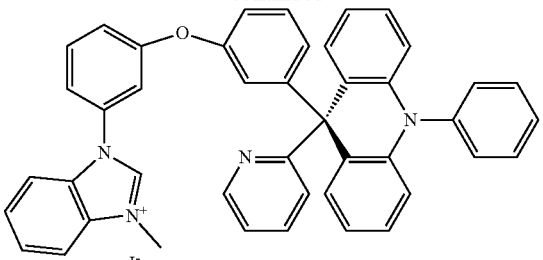
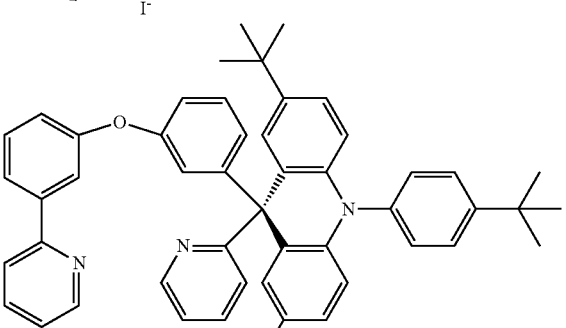
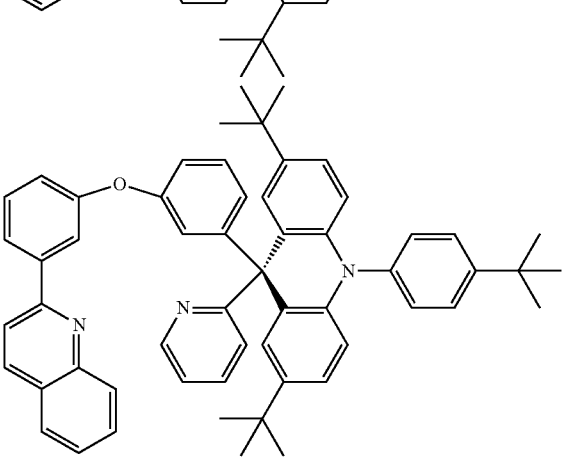
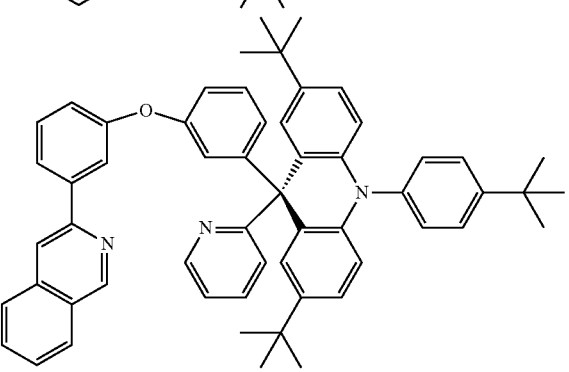
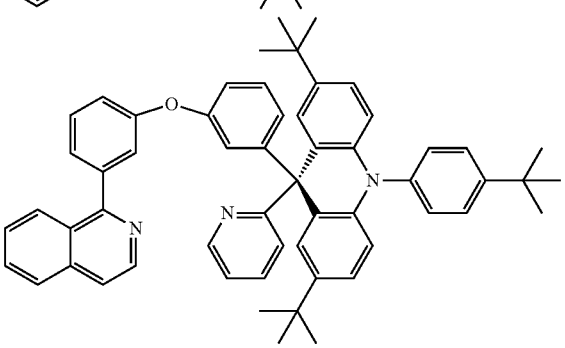

-continued
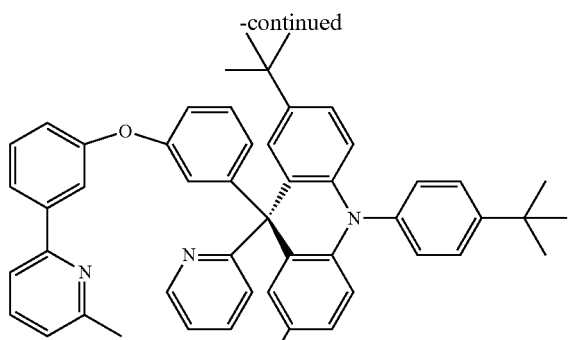
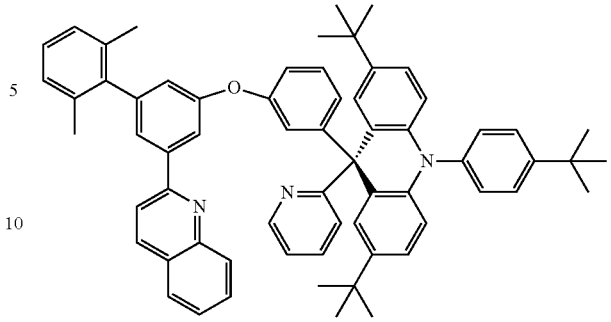
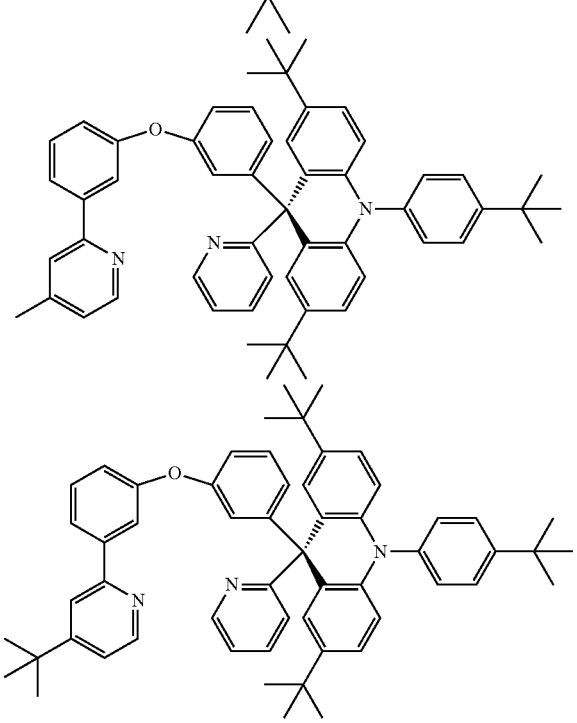
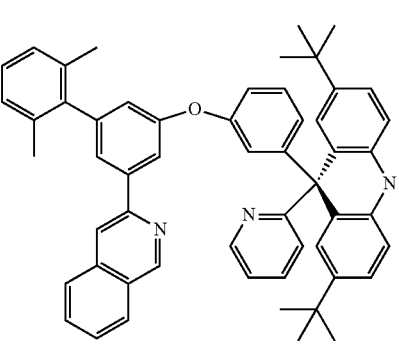
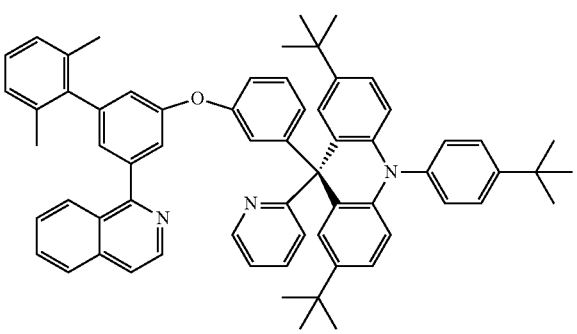
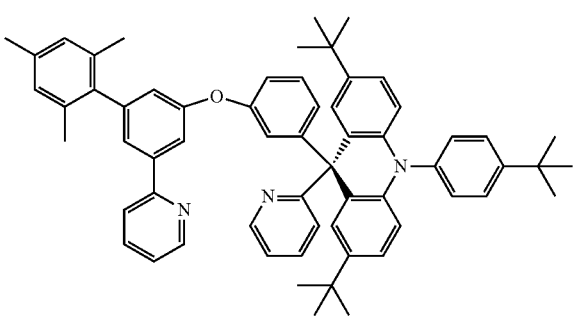
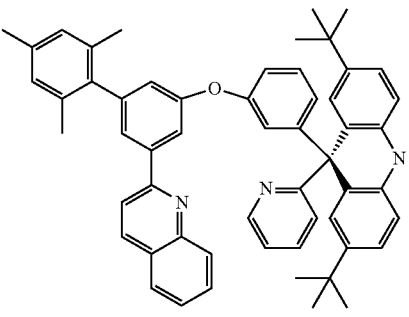

157
-continued
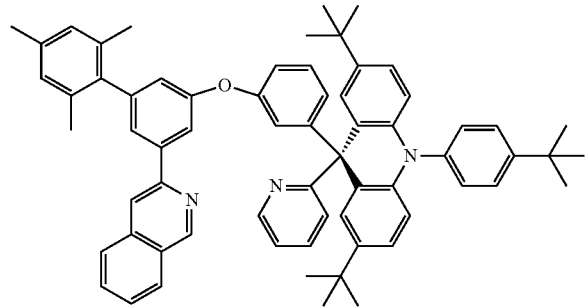
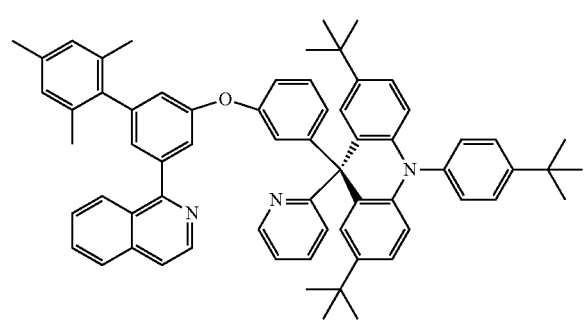
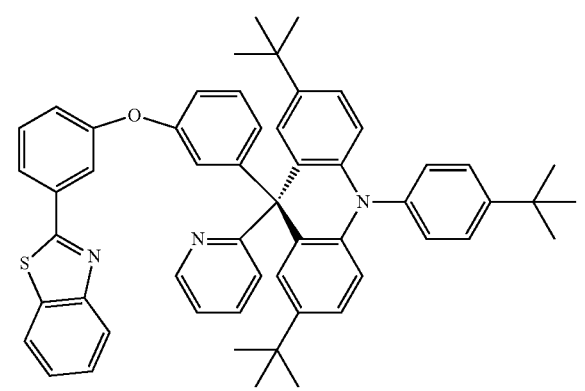
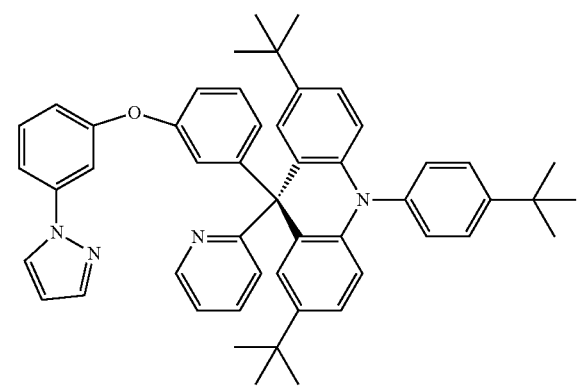
158
-continued
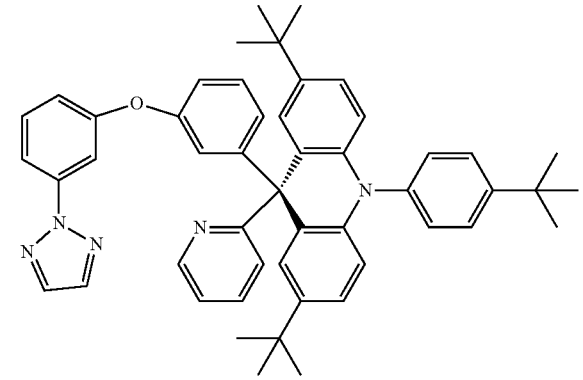
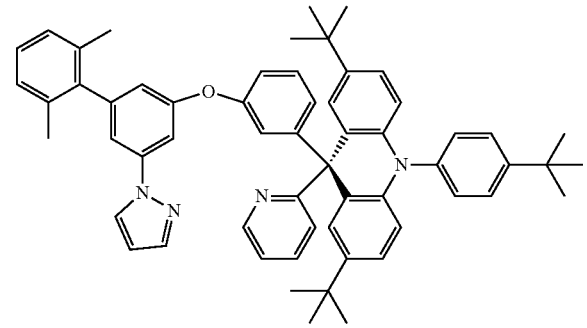
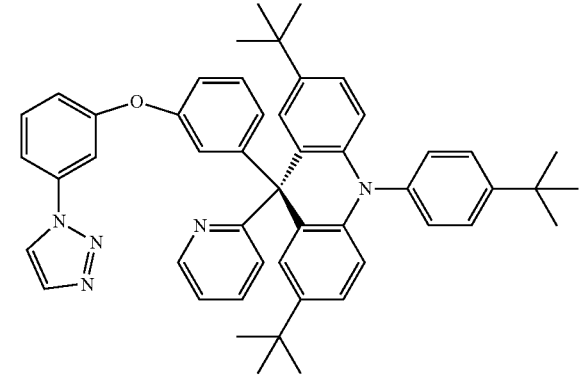
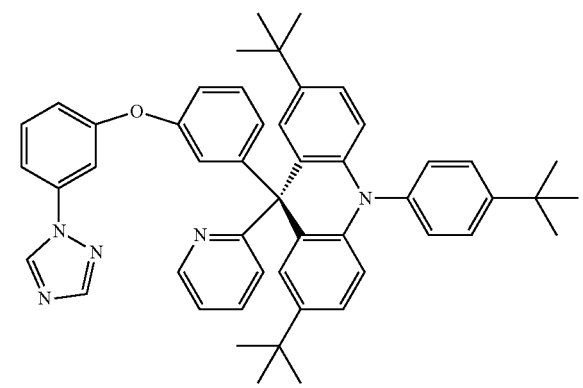

159
-continued
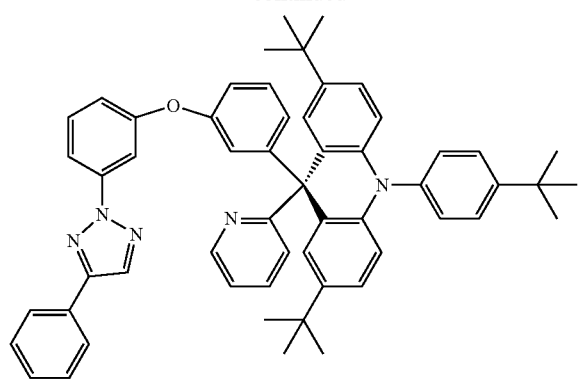
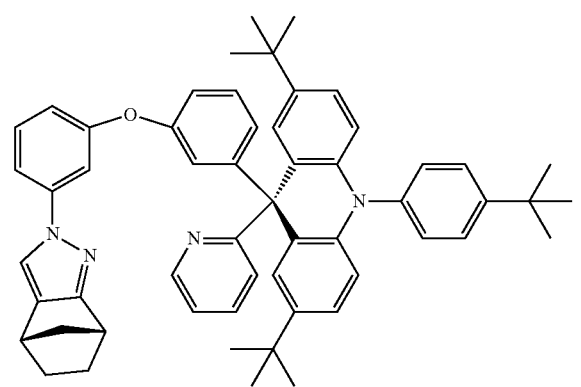
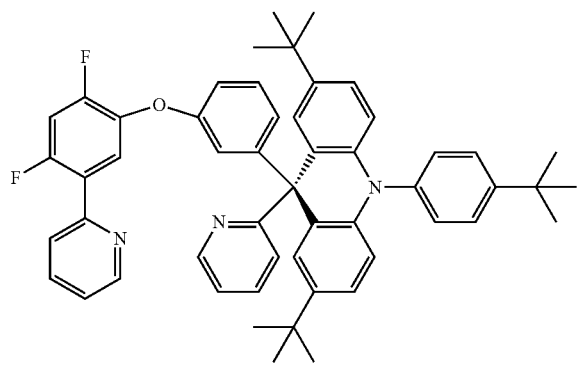
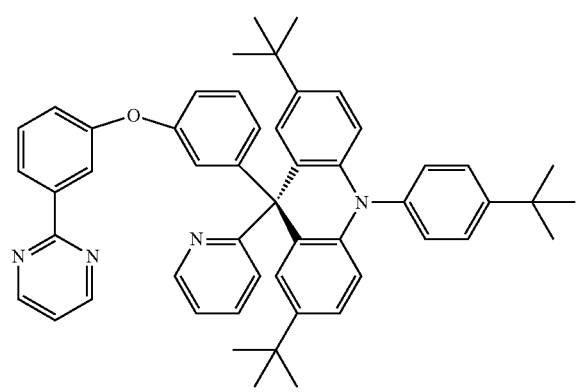
160
-continued
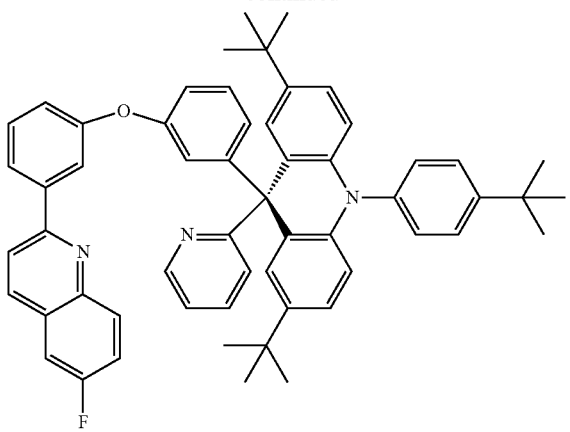
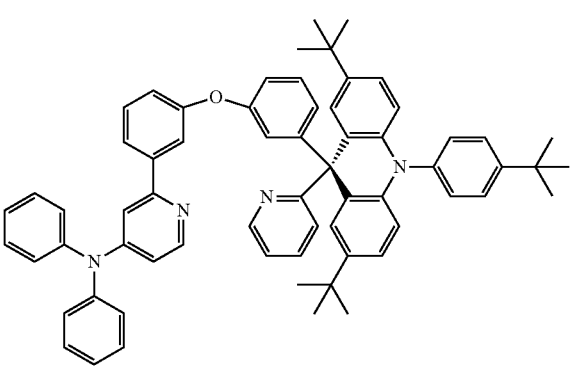
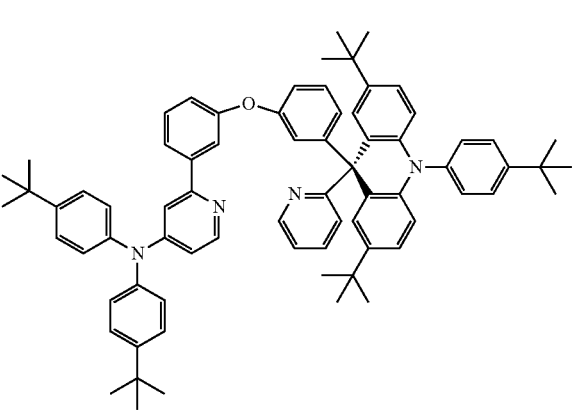
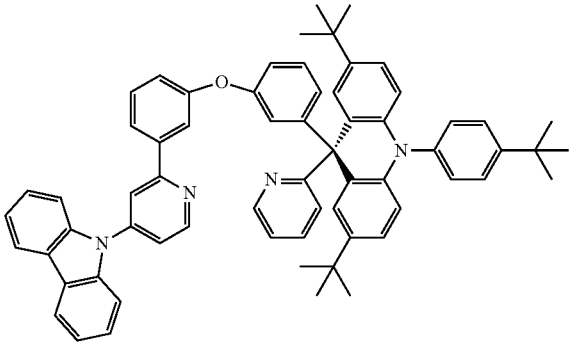

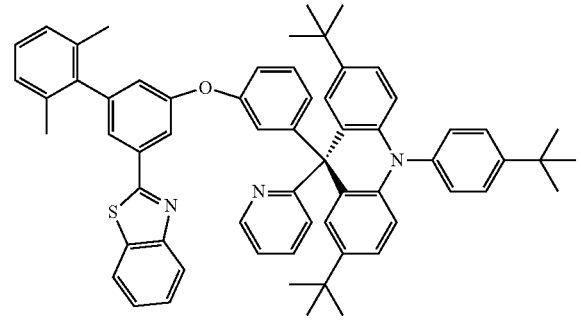
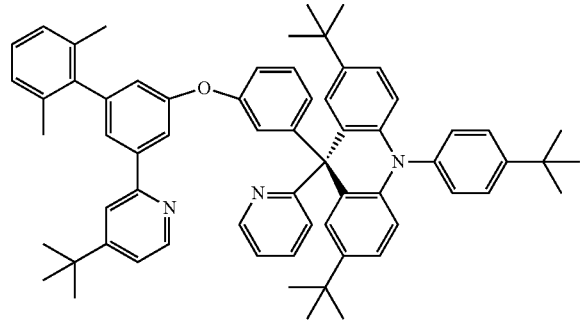
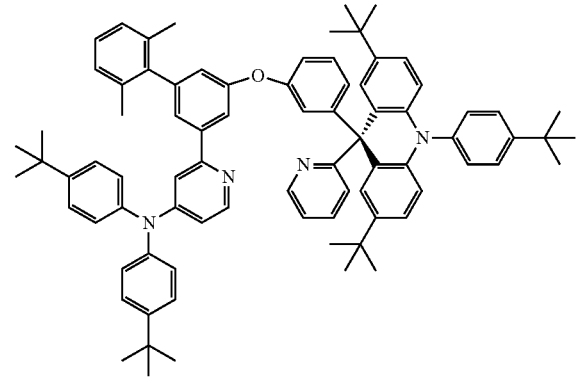
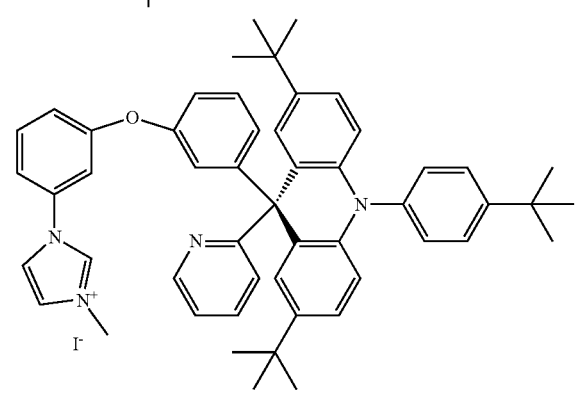
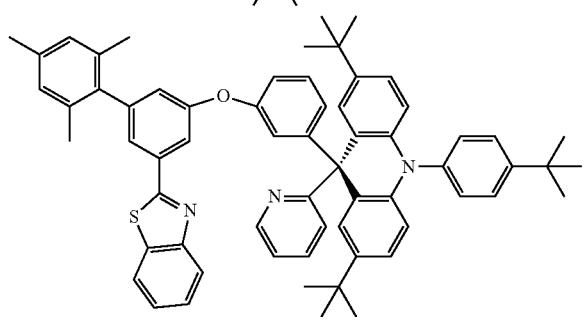
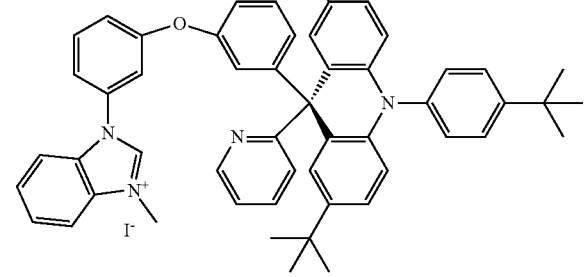
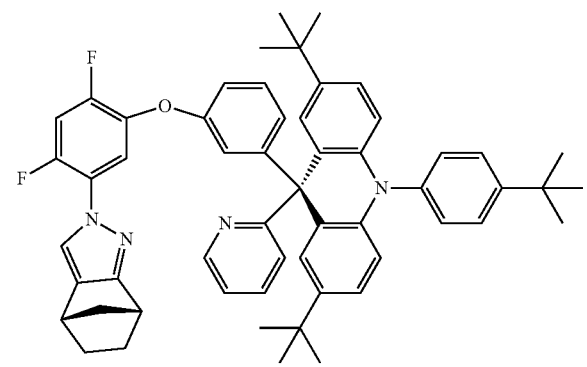
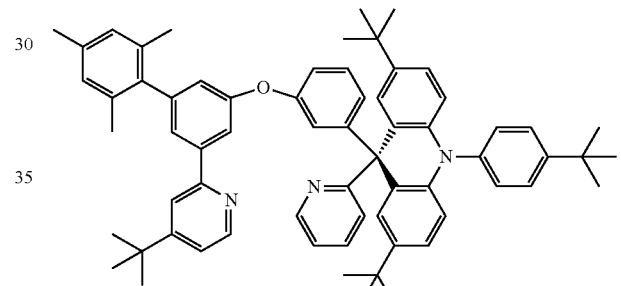
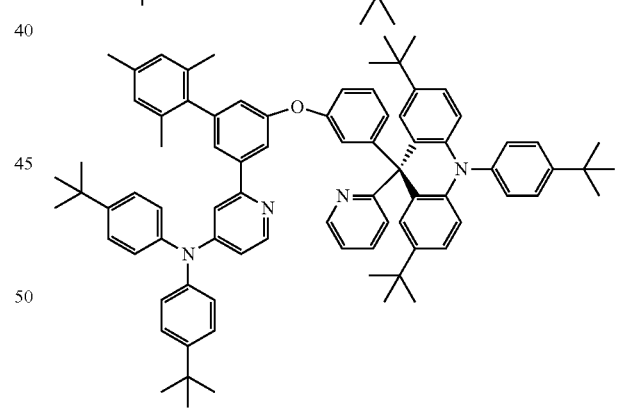
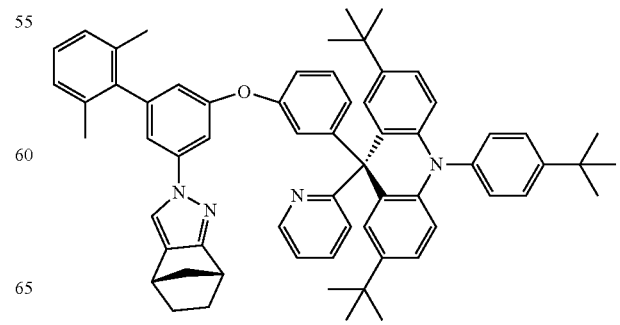

163
-continued
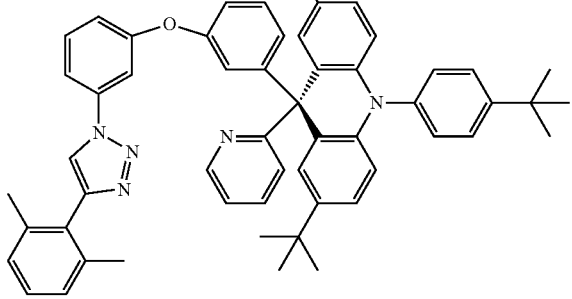
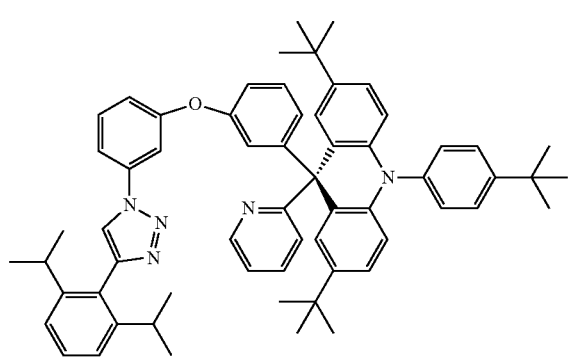
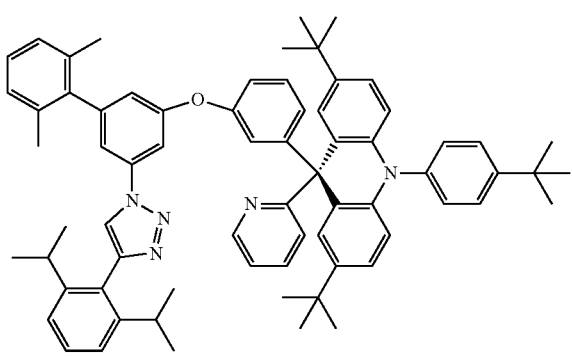
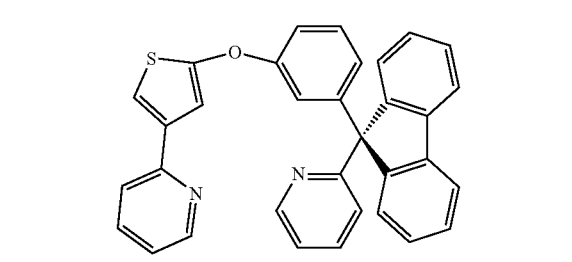
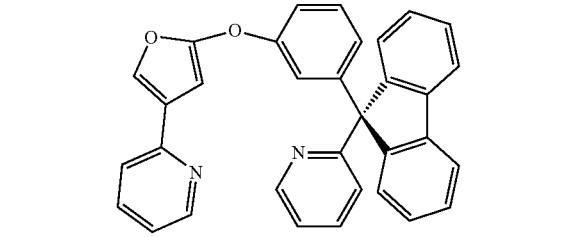
164
-continued
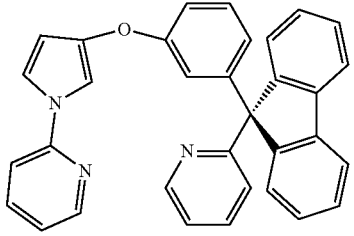
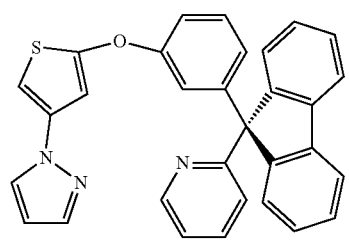
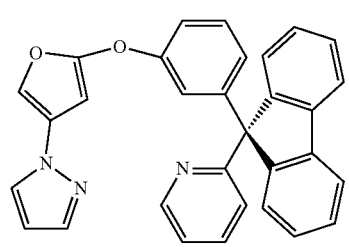
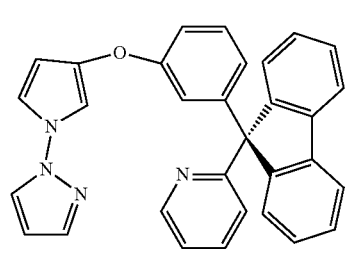
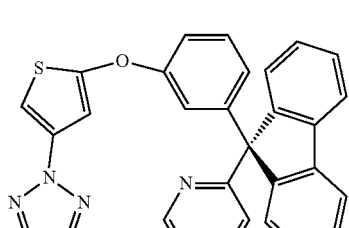
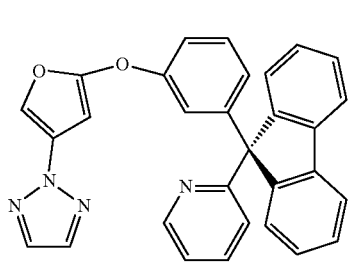

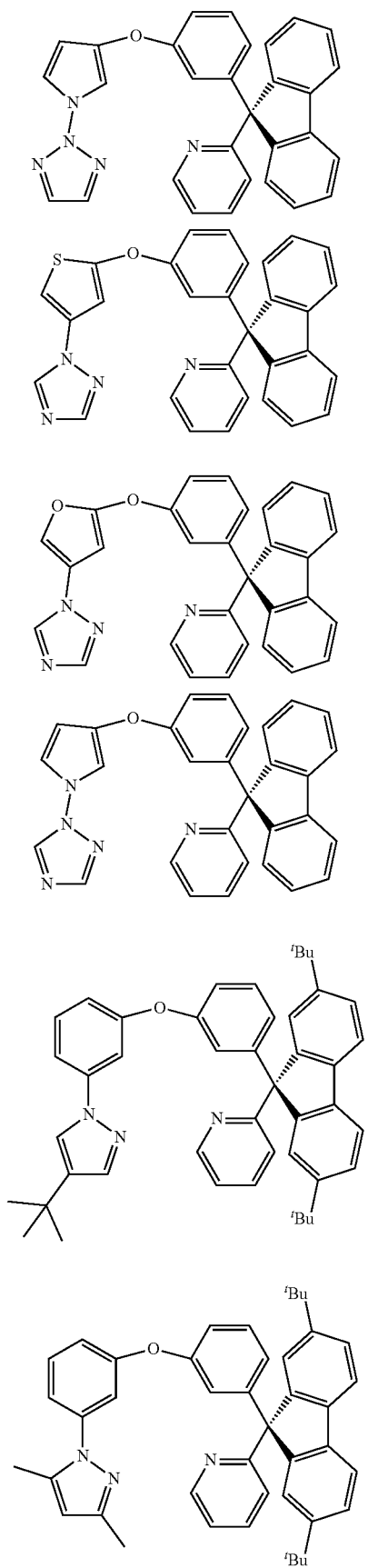
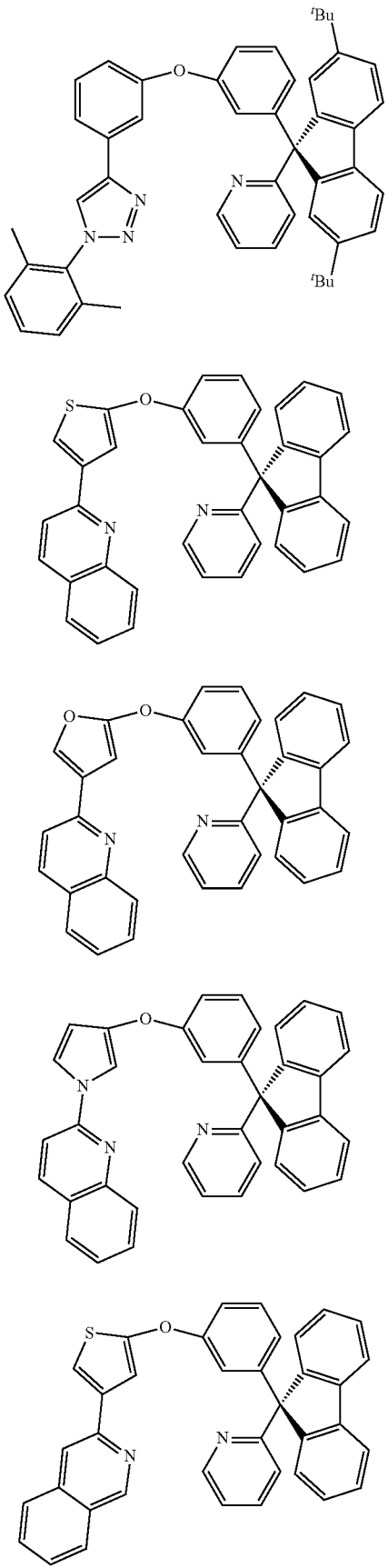

167
-continued
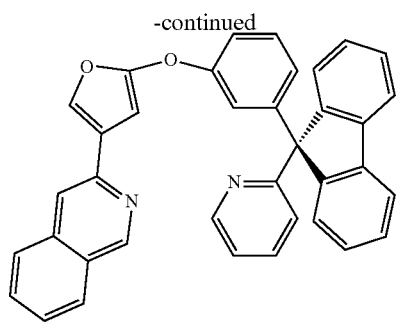
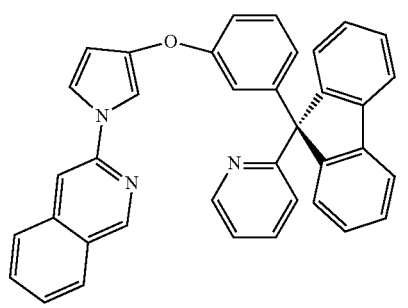
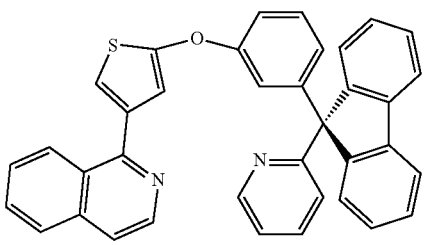
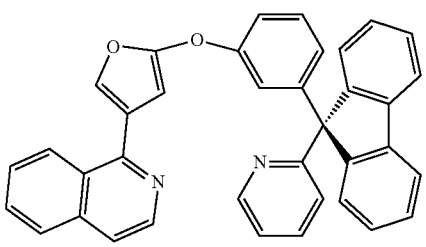
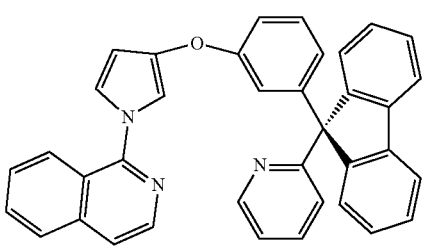
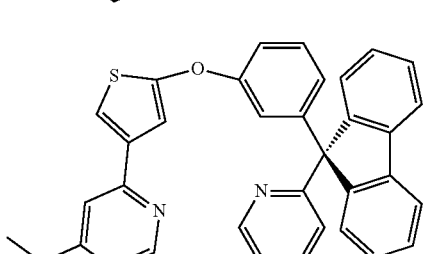
168
-continued
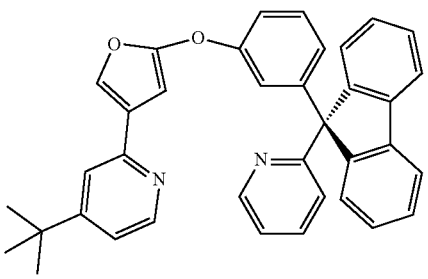
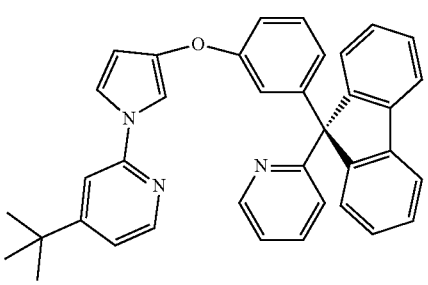
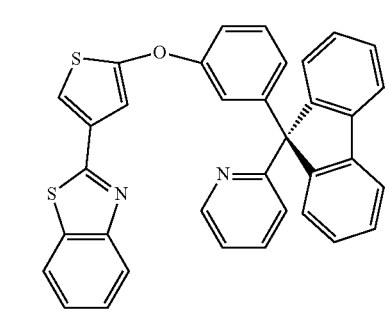
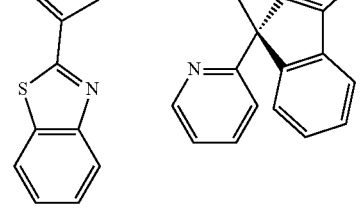
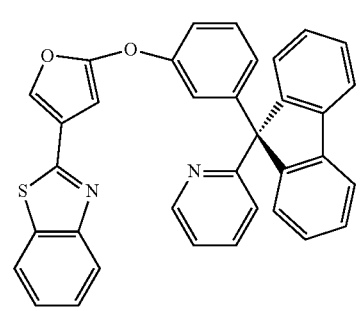
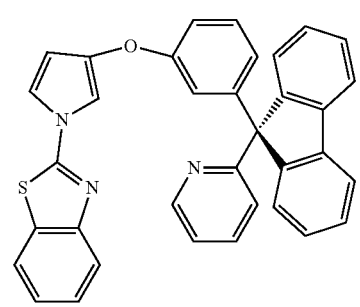

| 169 -continued | 170 -continued |
|---|---|
| 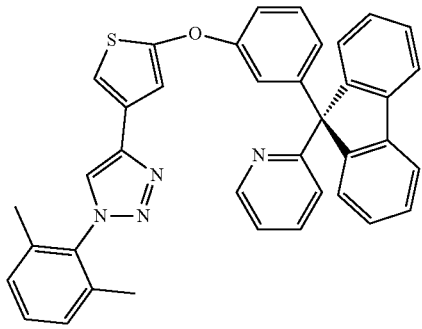 | 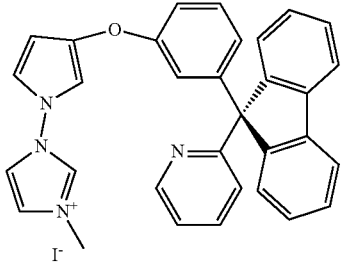 |
| 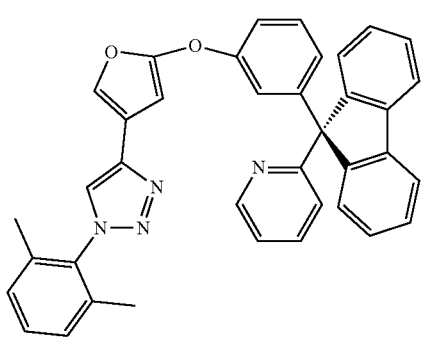 | 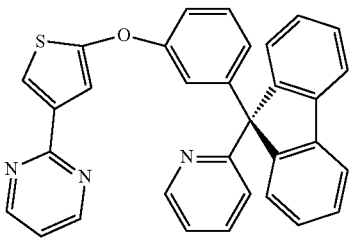 |
| 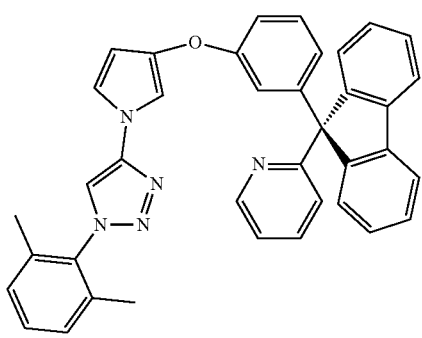 | 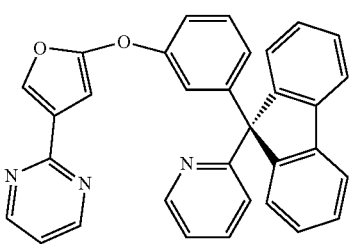 |
| 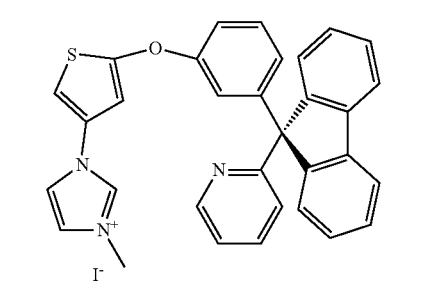 | 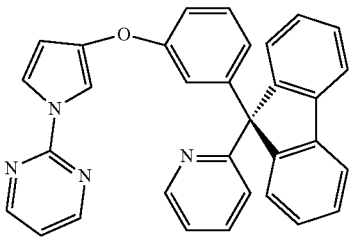 |
| 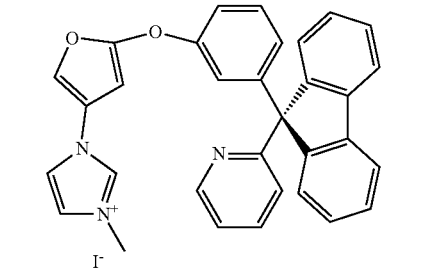 | 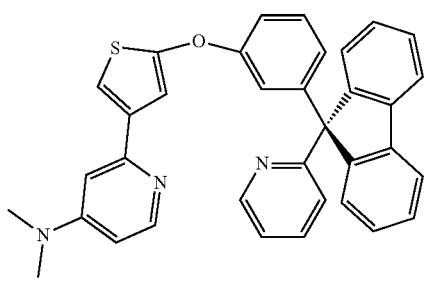 |
| | 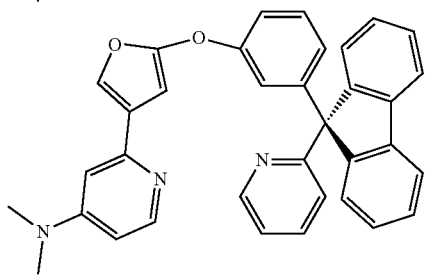 |

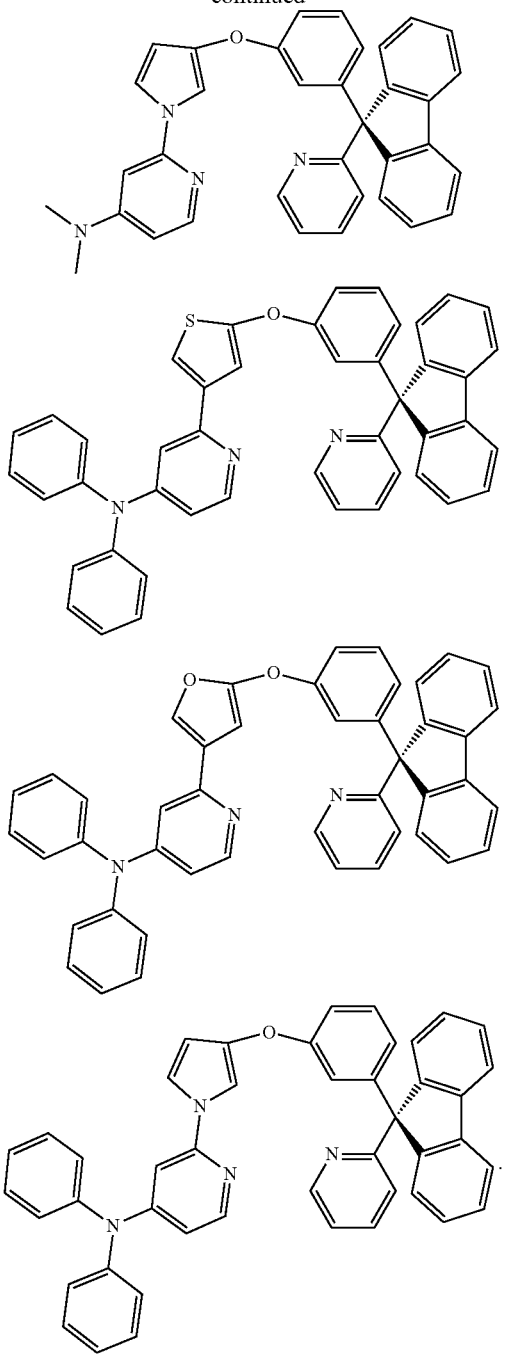

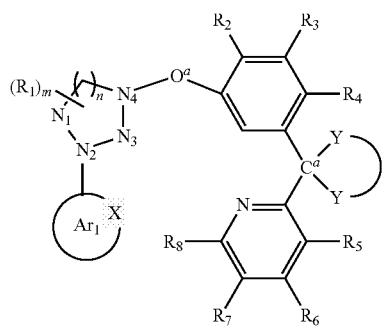

Where M is Pt, Ir, W, Fe, Ru, Ni, Pd, Cu, Au, or Zn and the structure of the ligand core is the following structure:

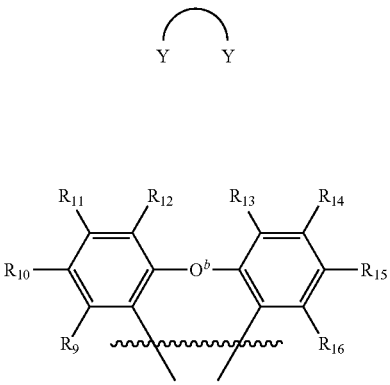

where $Ar_1$ is a substituted or unsubstituted aromatic or heteroaromatic ring where X is N or other electron pair donor;

is

11. A method of preparing a metal complex, comprising:
providing a tetradentate ligand according to claim 9;
providing a metal salt comprising Pt, Ir, W, Fe, Ru, Ni, Cu, Au, or Zn; and
reacting the tetradentate ligand with the metal salt.

12. A method of preparing a metal complex of a ligand core, comprising:
reacting the ligand core with metal salt in presence of tetra-n-butyl ammonium salt,
where the structure of the metal complex is the following structure:

and forms a spiro unit with $C^a$, where $C^a$ is carbon or silicon and $O^b$ is a bond, O, S, $NR_{17}$, B $R_{17}$, $PR_{17}$, $CR_{17}R_{18}$, or $SiR_{17}R_{18}$, where $O^a$ is O, S, $NR_{19}$, B $R_{19}$, $PR_{19}$, $CR_{19}R_{20}$, or $SiR_{19}R_{20}$; where $N_1$, $N_2$ and $N_4$ are independently unsubstituted or substituted boron, carbon, nitrogen, oxygen, silicon, germanium, phosphorous, sulphur or selenium and n is 1 to 3; where $N_3$ is carbon, boron, nitrogen, oxygen, silicon, germanium, phosphorous, sulphur or selenium; and the ring containing $N_1$, $N_2$, $N_3$ and $N_4$ is a saturated, unsaturated or aromatic ring; where $R_1$ is independently hydrogen, substituted or unsubstituted alkyl, alkenyl, alkynyl, aryl, heteroaryl, cycloalkyl, heterocyclyl, amino, nitro, hydroxyl, halogen, thio, alkoxy, haloalkyl, arylalkane or arylalkene; where $R_2$, $R_3$, $R_4$, $R_5$, $R_6$, $R_7$, and $R_8$ are independently hydrogen, substituted or unsubstituted alkyl, alkenyl, alkynyl, aryl, heteroaryl, cycloalkyl, heterocyclyl, amino, nitro hydroxyl, halogen, thio, alkoxy, haloalkyl, arylalkane or arylalkene; where $R_9$, $R_{10}$, $R_{11}$, $R_{12}$, $R_{13}$, $R_{14}$, $R_{15}$, and $R_{16}$ are independently hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group and where a pair of adjacent R groups can independently form a 5-8 membered aryl or arylalkyl ring which may be interrupted one or more times with O, S, N, or $NR_{21}$; and where $R_{17}$, $R_{18}$, $R_{19}$, $R_{20}$, and $R_{21}$ are independently alkyl, alkenyl, alkynyl, aryl, heteroaryl, cycloalkyl, heterocyclyl, haloalkyl, arylalkane or arylalkene.

13. The method according to claim 12, wherein the metal salt is potassium tetrachloroplatinate(II), bis-dimethylsulfide platinum(II) dichloride, cis-dichlorobis(dimethyl sulfoxide) platinum(II), dichloro(1,5-cyclooctadiene)platinum(II), or potassium tetrachloroplatinate(II).

14. The method according to claim 12, wherein reacting is refluxing in a solvent.

15. The method according to claim 14, wherein the solvent is acetic acid or a mixture of acetic acid and chloroform or methylene chloride.

16. A light-emitting device, comprising at least one metal complex according to claim 1.

17. The light-emitting device according to claim 16, wherein the device comprises at least one organic light-emitting diode (OLED).

* * * * *